(12) United States Patent
Sugibayashi et al.

(10) Patent No.: US 7,184,301 B2
(45) Date of Patent: Feb. 27, 2007

(54) MAGNETIC MEMORY CELL AND MAGNETIC RANDOM ACCESS MEMORY USING THE SAME

(75) Inventors: Tadahiko Sugibayashi, Tokyo (JP); Noboru Sakimura, Tokyo (JP); Takeshi Honda, Tokyo (JP)

(73) Assignee: NEC Corporation, Tokyo (JP)

( * ) Notice: Subject to any disclaimer, the term of this patent is extended or adjusted under 35 U.S.C. 154(b) by 450 days.

(21) Appl. No.: 10/702,655

(22) Filed: Nov. 7, 2003

(65) Prior Publication Data

US 2004/0100835 A1 May 27, 2004

(30) Foreign Application Priority Data

Nov. 27, 2002 (JP) ............................. 2002-382778
Apr. 30, 2003 (JP) ............................. 2003-124959

(51) Int. Cl.
*G11C 11/00* (2006.01)
(52) U.S. Cl. ...................... 365/158; 365/145; 365/171
(58) Field of Classification Search ................ 365/171, 365/145, 158, 173
See application file for complete search history.

(56) References Cited

U.S. PATENT DOCUMENTS

| | | | |
|---|---|---|---|
| 5,640,343 A | 6/1997 | Gallagher et al. | |
| 6,191,989 B1 | 2/2001 | Luk et al. | |
| 6,795,340 B2 * | 9/2004 | Sakimura et al. | 365/171 |
| 2003/0123199 A1 * | 7/2003 | Honda et al. | 360/324 |

FOREIGN PATENT DOCUMENTS

| | | |
|---|---|---|
| JP | 2000-82791 | 3/2000 |
| JP | 2001-273760 | 10/2001 |
| JP | 2002-8367 | 1/2002 |
| JP | 2002-100181 | 4/2002 |
| JP | 2002-110938 | 4/2002 |
| JP | 2002-140889 | 5/2002 |
| JP | 2002-230965 | 8/2002 |
| JP | 2002-246568 | 8/2002 |
| JP | 2002-334973 | 11/2002 |
| JP | 2003-31773 | 1/2003 |

* cited by examiner

*Primary Examiner*—Richard Elms
*Assistant Examiner*—Hien Nguyen
(74) *Attorney, Agent, or Firm*—Young & Thompson

(57) ABSTRACT

In a magnetic random access memory, a memory cell includes a magnetic field generating section having an extension wiring line, and connected with a first selected bit line, a conductive pattern, and a magnetic resistance element having a spontaneous magnetization, storing a data and connected between the extension wiring line and the conductive pattern. In a data write operation into the memory cell, a write data is written in the magnetic resistance element of the memory cell by a write electric current which flows through the extension wiring line of the magnetic field generating section of the memory cell, and a value of the write data is determined based on a direction of the write electric current. In a data read operation from the memory cell, a read electric current flows through the extension wiring line of the magnetic field generating section and the magnetic resistance element in the memory cell. A memory cell array section includes the memory cells arranged in a matrix, and each memory cell is connected with a first word line and a first bit line at least, the gate section.

121 Claims, 79 Drawing Sheets

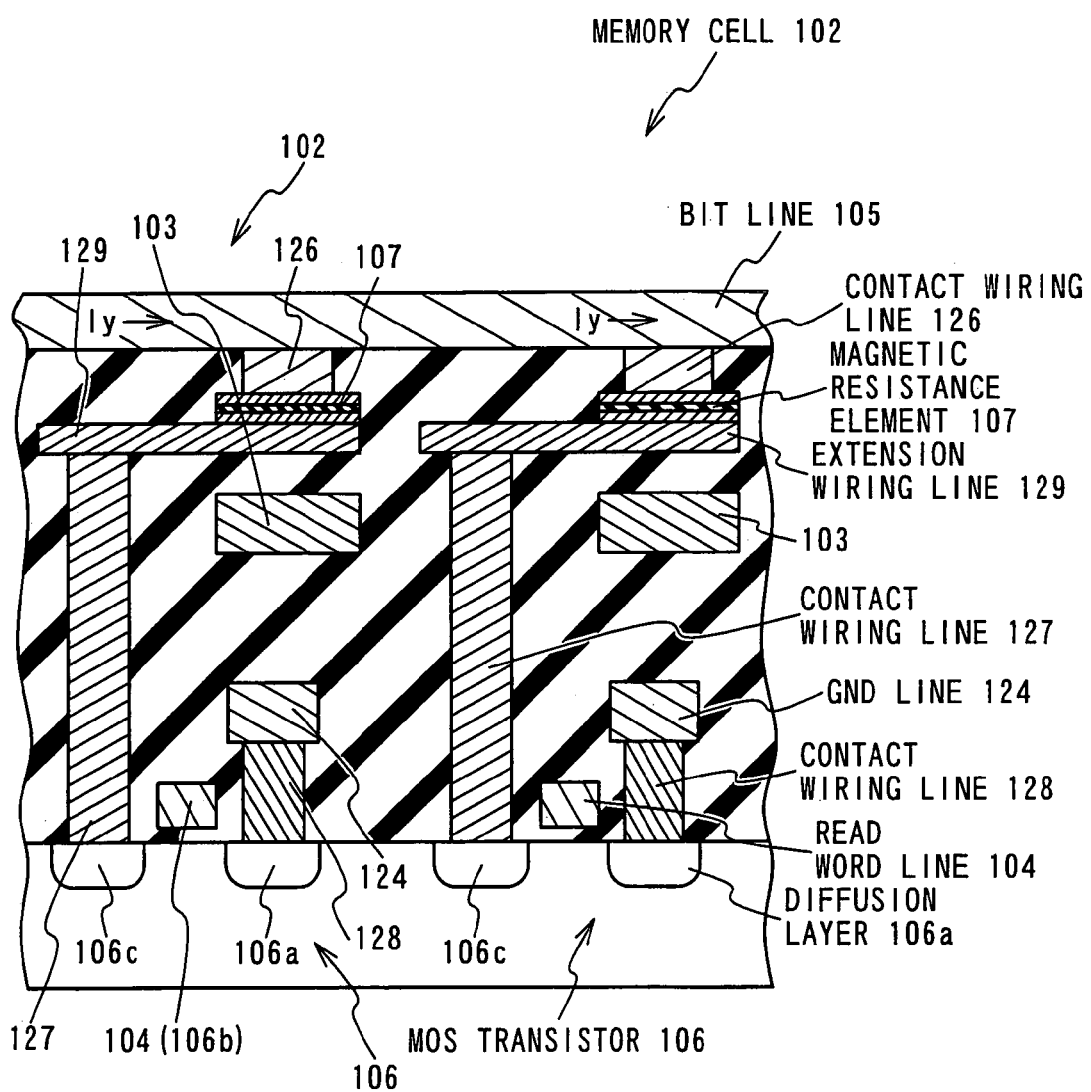

ANISOTROPY OF MAGNETIC SUBSTANCE

Fig. 53
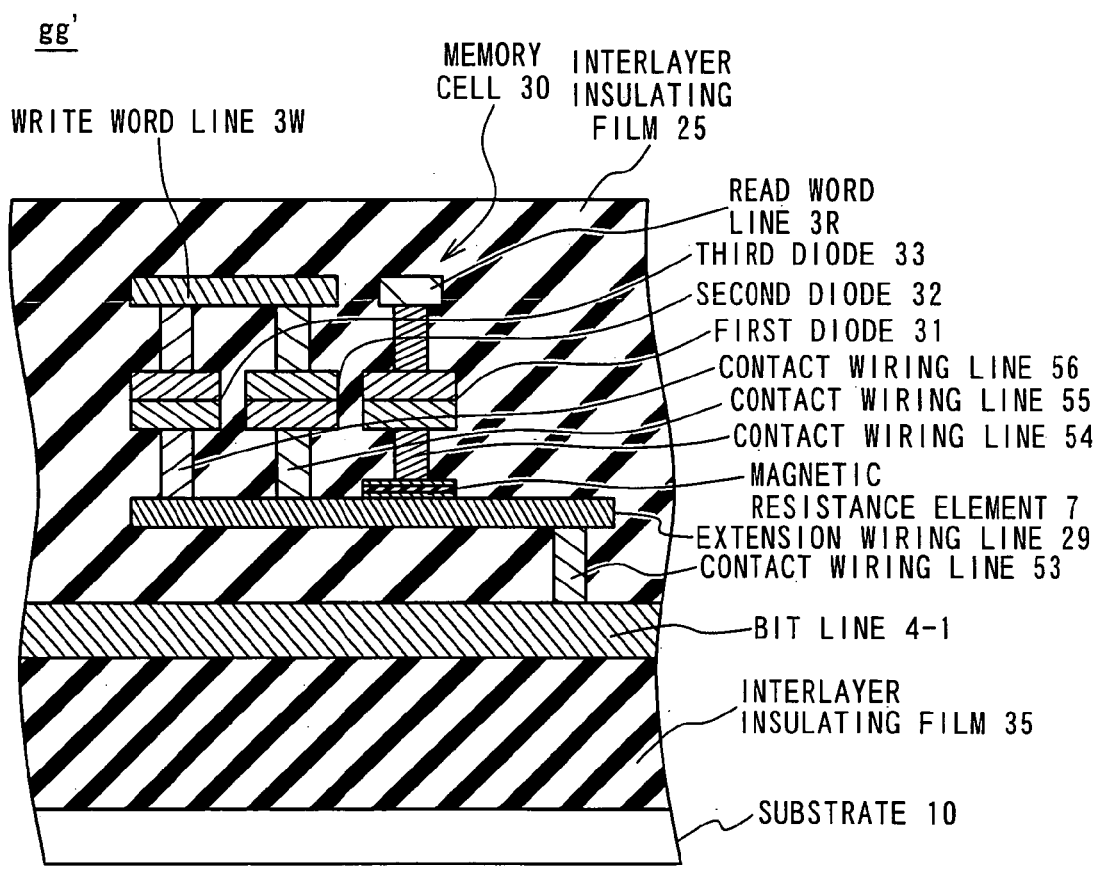
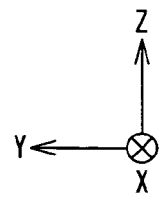

MAGNETIC MEMORY CELL AND MAGNETIC RANDOM ACCESS MEMORY USING THE SAME

BACKGROUND OF THE INVENTION

1. Field of the Invention

The present invention relates to a magnetic memory cell and a magnetic random access memory. More particularly, the present invention relates a magnetic memory cell in which a tunnel magnetic resistance element and a transistor are combined, and a magnetic random access memory.

2. Description of the Related Art

A magnetic random access memory (MRAM) is known. The magnetic random access memory using magnetic memory cells will be described with reference to U.S. Pat. No. 6,191,989. FIGS. 1A and 1B are diagrams showing the operation principle of a magnetic resistance element contained in a magnetic memory cell. The magnetic resistance element 107 is composed of a free layer 121 having an invertible spontaneous magnetization, a pin layer 123 having a fixed spontaneous magnetization, and a tunnel insulating layer 122 which is interposed between the pin layer 123 and the free layer 121. The free layer 121 is formed in such a manner that the direction of the spontaneous magnetization can oriented to the direction parallel to i.e., the same direction as the direction of the spontaneous magnetization of the pin layer 123, or the direction anti-parallel, i.e., the opposite direction to it.

The resistance of the magnetic resistance element 107 varies based on whether the direction of the spontaneous magnetization of the free layer 121 is parallel to the direction of the spontaneous magnetization of the pin layer 123 or anti-parallel to it. Therefore, a quantity of electric current which flows through the tunnel insulating layer 122 varies. In the magnetic resistance element 107, a data "1" is allocated to one of the "parallel state" and the "anti-parallel state" and a data "0" is allocated to the other. For example, as shown in FIG. 1A, when the directions of the spontaneous magnetizations are anti-parallel, the resistance of the magnetic resistance element 107 is R+ΔR. At this time, if the applied voltage is constant, the quantity of electric current is small. The data "1" is allocated to this state. On the other hand, as shown in FIG. 1B, when the directions of the spontaneous magnetizations are parallel to each other, the resistance of the magnetic resistance element 107 is R and the quantity of current becomes large. The data "0" is allocated to this state.

A semiconductor memory device which uses the magnetic memory cell containing such a magnetic resistance element 107 as memory cell 102 is called a magnetic random access memory. The direction of the magnetization of the pin layer 123 is fixed in the manufacturing. The fixation is often carried out by using anti-ferromagnetic substance layer 134.

FIG. 2 is a cross sectional view showing the memory cell. The memory cell 102 is composed of a magnetic resistance element 107, a MOS transistor 106, a contact wiring line 126, a contact wiring line 127, a contact wiring line 128, and an extension wiring line 129. The MOS transistor 106 has a first diffusion layer 106a, a second diffusion layer 106c and a first gate 106b provided on the semiconductor substrate through an insulating layer between the first diffusion layer 106a and the second diffusion layer 106c. The first diffusion layer 106a is connected with a ground (GND) wiring line 124 through a contact wiring line 128, and the second diffusion layer 106c is connected with one end of the extension wiring line 129 through a contact wiring line 127. The gate 106b is connected with a read word line 104. The extension wiring line 129 is connected at the other end with one end of the magnetic resistance element 107. The magnetic resistance element 107 is connected at the other end with a bit line 105 through a contact wiring line 126. Also, a write word line 103 is provided in the interlayer insulating layer 125 on the side opposite to the bit line 105 with respect to the extension wiring line 129 for the magnetic resistance element 107 to be orthogonal to the bit line 105.

The spontaneous magnetization of the free layer 121 of the magnetic resistance element 107 can be inverted into a desired direction based on a synthetic magnetic field which is generated by the electric current which flows through the bit line 105 and the electric current which flows through the write word line 103.

FIGS. 3A to 3C are diagrams showing the principle of the data write operation into the magnetic memory cell. The vertical axis shows the magnetic field in a Y-axis direction and the horizontal axis is the magnetic field in the X-axis direction, as shown in to FIGS. 1A and 1B and FIG. 2 in correspondence to the memory cell. The magnetic coercivity of the free layer 121 shows a characteristic called an asteroid curve (the magnetization inversion magnetic field curve). When a magnetic field having a strength in the region outside the asteroid curve is applied to the magnetic resistance element, the spontaneous magnetization of the free layer 121 is inverted, because the magnetic field exceeds the magnetic coercivity. The asteroid curve shown in FIGS. 3A to 3C shows that the spontaneous magnetization of the free layer 121 is most easily inverted when the synthetic magnetic field H0 having the angle of 45° with respect to both of the write word line 103 and the bit line 105 which is orthogonal to the write word line 103 is applied to the free layer 121. The electric currents which flow through the bit line 105 and the write word line 103 have been selected in such a manner that the synthetic magnetic field H0 of the magnetic fields which are generated by those electric currents is in the area outside the asteroid curve, and that the magnetic fields HY0 and HX0 which are generated independently by the respective electric currents is present in the area inside the asteroid curve. In this way, through the selection of the electric currents, the data can be written in the magnetic resistance element 107.

FIG. 4 is a diagram showing a conventional magnetic random access memory using the memory cells. The conventional magnetic random access memory is composed of a memory the memory cell array 101, a plurality of write word lines 103, a plurality of read word lines 104, a plurality of bit lines 105, an X-selector 108, an X-side current source circuit 109, an X-side current terminating circuit 110, a Y-selector 111, a Y-side electric current source circuit 112, a read current load circuit 113, a Y-side current terminating circuit 114 and a sense amplifier 115.

In the memory cell array 101, the memory cells 102 are arranged in a matrix. The X-selector 108 selects a desired read word line 104s from the plurality of read word lines 104 extending in the X-axis direction in case of a data read operation, and selects a desired write word line 103s from the plurality of write word lines 103 extending in the X-axis direction in case of a data write operation. The X-side current source circuit 109 has a constant current source, and supplies a constant electric current in the case of the data write operation into the memory cell 102. The X-side current terminating circuit 110 terminates the plurality of write word lines 103. The Y-selector 111 selects desired bit lines 105s from the plurality of bit lines 105 extending in the Y-axis direction. The Y-side electric current source circuit 112 has a constant current source, and supplies a constant electric current in the case of the data write operation into the memory cell 102. The read current load circuit 113 has a constant current source, and supplies a predetermined electric current to the selected memory cell and a reference memory cell 102r in case of the data read operation from the memory cell 102. The Y-side current terminating circuit 114 terminates the plurality of bit lines 105. The sense amplifier 115 detects the data of the selected memory cell 102s based on the difference between a voltage on the reference bit line 105r connected with the reference memory cell 102r and a voltage on the bit line 105 connected with the selected memory cell 102s.

The memory cell 102 is provided for each of intersections of a plurality of sets of the read word line 104 and the write word line 103 and the plurality of bit lines 105. The memory cell 102 contains a MOS transistor 106 turned on in the selection of the memory cell 102, and the magnetic resistance element 107. The MOS transistor 106 and the magnetic resistance element 107 are connected in series. The magnetic resistance element 107 is shown by a variable resistance symbol because the effective resistance value of the magnetic resistance element 107 varies between R+ΔR and R based on the data of "1" and "0".

The read operation of the data from the memory cell 102 is carried out as follows. That is, one of the memory cells 102 is selected which is provided for the intersection point of the selected read word line 104s selected by the X-selector 108 and the selected bit line 105s selected by the Y-selector, and the constant electric current is supplied to the magnetic resistance element 107 of the selected memory cell 102s from the read current load circuit 113. Thus, the selected bit line 105s is set to a voltage corresponding to the state of the free layer 121 of the magnetic resistance element 107, i.e., the resistance value of the magnetic resistance element 107. Also, the constant electric current is supplied to the reference memory cell 102r selected based on the bit line 105r and the selected read word line 104s in the same way. Thus, the bit line 105r is set to a predetermined reference voltage. The sense amplifier 115 compares the voltage of the bit line 105r and the voltage of the selected bit line 105 and determines the data of the selected memory cell 102s to be "1" if the voltage of the selected bit line 105s is equal to or larger than the reference voltage and "0" if it is smaller.

The write operation of data into the memory cell 102 is carried out as follows. That is, one of the memory cells 102 is selected which is provided for the point of intersection of the selected write word line 103s selected by the X-selector 108 and the selected bit line 105s selected by the Y-selector, and a magnetic field HY0 and a magnetic field HX0 are generated to the magnetic resistance element 107 of the selected memory cell 102s. Thus, a synthetic magnetic field H0 is generated. Here, the magnetic field HY0 is generated when the electric current flows through the selected write word line 103 from the X-side current source circuit 109. Also, the magnetic field HX0 is generated when the electric current flows through the selected bit line 105 from the Y-side electric current source circuit 112 to have the direction corresponding to the write data. The magnetic resistance element 107 receives the synthetic magnetic field H0 of the magnetic field HX0 and the magnetic field HY0, and the direction of the spontaneous magnetization is inverted in accordance with the write data.

In the magnetic random access memory shown here, data is written in the selected memory cell using the synthetic magnetic field H0 which is formed by the electric current which flows through the selected write word line and the electric current which flows through the selected bit line. The electric current can not be used for the data write operation when the electric current is too small. Also, oppositely, when the electric current is too large, there is a possibility that the data is written in another memory cell connected with the same selected write word line or the same selected bit line, in addition to the selected memory cell. Therefore, the value of electric current which flows through the selected write word line and the value of electric current which flows through the selected bit line are required to have high precise.

The technique which does not have any influence on another memory cell is demanded when the data write operation is carried out to the selected memory cell. The technique which can increase a margin of the electric current for the data write operation is demanded in case of the data write operation. The structure of the memory cell with the high selectivity is demanded when a memory cell is selected from the memory cell array. The technique which can manufacture a nonvolatile memory in a high production yield is demanded. Additionally, the technique which manufactures a nonvolatile memory cheaply is demanded.

In conjunction with the above description, a nonvolatile memory apparatus is disclosed in Japanese Laid Open Patent Application (JP-P2002-230965A). The nonvolatile memory apparatus of this conventional example contains in a memory cell having a magnetic resistance element whose resistance value changes depending on the direction of the magnetization, and 1-bit data is stored in the memory cell. Here, the memory cell has a plurality of sub-cells, each of which contains at least one magnetic resistance element. The sub-cells are connected in series or parallel. The sub cell is composed of the plurality of magnetic resistance elements connected in series or parallel and one selection transistor. Also, the memory cell may be composed of the plurality of sub cells connected in series or parallel. This technique has purposes of improving the record reliability of the magnetic random access memory, realizing the read of data with high reliability even if a deviation between resistance values is present with some degree, and eliminating bias voltage dependence on the MR ratio of the magnetic resistance element.

Also, a ferromagnetic memory and a data reading method are disclosed in Japanese Laid Open Patent Application (JP-P2002-140889A). The ferromagnetic material memory of this conventional example has a variable resistor, a magnetic field generating section, a holding circuit and a signal detecting circuit. The variable resistor consists of a magnetic substance and has a soft layer where data is stored based on the direction of magnetization, a non-magnetic layer, and a soft layer which consists of magnetic substance with magnetic coercivity smaller than a hard layer. The magnetic field generating section initializes the magnetization of the soft layer and also inverts it from the initialization state. The holding circuit holds a resistance value in the initialization state. The signal detecting circuit compares the resistance value of the variable resistor after inversion and the resistance value held in the holding circuit and outputs a reproduction signal. This technique has the purposes of decreasing a cell area and detecting stored data stably in the 1T1R type magnetic random access memory.

Also, a magnetic random access memory is disclosed in Japanese Laid Open Patent Application (JP-P2002-100181A). The magnetic random access memory of this conventional example is composed of a plurality of sense lines, a plurality of word lines provided to extending in a direction orthogonal to the plurality of sense lines, and unit memory cells, which are arranged like an array, and each of which is provided in each of intersections of the sense lines and the word lines. In the unit memory cell, a cell selection switch and a magnetic resistance element are connected in series. The magnetic random access memory of this conventional example further has a condenser which is connected with a power supply through a switch and a voltage drop element which connects one end of the condenser and the sense line. One end of the condenser is used as a detection end of the voltage change corresponding to the data stored in the unit memory cell. This technique has the purposes of widening an operation margin while characteristic deviation between the magnetic resistance elements is excluded, of preventing the decrease of the detection sensitivity of the read circuit (sense amplifier) due to the voltage drop by the wiring line connected with the magnetic resistance element in series and by the resistance of the transistor brings, and preventing the bias effect of the magnetic resistance element and the destruction of the tunnel barrier.

SUMMARY OF THE INVENTION

Therefore, an object of the present invention is to provide a magnetic memory cell and a magnetic random access memory in which data is written in a memory cell without giving any influence on other memory cells.

Also, another object of the present invention is to provide a magnetic memory cell and a magnetic random access memory in which a margin of write electric current can be made larger when data is written in a memory cell.

Also, another object of the present invention is to provide a magnetic memory cell and a magnetic random access memory in which a memory cell can be selected from a memory cell array in a high selectivity.

Also, another object of the present invention is to provide a magnetic memory cell and a magnetic random access memory that can be manufactured in a high production yield.

Also, another object of the present invention is to provide a magnetic memory cell and a magnetic random access memory that can be manufactured in a low manufacturing cost.

In an aspect of the present invention, a magnetic random access memory include a memory cell array section which include a plurality of first word lines which extend in a first direction; a plurality of first bit lines which extend in a second direction different from the first direction; and a plurality of memory cells, which are respectively provided for positions where the plurality of first word lines and the plurality of first bit lines intersect, and each of which is connected with a corresponding one of the plurality of first word lines and a corresponding one of the plurality of first bit lines. A selected memory cell as one of the plurality of memory cells is selected by the corresponding one of the plurality of first word lines as a first selected word line and the corresponding one of the plurality of first bit lines as a first selected bit line. The memory cell include: a magnetic field generating section having an extension wiring line, and connected with the first selected bit line; a conductive pattern; and a magnetic resistance element having a spontaneous magnetization, storing a data and connected between the extension wiring line and the conductive pattern. In a data write operation into the selected memory cell, a write data is written in the magnetic resistance element of the selected memory cell by a write electric current which flows through the extension wiring line of the magnetic field generating section of the selected memory cell, and a value of the write data is determined based on a direction of the write electric current. In a data read operation from the selected memory cell, a read electric current flows through the extension wiring line of the magnetic field generating section and the magnetic resistance element in the selected memory cell.

Here, the magnetic resistance element may be formed between the extension wiring line and the conductive pattern directly or indirectly on a semiconductor substrate. In this case, the conductive pattern may be set to a first predetermined potential. Also, the conductive pattern may be connected with a ground potential. In this case, the conductive pattern may be formed to cover the plurality of memory cells.

Also, the conductive pattern may be connected with a second predetermined potential in the data read operation and a third predetermined potential in the data write operation. In this case, the conductive pattern may be precharged to a fourth predetermined potential in a state except for the data read operation and the data write operation.

Also, the selected memory cell further may include: a laminate ferrimagnetic structure provided on a side opposite to the magnetic resistance element with respect to the extension wiring line to generate a magnetic field to be applied to the magnetic resistance element by a magnetic field generated by the write electric current flowing through the extension wiring line. In this case, the laminate ferrimagnetic structure may include: two ferromagnetic layers which have magnetization directions opposite to each other and are anti-ferromagnetically coupled to each other; and a non-magnetic layer provided between the two ferromagnetic layers. Each of the two ferromagnetic layers is formed of NiFe, and the non-magnetic layer is formed of Ru.

Also, a direction of the magnetic field generated by the laminate ferrimagnetic structure may be same as a direction of the magnetic field generated by the write electric current. A direction of the magnetic field generated by the laminate ferrimagnetic structure may be tilted from a direction of the magnetic field generated by the write electric current.

Also, the extension wiring line may be formed as a diffusion layer in a semiconductor substrate.

Also, the extension wiring line may be provided to extend in the first direction, and the magnetic resistance element may be provided to have a magnetization inversion easy axis in the second direction.

Also, the extension wiring line may be provided to extend in the first direction, and the magnetic resistance element may be provided to have a magnetization inversion easy axis in a direction tilted by a predetermined angle from the first direction. In this case, the predetermined angle may be in a range of 30° to 60°.

Also, the extension wiring line may be provided to extend in a direction tilted by a predetermined angle from the first direction, and the write electric current may flow through the extension wiring line in the tilted direction. The second direction may be substantially perpendicular to the first direction, and the magnetic resistance element may be provided to have a magnetization inversion easy axis in the second direction.

Also, the memory cell array further may include: a plurality of second bit lines as the conductive patterns, each of which is provided to form a pair together with a corresponding one of the plurality of first bit lines. One of the plurality of second bit lines connected with the selected memory cell is a second selected bit line. The selected memory cell may include: the magnetic field generating section which includes a first MOS transistor connected between the first selected bit line and the extension wiring line and having a gate connected with the first selected word line, the extension wiring line, and a second MOS transistor connected between the extension wiring line and the second selected bit line and a gate connected with the first selected word line; and the magnetic resistance element connected between the extension wiring line and the conductive pattern. In this case, the selected memory cell may include: a drain and a source of each of the first MOS transistor and the second MOS transistor formed in a surface portion of a semiconductor substrate; and a gate of each of the first MOS transistor and the second MOS transistor as a part of the corresponding first word line. The first selected bit line and the second selected bit line may be provided on an outer side of the gates of the first MOS transistor and the second MOS transistor from the magnetic resistance element. Also, the selected memory cell may include: a drain and a source of each of the first MOS transistor and the second MOS transistor formed in a surface portion of a semiconductor substrate; and a gate of each of the first MOS transistor and the second MOS transistor as a part of the first selected word line. The gates of the first MOS transistor and the second MOS transistor may be provided on an outer side of the first selected bit line and the second selected bit line from the magnetic resistance element.

Also, an even-numbered row of the memory cells may be shifted in the first direction by a half of a pitch between the memory cells in an odd-numbered row, two diffusion layers may be formed in a surface portion of a semiconductor substrate. One of the two diffusion layers may be shared by the first MOS transistors of adjacent two of the memory cells connected with the first selected bit line, and the other of the two diffusion layers may be shared by the second MOS transistors of adjacent two of the memory cells connected with the second selected bit line.

Also, the selected memory cell may include: two diffusion layers as first and second terminals of each of the first and second MOS transistors formed in a surface portion of a semiconductor substrate; the first word line formed as the gates of the first and second MOS transistors in an insulating film; the corresponding first and second bit lines formed in the insulating film to be connected with the first terminals of the first and second MOS transistors via contacts with a first height, respectively; the extension wiring line formed in the insulating film to be connected at both ends with the second terminals of the first and second MOS transistors via contacts with a second height which is higher than the first height; the magnetic resistance element formed on the extension wiring line in a center portion; and the conductive pattern formed on the magnetic resistance element via a contact.

Also, the selected memory cell may include: two diffusion layers formed for the first and second MOS transistors in a surface portion of a semiconductor substrate, respectively; portions of the first word line formed as the gates of the first and second MOS transistors in an insulating film to extend over the two diffusion layers, respectively, such that first and second terminals of each of the first and second MOS transistors are formed in each of the two diffusion layers; the first and second selected bit lines formed in the insulating film to be connected with the first terminals of the first and second MOS transistors via contacts with a first height, respectively; the extension wiring line formed in the insulating film to be connected at both ends with the second terminals of the first and second MOS transistors via contacts with a second height which is higher than the first height; the magnetic resistance element formed on the extension wiring line in a center portion; and the conductive pattern formed on the magnetic resistance element via a contact.

Also, the selected memory cell may include: a diffusion layer having first to third portion formed in a surface portion of a semiconductor substrate, wherein the first portion is provided for the first MOS transistor, the second portion is provided as the extension wiring line, and the third portion is provided for the second MOS transistor; portions of the first word line formed as the gates of the first and second MOS transistors in an insulating film to extend over the first and third portions, respectively, such that first and second terminals of each of the first and second MOS transistors are formed in each of the first and third portions; the first and second selected bit lines formed in the insulating film to be connected with the first terminals of the first and second MOS transistors via contacts with a first height, respectively; the magnetic resistance element formed on the extension wiring line in a center portion; and the conductive pattern formed on the magnetic resistance element via a contact.

Also, the selected memory cell may include: two diffusion layers as first and second terminals of each of the first and second MOS transistors formed in a surface portion of a semiconductor substrate; the first word line formed as the gates of the first and second MOS transistors in an insulating film; the first and second selected bit lines formed in the insulating film to be connected with the first terminals of the first and second MOS transistors via contacts with a first height, respectively; the conductive pattern formed in the insulating film at a location which is higher than the first height; the magnetic resistance element formed on the conductive pattern in a center portion; and the extension wiring line formed on the magnetic resistance element via a contact in the insulating film to be connected at both ends with the second terminals of the first and second MOS transistors via contacts.

Also, the memory access array further may include: a plurality of second bit lines as the conductive patterns, each of which is provided to form a pair together with a corresponding one of the plurality of first bit lines. One of the plurality of second bit lines connected with the selected memory cell is a second selected bit line. The magnetic field generating section in the selected memory cell may include: the extension wiring line; and a first MOS transistor connected with the extension wiring line and having a gate connected with the first selected word line. In this case, the selected memory cell may include: a drain and a source of the first MOS transistor formed in a surface portion of a semiconductor substrate; and a gate of the first MOS transistor as a part of the corresponding first word line. The first selected bit line may be provided on an outer side of the gate of the first MOS transistor from the magnetic resistance element.

Also, the selected memory cell may include: a drain and a source of the first MOS transistor formed in a surface portion of a semiconductor substrate; and a gate of the first MOS transistor as a part of the corresponding first word line. The gate of the first MOS transistor may be provided on an outer side of the corresponding first bit line from the magnetic resistance element.

Also, an even-numbered row of the memory cells may be shifted in a row direction by a half of a pitch between the memory cells in an odd-numbered row, a diffusion layer may be formed in a surface portion of a semiconductor substrate, and the diffusion layer may be shared by the first MOS transistors of adjacent two of the memory cells connected with the first selected bit line.

Also, the selected memory cell may include: two diffusion layers as first and second terminals of the first MOS transistor formed in a surface portion of a semiconductor substrate; the first word line formed as the gate of the first MOS transistor in an insulating film; the first and second selected bit lines formed in the insulating film, the corresponding first bit line being connected with the first terminal of the first MOS transistor via a contact with a first height; the extension wiring line formed in the insulating film to be connected at one end with the second terminal of the first MOS transistor via a contact with a second height which is higher than the first height, and at the other end with the second bit line; the magnetic resistance element formed on the extension wiring line in a center portion; and the second word line formed on the magnetic resistance element via a contact.

Also, each of the plurality of memory cells may include: a diffusion layer formed for the first MOS transistor in a surface portion of a semiconductor substrate; a portion of the first word line formed as the gate of the first MOS transistor in an insulating film to extend over the diffusion layer, such that first and second terminals of the first MOS transistor are formed in the diffusion layer; the first and second selected bit lines formed in the insulating film, the first selected bit line being connected with the first terminal of the first MOS transistor via a contact with a first height; the extension wiring line formed in the insulating film to be connected at one end with the second terminal of the first MOS transistor via a contact with a second height which is higher than the first height and at the other end with the second bit line; the magnetic resistance element formed on the extension wiring line in a center portion; and the conductive pattern formed on the magnetic resistance element via a contact.

Also, the selected memory cell may include: a diffusion layer having first and second portion formed in a surface portion of a semiconductor substrate, wherein the first portion is provided for the first MOS transistor, and the second portion is provided as the extension wiring line; a portion of the first word line formed as the gate of the first MOS transistor in an insulating film to extend over the first portion, such that first and second terminals of the first MOS transistor are formed in the first portion; the first and second selected bit lines formed in the insulating film, the first selected bit line being connected with the first terminal of the first MOS transistor via a contact with a first height; the magnetic resistance element formed on the extension wiring line in a center portion; and the conductive pattern formed on the magnetic resistance element via a contact.

Also, the selected memory cell may include: two diffusion layers as first and second terminals of the first MOS transistor formed in a surface portion of a semiconductor substrate; the first word line formed as the gate of the first MOS transistor in an insulating film; the first and second bit selected lines formed in the insulating film, the first selected bit line being connected with the first terminal of the first MOS transistor via a contact with a first height; the conductive pattern formed in the insulating film at a location which is higher than the first height; the magnetic resistance element formed on the conductive pattern in a center portion; and the extension wiring line formed on the magnetic resistance element via a contact in the insulating film to be connected at both ends with the second terminal of the first MOS transistor via a contact and the second selected bit line.

Also, the selected memory cell may include: the magnetic field generating section which may include: a diode set of a first diode and a second diode, in which the first diode and the second diode are connected in parallel in opposite directions to each other, wherein the diode set is connected with the first selected word line and the extension wiring line, and the extension wiring line connected with the first selected bit line; the magnetic resistance element connected with the extension wiring line; and a third diode interposed between the extension wiring line and the conductive pattern. In this case, the selected memory cell may include: the first bit line formed on a first insulating film; the extension wiring line formed above the first bit line to be connected with the first bit line by a contact; the magnetic resistance element formed on the extension wiring line; the first and second diodes formed above the extension wiring line to be connected therewith via contacts; the third diode formed above the magnetic resistance element to be connected therewith via a contact, wherein the first to third diodes are formed at a same height; the first selected word line formed to connect the first and second diodes; the second word line formed to be connected with the third diode, wherein the first selected word line and the second selected word line are formed at a same height; and a second insulating film formed to cover the first bit line, the extension wiring line, the magnetic resistance element, the first to third diodes and the first and second selected word lines. Also, the memory cells may be stacked into a height direction.

Also, the memory access array further may include: a plurality of second bit lines as the conductive patterns, each of which is provided to form a pair together with a corresponding one of the plurality of first bit lines. One of the plurality of second bit lines connected with the selected memory cell is a second selected bit line. The selected memory cell may include: the magnetic field generating section which include: a first MOS transistor connected with the first selected bit line and the extension wiring line and having a gate connected with the first selected word line, and the extension wiring line connected with the second selected bit line; the magnetic resistance element connected between the extension wiring line; and a diode interposed between the magnetic resistance element and the conductive pattern. In this case, the selected memory cell may include: the first MOS transistor on a semiconductor substrate; the first bit line formed in an insulating film and connected with a source of the first MOS transistor; the extension wiring line formed in the insulating film and connected with a drain of the first MOS transistor via a contact; the magnetic resistance element formed on the extension wiring line; the diode formed on the magnetic resistance element via a contact in the insulating film; the conductive pattern formed in the insulating film and connected with the extension wiring line via a contact.

Also, the memory access array further may include: a plurality of second bit lines as the conductive patterns, each of which is provided to form a pair together with a corresponding one of the plurality of first bit lines. One of the plurality of second bit lines connected with the selected memory cell is a second selected bit line. The selected memory cell may include: the magnetic field generating section which may include: a first MOS transistor connected with the first selected bit line and the extension wiring line and having a gate connected with the corresponding first word line, the extension wiring line, and a diode set of a first diode and a second diode, in which the first diode and the second diode are connected in parallel in opposite directions to each other, wherein the diode set is connected with the selected second word line and the extension wiring line, and the magnetic resistance element between the extension wiring line and the conductive pattern. In this case, the selected memory cell may include: the first MOS transistor on a semiconductor substrate; the first bit line formed in an insulating film and connected with a source of the first MOS transistor; the extension wiring line formed in the insulating film and connected with a drain of the first MOS transistor via a contact; the magnetic resistance element formed on the extension wiring line; the conductive pattern formed in the insulating film and connected with the magnetic resistance element via a contact; the first and second diodes formed in the insulating film to extend downwardly and connected with the extension wiring line via a contact; and the selected second bit line formed in the insulating film and connected with the first and second diodes via a contact.

Also, the memory access array further may include: a plurality of second bit lines as the conductive patterns, each of which is provided to form a pair together with a corresponding one of the plurality of first bit lines. One of the plurality of second bit lines connected with the selected memory cell is a second selected bit line. Each of the plurality of memory cells may include: the magnetic field generating section which may include: a first MOS transistor connected with the selected first bit line and the extension wiring line and having a gate connected with the corresponding first word line, the extension wiring line, and a diode set of a first diode and a second diode, in which the first diode and the second diode are connected in series in opposite directions to each other, wherein the diode set is connected with the selected second bit line and the extension wiring line; and the magnetic resistance element connected between the extension wiring line and the conductive pattern. In this case, the memory access array further may include: a plurality of second bit lines as the conductive patterns, each of which is provided to form a pair together with a corresponding one of the plurality of first bit lines, one of the plurality of second bit lines connected with the selected memory cell is a second selected bit line, and the selected memory cell may include: the first MOS transistor on a semiconductor substrate; the selected first bit line formed in an insulating film and connected with a source of the first MOS transistor; the extension wiring line formed in the insulating film and connected with a drain of the first MOS transistor via a contact; the magnetic resistance element formed on the extension wiring line; a conductive pattern formed in the insulating film and connected with the magnetic resistance element via a contact; the diode set formed in the insulating film to extend downwardly and connected with the extension wiring line via a contact; and the corresponding second bit line formed in the insulating film and connected with the diode set via contacts.

Also, the selected memory cell may include: the magnetic field generating section which may include: a first MOS transistor connected with the selected first bit line and the extension wiring line and having a gate connected with the corresponding first word line, and the extension wiring line, the magnetic resistance element connected between the extension wiring line and the conductive pattern; and a capacitor connected in parallel to the magnetic resistance element. In this case, the memory cell may include: the first MOS transistor on a semiconductor substrate; the first bit line formed in an insulating film and connected with a source of the first MOS transistor via a contact; the extension wiring line formed in the insulating film and connected with a drain of the first MOS transistor via a contact; the magnetic resistance element formed on the extension wiring line; a ground line formed in the insulating film and connected with the magnetic resistance element via a contact; the capacitor formed in the insulating film and connected at one electrode with the extension wiring line via a contact and connected at the other electrode with the ground line via a contact.

Also, In another aspect of the present invention, a magnetic random access memory includes a memory cell array section, which include: a plurality of memory cells arranged in a matrix of rows and columns, wherein one column of the memory cells a column of reference memory cells; a plurality of first word lines, each of which is connected with one row of the memory cells; a plurality of first bit lines, each of which is connected with one column of the memory cells; a plurality of second bit lines, each of which is connected with one column of the memory cells and forms a pair with a corresponding one of the plurality of first bit lines, wherein the first and second bit lines for the column of the reference memory cells are first and second reference bit lines; a first X selector which selects one of the plurality of first word lines as a first selected word line based on an address; a first Y selector which selects one of the plurality of second bit lines as a second selected bit line based on the address; and a second Y selector which selects one of the plurality of first bit lines as a first selected bit line based on the address. Each of the plurality of memory cells includes: an extension wiring line; a conductive pattern; a magnetic resistance element provided between the extension wiring line and the conductive pattern, and having a spontaneous magnetization, and storing a data as a direction of the spontaneous magnetization, wherein the direction of the spontaneous magnetization is inverted depending on a magnetic field applied to the magnetic resistance element; a first MOS transistor provided between the extension wiring line and a corresponding one of the plurality of first bit lines and having a gate connected with a corresponding one of the plurality of first word lines; and a second MOS transistor provided between the extension wiring line and a corresponding one of the plurality of second bit lines and having a gate connected with the corresponding one of the plurality of first word lines. A magnetic field generating section includes the first MOS transistor, the extension wiring line, and the first MOS transistor. One of the plurality of memory cells which is connected with the first selected word line, the first selected bit line and the second selected bit line is a selected memory cell, and one of the column of the reference memory cells which is connected with the first selected word line, the first reference bit line and the second reference bit line is a selected reference memory cell. In a data write operation into the selected memory cell, a write data is written in the magnetic resistance element of the selected memory cell by applying the magnetic field generated by a write electric current which flows through the extension wiring line of the magnetic field generating section of the selected memory cell, and a value of the write data is determined based on a direction of the write electric current. In a data read operation from the selected memory cell, a read electric current flows through a route of the first MOS transistor, the extension wiring line, the magnetic resistance element and the conductive pattern in the selected memory cell, and a read data from the selected memory cell is determined based on a resistance of the magnetic resistance element of the selected memory cell.

Here, the conductive pattern may be set to a ground potential in the data read operation and the data write operation. Also, the conductive pattern may be set to a first potential in the data read operation and to a second potential, different from the first potential, in the data write operation.

Also, the first X selector may select the first selected word line based on an address in the data read operation and the data write operation, the second Y selector may select the first selected bit line based on the address in the data read operation and the data write operation, and the first Y selector may select the second selected bit line based on the address in the data write operation.

Also, the magnetic random access memory may further include: a Y-side current source circuit which supplies or receives a constant electric current as the write electric current to or from the second Y selector based on the write data in the data write operation; a read current load circuit which supplies the read electric current to the second Y selector and a reference read electric current to the first reference bit line in the data read operation; and a sense amplifier which senses the read data based on a difference between the read electric current flowing through the first selected bit line and the reference read electric current flowing through the first reference bit line in the data read operation. The write electric current may flow through a route of the second Y selector, the first selected bit line, the magnetic field generating section of the selected memory cell, the second selected bit line and the first Y selector in the data write operation. The read electric current may flow through a route of the second Y selector, the first selected bit line, and the first MOS transistor, the extension bit line, the magnetic resistance element and the conductive pattern of the selected memory cell in the data read operation. The reference read electric current may flow through a route of the first reference bit line, and the first MOS transistor, the extension bit line, the magnetic resistance element and the conductive pattern of the selected reference memory cell in the data read operation.

Here, the Y-side current source circuit supplies or receives the constant electric current as a reference write electric current to or from the first reference bit line based on the write data in a reference data write operation to the selected reference memory cell. The reference write electric current flows through a route of the first reference bit line, the magnetic field generating section of the selected reference memory cell, the second reference bit line and the first Y selector in the reference data write operation. In this case, the Y-side current source circuit may include: a first circuit which generates a constant current source as the write electric current or the reference write electric current and receives the write electric current or the reference write electric current based on the write data in the data write operation or a reference data write operation to the selected reference memory cell; and a second circuit which selects the second Y selector for the write electric current in the data write operation and the first reference bit line for the reference write electric current in the reference data write operation.

Also, the second Y selector may be connected with the first reference bit line. The magnetic random access memory may further include: a plurality of the memory cell array sections; first and second main bit lines; a cell array selector which selects one of the plurality of memory cell array section as a selected memory cell array section based on the address to connect the first and second main bit lines with the second Y selector of the selected memory cell array section; a Y-side current source circuit which supplies the write electric current onto the first main bit line and receives the write electric current from the first main bit line based on the write data in the data write operation; a read current load circuit which supplies the read electric current and a reference read electric current to the first and second main bit lines; and a sense amplifier which senses the read data based on a difference between the read electric current flowing through the first main bit line and the reference read electric current flowing through the second main bit line in the data read operation to the selected memory cell. The write electric current may flow through a route of the first main bit line, the second Y selector, the first selected bit line, the magnetic field generating section of the selected memory cell, the second selected bit line and the first Y selector in the selected memory cell array section and the second main bit line in the data write operation. The read electric current may flow through a route of the first main bit line, the second Y selector, the first selected bit line, and the first MOS transistor, the extension bit line, the magnetic resistance element and the conductive pattern of the selected memory cell in the selected memory cell array section in the data read operation. The reference read electric current may flow through a route of the second main bit line, the first reference bit line, and the first MOS transistor, the extension bit line, the magnetic resistance element and the conductive pattern of the selected reference memory cell in the selected memory cell array section in the data read operation.

Also, the Y-side current source circuit may supply or receives the constant electric current as a reference write electric current to or from the second main bit line based on the write data in a reference data write operation to the selected reference memory cell, and the reference write electric current may flow through a route of the first main bit line, the second Y selector, the first reference bit line, the magnetic field generating section of the selected reference memory cell, the second reference bit line and the first Y selector in the selected memory cell array section in the reference data write operation. In this case, the Y-side current source circuit may include: a first circuit which generates a constant current source as the write electric current or the reference write electric current and receives the write electric current or the reference write electric current based on the write data; and a second circuit which selects the first main bit line for the data write operation and the second main bit line for the reference data write operation.

Also, the second Y selector may be connected with the plurality of second bit lines and the first and second reference bit lines. The memory cell array section further may include: a plurality of second word lines, each of which is connected with one row of the memory cells as the conductive pattern; a second X selector which selects one of the plurality of second word lines as a second selected word line based on the address, and supplies an electric current to the second selected word line as the read electric current and the reference read electric current; a Y-side current source circuit which supplies or receives a constant electric current as the write electric current to or from the second Y selector based on the write data in the data write operation; and a sense amplifier which senses the read data based on a difference between the read electric current flowing through the second selected bit line and the reference read electric current flowing through the second reference bit line in the data read operation. The write electric current may flow through a route of the second Y selector, the first selected bit line, the magnetic field generating section of the selected memory cell, the second selected bit line and the first Y selector in the data write operation. The read electric current may flow through a route of the second X selector, the second selected word line, the magnetic resistance element, the extension bit line, and the second MOS transistor of the selected memory cell, the second selected bit line, and the second Y selector in the data read operation. The reference read electric current may flow through a route of the second X selector, the second selected word line, the magnetic resistance element, the extension bit line, and the second MOS transistor of the selected reference memory cell, the second reference bit line, and the second Y selector in the data read operation.

In this case, the Y-side current source circuit which supplies or receives the constant electric current as a reference write electric current to or from the second Y selector based on the write data in a reference data write operation to the selected reference memory cell, and the reference write electric current may flow through a route of the second Y selector, the first selected bit line, the magnetic field generating section of the selected reference memory cell, the second selected bit line and the first Y selector in the reference data write operation. In this case, the Y-side current source circuit may include: a first circuit which generates a constant current source as the write electric current or the reference write electric current and receives the write electric current or the reference write electric current based on the write data in the data write operation or a reference data write operation to the selected reference memory cell; and a second circuit which selects the first selected bit line for the write electric current in the data write operation and the first reference bit line for the reference write electric current in the reference data write operation.

Also, the memory cell array section may further include: a plurality of second word lines, each of which is connected with one row of the memory cells as the conductive pattern; a second X selector which selects one of the plurality of second word lines as a second selected word line based on the address, and supplies an electric current to the second selected word line as the read electric current and the reference read electric current. The second Y selector may be connected with the plurality of second bit lines and the first and second reference bit lines. The magnetic random access memory may further include: a plurality of the memory cell array sections; first and second main bit lines; a cell array selector which selects one of the plurality of memory cell array section as a selected memory cell array section based on the address to connect the first and second main bit lines with the second Y selector of the selected memory cell array section; a Y-side current source circuit which supplies the write electric current onto the first main bit line and receives the write electric current from the first main bit line based on the write data in the data write operation; and a sense amplifier which senses the read data based on a difference between the read electric current flowing through the first main bit line and the reference read electric current flowing through the second main bit line in the data read operation to the selected memory cell. The write electric current may flow through a route of the first main bit line, and the second Y selector, the first selected bit line, the magnetic field generating section of the selected memory cell, the second selected bit line and the first Y selector in the selected memory cell array section in the data write operation. The read electric current may flow through a route of the second X selector, the second selected word line, the magnetic resistance element, the extension bit line, and the second MOS transistor of the selected memory cell, the second selected bit line, and the second Y selector in the selected memory cell array section and the first main bit line in the data read operation. The reference read electric current may flow through a route of the second X selector, the second selected word line, the magnetic resistance element, the extension bit line, and the second MOS transistor of the selected reference memory cell, the second selected bit line, and the second Y selector in the selected memory cell array section and the second main bit line in the data read operation.

In this case, the Y-side current source circuit supplies or receives the constant electric current as a reference write electric current to or from the second main bit line based on the write data in a reference data write operation to the selected reference memory cell, and the reference write electric current may flow through a route of the second main bit line, the second Y selector, the first reference bit line, the magnetic field generating section of the selected reference memory cell, the second reference bit line and the first Y selector in the selected memory cell array section in the reference data write operation. The Y-side current source circuit may include: a first circuit which generates a constant current source as the write electric current or the reference write electric current and receives the write electric current or the reference write electric current based on the write data; and a second circuit which selects the first main bit line for the write electric current in the data write operation and the second main bit line for the reference write electric current in the reference data write operation.

Also, The second Y selector may be connected with the first reference bit line. The magnetic random access memory may further include: a plurality of the memory cell array sections; first and second main bit lines; a cell array selector which selects one of the plurality of memory cell array section as a selected memory cell array section based on the address to respectively connect the first and second main bit lines with the second and first Y selectors; a Y-side current source circuit which supplies the write electric current onto one of the first and second main bit lines and receives the write electric current from the other based on the write data in the data write operation; a read current load circuit which supplies the read electric current and a reference read electric current to the first and second main bit lines; and a sense amplifier which senses the read data based on a difference between the read electric current flowing through the first main bit line and the reference read electric current flowing through the second main bit line in the data read operation to the selected memory cell. The write electric current may flow through a route of the first main bit line, the second Y selector, the first selected bit line, the magnetic field generating section of the selected memory cell, the second selected bit line and the first Y selector in the selected memory cell array section and the second main bit line in the data write operation. The read electric current may flow through a route of the first main bit line, the second Y selector, the first selected word line, and the first MOS transistor, the extension bit line, the magnetic resistance element, and the conductive pattern of the selected memory cell in the selected memory cell array section in the data read operation. The reference read electric current may flow through a route of the second main bit line, the first Y selector, the second reference bit line, the second MOS transistor, the magnetic resistance element, and the extension bit line of the selected reference memory cell in the selected memory cell array section in the data read operation.

Here, the Y-side current source circuit supplies the constant electric current as a reference write electric current onto one of the first and second main bit lines and receives the reference write electric current from the other based on the write data in a reference data write operation to the selected reference memory cell, and the reference write electric current may flow through a route of the first main bit line, the second Y selector, the first reference bit line, the magnetic field generating section of the selected reference memory cell, the second reference bit line and the first Y selector in the selected memory cell array section and the second main bit line in the reference data write operation. In this case, the Y-side current source circuit may include: a first circuit which generates a constant current source as the write electric current or the reference write electric current and receives the write electric current or the reference write electric current; and a second circuit which selects one of the first and second main bit lines for the write electric current in the data write operation and for the reference write electric current in the reference data write operation based on the write data.

Also, the memory cell array section may further include: a precharge power supply; a precharge word line; a precharge line; a precharge circuit provided for each of pairs of the first and second bit lines and containing two MOS transistors which are provided between the first and second bit lines of the pair in series and have gates connected with the precharge word line, wherein a node between the two MOS transistors is connected with the precharge line; a plurality of second word lines, each of which is connected with one row of the memory cells as the conductive pattern; a precharge selector which selects the precharge word line to activate the two MOS transistors for each pair of the first and second bit lines; and a precharge power supply which sets one of the plurality of second word line corresponding to the selected memory cell to a predetermined potential in the data read operation, and the data write operation and a reference data write operation to the selected reference memory cell, and sets the pair of the first and second bit lines to a precharge voltage when the pair of the first and second bit lines is not selected.

Also, the second Y selector may be connected with the first reference bit line. The memory cell array section may further include: a third Y selector which selects one of the plurality of first bit lines as a first selected bit line based on the address, and is connected with the first reference bit line. The magnetic random access memory may further include: a plurality of the memory cell array sections; first and second write main bit lines; first and second read main bit lines; a cell array selector which selects one of the plurality of memory cell array section as a selected memory cell array section based on the address to respectively connect the first and second write main bit lines with the second and first Y selectors and to connect the first and second read main bit lines with the third Y selector; a Y-side current source circuit which supplies the write electric current onto one of the first and second write main bit lines and receives the write electric current from the other based on the write data in the data write operation; a read current load circuit which supplies the read electric current and a reference read electric current to the first and second read main bit lines; and a sense amplifier which senses the read data based on a difference between the read electric current flowing through the first main bit line and the reference read electric current flowing through the second main bit line in the data read operation to the selected memory cell. The write electric current may flow through a route of the first write main bit line, the second Y selector, the first selected bit line, the magnetic field generating section of the selected memory cell, the second selected bit line and the first Y selector in the selected memory cell array section and the second write main bit line in the data write operation. The read electric current may flow through a route of the first read main bit line, the third Y selector, the first selected word line, and the first MOS transistor, the extension bit line, the magnetic resistance element, and the conductive pattern of the selected memory cell in the selected memory cell array section in the data read operation. The reference read electric current may flow through a route of the second read main bit line, the third Y selector, the first reference bit line, the first MOS transistor, the extension bit line, the magnetic resistance element, and the conductive pattern of the selected reference memory cell in the selected memory cell array section in the data read operation.

Here, the Y-side current source circuit supplies the constant electric current as a reference write electric current onto one of the first and second write main bit lines and receives the reference write electric current from the other based on the write data in a reference data write operation to the selected reference memory cell, and the reference write electric current may flow through a route of the first write main bit line, the second Y selector, the first reference bit line, the magnetic field generating section of the selected reference memory cell, the second reference bit line and the first Y selector in the selected memory cell array section and the second write main bit line in the reference data write operation. In this case, the Y-side current source circuit may include: a first circuit which generates a constant current source as the write electric current or the reference write electric current and receives the write electric current or the reference write electric current; and a second circuit which selects one of the first and second write main bit lines for the write electric current in the data write operation and for the reference write electric current in the reference data write operation based on the write data.

Also, the second Y selector may be connected with the plurality of second bit lines and the first reference bit line, and the first Y selector is connected with the plurality of first bit lines and the first and second reference bit line. The magnetic random access memory may further include: a plurality of the memory cell array sections; first and second main bit lines; a cell array selector which selects one of the plurality of memory cell array section as a selected memory cell array section based on the address to respectively connect the first and second main bit lines with the second and first Y selectors; a Y-side current source circuit which supplies the write electric current onto the second main bit line and receives the write electric current from the first main bit line in the data write operation; a read current load circuit which supplies the read electric current and a reference read electric current to the first and second main bit lines; and a sense amplifier which senses the read data based on a difference between the read electric current flowing through the first main bit line and the reference read electric current flowing through the second main bit line in the data read operation to the selected memory cell. The write electric current may flow through a route of the second main bit line, the first Y selector, one of the first selected bit line and the second selected bit line, the magnetic field generating section of the selected memory cell, the other and the first Y selector in the selected memory cell array section and the first main bit line in the data write operation. The read electric current may flow through a route of the first main bit line, the second Y selector, the first and second selected word lines, and the first and second MOS transistors, the extension bit line, the magnetic resistance element, and the conductive pattern of the selected memory cell in the selected memory cell array section in the data read operation. The reference read electric current may flow through a route of the second main bit line, the first Y selector, the first and second reference bit lines, the first and second MOS transistors, the magnetic resistance element, and the extension bit line of the selected reference memory cell in the selected memory cell array section in the data read operation.

Here, the Y-side current source circuit supplies the constant electric current as a reference write electric current onto the second main bit line and receives the reference write electric current from the first main bit line based on the write data in a reference data write operation to the selected reference memory cell, and the reference write electric current may flow through a route of the second main bit line, the first Y selector, the second reference bit line, the magnetic field generating section of the selected reference memory cell, the first reference bit line and the first Y selector in the selected memory cell array section in the selected memory cell array section and the first main bit line in the reference data write operation. In this case, the Y-side current source circuit may include: a first circuit which generates a constant current source as the write electric current or the reference write electric current and receives the write electric current or the reference write electric current based on the write data; and a second circuit which selects one of the first and second main bit lines for the write electric current in the data write operation and for the reference write electric current in the reference data write operation.

Also, the Y-side current source circuit may include: a first circuit which generates a constant current source as the write electric current or the reference write electric current and receives the write electric current or the reference write electric current based on the write data; and a second circuit which selects one of the first and second main bit lines for the write electric current in the data write operation and for the reference write electric current in the reference data write operation.

Also, each of the plurality of second bit lines may be provided for one pair of adjacent two of the plurality of first bit lines.

In another aspect of the present invention, a magnetic random access memory includes a memory cell array section, which may include: a plurality of memory cells arranged in a matrix of rows and columns, wherein one column of the memory cells a column of reference memory cells; a plurality of first word lines, each of which is connected with one row of the memory cells; a plurality of second word lines, each of which is connected with one row of the memory cells; a plurality of first bit lines, each of which is connected with one column of the memory cells; a plurality of second bit lines, each of which is connected with one column of the memory cells and forms a pair with a corresponding one of the plurality of first bit lines, The first and second bit lines for the column of the reference memory cells are first and second reference bit lines; a first X selector which selects one of the plurality of first word lines as a first selected word line based on an address; a second X selector which selects one of the plurality of second word lines as a second selected word line based on the address; a first Y selector which selects one of the plurality of second bit lines as a second selected bit line based on the address; a second Y selector which selects one of the plurality of first bit lines as a first selected bit line based on the address, and a third Y selector which selects one of the plurality of second bit lines as a second selected bit line based on the address. Each of the plurality of memory cells may include: an extension wiring line connected with a corresponding one of the plurality of second bit lines; a magnetic resistance element provided between the extension wiring line and a corresponding one of the plurality of second word lines, and having a spontaneous magnetization, and storing a data as a direction of the spontaneous magnetization, The direction of the spontaneous magnetization is inverted depending on a magnetic field applied to the magnetic resistance element; and a first MOS transistor provided between the extension wiring line and a corresponding one of the plurality of first bit lines and having a gate connected with a corresponding one of the plurality of first word lines. A magnetic field generating section may include the first MOS transistor, and the extension wiring line, and one of the plurality of memory cells which is connected with the first selected word line, the first selected bit line and the second selected bit line is a selected memory cell, and one of the column of the reference memory cells which is connected with the first selected word line, the first reference bit line and the second reference bit line is a selected reference memory cell. In a data write operation into the selected memory cell, a write data is written in the magnetic resistance element of the selected memory cell by applying the magnetic field generated by a write electric current which may flow through the extension wiring line of the magnetic field generating section of the selected memory cell, and a value of the write data is determined based on a direction of the write electric current. In a data read operation from the selected memory cell, a read electric current may flow through a route of the first MOS transistor, the extension wiring line, and the magnetic resistance element in the selected memory cell, and a read data from the selected memory cell is determined based on a resistance of the magnetic resistance element of the selected memory cell.

Here, the second selected word line may be set to a predetermined potential in the data read operation and the data write operation.

Also, the first X selector may select the first selected word line based on an address in the data read operation and the data write operation, the second Y selector may select the first selected bit line based on the address in the data read operation and the data write operation, and the first Y selector may select the second selected bit line based on the address in the data write operation.

Also, the magnetic random access memory may further include: a Y-side current source circuit which supplies or receives a constant electric current as the write electric current to or from the second Y selector based on the write data in the data write operation; and a sense amplifier which senses the read data based on a difference between the read electric current flowing through the second selected bit line and the reference read electric current flowing through the second reference bit line in the data read operation. The write electric current may flow through a route of the second Y selector, the first selected bit line, the magnetic field generating section of the selected memory cell, the second selected bit line and the first Y selector in the data write operation. The read electric current may flow through a route of the second X selector, the second selected word line, the magnetic resistance element and the extension bit line of the selected memory cell, and the third Y selector in the data read operation. The reference read electric current may flow through a route of the second X selector, the second selected word line, the magnetic resistance element and the extension bit line of the selected reference memory cell, and the second reference bit line in the data read operation.

Here, the Y-side current source circuit supplies or receives the constant electric current as a reference write electric current to or from the first reference bit line based on the write data in a reference data write operation to the selected reference memory cell, and the reference write electric current may flow through a route of the first selected bit line, the magnetic field generating section of the selected reference memory cell, the second reference bit line and the first Y selector in the reference data write operation. In this case, the Y-side current source circuit may include: a first circuit which generates a constant current source as the write electric current or the reference write electric current and receives the write electric current or the reference write electric current based on the write data in the data write operation or a reference data write operation to the selected reference memory cell; and a second circuit which selects the second Y selector for the write electric current in the data write operation and the first reference bit line for the reference write electric current in the reference data write operation.

Also, the second Y selector may be connected with the first reference bit line. The magnetic random access memory may further include: a plurality of the memory cell array sections; first and second main bit lines; a cell array selector which selects one of the plurality of memory cell array section as a selected memory cell array section based on the address to connect the first and second main bit lines with the second Y selector of the selected memory cell array section; a Y-side current source circuit which supplies the write electric current onto the first main bit line and receives the write electric current from the first main bit line based on the write data in the data write operation; a read current load circuit which supplies the read electric current and a reference read electric current to the first and second main bit lines; and a sense amplifier which senses the read data based on a difference between the read electric current flowing through the first main bit line and the reference read electric current flowing through the second main bit line in the data read operation to the selected memory cell. The write electric current may flow through a route of the first main bit line, the second Y selector, the first selected bit line, the magnetic field generating section of the selected memory cell, the second selected bit line and the first Y selector in the selected memory cell array section in the data write operation. The read electric current may flow through a route of the second X selector, the second selected word line, the magnetic resistance element, the extension bit line, and the first MOS transistor of the selected memory cell, the first selected bit line, and the second Y selector in the selected memory cell array section and the first main bit line in the data read operation. The reference read electric current may flow through a route of the second X selector, the second selected word line, the magnetic resistance element, the extension bit line, and the first MOS transistor of the selected reference memory cell, the second reference bit line, and the first Y selector in the selected memory cell array section and the second main bit line in the data read operation.

Here, the Y-side current source circuit supplies a constant electric current as a reference write electric current to the second main bit line and receives the reference write electric current from the second main bit line based on the write data in a reference data write operation to the selected reference memory cell, and the reference write electric current may flow through a route of the second main bit line, the first Y selector, the second reference bit line, the magnetic field generating section of the selected reference memory cell, the first reference bit line and the second Y selector in the selected memory cell array section and the first main bit line in the reference data write operation. In this case, the Y-side current source circuit may include: a first circuit which generates a constant current source as the write electric current or the reference write electric current and receives the write electric current or the reference write electric current based on the write data; and a second circuit which selects one of the first and second main bit lines the write electric current and the reference write electric current to be supplied in the data write operation and in the reference data write operation.

Also, the second Y selector may be connected with the plurality of second bit lines and the first and second reference bit lines. The memory cell array section may further include: a Y-side current source circuit which supplies or receives a constant electric current as the write electric current to or from the second Y selector based on the write data in the data write operation; and a sense amplifier which senses the read data based on a difference between the read electric current flowing through the second selected bit line and the reference read electric current flowing through the second reference bit line in the data read operation. The write electric current may flow through a route of the second Y selector, the first selected bit line, the magnetic field generating section of the selected memory cell, the second selected bit line and the first Y selector in the data write operation. The read electric current may flow through a route of the second X selector, the second selected word line, the magnetic resistance element, the extension bit line, and the second MOS transistor of the selected memory cell, the second selected bit line, and the second Y selector in the data read operation. The reference read electric current may flow through a route of the second X selector, the second selected word line, the magnetic resistance element, the extension bit line, and the second MOS transistor of the selected reference memory cell, the second reference bit line, and the second Y selector in the data read operation.

Here, the Y-side current source circuit supplies or receives the constant electric current as a reference write electric current to or from the second Y selector based on the write data in a reference data write operation to the selected reference memory cell, and the reference write electric current may flow through a route of the second y selector, the first selected bit line, the magnetic field generating section of the selected reference memory cell, the second selected bit line and the first Y selector in the reference data write operation. In this case, the Y-side current source circuit may include: a first circuit which generates a constant current source as the write electric current or the reference write electric current and receives the write electric current or the reference write electric current based on the write data in the data write operation or a reference data write operation to the selected reference memory cell; and a second circuit which selects one of the first selected bit line and the first reference bit line Y selector for the write electric current in the data write operation and the first reference bit line for the reference write electric current in the reference data write operation.

Also, the second Y selector may be connected with the plurality of second bit lines and the first and second reference bit lines. The magnetic random access memory may further include: a plurality of the memory cell array sections; first and second main bit lines; a cell array selector which selects one of the plurality of memory cell array section as a selected memory cell array section based on the address to connect the first and second main bit lines with the second Y selector of the selected memory cell array section; a Y-side current source circuit which supplies the write electric current onto the first main bit line and receives the write electric current from the first main bit line based on the write data in the data write operation; and a sense amplifier which senses the read data based on a difference between the read electric current flowing through the first main bit line and the reference read electric current flowing through the second main bit line in the data read operation to the selected memory cell. The write electric current may flow through a route of the first main bit line, and the second Y selector, the first selected bit line, the magnetic field generating section of the selected memory cell, the second selected bit line and the first Y selector in the selected memory cell array section in the data write operation. The read electric current may flow through a route of the second X selector, the second selected word line, the magnetic resistance element, the extension bit line, and the second MOS transistor of the selected memory cell, the second selected bit line, and the second Y selector in the selected memory cell array section and the first main bit line in the data read operation. The reference read electric current may flow through a route of the second X selector, the second selected word line, the magnetic resistance element, the extension bit line, and the second MOS transistor of the selected reference memory cell, the second selected bit line, and the second Y selector in the selected memory cell array section and the second main bit line in the data read operation.

Here, the Y-side current source circuit supplies or receives the constant electric current as a reference write electric current to or from the second main bit line based on the write data in a reference data write operation to the selected reference memory cell, and the reference write electric current may flow through a route of the second main bit line, the second Y selector, the first reference bit line, the magnetic field generating section of the selected reference memory cell, the second reference bit line and the first Y selector in the selected memory cell array section in the reference data write operation. In this case, the Y-side current source circuit may include: a first circuit which generates a constant current source as the write electric current or the reference write electric current and receives the write electric current or the reference write electric current based on the write data; and a second circuit which selects the first main bit line for the write electric current in the data write operation and the second main bit line for the reference write electric current in the reference data write operation.

Also, the second Y selector may be connected with the first reference bit line. The magnetic random access memory may further include: a plurality of the memory cell array sections; first and second main bit lines; a cell array selector which selects one of the plurality of memory cell array section as a selected memory cell array section based on the address to respectively connect the first and second main bit lines with the second and first Y selectors of the selected memory cell array section; a Y-side current source circuit which supplies the write electric current onto one of the first and second main bit lines and receives the write electric current from the other based on the write data in the data write operation; and a sense amplifier which senses the read data based on a difference between the read electric current flowing through the first main bit line and the reference read electric current flowing through the second main bit line in the data read operation to the selected memory cell. The write electric current may flow through a route of the first main bit line, the second Y selector, the first selected bit line, the magnetic field generating section of the selected memory cell, the second selected bit line and the first Y selector in the selected memory cell array section and the second main bit line in the data write operation. The read electric current may flow through a route of the second X selector, the second selected word line, the magnetic resistance element, and the extension bit line of the selected memory cell, the first selected word line, the second Y selector in the selected memory cell array section and the first main bit line in the data read operation. The reference read electric current may flow through a route of the second X selector, the second selected word line, the magnetic resistance element, and the extension bit line of the selected reference memory cell, the first reference word line, the second Y selector in the selected memory cell array section and the second main bit line in the data read operation.

Here, the Y-side current source circuit supplies the constant electric current as a reference write electric current onto one of the first and second main bit lines and receives the reference write electric current from the other based on the write data in a reference data write operation to the selected reference memory cell, and the reference write electric current may flow through a route of the first main bit line, the second Y selector, the first reference bit line, the magnetic field generating section of the selected reference memory cell, the second reference bit line and the first Y selector in the selected memory cell array section and the second main bit line in the reference data write operation. In this case, the Y-side current source circuit may include: a first circuit which generates a constant current source as the write electric current or the reference write electric current and receives the write electric current or the reference write electric current; and a second circuit which selects one of the first and second main bit lines for the write electric current in the data write operation and for the reference write electric current in the reference data write operation based on the write data.

Also, the memory cell array section may further include: a precharge power supply; a precharge word line; a precharge line; a precharge circuit provided for each of pairs of the first and second bit lines and containing two MOS transistors which are provided between the first and second bit lines of the pair in series and have gates connected with the precharge word line, wherein a node between the two MOS transistors is connected with the precharge line; and a precharge selector which selects the precharge word line to activate the two MOS transistors for each pair of the first and second bit lines. The second X selector may set one of the plurality of second word line corresponding to the selected memory cell to a predetermined potential in the data read operation, and the data write operation and a reference data write operation to the selected reference memory cell, and set the pair of the first and second bit lines to a precharge voltage when the pair of the first and second bit lines is not selected.

Also, the second Y selector is connected with the first reference bit line. The memory cell array section may further include: a third Y selector which selects one of the plurality of first bit lines as a first selected bit line based on the address, and is connected with the first reference bit line. The magnetic random access memory may further include: a plurality of the memory cell array sections; first and second write main bit lines; first and second read main bit lines; a cell array selector which selects one of the plurality of memory cell array section as a selected memory cell array section based on the address to respectively connect the first and second write main bit lines with the second and first Y selectors of the selected memory cell array section and to connect the first and second read main bit lines with the third Y selector of the selected memory cell array section; a Y-side current source circuit which supplies the write electric current onto one of the first and second write main bit lines and receives the write electric current from the other based on the write data in the data write operation; and a sense amplifier which senses the read data based on a difference between the read electric current flowing through the first main bit line and the reference read electric current flowing through the second main bit line in the data read operation to the selected memory cell. The write electric current may flow through a route of the first write main bit line, the second Y selector, the first selected bit line, the magnetic field generating section of the selected memory cell, the second selected bit line and the first Y selector in the selected memory cell array section and the second write main bit line in the data write operation. The read electric current may flow through a route of the second X selector, the second selected word line, the magnetic resistance element and the extension bit line of the selected memory cell, the first selected bit line, and the third Y selector in the selected memory cell array section and the first read main bit line in the data read operation. The reference read electric current may flow through a route of the second X selector, the second selected word line, the magnetic resistance element and the extension bit line of the selected reference memory cell, the first reference bit line, and the third Y selector in the selected memory cell array section and the second read main bit line in the data read operation.

Here, the Y-side current source circuit supplies the constant electric current as a reference write electric current onto one of the first and second write main bit lines and receives the reference write electric current from the other based on the write data in a reference data write operation to the selected reference memory cell, and the reference write electric current may flow through a route of the first write main bit line, the second Y selector, the first reference bit line, the magnetic field generating section of the selected reference memory cell, the second reference bit line and the first Y selector in the selected memory cell array section and the second write main bit line in the reference data write operation. In this case, the Y-side current source circuit may include: a first circuit which generates a constant current source as the write electric current or the reference write electric current and receives the write electric current or the reference write electric current; and a second circuit which selects one of the first and second write main bit lines for the write electric current in the data write operation and for the reference write electric current in the reference data write operation based on the write data.

Also, the memory cell array section may further include: a plurality of a plurality of additional word lines, the gate of the second MOS is connected with a corresponding one of the plurality of additional word lines in place of the corresponding first word line, and each of the plurality of second bit lines is shared by adjacent two of the plurality of first bit lines.

Also, the memory cell array section may further include: a plurality of a plurality of additional word lines, the gate of the first MOS transistor is connected with a corresponding one of the plurality of additional word lines in place of the corresponding first word line, and each of the plurality of second bit lines is shared by adjacent two of the plurality of first bit lines.

In another aspect of the present invention, a magnetic random access memory includes a memory cell array section, which may include: a plurality of memory cells arranged in a matrix of rows and columns, wherein one column of the memory cells a column of reference memory cells; a plurality of first word lines, each of which is connected with one row of the memory cells; a plurality of second word lines, each of which is connected with one row of the memory cells; a plurality of first bit lines, each of which is connected with one column of the memory cells, The first bit line for the column of the reference memory cells is a first reference bit line; a first X selector which selects one of the plurality of first word lines as a first selected word line based on an address; a second X selector which selects one of the plurality of second word lines as a second selected word line based on an address; a first Y selector which selects one of the plurality of first bit lines as a first selected bit line based on the address. Each of the plurality of memory cells includes: an extension wiring line; a magnetic resistance element having a spontaneous magnetization, and storing a data as a direction of the spontaneous magnetization, The direction of the spontaneous magnetization is inverted depending on a magnetic field applied to the magnetic resistance element; a first diode connected with the magnetic resistance element in series, wherein a series connection of the magnetic resistance element and the first diode is provided between the extension wiring line and a corresponding one of the plurality of second word line; and a parallel connection of second and third diodes connected between a corresponding one of the plurality of first word lines and the extension wiring line, the second and third diodes are connected in parallel in opposite directions. A magnetic field generating section includes the extension wiring line, and the parallel connection of the second and third diodes, and one of the plurality of memory cells which is connected with the first selected word line, the second selected word line, and the first selected bit line is a selected memory cell, and one of the column of the reference memory cells which is connected with the first and second selected word lines, and the first reference bit line is a selected reference memory cell. In a data write operation into the selected memory cell, a write data is written in the magnetic resistance element of the selected memory cell by applying the magnetic field generated by a write electric current which may flow through the extension wiring line of the magnetic field generating section of the selected memory cell, and a value of the write data is determined based on a direction of the write electric current. In a data read operation from the selected memory cell, a read electric current may flow through a route of the extension wiring line, the magnetic resistance element and the first diode in the selected memory cell, and a read data from the selected memory cell is determined based on a resistance of the magnetic resistance element of the selected memory cell.

Here, the first and second X selectors set the plurality of first and second word lines to a first voltage. The magnetic random access memory may further include: a Y-side power supply circuit which applies one of a second voltage and a third voltage to the first Y selector based on the write data in the data write operation, The first X selector applies the other of the second and third voltages to the first selected word line; a read current load circuit which supplies the read electric current to the first Y selector and a reference read electric current to the first reference bit line in the data read operation; and a sense amplifier which senses the read data based on a difference between the read electric current flowing through the first selected bit line and the reference read electric current flowing through the first reference bit line in the data read operation. In the data write operation, the write electric current may flow through a route of the first Y selector, the first selected bit line, the magnetic field generating section of the selected memory cell, the first selected word line and the first X selector. In the data read operation, the second X selector sets the second selected word line to the third voltage, and the read electric current may flow through a route of the first Y selector, the first selected bit line, the extension bit line, the magnetic resistance element and the first diode of the selected memory cell and the second X selector. The reference read electric current may flow through a route of the first reference bit line, the extension bit line, the magnetic resistance element and the first diode of the selected reference memory cell and the second X selector in the data read operation.

Here, the Y-side power supply circuit which applies the one of the second and third voltages to the first reference bit line based on the write data in a reference data write operation to the selected reference memory cell, and the reference write electric current may flow through a route of the first reference bit line, the magnetic field generating section of the selected reference memory cell, the first selected word line and the first Y selector in the reference data write operation.

Also, the first Y selector is connected with the first reference bit line, and the first and second X selectors set the plurality of first and second word lines to a first voltage. The magnetic random access memory may further include: a plurality of the memory cell array sections; first to third main bit lines; a cell array selector which selects one of the plurality of memory cell array section as a selected memory cell array section based on the address to connect the first and second main bit lines with the first Y selector of the selected memory cell array section and the third main bit line with the first X selector of the selected memory cell array section, a Y-side power supply circuit which applies one of the second and third voltages to the third main bit line and the other of the second and third voltages to the second main bit line based on the write data in the data write operation, The first X selector applies the other of the second and third voltages on the second main bit line to the first selected word line; a read current load circuit which supplies the read electric current and a reference read electric current to the second and first main bit lines; and a sense amplifier which senses the read data based on a difference between the read electric current flowing through the second main bit line and the reference read electric current flowing through the first main bit line in the data read operation to the selected memory cell. The write electric current may flow through a route of the second main bit line, and the first Y selector, the first selected bit line, the magnetic field generating section of the selected memory cell, the first selected word line and the first X selector in the selected memory cell array section and the third main bit line in the data write operation. In the data read operation, the second X selector sets the second selected word line to the third voltage, and the read electric current may flow through a route of the second main bit line, the first Y selector, the first selected bit line, and the extension bit line, the magnetic resistance element and the first diode of the selected memory cell and the second X selector in the selected memory cell array section. The reference read electric current may flow through a route of the first main bit line, the first reference bit line, and the extension bit line, the magnetic resistance element and the first diode of the selected reference memory cell and the second X selector in the selected memory cell array section in the data read operation.

Here, the Y-side current source circuit applies one of the second and third voltages to the first main bit based on the write data in a reference data write operation to the selected reference memory cell, and a reference write electric current may flow through a route of the first main bit line, the first Y selector, the first reference bit line, the magnetic field generating section of the selected reference memory cell, the first selected word line and the first Y selector in the selected memory cell array section in the reference data write operation.

Also, in another aspect of the present invention, a magnetic random access memory includes a memory cell array section, which includes: a plurality of memory cells arranged in a matrix of rows and columns, wherein one column of the memory cells a column of reference memory cells; a plurality of first word lines, each of which is connected with one row of the memory cells; a plurality of second word lines, each of which is connected with one row of the memory cells; a plurality of first bit lines, each of which is connected with one column of the memory cells; a plurality of second bit lines, each of which is connected with one column of the memory cells, The first and second bit lines for the column of the reference memory cells are first and second reference bit lines; a first X selector which selects one of the plurality of first word lines as a first selected word line and one of the plurality of second word lines as a second selected word line based on an address; a first Y selector which selects one of the plurality of second bit lines as a second selected bit line based on the address; and a second Y selector which selects one of the plurality of first bit lines as a first selected bit line based on the address. Each of the plurality of memory cells includes: an extension wiring line; a magnetic resistance element having a spontaneous magnetization, and storing a data as a direction of the spontaneous magnetization, The direction of the spontaneous magnetization is inverted depending on a magnetic field applied to the magnetic resistance element; a first diode connected with the magnetic resistance element in series, wherein a series connection of the magnetic resistance element and the first diode is provided between the extension wiring line and a corresponding one of the plurality of second word line; and a first MOS transistor which is provided between the extension wiring line and a corresponding one of the plurality of first bit lines and having a gate connected with the first selected word line. A magnetic field generating section includes the extension wiring line, and the first MOS transistor, and one of the plurality of memory cells which is connected with the first selected word line, the second selected word line, and the first selected bit line is a selected memory cell, and one of the column of the reference memory cells which is connected with the first and second selected word lines, and the first reference bit line is a selected reference memory cell. In a data write operation into the selected memory cell, a write data is written in the magnetic resistance element of the selected memory cell by applying the magnetic field generated by a write electric current which may flow through the extension wiring line of the magnetic field generating section of the selected memory cell, and a value of the write data is determined based on a direction of the write electric current. In a data read operation from the selected memory cell, a read electric current may flow through a route of the extension wiring line, the magnetic resistance element and the first diode in the selected memory cell, and a read data from the selected memory cell is determined based on a resistance of the magnetic resistance element of the selected memory cell.

Here, the first and second X selectors set the plurality of first and second word lines to a first voltage. The magnetic random access memory may further include: a Y-side power supply circuit which applies one of a second voltage and a third voltage to the second Y selector based on the write data in the data write operation, The first Y selector applies the other of the second and third voltages to the second selected bit line in the data write operation; a read current load circuit which supplies the read electric current to the first Y selector and a reference read electric current to the first reference bit line in the data read operation, The first X selector sets the second selected word line to the third voltage in the data read operation; and a sense amplifier which senses the read data based on a difference between the read electric current flowing through the first selected bit line and the reference read electric current flowing through the first reference bit line in the data read operation. In the data write operation, the write electric current may flow through a route of the first Y selector, the first selected bit line, the magnetic field generating section of the selected memory cell, the second selected bit line and the first X selector. The read electric current may flow through a route of the first Y selector, the first selected bit line, the first MOS transistor, the extension bit line, the magnetic resistance element and the first diode of the selected memory cell and the first X selector in the data read operation. The reference read electric current may flow through a route of the first reference bit line, the first MOS transistor, the extension bit line, the magnetic resistance element and the first diode of the selected memory cell and the first X selector in the data read operation. In this case, the Y-side power supply circuit applies one of the second and third voltages to the first reference bit line based on the write data in a reference data write operation to the selected reference memory cell, and the reference write electric current may flow through a route of the first reference bit line, the magnetic field generating section of the selected reference memory cell, the second reference bit line word line and the first Y selector in the reference data write operation.

Also, the first Y selector is connected with the first reference bit line. The magnetic random access memory may further include: a plurality of the memory cell array sections; first to third main bit lines; a cell array selector which selects one of the plurality of memory cell array section as a selected memory cell array section based on the address to connect the first and second main bit lines with the second Y selector of the selected memory cell array section and the third main bit line with the first Y selector of the selected memory cell array section; a Y-side power supply circuit which applies one of the second and third voltages to the third main bit line and the other of the second and third voltages to the second main bit line based on the write data in the data write operation; a read current load circuit which supplies the read electric current and a reference read electric current to the second and first main bit lines; and a sense amplifier which senses the read data based on a difference between the read electric current flowing through the second main bit line and the reference read electric current flowing through the first main bit line in the data read operation to the selected memory cell. The write electric current may flow through a route of the second main bit line, and the second Y selector, the first selected bit line, the magnetic field generating section of the selected memory cell, the second selected bit line and the first Y selector in the selected memory cell array section and the first main bit line in the data write operation. The read electric current may flow through a route of the second main bit line, the second Y selector, the first selected bit line, and the extension bit line, the magnetic resistance element and the first diode of the selected memory cell and the first X selector in the selected memory cell array section in the data read operation. The reference read electric current may flow through a route of the first main bit line, the first reference bit line, and the extension bit line, the magnetic resistance element and the first diode of the selected reference memory cell and the first X selector in the selected memory cell array section in the data read operation.

Here, the Y-side current source circuit applies the one of the second and third voltages to the first main bit line based on the write data in a reference data write operation to the selected reference memory cell, and a reference write electric current may flow through a route of the first main bit line, the second Y selector, the first reference bit line, the magnetic field generating section of the selected reference memory cell, the second reference bit line and the first Y selector in the selected memory cell array section and the third main bit line in the reference data write operation.

Also, in another aspect of the present invention, a magnetic random access memory includes a memory cell array section, which includes: a plurality of memory cells arranged in a matrix of rows and columns, wherein one column of the memory cells a column of reference memory cells; a plurality of first word lines, each of which is connected with one row of the memory cells; a plurality of first bit lines, each of which is connected with one column of the memory cells; a plurality of second bit lines, each of which is connected with one column of the memory cells, The first and second bit lines for the column of the reference memory cells are first and second reference bit lines; a first X selector which selects one of the plurality of first word lines as a first selected word line and one of the plurality of second word lines as a second selected word line based on an address; a first Y selector which selects one of the plurality of second bit lines as a second selected bit line based on the address; and a second Y selector which selects one of the plurality of first bit lines as a first selected bit line based on the address. Each of the plurality of memory cells includes: an extension wiring line; a magnetic resistance element having a spontaneous magnetization, and storing a data as a direction of the spontaneous magnetization, The direction of the spontaneous magnetization is inverted depending on a magnetic field applied to the magnetic resistance element; a conductive pattern which is connected in series with the magnetic resistance element; a parallel connection of first and second diodes provided between the extension wiring line and a corresponding one of the plurality of second bit lines, the first and second diodes being connected in opposite directions; and a MOS transistor which is provided between the extension wiring line and a corresponding one of the plurality of first bit lines and having a gate connected with the first selected word line. A magnetic field generating section includes the parallel connection of the second and third diodes, the extension wiring line, and the first MOS transistor, and one of the plurality of memory cells which is connected with the first selected word line, the second selected word line, and the first selected bit line is a selected memory cell, and one of the column of the reference memory cells which is connected with the first and second selected word lines, and the first reference bit line is a selected reference memory cell. In a data write operation into the selected memory cell, a write data is written in the magnetic resistance element of the selected memory cell by applying the magnetic field generated by a write electric current which may flow through the extension wiring line of the magnetic field generating section of the selected memory cell, and a value of the write data is determined based on a direction of the write electric current. In a data read operation from the selected memory cell, a read electric current may flow through a route of the extension wiring line, the magnetic resistance element and the first diode in the selected memory cell, and a read data from the selected memory cell is determined based on a resistance of the magnetic resistance element of the selected memory cell.

Here, the first Y selector sets the plurality of second bit lines to a first voltage. The magnetic random access memory may further include: a Y-side power supply circuit which applies one of the second and third voltages to the second Y selector based on the write data in the data write operation, The first Y selector applies the other of the second and third voltages to the second selected bit line based on the write data in the data write operation; a read current load circuit which supplies the read electric current to the first Y selector and a reference read electric current to the first reference bit line in the data read operation; and a sense amplifier which senses the read data based on a difference between the read electric current flowing through the first selected bit line and the reference read electric current flowing through the first reference bit line in the data read operation. In the data write operation, the write electric current may flow through a route of the second Y selector, the first selected bit line, the magnetic field generating section of the selected memory cell, the second selected bit line and the first X selector. The read electric current may flow through a route of the second Y selector, the first selected bit line, and the first MOS transistor, the extension bit line, the magnetic resistance element and the conductive pattern of the selected memory cell in the data read operation. The reference read electric current may flow through a route of the first reference bit line, the first MOS transistor, the extension bit line, the magnetic resistance element and the conductive pattern of the selected memory cell and the first Y selector in the data read operation.

Here, the Y-side power supply circuit which applies the one of the second and third voltages to the first reference bit line based on the write data in a reference data write operation to the selected reference memory cell, and the reference write electric current may flow through a route of the first reference bit line, the magnetic field generating section of the selected reference memory cell, the second reference bit line word line and the first Y selector in the reference data write operation.

Also, the first Y selector is connected with the first reference bit line, and the first Y selector set the plurality of second bit lines to a first voltage. The magnetic random access memory may further include: a plurality of the memory cell array sections; first to third main bit lines; a cell array selector which selects one of the plurality of memory cell array section as a selected memory cell array section based on the address to connect the first and second main bit lines with the second Y selector of the selected memory cell array section and the third main bit line with the first Y selector of the selected memory cell array section; a Y-side power supply circuit which applies one of the second and third voltages to the third main bit line and the other of the second and third voltages to the second main bit line based on the write data in the data write operation; a read current load circuit which supplies the read electric current and a reference read electric current to the second and first main bit lines; and a sense amplifier which senses the read data based on a difference between the read electric current flowing through the second main bit line and the reference read electric current flowing through the first main bit line in the data read operation to the selected memory cell. The write electric current may flow through a route of the second main bit line, and the second Y selector, the first selected bit line, the magnetic field generating section of the selected memory cell, the second selected bit line and the first Y selector in the selected memory cell array section and the first main bit line in the data write operation. The read electric current may flow through a route of the second main bit line, the second Y selector, the first selected bit line, and the first MOS transistor, the extension bit line, the magnetic resistance element and the conductive pattern of the selected memory cell in the selected memory cell array section in the data read operation. The reference read electric current may flow through a route of the first main bit line, the first reference bit line, and the first MOS transistor, the extension bit line, the magnetic resistance element and the conductive pattern of the selected reference memory cell in the selected memory cell array section in the data read operation. In this case, the Y-side current source circuit applies the one of the second and third voltages to the first main bit based on the write data in a reference data write operation to the selected reference memory cell, and a reference write electric current may flow through a route of the first main bit line, the second Y selector, the first reference bit line, the magnetic field generating section of the selected reference memory cell, the second reference bit line and the first Y selector in the selected memory cell array section and the third main bit line in the reference data write operation.

Also, in another aspect of the present invention, a magnetic random access memory includes a memory cell array section, which includes: a plurality of memory cells arranged in a matrix of rows and columns, wherein one column of the memory cells a column of reference memory cells; a plurality of first word lines, each of which is connected with one row of the memory cells; a plurality of first bit lines, each of which is connected with one column of the memory cells; a plurality of second bit lines, each of which is connected with one column of the memory cells, The first and second bit lines for the column of the reference memory cells are first and second reference bit lines; a first X selector which selects one of the plurality of first word lines as a first selected word line and one of the plurality of second word lines as a second selected word line based on an address; a first Y selector which selects one of the plurality of second bit lines as a second selected bit line based on the address; and a second Y selector which selects one of the plurality of first bit lines as a first selected bit line based on the address. Each of the plurality of memory cells includes: an extension wiring line; a magnetic resistance element having a spontaneous magnetization, and storing a data as a direction of the spontaneous magnetization, The direction of the spontaneous magnetization is inverted depending on a magnetic field applied to the magnetic resistance element; a conductive pattern which is connected in series with the magnetic resistance element; a serial connection of first and second diodes provided between the extension wiring line and a corresponding one of the plurality of second bit lines, the first and second diodes being connected in opposite directions; and a MOS transistor which is provided between the extension wiring line and a corresponding one of the plurality of first bit lines and having a gate connected with the first selected word line. A magnetic field generating section may include the parallel connection of the second and third diodes, the extension wiring line, and the first MOS transistor, and one of the plurality of memory cells which is connected with the first selected word line, the second selected word line, and the first selected bit line is a selected memory cell, and one of the column of the reference memory cells which is connected with the first and second selected word lines, and the first reference bit line is a selected reference memory cell. In a data write operation into the selected memory cell, a write data is written in the magnetic resistance element of the selected memory cell by applying the magnetic field generated by a write electric current which may flow through the extension wiring line of the magnetic field generating section of the selected memory cell, and a value of the write data is determined based on a direction of the write electric current. In a data read operation from the selected memory cell, a read electric current may flow through a route of the extension wiring line, the magnetic resistance element and the first diode in the selected memory cell, and a read data from the selected memory cell is determined based on a resistance of the magnetic resistance element of the selected memory cell.

Here, the first Y selector sets the plurality of second bit lines to a first voltage. The magnetic random access memory may further include: a Y-side power supply circuit which applies one of the second and third voltages to the second Y selector based on the write data in the data write operation, The first Y selector applies the other of the second and third voltages to the second selected bit line based on the write data in the data write operation; a read current load circuit which supplies the read electric current to the first Y selector and a reference read electric current to the first reference bit line in the data read operation; and a sense amplifier which senses the read data based on a difference between the read electric current flowing through the first selected bit line and the reference read electric current flowing through the first reference bit line in the data read operation. In the data write operation, the write electric current may flow through a route of the second Y selector, the first selected bit line, the magnetic field generating section of the selected memory cell, the second selected bit line and the first X selector. The read electric current may flow through a route of the second Y selector, the first selected bit line, and the first MOS transistor, the extension bit line, the magnetic resistance element and the conductive pattern of the selected memory cell in the data read operation. The reference read electric current may flow through a route of the first reference bit line, and the first MOS transistor, the extension bit line, the magnetic resistance element and the conductive pattern of the selected memory cell in the data read operation. In this case, the Y-side power supply circuit applies the one of the second and third voltages to the first reference bit line based on the write data in a reference data write operation to the selected reference memory cell, and the reference write electric current may flow through a route of the first reference bit line, the magnetic field generating section of the selected reference memory cell, the second reference bit line word line and the first Y selector in the reference data write operation.

Also, the first Y selector is connected with the first reference bit line, and the first Y selector set the plurality of second bit lines to a first voltage, and the second Y selector set the plurality of second bit lines to the first voltage. The magnetic random access memory may further include: a plurality of the memory cell array sections; first to third main bit lines; a cell array selector which selects one of the plurality of memory cell array section as a selected memory cell array section based on the address to connect the first and second main bit lines with the second Y selector of the selected memory cell array section and the third main bit line with the first Y selector of the selected memory cell array section; a Y-side power supply circuit which applies one of the second and third voltages to the third main bit line and the other of the second and third voltages to the second main bit line based on the write data in the data write operation; a read current load circuit which supplies the read electric current and a reference read electric current to the second and first main bit lines; and a sense amplifier which senses the read data based on a difference between the read electric current flowing through the second main bit line and the reference read electric current flowing through the first main bit line in the data read operation to the selected memory cell. The write electric current may flow through a route of the second main bit line, and the second Y selector, the first selected bit line, the magnetic field generating section of the selected memory cell, the second selected bit line and the first Y selector in the selected memory cell array section and the first main bit line in the data write operation. The read electric current may flow through a route of the second main bit line, the second Y selector, the first selected bit line, and the first MOS transistor, the extension bit line, the magnetic resistance element and the conductive pattern of the selected memory cell in the selected memory cell array section in the data read operation. The reference read electric current may flow through a route of the first main bit line, the first reference bit line, and the first MOS transistor, the extension bit line, the magnetic resistance element and the conductive pattern of the selected reference memory cell in the selected memory cell array section in the data read operation. In this case, the Y-side current source circuit applies the one of the second and third voltages to the first main bit line based on the write data in a reference data write operation to the selected reference memory cell, and a reference write electric current may flow through a route of the first main bit line, the second Y selector, the first reference bit line, the magnetic field generating section of the selected reference memory cell, the second reference bit line and the first Y selector in the selected memory cell array section and the third main bit line in the reference data write operation.

Also, in another aspect of the present invention, a magnetic random access memory includes a memory cell array section, which includes: a plurality of memory cells arranged in a matrix of rows and columns, wherein one column of the memory cells a column of reference memory cells; a plurality of first word lines, each of which is connected with one row of the memory cells; a plurality of first bit lines, each of which is connected with one column of the memory cells, The first bit line for the column of the reference memory cells is a first reference bit line; a first X selector which selects one of the plurality of first word lines as a first selected word line and one of the plurality of second word lines as a second selected word line based on an address; and a first Y selector which selects one of the plurality of first bit lines as a first selected bit line based on the address. Each of the plurality of memory cells includes: an extension wiring line; a magnetic resistance element having a spontaneous magnetization, and storing a data as a direction of the spontaneous magnetization, The direction of the spontaneous magnetization is inverted depending on a magnetic field applied to the magnetic resistance element; a conductive pattern connected with a predetermined voltage; a first MOS transistor which is provided between the extension wiring line and a corresponding one of the plurality of first bit lines and having a gate connected with the first selected word line; and a capacitor connected between the extension wiring line and the conductive pattern. A magnetic field generating section may include the extension wiring line and the first MOS transistor, and one of the plurality of memory cells which is connected with the first selected word line, the second selected word line, and the first selected bit line is a selected memory cell, and one of the column of the reference memory cells which is connected with the first and second selected word lines, and the first reference bit line is a selected reference memory cell. In a data write operation into the selected memory cell, a write data is written in the magnetic resistance element of the selected memory cell by applying the magnetic field generated by a write electric current which may flow through the extension wiring line of the magnetic field generating section of the selected memory cell, and a value of the write data is determined based on a direction of the write electric current. In a data read operation from the selected memory cell, a read electric current may flow through a route of the extension wiring line, the magnetic resistance element and the first diode in the selected memory cell, and a read data from the selected memory cell is determined based on a resistance of the magnetic resistance element of the selected memory cell. In this case, the first Y selector sets the first selected bit line to a predetermined voltage, and the first X selector selects the first selected word line to charge the capacitor to the predetermined voltage. The magnetic random access memory may further include: a Y-side power supply circuit which applies one of a first voltage higher than the predetermined voltage and a second voltage lower than the predetermined voltage to the first Y selector based on the write data in the data write operation; a read current load circuit which supplies the read electric current to the first Y selector and a reference read electric current to the first reference bit line in the data read operation, The first X selector sets the second selected word line to the third voltage in the data read operation; and a sense amplifier which senses the read data based on a difference between the read electric current flowing through the first selected bit line and the reference read electric current flowing through the first reference bit line in the data read operation. In the data write operation, the write electric current may flow through a route of the first Y selector, the first selected bit line, the magnetic field generating section of the selected memory cell, and capacitor. The read electric current may flow through a route of the first Y selector, the first selected bit line, the first MOS transistor, the extension bit line, the magnetic resistance element and the conductive pattern of the selected memory cell in the data read operation. The reference read electric current may flow through a route of the first reference bit line, the first MOS transistor, the extension bit line, the magnetic resistance element and the conductive pattern of the selected memory cell in the data read operation.

Here, the Y-side power supply circuit applies one of the first and second voltages to the first reference bit line based on the write data in a reference data write operation to the selected reference memory cell, and the reference write electric current may flow through a route of the first reference bit line, the magnetic field generating section of the selected reference memory cell, the capacitor in the reference data write operation.

Also, in another aspect of the present invention, a magnetic random access memory includes a memory cell array section, which includes: a plurality of memory cells arranged in a matrix of rows and columns, wherein one column of the memory cells a column of reference memory cells; a plurality of first word lines, each of which is connected with one row of the memory cells; a plurality of first bit lines, each of which is connected with one column of the memory cells; a plurality of second bit lines, each of which is connected with one column of the memory cells and forms a pair with a corresponding one of the plurality of first bit lines, The first and second bit lines for the column of the reference memory cells are first and second reference bit lines; a X selector which selects one of the plurality of first word lines as a first selected word line based on an address; and a Y selector interposed between an upper portion and a lower portion of each of the plurality of first bit lines and between an upper portion and a lower portion of each of the plurality of second bit lines to connect the upper portion and the lower portion of each of the plurality of first bit lines in data read and write operations and the upper portion and the lower portion of each of the plurality of second bit lines in the data write operation; a read current load circuit provided for each of pairs of the first bit line and the second bit line to supply a read electric current to the first selected bit line and a reference read electric current to the first reference bit line in the data read operation; a sense amplifier provided for each of pairs of the first bit line and the second bit line to sense the read data based on a difference between a read voltage on the first selected bit line and the reference read voltage on the second selected bit line in the data read operation; a transfer section which selectively connects the first reference bit line with the plurality of second bit lines; first and second main bit lines; and a gate section provided for each of pairs of the first bit line and the second bit line to select one of the pairs of the first bit line and the second bit line based on the address as a pair of first selected bit line and a second selected bit line, and to connect the first and second main bit lines with the first and second selected bit lines based on an address, The read current load circuit, the a sense amplifier and transfer section are provided between the Y selector and the gate section. Each of the plurality of memory cells includes: an extension wiring line; a conductive pattern; a magnetic resistance element provided between the extension wiring line and the conductive pattern, and having a spontaneous magnetization, and storing a data as a direction of the spontaneous magnetization, The direction of the spontaneous magnetization is inverted depending on a magnetic field applied to the magnetic resistance element; a first MOS transistor provided between the extension wiring line and a corresponding one of the plurality of first bit lines and having a gate connected with a corresponding one of the plurality of first word lines; and a second MOS transistor provided between the extension wiring line and a corresponding one of the plurality of second bit lines and having a gate connected with the corresponding one of the plurality of first word lines. A magnetic field generating section may include the first MOS transistor, the extension wiring line, and the first MOS transistor, and one of the plurality of memory cells which is connected with the first selected word line, the first selected bit line and the second selected bit line is a selected memory cell, and one of the column of the reference memory cells which is connected with the first selected word line, the first reference bit line and the second reference bit line is a selected reference memory cell. In a data write operation into the selected memory cell, a write data is written in the magnetic resistance element of the selected memory cell by applying the magnetic field generated by a write electric current which may flow through the extension wiring line of the magnetic field generating section of the selected memory cell, and a value of the write data is determined based on a direction of the write electric current. In a data read operation from the selected memory cell, a read electric current may flow through a route of the first MOS transistor, the extension wiring line, the magnetic resistance element and the conductive pattern in the selected memory cell, and a read data from the selected memory cell is determined based on a resistance of the magnetic resistance element of the selected memory cell.

Here, the write electric current may flow through a route of the first main bit line, the gate section, the first selected bit line, the Y selector, the magnetic field generating section of the selected memory cell, the second selected bit line and the Y selector, the gate section, and the first main bit line in the data write operation. The read electric current may flow through a route of the read current load circuit for the selected memory cell, the first selected bit line, the Y selector, the first MOS transistor, the extension bit line, the magnetic resistance element and the conductive pattern of the selected memory cell in the data read operation. The reference read electric current may flow through a route of the read current load circuit for the selected reference memory cell, the first reference bit line, the Y selector and the first MOS transistor, the extension bit line, the magnetic resistance element and the conductive pattern of the selected reference memory cell in the data read operation, The reference read electric current is transferred to the second selected bit line by the transfer section. The sense amplifier senses the read data from the selected memory cell based on the difference between the read voltage on the first selected bit line and the reference read voltage on the second selected bit line in the data read operation when the upper portions of the first and second selected bit lines are disconnected from the lower portions of the first and second selected bit lines, and outputs the sensing result to the first and second main bit lines through the gate section.

BRIEF DESCRIPTION OF THE DRAWINGS

FIG. 2 is a cross sectional view of the conventional magnetic memory cell;

FIG. 53 is a cross sectional view of the memory cell according to the gg' line shown in FIG. 52;

DESCRIPTION OF THE PREFERRED EMBODIMENTS

Hereinafter, a magnetic random access memory using magnetic memory cells of the present invention will be described in detail with reference to the attached drawings.

First Embodiment

The magnetic random access memory using a plurality of magnetic memory cells according to the first embodiment of the present invention will be described.

Figure 5:
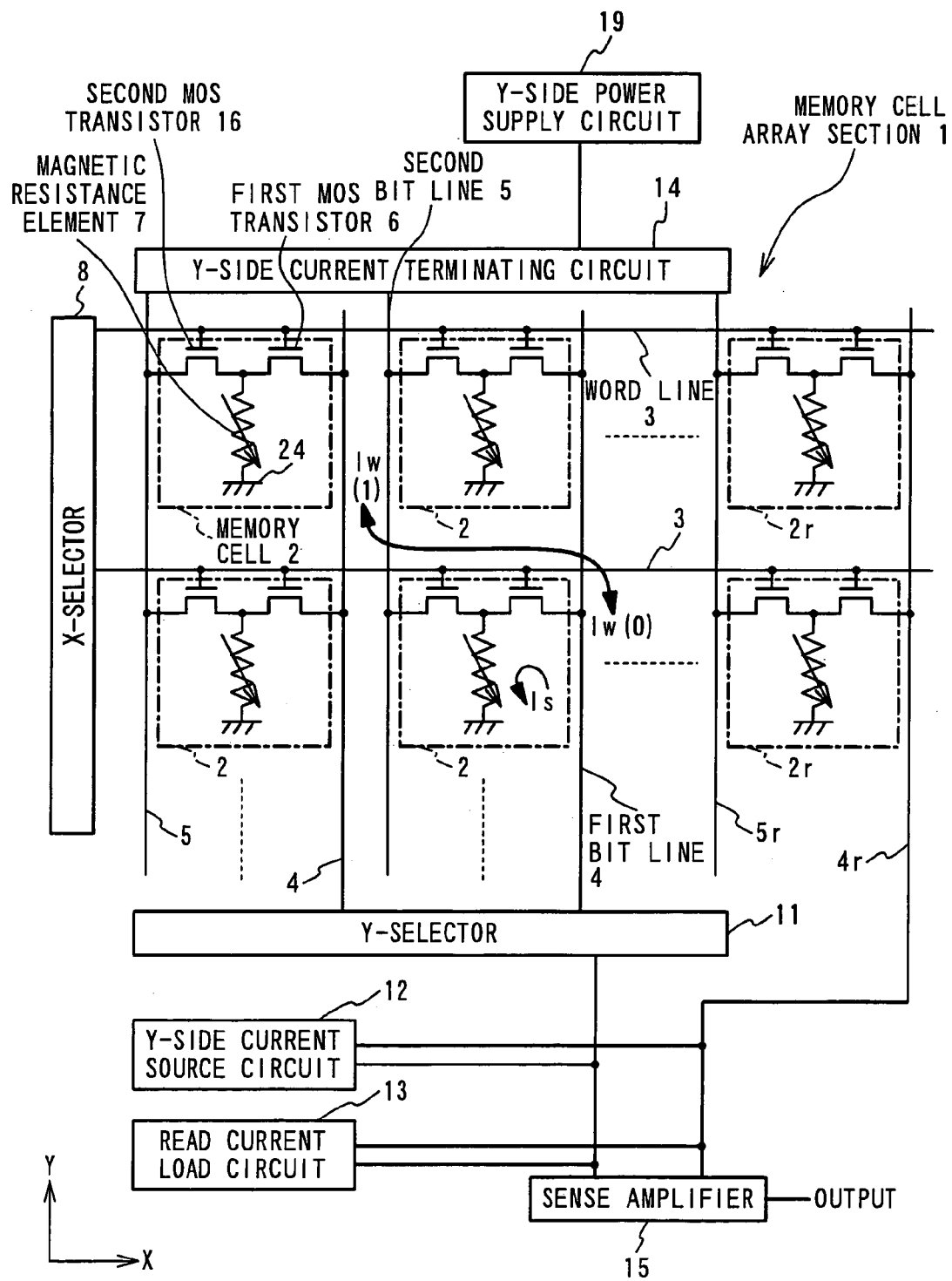
FIG. 5 is a diagram showing the structure of a magnetic random access memory which contains magnetic memory cells according to a first embodiments of the present invention.

First, the structure of the magnetic memory cell and the structure of the magnetic random access memory according to the first embodiment of the present invention will be described with reference to FIG. 5. As shown in FIG. 5, the magnetic random access memory in this embodiment is composed of a memory cell array section 1, a Y-side electric current source circuit 12, a read current load circuit 13, and a sense amplifier 15.

The memory cell array section 1 contains a plurality of memory cells 2, a plurality of word lines 3, a plurality of first bit lines 4, a plurality of second bit lines 5, an X-selector 8, a Y-selector 11, a Y-side current terminating circuit 14 and a Y-side power supply circuit 19. In the memory cell array section 1, the plurality of magnetic memory cells 2 are arranged in a matrix. Each of the memory cells 2 is connected with one of the plurality of first bit lines 4, one of the plurality of second bit lines 5, and one of the plurality of first word lines 3. Each of the above memory cells 2 is provided for one of the positions where a plurality of sets of the first bit line and the second bit line and the plurality of word lines intersect. The memory cells 2 of one column are reference memory cells 2r. The bit lines connected with the reference memory cells 2r is referred to as first and second reference bit lines 4r and 5r. The X-selector 8 is connected with the plurality of first word lines 3. The Y-selector 11 is connected with the plurality of first bit lines 4. The Y-side current source circuit 12, the read current load circuit 13 and the sense amplifier 15 are connected with the Y-selector 11 and the first reference bit line 4r. The Y-side current terminating circuit 14 is connected with the plurality of second bit lines 5 containing the second reference bit line 5r. The Y-side current terminating circuit 14 is also connected with the Y-side power supply circuit 19.

The X-selector 8 selects one from the plurality of word lines 3 as the selected word line 3s based on a row address in case of a data read operation and a data write operation. The Y-selector 11 selects one of the plurality of first bit lines 4 as a first selected bit line 4s based on a column address in case of the data read operation and the data write operation. The Y-side current terminating circuit 14 selects one of the plurality of second bit lines 4 as a second selected bit line 5s based on the column address in case of the data write operation. One of the plurality of memory cells 2 is selected by using the selected word line 3s and the first selected bit line 4s and is referred to as a selected memory cell 2s. The selected memory cell 2s is connected with a second selected bit line 5s. Also, one of the reference memory cells 2r connected with the selected word line 3s is referred to as a selected reference memory cell.

The memory cell 2 contains a first MOS transistor 6, a second MOS transistor 16, an extension wiring line 29 (or a conductive section which is not shown) between the first and second MOS transistors, a magnetic resistance element 7 and a ground (GND) wiring line (a conductive pattern) 24.

In the first MOS transistor 6 of each memory cell 2, a gate is connected with the word line 3, a source is connected with the first bit line 4, and a drain is connected with the magnetic resistance element 7 and a drain of the second MOS transistor 16 via the extension lining line 29. In the second MOS transistor 16, a gate is connected with the word line 3, a source is connected with the second bit line 5, and the drain is connected with the magnetic resistance element 7 and the drain of the first MOS transistor 6 via the extension wiring line 29. The magnetic resistance element 7 is connected with the extension wiring line 29 and the ground wiring line 24. The magnetic resistance element 7 has a spontaneous magnetization and the direction of the spontaneous magnetization is can be inverted in accordance with a stored data.

Here, the basic structure of the reference memory cell 2r is the same as the memory cell 2. However, the resistance value of the reference memory cell 2r is fixed to a predetermined value. That is, the resistance value is previously set to have a middle voltage drop between the voltage drop of the magnetic resistance element 7 of the selected memory cell 2s which stores the data of "1" and the voltage drop of the magnetic resistance element 7 of the selected memory cell 2s which stores the data of "0", when the read current load circuit 13 supplies the predetermined electric current. Such setting is possible by changing the value of electric current which flows through the reference memory cell 2r or changing the film characteristic of the magnetic resistance element 7 of the reference memory cell 2r such as the film thickness and the material and so on.

The Y-side current source circuit 12 is a power supply circuit. In this example, the Y-side current source circuit 12 is an electric current source which carries out the supply or drawing-in of an electric current to or from the first selected bit line 4s in case of the data write operation. The Y-side current source circuit 12 is composed of a constant current source 12a to supply a predetermined electric current and a selection section 12b to set the bit line for the write electric current to flow. The Y-side power supply circuit 19 applies a predetermined voltage to the Y-side current terminating circuit 14 in case of the data write operation. Thus, in the data write operation, the electric current flows from the Y-side current source circuit 14 into the Y-selector 11 or from the Y-selector 11 to the Y-side current source circuit 14 through the route of the first selected bit line 4s—the selected memory cell 2s—the second selected bit line 5s in accordance with a write data. The read current load circuit 13 flows a predetermined electric current to the first selected bit line 4s and the first reference bit line 4r in case of the data read operation. The sense amplifier 15 reads data from the selected memory cell 2s based on the difference between the voltage or current of the first reference bit line 4r connected with the reference memory cell 2r and the voltage or current of the first selected bit line 4s connected with the selected memory cell 2s, and outputs the read data.

In a data read operation, the first MOS transistor 6 of the selected memory cell 2s is activated to connect the magnetic resistance element 7 with the first selected bit line 4s and the read electric current flows through the route of the first bit line 4, the extension wiring line 29 and the magnetic resistance element 7. In the data write operation, the first MOS transistor 6, the extension wiring line 29 and the second MOS transistor 16 are used to connect the first bit line 4 and the second bit line 5 and to supply a write electric current to flow through the neighborhood of the magnetic resistance element 7. Thus, a magnetic field generated by the write electric current flowing through the extension wiring line 29 is applied to the magnetic resistance element 7 and the write data is written into the magnetic resistance element 7.

Figure 6:
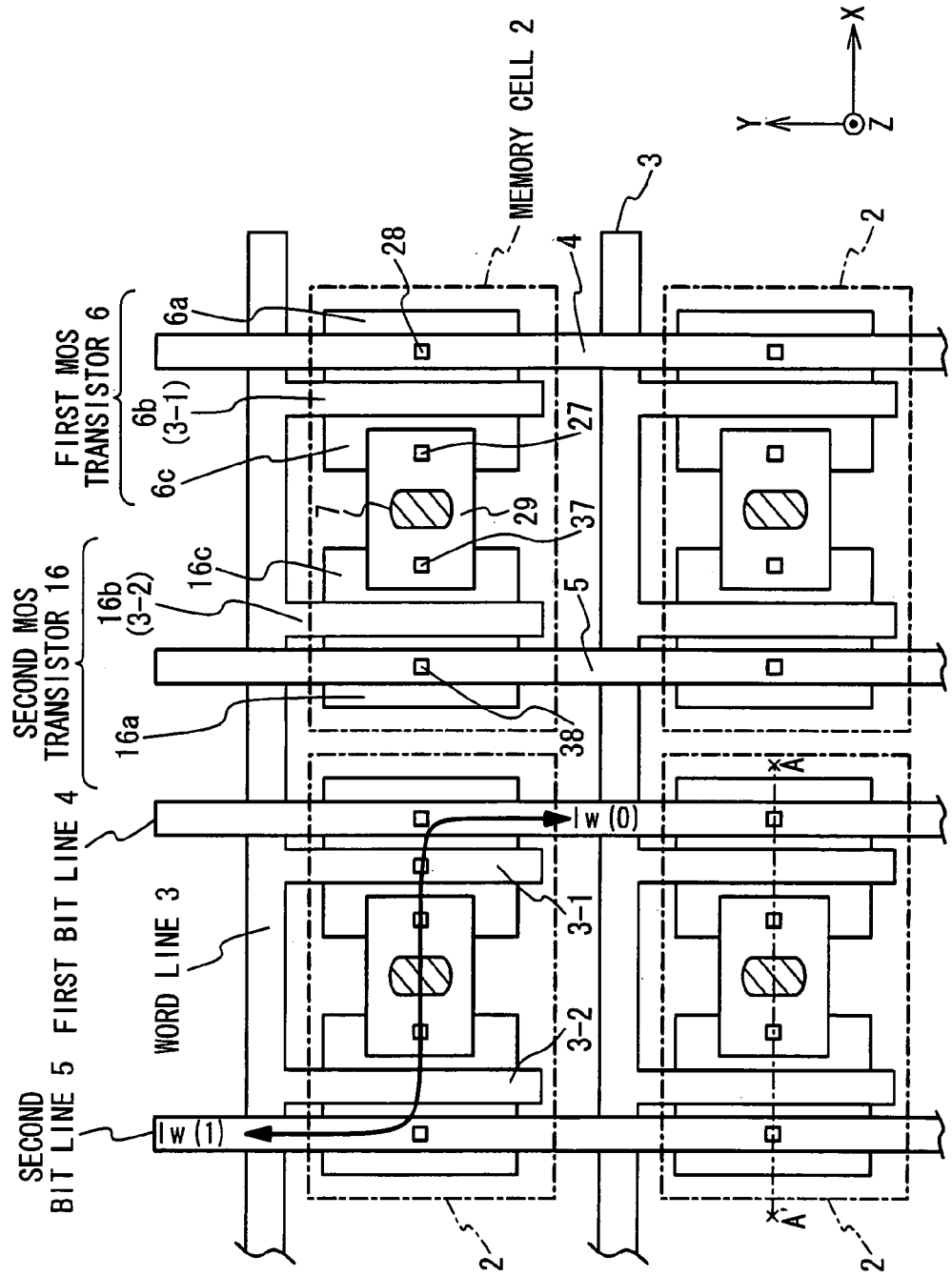
FIG. 6 is a plan view of the magnetic random access memory shown in FIG. 5.

FIG. 6 is a plan view of a part of the memory cell array section of the magnetic random access memory shown in FIG. 5. In FIG. 6, the memory cells 2 of 2×2 in the memory cell array section 1 are shown as representative cells. The source 6a of the first MOS transistor 6 of the memory cell 2 is connected with the first bit line 4 through a contact wiring line 28. The gate 6b thereof is a word line 3-1 which is branched in the Y-axis direction from the word line 3. The drain 6c thereof is connected with the drain 16c of the second MOS transistor 16 through a contact wiring line 27, the extension wiring line layer 29, and a contact wiring line 37. The gate 16b of the second MOS transistor 16 is a word line 3-2 which is branched in the Y-axis direction from the word line 3. The source 16a thereof is connected with the second bit line 5 through a contact wiring line 38.

The magnetic resistance element 7 is provided on the extension wiring line 29. The direction of the spontaneous magnetization is inverted by the electric current which flows through the extension wiring line 29. Here, the electric current flows through the extension wiring line 29 in the X-axis direction. Therefore, the direction of the magnetic field applied to the magnetic resistance element 7 is the Y-axis direction. Thus, the magnetic resistance element 7 has an easy axis in the Y-axial direction. For example, the magnetic resistance element 7 has the shape of an ellipse having a long axis parallel to the Y-axis direction or a shape similar to the ellipse. The one end of the magnetic resistance element 7 is connected with the extension wiring line 29 and the other end thereof is connected with the ground wiring line 24 (not shown in FIG. 6). The ground (GND) wiring line 24 is formed unitarily because it is not necessary to separate the memory cells 2 individually.

Figure 7:
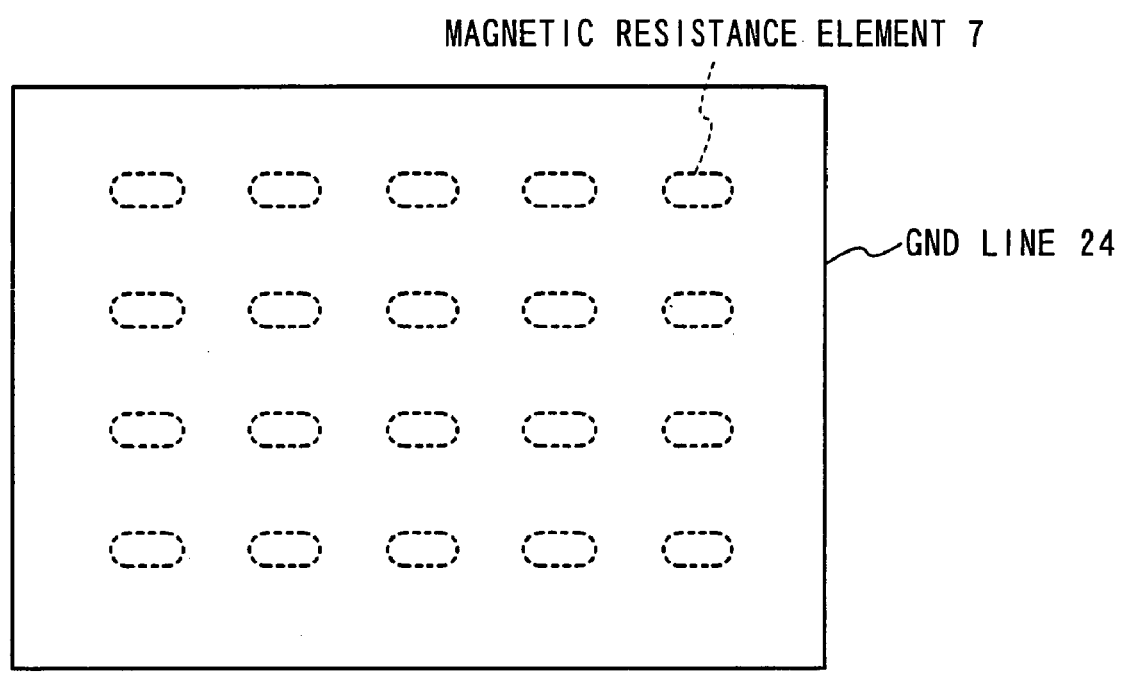
FIG. 7 is a diagram showing a ground wiring line.

FIG. 7 is a diagram showing the ground wiring line 24. The ground (GND) wiring line 24 is provided to cover the whole memory cell array section 1 far above the memory cell array section 1 shown in FIG. 6. Thus, the ground wiring line 24 has a magnetic field shielding effect. It should be noted that in FIG. 7, one memory cell 2 is shown as one magnetic resistance element 7.

Figure 8A:
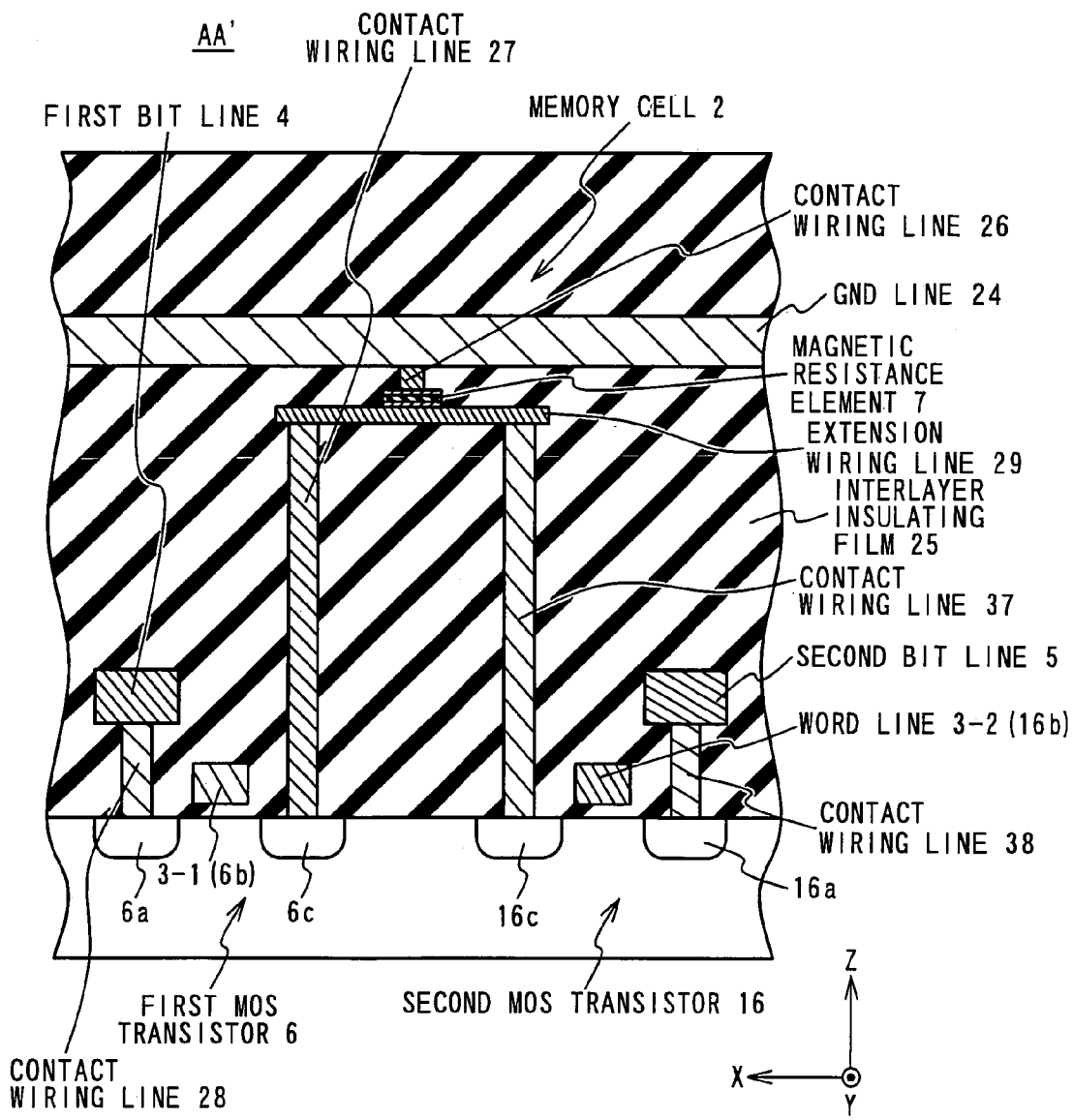
FIG. 8A is a cross sectional view of the memory cell along the AA' line shown in FIG. 7.

FIG. 8A is a cross sectional view of the memory cell 2 along the AA' line shown in FIG. 6. Referring to FIG. 6A, the first MOS transistor 6 is formed in the surface section of the semiconductor substrate. The source 6a of the first MOS transistor 6 is formed as a diffusion layer in the semiconductor substrate and is connected with the first bit line 4 through the contact wiring line 28 extending into the Z-axis direction. The drain 6c thereof as a diffusion layer is connected with one end of the extension wiring line 29 through the contact wiring line 27 extending into the Z-axis direction. The gate 6b thereof functions as the word line 3-1 which is branched from the word line 3. Here, the drain 6c is formed on the inner side of the memory cell 2 than the source 6a. The second MOS transistor 16 is formed in the surface section of the semiconductor substrate. The source 16a of the second MOS transistor 16 is provided as a diffusion layer in the semiconductor substrate and is connected with the second bit line 5 through the contact wiring line 38 extending into the Z-axis direction. The drain 16c thereof as a diffusion layer is connected with the other end of the extension wiring line 29 through the contact wiring line 37 extending into the Z-axis direction. The gate 16b thereof functions as the word line 3-2 which is branched from the word line 3. Here, the drain 16c is formed on the inner side of the memory cell 2 than the source 16a. The magnetic resistance element 7 is connected at one end with the extension wiring line 29. The other end thereof is connected with the ground (GND) wiring line 24 through the contact wiring line 26.

Figure 8B:
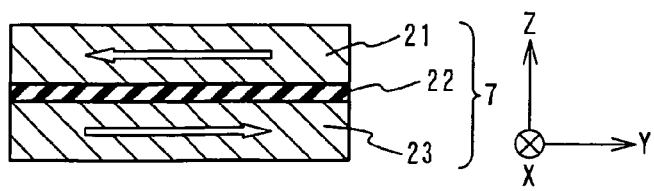
FIG. 8B is a cross sectional view of the magnetic resistance element.

FIG. 8B is a cross sectional view of the structure of the magnetic resistance element 7. The magnetic resistance element 7 is composed of a free layer 21, and a pin layer 23 and a tunnel insulating layer 22. The pin layer 23 is formed on the extension wiring line 29, the tunnel insulating layer 22 is formed on the pin layer 23 and the free layer 21 is formed on the tunnel insulating layer 22. The pin layer 23 and the free layer 21 are formed of ferromagnetic materials and have spontaneous magnetizations, respectively. The direction of the spontaneous magnetization of the pin layer 23 is fixed on the +X-axis direction. The spontaneous magnetization of the free layer 21 is invertible and possible to turn the +X-axis direction and the −X-axis direction. A write data written into the memory cell 2 is stored as the direction of the spontaneous magnetization of the free layer 21. The resistance value of the magnetic resistance element 7 varies based on the difference in the direction of the spontaneous magnetization of the free layer 21, and the stored data is read based on the difference in the resistance value of the magnetic resistance element 7. The tunnel insulating layer 22 is formed of an insulating film. The film thickness of the tunnel insulating layer 22 is thin to the extent that tunnel current can flow.

Figure 74:
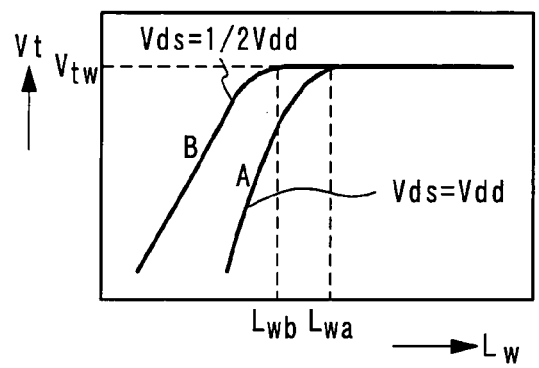
FIG. 74 is a graph showing a relation of gate length and threshold value voltage of a transistor.

FIG. 74 is a graph showing a relation between the gate length and the threshold value voltage in a transistor. The vertical axis shows the threshold voltage Vt and the horizontal axis shows the gate length Lw. Generally, the gate length Lw of the transistor is determined to have the minimum gate length Lwa for the stable threshold voltage Vtw except for a special case. The voltage Vds between the drain and the source at this time is power supply voltage Vdd (Curve A). However, considering only the electric current route ( . . . —the first bit line 4—the memory cell 2—the second bit line 5- . . . ) in the data write operation, devices such as the transistors exist on both sides of the magnetic resistance element 7. The devices have a device resistance. Therefore, supposing that each device is a resistance, the efficiency would be better if the resistances are separated on the side of power supply (Vdd) and the side of the ground (Gnd). In this case, the voltage of the magnetic resistance element 7 is approximately equal to or less than Vdd/2.

For the above reasons, in the present invention, the gate length Lw of the transistors which are in the electric current route in the data write operation, especially, the first MOS transistor 6 and the second transistor 16 of the memory cell 2 is optimized based on Vds (=Vdd/2) (Curve B). In case of the lower Vds, the stable threshold voltage Vtw is accomplished in a narrower gate length Lwb. Thus, the gate length Lwb can be made narrower than the gate length Lwa. The reduction of the cell area can be achieved directly by narrowing the gate length Lw.

Figure 75:
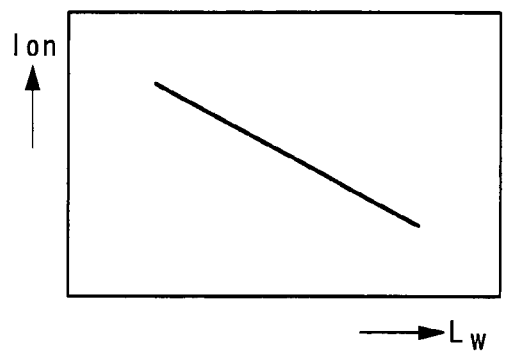
FIG. 75 is a graph showing a relation of electric current ability and the gate length of the transistor.

FIG. 75 is a graph showing relation of the electric current ability and the gate length of the transistor. The vertical axis shows the electric current ability Ion and the horizontal axis shows the gate length Lw. The electric current ability Ion of the transistor monotonously decreases as the gate length Lw increases. That is, as shown in FIG. 74, by shortening the gate length Lw, the larger write electric current can be flowed in the same memory cell area. Thus, the operation margin of the write electric current can be increased without increasing a chip area.

Figure 76:
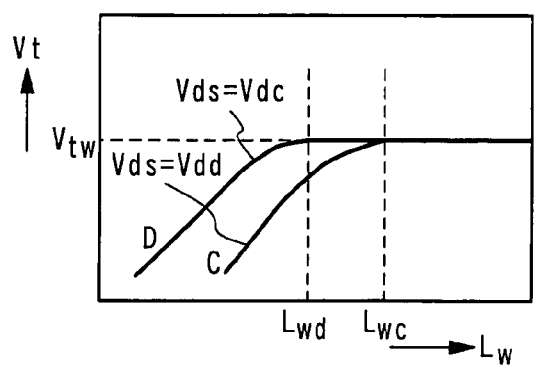
FIG. 76 is a graph showing a relation of the gate length and the threshold value voltage of the transistor.

FIG. 76 is a graph showing a relation of the gate length and the threshold voltage of the transistor. The vertical axis shows the threshold voltage Vt and the horizontal axis shows the gate length Lw. Generally, the stable threshold voltage Vtw of the transistor is controlled based on the concentration of impurities which are implanted into a silicon substrate and so on. When the threshold voltage Vtw is set to a lower value, it is possible to improve the electric current ability of the transistor in a typical transistor as derived from the equation of the electric current ability Ion $((Vgs-Vtw)^2$, where the voltage Vgs is a voltage between the gate and the source. On the other hand, however, when the threshold voltage Vtw is set to a low value, the gate length Lw becomes long. That is, a relation of Lwa<Lwc is met, like the gate length Lwc in the curve C shown in FIG. 76, as compared with the gate length Lwa in the curve A shown in FIG. 74. This value is not always favorable. Therefore, the threshold voltage Vtw is totally optimized.

If the voltage Vds is set to Vdd/2, as shown in FIG. 74, a lower threshold voltage Vtw can be set while keeping the gate length Lw short. Thus, as shown in FIG. 76 by the curve D, a transistor with the shorter gate length Lwd and the lower threshold voltage Vtw can be realized. Therefore, the larger write electric current can be flowed in the same memory cell area. Also, the operation margin of the write electric current can be increased without increasing a chip area.

The description accomplished with reference to FIGS. 74 to 76 can be applied to the other memory cells and memory cell arrays that the transistors exist on the route of the write electric current in the same way.

Figure 9:
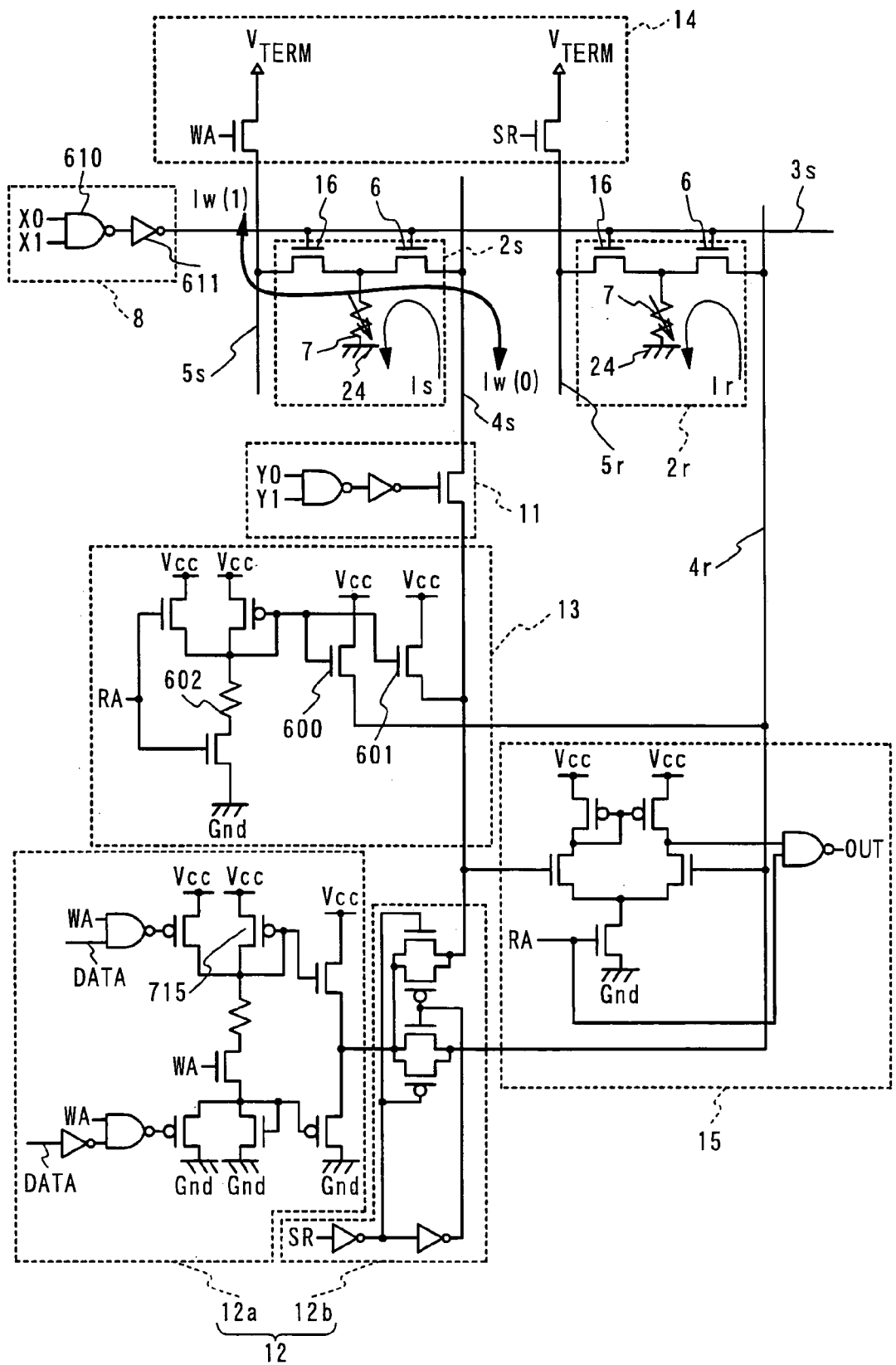
FIG. 9 is a diagram showing the operation of the magnetic random access memory containing the magnetic memory cells according to the first embodiment of the present invention.

FIG. 9 is a diagram showing a circuit example of the magnetic random access memory according to the first embodiment of the present invention. That is, FIG. 9 is a circuit diagram in which routes of the write electric current and a route of a read electric current are shown on one memory cell 2 used as an example.

Next, an operation of the magnetic random access memory containing the magnetic memory cells according to the first embodiment of the present invention will be described below.

The read operation of the data from the memory cell 2 is carried out as follows.

(1) Step S01

The X-selector 8 selects one from the plurality of word lines 3 as the selected word line 3s based on the input of a row address (X0 and X1 in this example). The first MOS transistor 6 and the second MOS transistor 16 in each of the memory cells 2 of a row corresponding to the selected word line 3s are turned on.

(2) Step S02

The Y-selector 11 selects one from the plurality of first bit lines 4 as the first selected bit line 4s based on the input of a column address (Y0 and Y1 in this example). In response to the read active signal RA, the read current load circuit 13 supplies a predetermined read electric current Is and a predetermined reference read electric current Ir which are supplied to the first selected bit line 4s via the Y-selector 11 and to the first reference bit line 4r. At this time, the read electric current Is flows from the read current load circuit 13 to the ground wiring line 24 through a route of the first selected bit line 4s, and the first MOS transistor 6, the extension wiring line 29 and the magnetic resistance element 7 of the selected memory cell 2s. In the same way, reference read electric current Ir flows from the read current load circuit 13 to the ground wiring line 24 through the route of the first reference bit line 4r, and the first MOS transistor 6, the extension wiring line 29 and the magnetic resistance element 7 of the selected reference memory cell 2r.

(3) Step S03

In response to the read active signal RA, the sense amplifier 15 outputs either of "1" or "0" based on the difference of the voltage on the first selected bit line 4s when the predetermined read electric current Is flows and the voltage on the first reference bit line 4r when the predetermined reference read electric current Ir flows.

Through the above data read operation, the data of the selected memory cell 2s can be read.

On the other hand, the write operation of the data into the memory cell 2 is carried out as follows.

(1) Step S11

The X-selector 8 selects one from the plurality of word lines 3 as the selected word line 3s based on the input of the row address (X0 and X1 in this example). The first MOS transistor 6 and the second MOS transistor 16 in each of the memory cells 2 are turned on.

(2) Step S12

The Y-selector 11 selects one from the plurality of first bit lines 4 as the first selected bit line 4s based on the input of the column address (Y0 and Y1 in this example). Also, the Y-side current terminating circuit 14 selects one from the plurality of second bit lines 5 as the second selected bit line 5s based on a write active signal WA and the column address (not shown). The first selected bit line 4s and the second selected bit line 5s forms a pair originally. At this time, the Y-side current terminating circuit 14 applies a predetermined voltage Vterm to the second selected bit line 5s. As a result, the electric current Iw(0) or the electric current Iw(1) flows through the route of the second selected bit line 5s—the second MOS transistor 16 of the selected memory cell 2s—the extension wiring line 29 of the selected memory cell 2s—the first MOS transistor 6 of the selected memory cell 2s—the first selected bit line 4s. The write electric current has a predetermined magnitude corresponding to a data signal Data. The flow direction of the write electric current is determined based on the data signal Data. The direction of the write electric current Iw(0) is a direction that the electric current flows into the Y-side current source circuit 12 in case of "0" and the direction of the write electric current Iw(1) is in a direction that the electric current flow out from the Y-side current source circuit 12 in case of "1".

(3) Step S13

The electric current Iw(0) (+X-axis direction) or the electric current Iw(1) (−X-axis direction) flows through the extension wiring line 29 connected with the magnetic resistance element 7, and a magnetic field is generated in the selected memory cell 2s into the −Y-axis direction or the +Y-axis direction. A direction of the spontaneous magnetization in the free layer 21 of the magnetic resistance element 7 is inverted based on the magnetic field and the spontaneous magnetization corresponding to the data signal Data is stored. It should be noted that a reference active signal SR is a signal to select the reference memory cell 2r. The data write operation to the reference memory cell 2r is the same as the data write operation to the selected memory cell 2s.

Through the above data write operation, the data can be written in the selected memory cell 2s.

Figure 10:
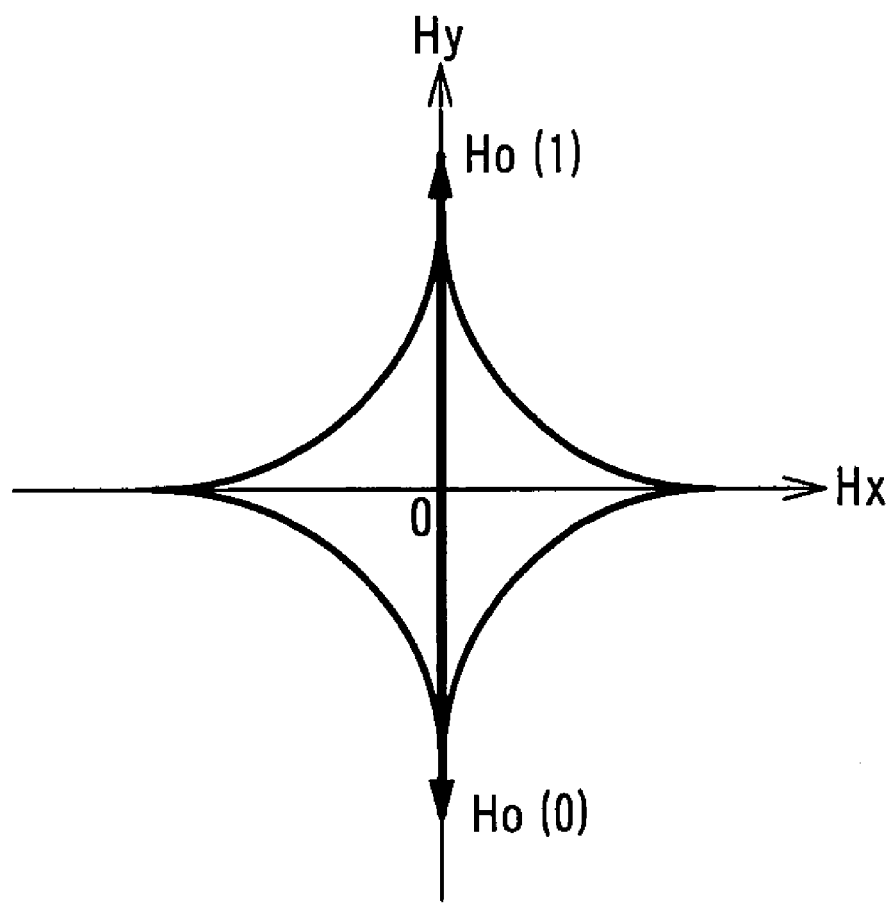
FIG. 10 is a graph showing comparison of a magnetic field H0 applied to a magnetic resistance element of a selected memory cell and an asteroid curve.

FIG. 10 is a graph showing comparison of the magnetic field H0 applied to the magnetic resistance element 7 of the selected memory cell 2s and the asteroid curve. The electric current Iw(0) and electric current Iw(1) are set in such a manner that the applied magnetic field H0 (H0(0) and H0(1)) has a magnitude extending to the outside of the asteroid curve. No electric current flow through the memory cell 2 which is not selected (hereinafter, to be referred to as a "non-selected memory cell 2"). Therefore, there is no fear of an erroneous data write operation into the non-selected memory cell 2 and it is possible to set a sufficiently large electric current.

The electric currents Iw(0) and Iw(1) in case of the data write operation never flow through the memory cells 2 other than the selected memory cell 2s and do not have any influence on the other memory cells 2. Therefore, it is possible to improve the reliability of the memory cell.

Moreover, the electric currents Iw(0) and Iw(1) in the data write operation never flow through the memory cells 2 other than the selected memory cell 2s. Thus, the selectivity can be improved when the memory cell 2 is selected.

In the conventional techniques, two of the write word line and the read word line are necessary, and also two output sections are required in correspondence to them. On the other hand, in this embodiment, the X-selector 8 is different from that in the conventional technique and selects only one word line 3 in the X-axis direction. Therefore, it is possible to decrease a chip area for a circuit area of the X-selector 8, a circuit area of the X-side current source circuit and an area of one word line.

Also, as shown in FIG. 8, because the magnetic resistance element 7 and the extension wiring line 29 are provided very near in the selected memory cell 2s, the write electric currents Iw(0) and Iw(1) flowing through the extension wiring line 29 can be made smaller.

Figure 77:
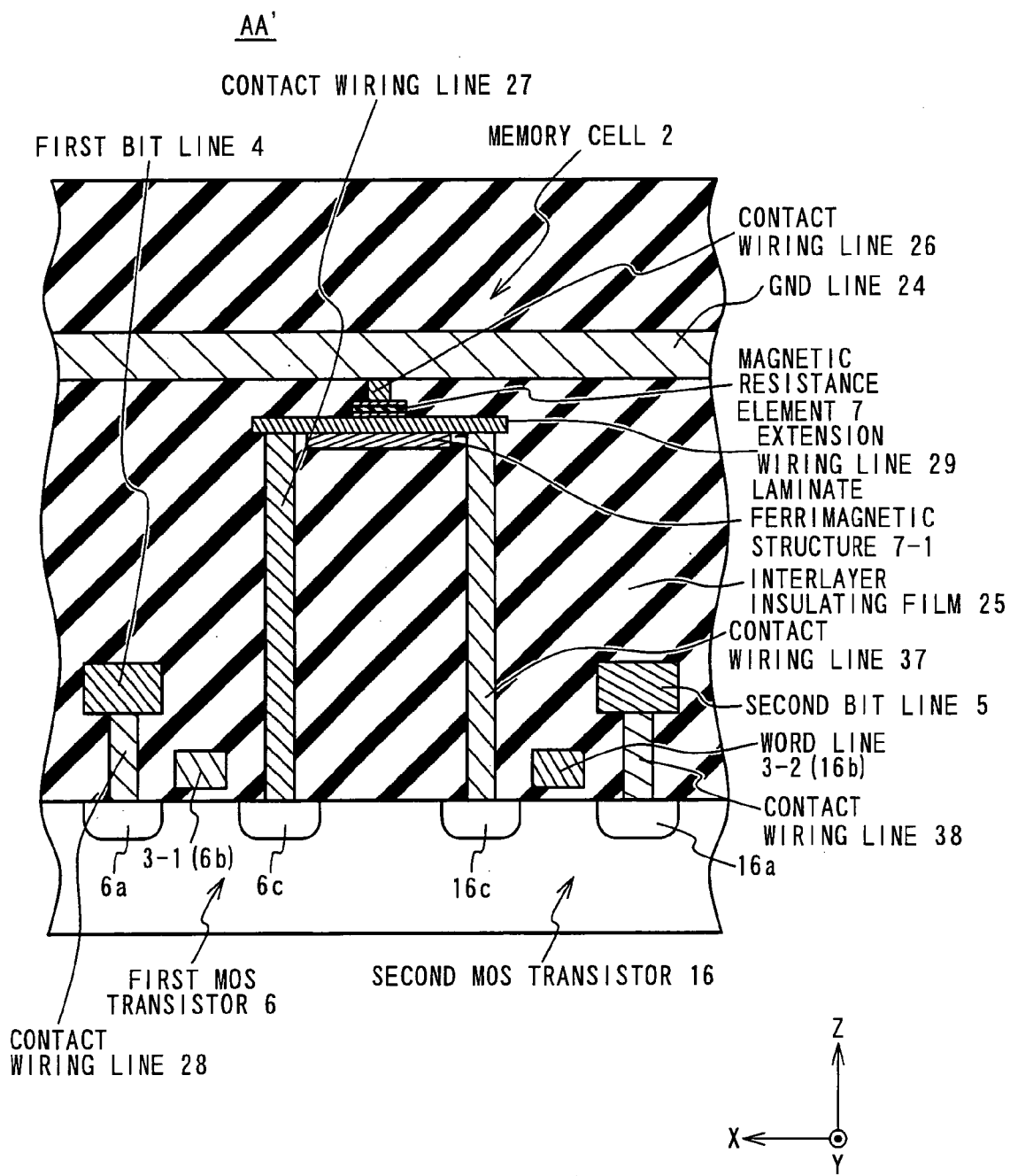
FIG. 77 is a cross sectional view of another example of the magnetic random access memory containing the magnetic memory cells according to the first embodiment of the present invention.

In this embodiment, as described below, it is possible to arrange a laminate ferri-magnaetic structure on the extension wiring line. FIG. 77 is a cross sectional view of a modification example of the magnetic random access memory containing the magnetic memory cells according to the first embodiment of the present invention. That is, FIG. 77 shows a modification example of the structure of the memory cell 2 and shows a cross sectional view of the memory cell along the AA' line shown in FIG. 6.

Figure 73:
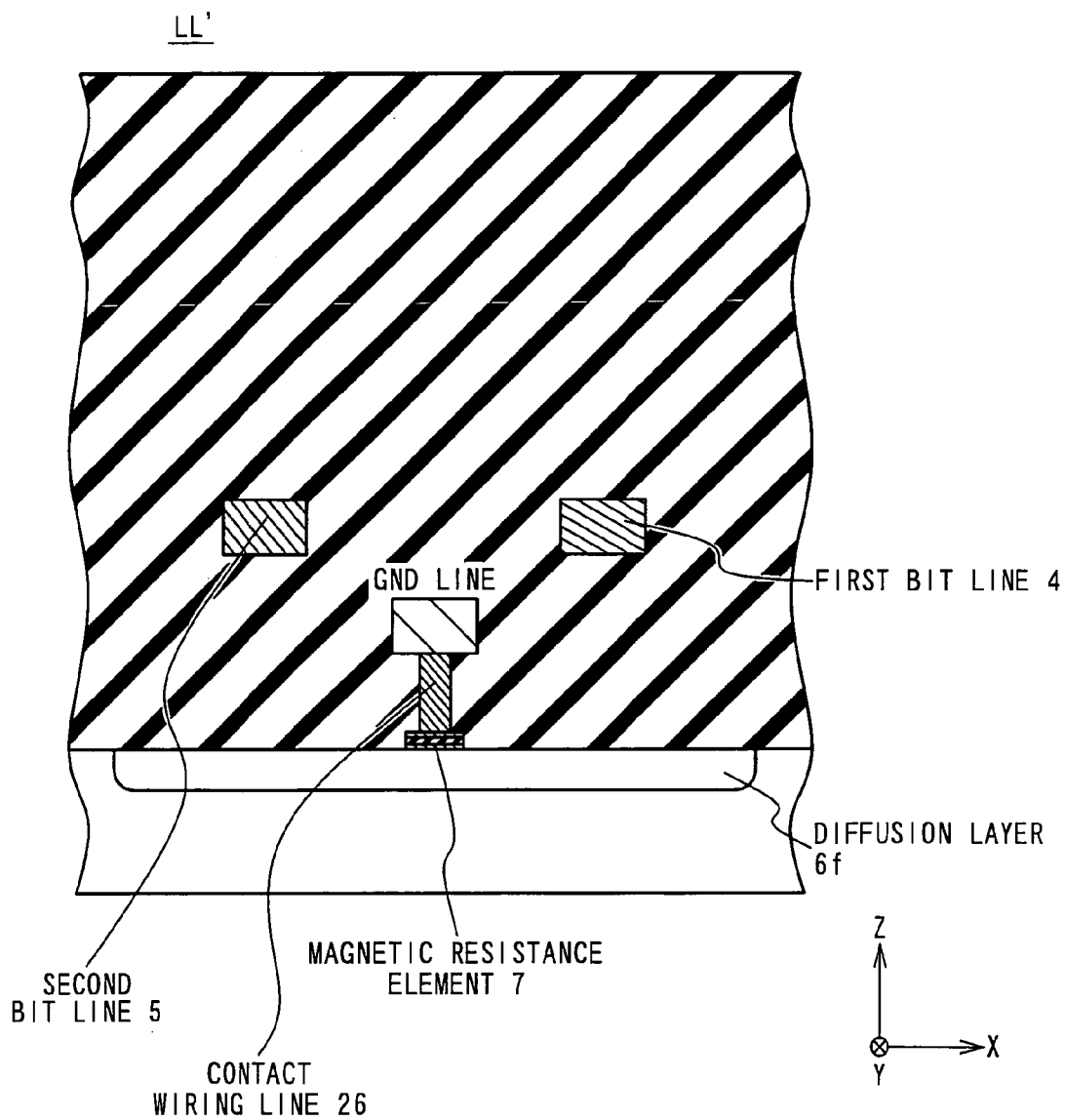
FIG. 73 is a cross sectional view of the memory cell along the LL' line shown in FIG. 72.

The laminate ferri-magnaetic structure 7-1 is arranged on the side opposite to the magnetic resistance element 7 with respect to the extension wiring line 29, i.e., on the side of the substrate in FIG. 73. It is desirable that the laminate ferri-magnaetic structure 7-1 has a size equal to or larger than the magnetic resistance element 7 for example. It is desirable that the arrangement position of the laminate ferri-magnaetic structure 7-1 is directly below the magnetic resistance element 7 via the extension wiring line 29. Thus, the influence of the magnetic field to the magnetic resistance element 7 by the laminate ferri-magnaetic structure 7-1 can be made larger.

Figure 78:
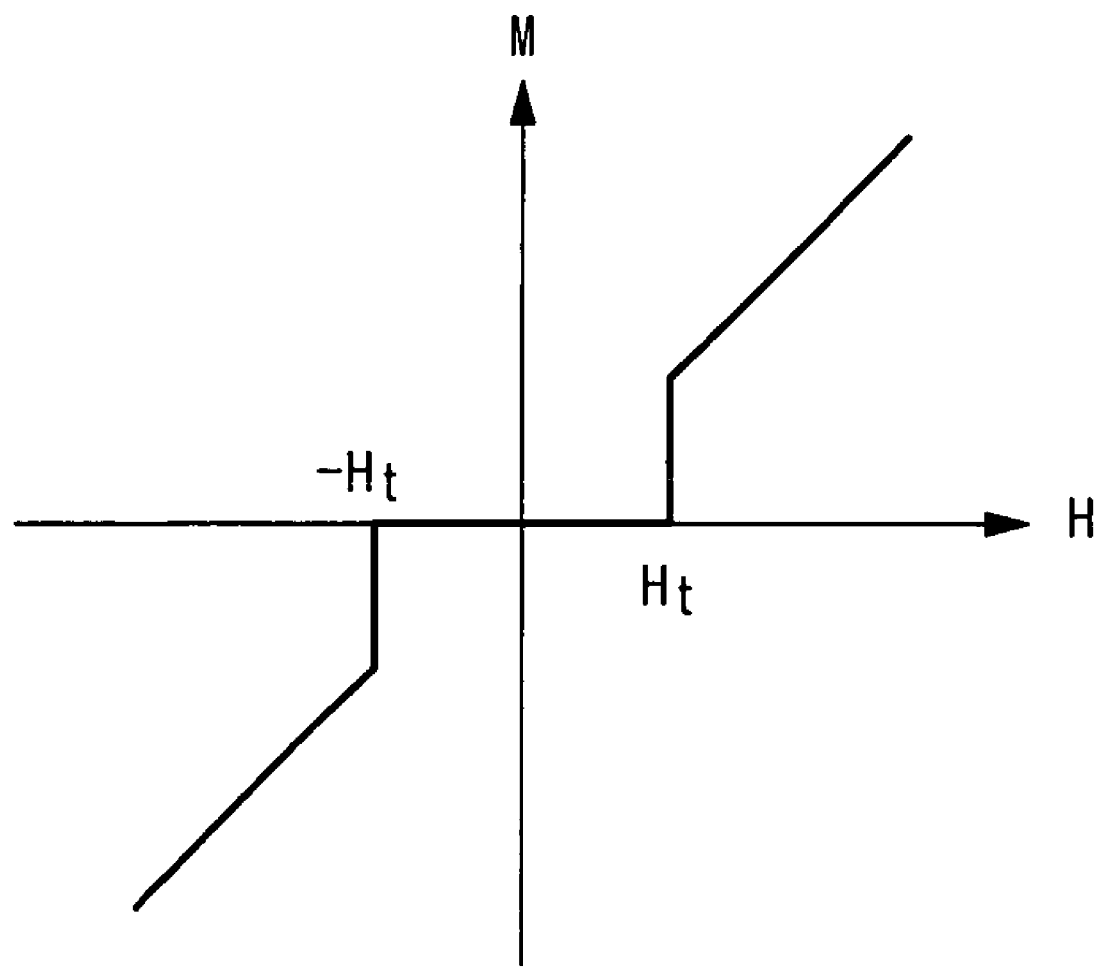
FIG. 78 is a graph showing the characteristic of a laminate ferrimagnetic structure.

FIG. 78 is a graph showing the characteristics of the laminate ferri-magnaetic structure 7-1. The vertical axis shows the spontaneous magnetization (M) and the horizontal axis shows the magnetic field (H). As shown in this graph, the structure of the laminate ferri-magnaetic structure 7-1 is designed in such a manner that the spontaneous magnetization (M) is 0 when an absolute value of the magnetic field (H) is below a threshold value (Ht).

Figure 79:
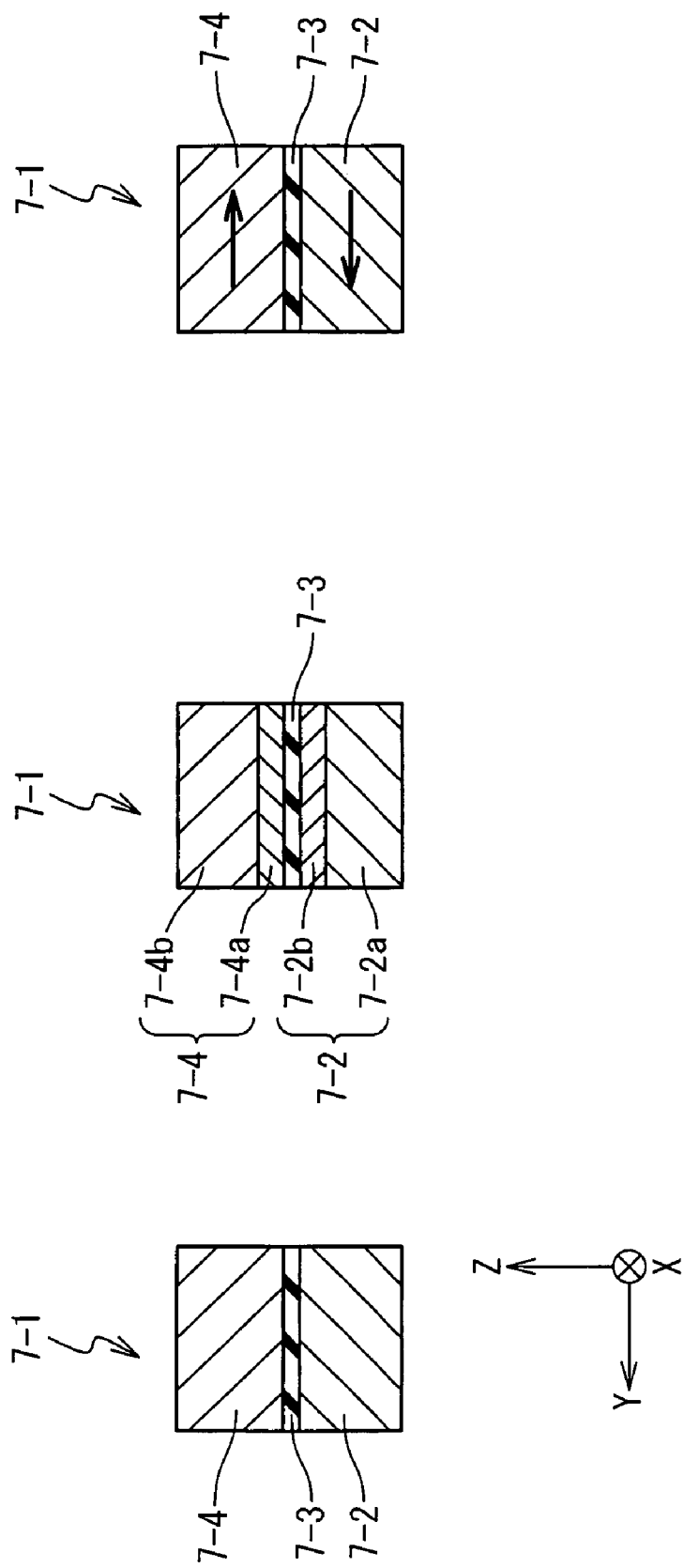
FIGS. 79A to 79C are diagrams showing the structure of the laminate ferri-magnaetic structure.

FIGS. 79A to 79C show the structure of the laminate ferri-magnaetic structure 7-1. The laminate ferri-magnaetic structure 7-1 contains a first magnetic layer 7-2, a non-magnetic spacer layer 7-3 and a second magnetic layer 7-4 as shown in FIG. 79A. The first magnetic layer 7-2 and the second magnetic layer 7-4 are formed of the ferromagnetic material. The non-magnetic spacer layer 7-3 is interposed between the first magnetic layer 7-2 and the second magnetic layer 7-4 and is formed of non-magnetic substance.

The film thickness t of the non-magnetic spacer layer 7-3 of the laminate ferri-magnaetic structure 7-1 is set in such a manner that the first magnetic layer 7-2 and the second magnetic layer 7-4 are combined with each other anti-ferromagnetically. Therefore, the first magnetic layer 7-2 and the second magnetic layer 7-4 have the spontaneous magnetizations of directions opposite to each other, in the state that any magnetic field is not applied to the laminate ferri-magnaetic structure 7-1, as shown in FIG. 79C. In this state, the whole magnetization of the laminate ferri-magnaetic structure 7-1 is substantially 0. That is, in the state that the magnetic field is not applied to the laminate ferri-magnaetic structure 7-1, the laminate ferri-magnaetic structure 7-1 dose not have a magnetic moment substantially.

It is desirable in the point that an offset magnetic field of the magnetic resistance element 7 is small, that the first magnetic layer 7-2 and the second magnetic layer 7-4 are combined anti-ferromagnetically so that the laminate ferri-magnaetic structure 7-1 does not have a magnetic moment as a whole. For example, when the laminate ferri-magnaetic structure 7-1 has a magnetic moment as a whole, the magnetic field generated by the magnetic moment is applied to the magnetic resistance element 7. Therefore, in the state that the write electric current Iw does not flow through the extension wiring line 29, the magnetic field generated by the magnetic moment is applied to the magnetic resistance element 7. This magnetic field produces a switching magnetic field (coercive magnetization) when the spontaneous magnetization of the free layer of the magnetic resistance element 7 is inverted asymmetry, and becomes a cause that the magnetic resistance element 7 has an offset magnetic field. The existence of the offset magnetic field in the magnetic resistance element 7 is not desirable in the point to increase the write electric current Iw and to decrease the operation margin of the memory cell 2. It prevents the production of the offset magnetic field in the magnetic resistance element 7 effectively that the laminate ferri-magnaetic structure 7-1 has no magnetic moment.

FIG. 79B shows the suitable structure of the laminate ferri-magnaetic structure 7-1. In the suitable laminate ferri-magnaetic structure 7-1, the first magnetic layer 7-2 contains a NiFe layer 7-2a and a CoFe layer 7-2b, and the second magnetic layer 7-4 contains a CoFe layer 7-4a and a NiFe layer 7-4b. The non-magnetic spacer layer 7-3 is formed of a Ru layer. The CoFe layer 7-2b is formed on the NiFe layer 7-2a, and the Ru layer 7-3 is formed on the CoFe layer 7-2b. The CoFe layer 7-4a is formed on the Ru layer 7-3, and the NiFe layer 7-4b is formed on the CoFe layer 7-4a.

The laminate ferri-magnaetic structure 7-1 having such a structure has the advantages in that the control of the characteristic of the laminate ferri-magnaetic structure 7-1 is easy, and therefore, the design thereof is easy. The strength of the magnetization of the laminate ferri-magnaetic structure 7-1 can be determined independently based on the thickness of the NiFe layer 7-2a and the thickness of the NiFe layer 7-4b. Moreover, a combination constant between the first magnetic layer 7-2 and the second magnetic layer 7-4 can be determined independently based on the thickness of the Ru layer 7-3. In this way, the characteristics of the laminate ferri-magnaetic structure 7-1 can be freely determined based on the thicknesses of the NiFe layer 7-2a, NiFe layer 7-4b and Ru layer 7-3.

Figure 80:
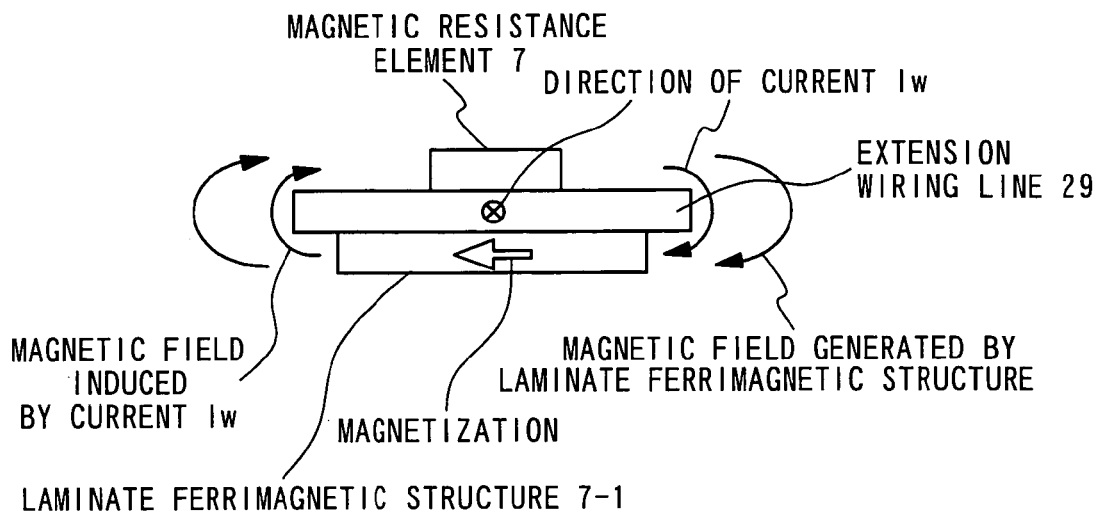
FIG. 80 is a diagram showing the operation of the magnetism structure which is composed of a magnetic resistance element and the laminate ferri-magnaetic structure.

FIG. 80 is a diagram showing the operation of the magnetism structure composed of the magnetic resistance element and the laminate ferri-magnaetic structure. The laminate ferrimagnetic structure 7-1 is magnetized by the magnetic field HI generated based on the write electric current Iw. Here, HI>Ht. The magnetic field HJ is generated through this magnetization. Thus, an effective magnetic field H to the magnetic resistance element 7 becomes H=HI+HJ. That is, the effective magnetic field H becomes larger than the magnetic field HI which is generated based on only the write electric current Iw. Therefore, even if the same electric current flows to the same memory cell area, the magnetic field in case of the data write operation can be made larger. Thus, the operation margin can be increased without increasing a chip area.

The description accomplished with reference to FIGS. 77 to 80 can be applied in the same way to the other memory cells and the memory cell array.

Second Embodiment

Figure 11:
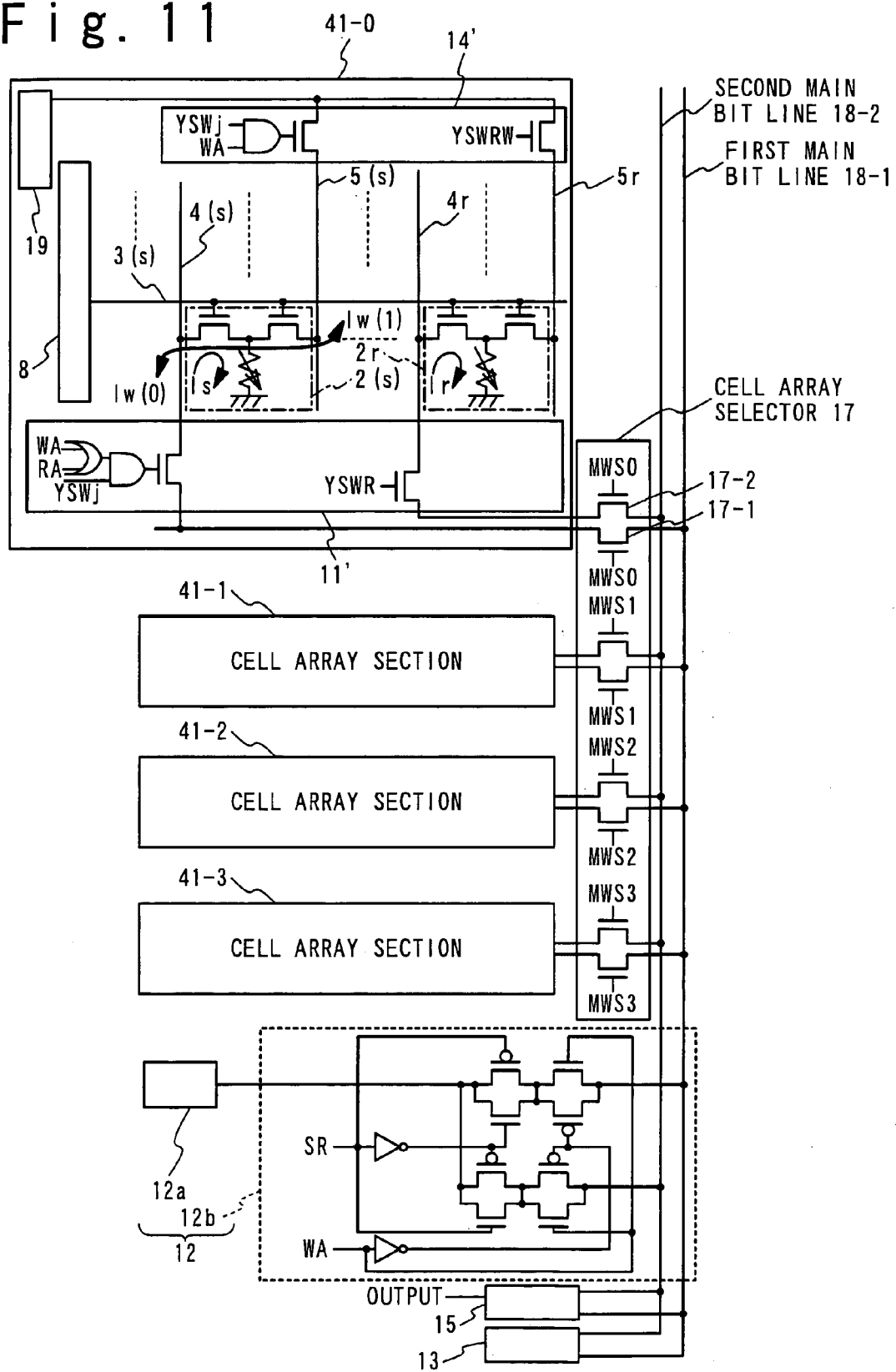
FIG. 11 is a diagram showing the structure of the magnetic random access memory containing the magnetic memory cells according to a second embodiment of the present invention.

The magnetic random access memory containing the magnetic memory cells according to the second embodiment of the present invention will be described. FIG. 11 is a diagram showing the structure of the magnetic random access memory containing the magnetic memory cells according to the second embodiment of the present invention. Referring to FIG. 11, the magnetic random access memory of this embodiment is composed of memory cell array sections 41-0 to 41-3, a memory cell array selector 17, the Y-side current source circuit 12, the read current load circuit 13 and the sense amplifier 15. It should be noted that although the four memory cell arrays 41 are shown in FIG. 11, the present invention is not limited to this number.

Each of the memory cell array sections 41-0 to 41-3 is composed of the plurality of word lines 3, the plurality of first bit lines 4 (containing the first reference bit line 4r), the plurality of second bit lines 5 (containing the second reference bit line 5r), the X-selector 8, a Y-selector 11', the Y-side current terminating circuit 14, and the Y-side power supply circuit 19. The memory cell array 41-i (i=1 to 3) is the same circuit structure as the memory cell array section 1 shown in FIG. 5 but is different from it in the circuit structures of the Y-selector 11' and the Y-side current terminating circuit 14'.

Here, YSWj (j is an integer between 0 to m and m+1 is the number of bit lines 4) is a signal used to select the j-th bit line of the plurality of bit lines 4 and is generated an address, WA is the write active signal, RA is the read active signal, YSWR is the signal used to select the reference memory cell in case of a reference data write operation and a reference data read operation, YSWRW is the signal used to select the reference memory cell 2r in case of the reference data write operation, and SR is a signal used to activate the reference memory cell 2r. They are same in the whole of specification.

The Y-selector 11' selects one of the plurality of first bit lines 4 as the first selected bit line 4s in the data write operation and the data read operation based on the write active signal WA, the read active signal RA and a bit line selection signal YSWj which is activated based on the column address. Also, the Y-selector 11' selects the first reference bit line 4r in the data write operation and the data read operation based on a read write reference selection signal YSWR. The Y-side current terminating circuit 14' selects one of the plurality of second bit lines 5 as the second selected bit line 5s in the data write operation based on the write active signal WA and the bit line selection signal YSWj. Also, the Y-side current terminating circuit 14' selects the second reference bit line 5r in the data write operation based on a write reference selection signal YSWRW. The remaining structure of the memory cell array section in the second embodiment is the same as that of the memory cell array section in the first embodiment. Therefore, the description of the memory cell array sections 41-0 to 41-3 will be omitted.

The memory cell array selector 17 has four pairs of selector transistors 17-1 and 17-2 and selects one from the memory cell array sections 41-0 to 41-3 as a selected memory cell array 41-i based on a memory cell array selection signal MWSi (i is an integer between 0 and 3, and corresponds to a number of the memory cell array sections 41). The memory cell array selection signal MWSi is determined based on an address (the same is true in the following description). The Y-side current source circuit 12, the read current load circuit 13 and the sense amplifier 15 are connected with the selected memory cell array section 41-i by the first main bit line 18-1 and the second main bit line 18-2. The read current load circuit 13 and the sense amplifier 15 are the same as those in the first embodiment. Therefore, the description of them will be omitted. The Y-side current source circuit 12 contains the constant current source 12a and the selection section 12b. The selection section 12b selects the first main bit line 18-1 in case of the data write operation into the selected memory cell 2s and the second main bit line 18-2 in case of the data write operation into the selected reference memory cell 2s. The constant current source 12a has a transistor (not shown) to connect the write electric current to the ground potential, as in the first embodiment.

Next, the operation of the magnetic random access memory containing the magnetic memory cells according to the second embodiment of the present invention will be described below.

In the magnetic random access memory shown in FIG. 11, the data read operation of the data from the memory cell 2 is carried out as follows.

(1) Step S21

In the memory cell array selector 17, the pair of the selector transistors 17-1 and 17-2 is turned on based on the memory cell array selection signal MWSi and one of the memory cell array sections 41-i is selected as the selected memory cell array section 41-i. At this time, the selected memory cell array section 41-i is connected with the read current load circuit 13 and the sense amplifier 15 by the first main bit line 18-1 and the second main bit line 18-2.

(2) Step S22

Hereinafter, the operation of the same steps S01 to S03 as in the first embodiment is carried out. However, at the step S02, the Y-selector 11' selects the first reference bit line 4r in addition to the first selected bit line 4s, based on the read active signal RA, the bit line selection signal YSWj and the reference read and write signal YSWR.

Through the above data read operation, the data of the desired selected memory cell 2s can be read in the desired selected memory cell array section 41-i.

Next, the data write operation of the data into the memory cell 2 is carried out as follows.

(1) Step S31

In the memory cell array selector 17, one pair of the corresponding selector transistors 17-1 and 17-2 is turned on based on the selected memory cell array selection signal MWSi and one of the memory cell array sections 41-0 to 41-3 is selected as the selected memory cell array section 41-i. At this time, the selected memory cell array section 41-i is connected with the Y-side current source circuit 12 by the first main bit line 18-1 and the second main bit line 18-2.

(2) Step S32

Hereinafter, the operation of the same steps S11 to S13 as in the first embodiment is carried out. In this case, the Y-selector 11' selects the first selected bit line 4s based on the write active signal WA, and the bit line selection signal YSWj. Also, the Y-side current terminating circuit 14' selects one of the plurality of second bit lines 5 as the second selected bit line based on the write active signal WA and the bit line selection signal YSWj. Thus, the second selected bit line 5s is applied with the predetermined voltage.

Through the above data write operation, the data can be written in the desired selected memory cell 2s in the desired selected memory cell array section 41-*i*. It should be noted that when the data write operation into the reference memory cell 2r is carried out, the Y-side current source circuit 12 selects the second main bit line 18-2 based on the reference active signal SR. The Y-selector 11' selects the first reference bit line 4r based on the reference read write signal YSWR. The Y-side current terminating circuit 14 selects the second reference bit line 5r based on the reference write signal YSWRW.

According to the second embodiment, the same effect as in the first embodiment can be achieved. Also, the magnetic random access memory can be made small because the plurality of memory cell arrays are arranged in a hierarchy and the Y-side current source circuit 12, the read current load circuit 13 and the sense amplifier 15 are used in common to the memory cell array sections.

Third Embodiment

Figure 12:
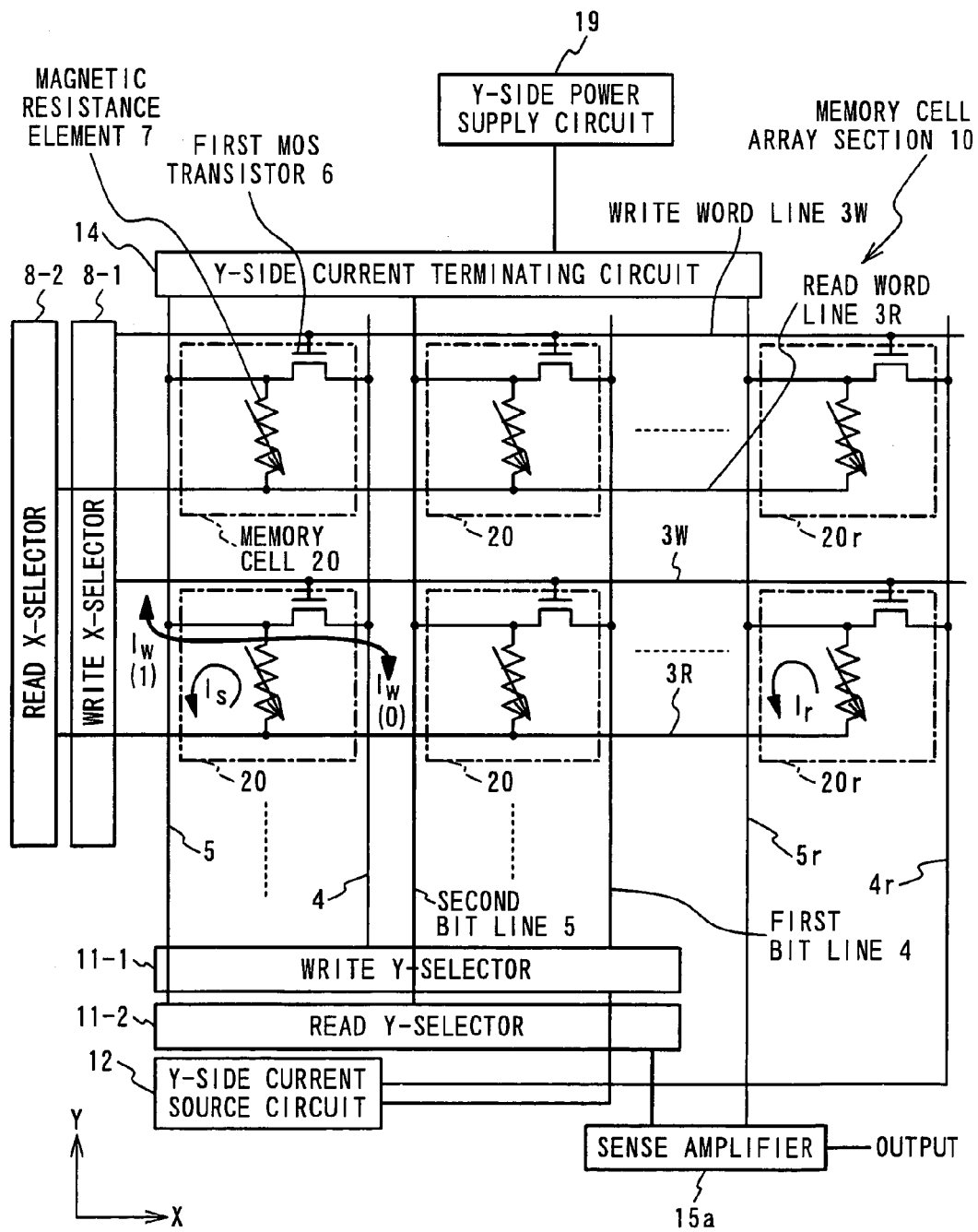
FIG. 12 is a diagram showing the structure of the magnetic random access memory containing the magnetic memory cells according to a sixth embodiment of the present invention.

The magnetic random access memory containing the magnetic memory cells according to the third embodiment of the present invention will be described. FIG. 12 is a diagram showing the structure of the magnetic random access memory containing the magnetic memory cells according to the third embodiment of the present invention. Referring to FIG. 12, the magnetic random access memory in this embodiment is composed of a memory cell array section 10, the Y-side current source circuit 12, and a current sense amplifier 15a. The memory cell array section 10 is compose of a plurality of memory cells 20, a plurality of write word lines 3W, a plurality of read word lines 3R, the plurality of first bit lines 4, the plurality of second bit lines 5, a write X-selector 8-1, a read X-selector 8-2, a write Y-selector 11-1, a read Y-selector 11-2, and the Y-side power supply circuit 19, and the Y-side current terminating circuit 14.

The plurality of first bit lines 4 are provided to extend into the Y-axis direction. One of the plurality of first bit lines 4 is referred to as the first reference bit line 4r. The plurality of first bit lines 4 except for the first reference bit line 4r are connected with the write Y-selector 11-1. Each of the plurality of second bit lines 5 forms a pair together with a corresponding to one of the plurality of first bit lines 4 and is provided to extend into the Y-axis direction. One of the plurality of second bit lines 5 is referred to as the second reference bit line 5r. The plurality of first bit lines 4 except for the second reference bit line 5r are connected with the read Y-selector 11-2. Also, the plurality of second bit lines are connected with the Y-side current terminating circuit 14 containing the second reference bit line 5r. The plurality of write word lines 3W are provided to extend into the X-axis direction substantially perpendicular to the Y-axis direction and is connected with the write X-selector 8-1. Each of the plurality of read word lines 3R forms a pair together with a corresponding one of the plurality of write word lines 3W and is provided to extend into the X-axis direction. The plurality of read word lines 3R are connected with the read X-selector 8-2. The above memory cells 20 are respectively provided for the positions where the plurality of sets of the first bit line and the second bit line and the plurality of sets of the write word line 3W and the read word line 3R intersect.

The write X-selector 8-1 selects one from the plurality of write word lines 3W as a selected write word line 3W in case of the data write operation. In case of the data write operation, the read X-selector 8-2 selects one from the plurality of read word lines 3R as a selected read word line 3R and fixes it to the GND (the ground) voltage. Also, in case of the data read operation, the read X-selector 8-2 selects one from the plurality of read word lines 3R as the selected read word line 3R and fixes it on a predetermined read voltage Vread (for example, 0.5 V). The write Y-selector 11-1 selects one of the plurality of first bit lines 4 as the first selected bit line 4s in case of the data write operation. The read Y-selector 11-2 selects one from the plurality of second bit lines 5 as the second selected bit line 5s in case of the data read operation. The memory cell 2 selected by the selected write/read word lines 3Ws/3Rs and the first/second selected bit lines 4s/5s is referred to as the selected memory cell 2s. The Y-side current terminating circuit 14 selects one from the plurality of second bit lines 5 as the second selected bit line 5s which forms a pair together with the first selected bit line 4s in case of the data write operation. The Y-side power supply circuit 19 applies a predetermined voltage to the Y-side current terminating circuit 14 in case of the data write operation.

The Y-side current source circuit 12 is the an electric current source which carries out the supply or drawing-out of a predetermined write electric current to or from the first selected bit line 4s in case of the data write operation. The Y-side current source circuit 12 is composed of a constant current source 12a which supplies a constant current and the selection section 12b to set the bit line for write electric current to flow. Here, the predetermined write electric current by the Y-side current source circuit 12 flows into the write Y-selector 11-1 or flows out from the write Y-selector 11-1 through the route of the first selected bit line 4s—the selected memory cell 2s—the second selected bit line 5s in accordance with a write data.

The sense amplifier 15a reads a stored data from the selected memory cell 2s based on the difference between the read electric current which flows through the second reference bit line 5r connected with the selected reference memory cell 20r and the read electric current which flows through the second selected bit line 5s connected with the selected memory cell 2s and output the read data.

In the memory cell array section 10, the memory cells 20 are arranged in a matrix. The memory cell 20 contains the first MOS transistor 6, the extension wiring line 29, and the magnetic resistance element 7. In the first MOS transistor 6 of the memory cell 20, a gate is connected with the write word line 3W, a source is connected with the first bit line 4 and a drain is connected with one end of the magnetic resistance element 7 and the second bit line 5 via the extension wiring line 29. It should be noted that the memory cell 20 is different from the memory cell 2 in the first embodiment in the point that the memory cell 20 does not have the second MOS transistor 16. The first MOS transistor 6 is used to supply an electric current in the neighborhood of the magnetic resistance element 7, by connecting the first bit line 4 and the second bit line 5 in the data write operation. The magnetic resistance element 7 is connected at one end with the drain of the first MOS transistor 6 via the extension wiring line 29 and is connected with the read word line 3R at the other end. The direction of the spontaneous magnetization of the magnetic resistance element 7 is inverted in accordance with a write data.

Figure 13:
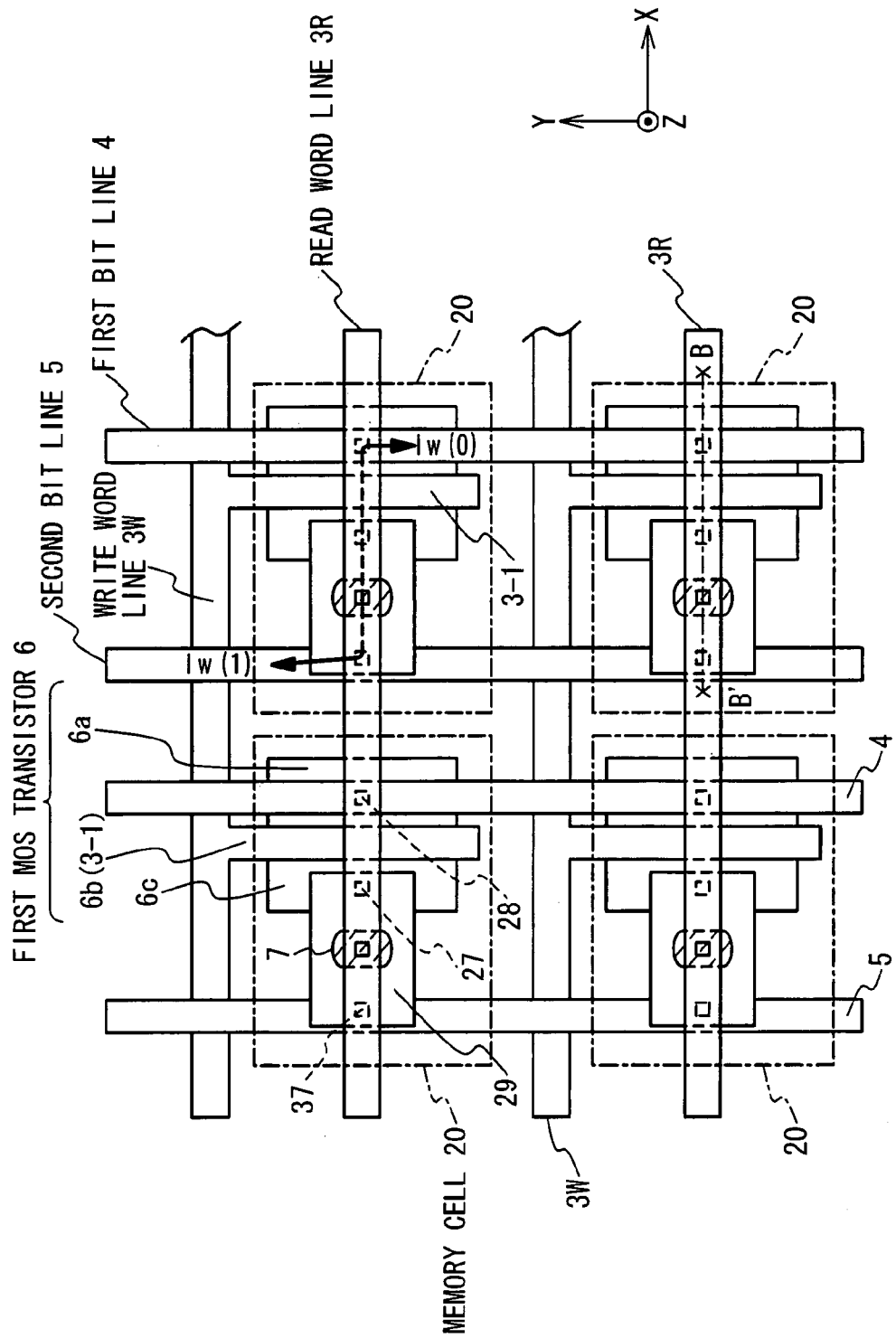
FIG. 13 is a plan view of the magnetic random access memory shown in FIG. 12.

FIG. 13 is a plan view of the memory cell array of the magnetic random access memory shown in FIG. 12. Referring to FIG. 13, the memory cells 20 of 2×2 in the memory cell array section 10 are shown as the representative cells. In the first MOS transistor 6 of the memory cell 20, the source 6a is connected with the first bit line 4 through a contact wiring line 28, the gate 6b is s write word line 3-1 which is branched in the Y-axis direction from the write word line 3W, and the drain 6c is connected with the second bit line 5 through a contact wiring line 27—the extension wiring line 29—the contact wiring line 37. The magnetic resistance element 7 is provided on the extension wiring line 29. The direction of the spontaneous magnetization is inverted depending on the electric current which flows through the extension wiring line 29. Because the electric current flows through the extension wiring line 29 in the X-axis direction, the direction of the magnetic field applied to the magnetic resistance element 7 is the Y-axis direction. Therefore, the magnetic resistance element 7 is provided to have an easy magnetization axis in the Y-axis direction. For example, the magnetic resistance element 7 has an ellipse shape having a long axis parallel in the Y-axis direction or a shape similar the ellipse. The one end of the magnetic resistance element 7 is connected with the extension wiring line 29 and the other end is connected with the read word line 3R.

Figure 14:
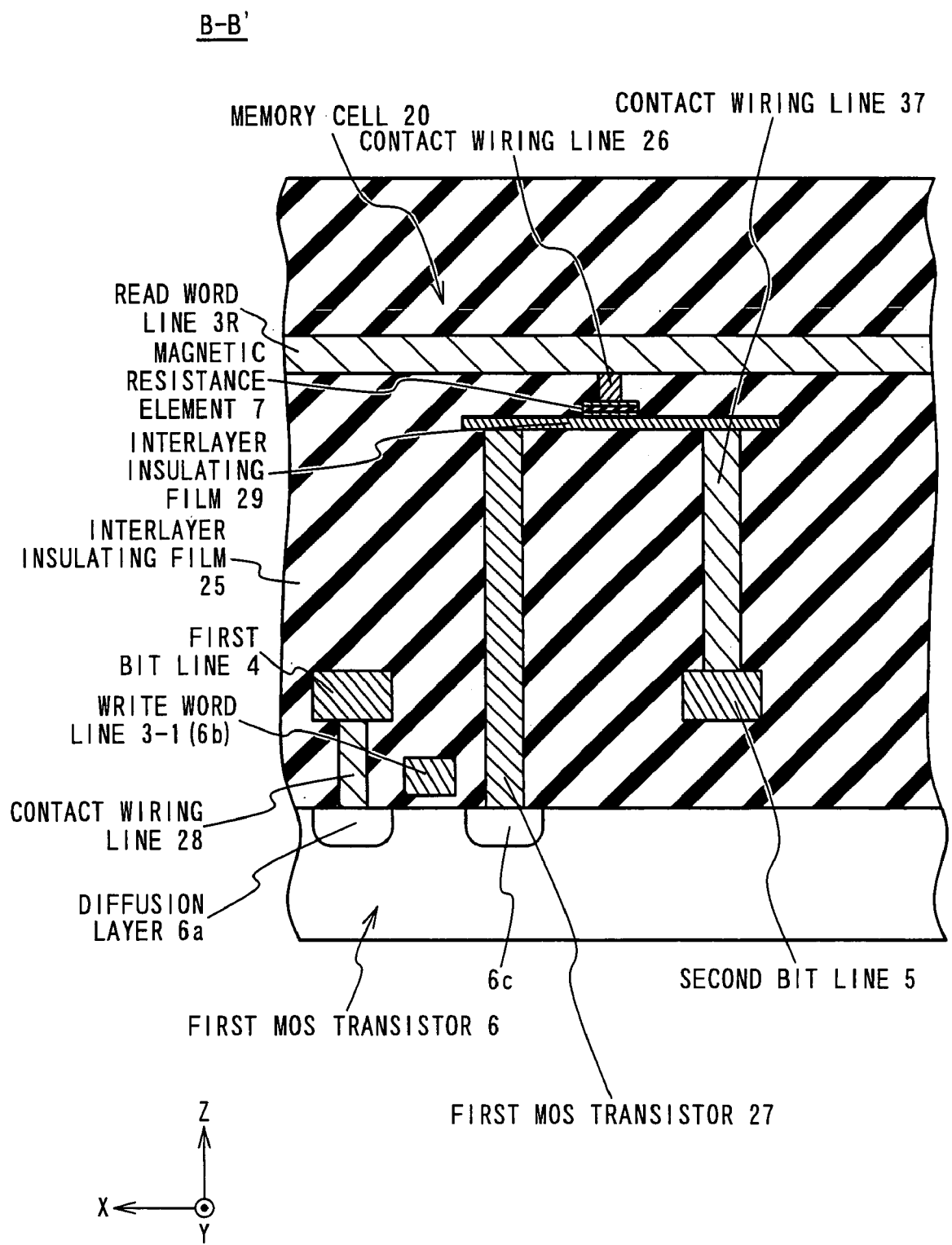
FIG. 14 is a cross sectional view of the memory cell along the BB' line at FIG. 13.

FIG. 14 is a cross sectional view of the structure of the memory cell 20 along the BB' line shown in FIG. 13. Referring to FIG. 14, the first MOS transistor 6 is formed in the surface section of the semiconductor substrate. The source 6a of the first MOS transistor 6 is provided in the semiconductor substrate and is connected with the first bit line 4 through the contact wiring line 28 extending into the Z-axis direction. The drain 6c thereof is connected with the one end of the extension wiring line 29 through the contact wiring line 27 extending into the Z-axis direction. The gate 6b thereof is the write word line 3-1 which is branched from the write word line 3W. In this example, the drain 6c is provided on the inner side of the memory cell 20 than the source 6a. The other end of the extension wiring line 29 is connected with the contact wiring line 37 extending from the second bit line 5 into the Z-axis direction. The extension wiring line 29 is provided in parallel to the semiconductor substrate. The magnetic resistance element 7 is provided on the extension wiring line 29 to be connected with it at the one end. The other end thereof is connected with the read word line 3R through the contact wiring line 26.

Next, the operation of the magnetic random access memory containing the magnetic memory cells according to the third embodiment of the present invention will be described below.

The data read operation from the memory cell 2 is carried out as follows.

(1) Step S41

The read X-selector 8-2 selects one from the plurality of read word lines 3R as the selected read word line 3R based on a row address. Thus, the selected reference memory cell 20r is determined.

(2) Step S42

The read Y-selector 11-2 selects one from the plurality of second bit lines 5 as the second selected bit line 5s based on a column address. Thus, the selected memory cell 20s is determined. Thus, the read electric current Is flows through the route of the read X-selector 8-2—the selected read word line 3R——the magnetic resistance element 7 of the selected memory cell 20s—the second selected bit line 5s—the read Y-selector 11-2—the current sense amplifier 15a based on the voltage difference between the read X-selector 8-2 and the current sense amplifier 15a to reflect the data stored in the selected memory cell 20s. On the other hand, the reference read electric current Ir flows through the route of the read X-selector 8-2—the selected read word line 3R—the magnetic resistance element 7 of the selected reference memory cell 20r—the second reference bit line 5r—the current sense amplifier 15a to reflect the data "0" stored in the reference memory cell 20r.

(3) Step S43

The current sense amplifier 15a determines the read data to be "0" if the read electric current Is and the reference read electric current Ir are approximately the same and to be "1" if they are different from each other (for example, the difference between them is large) and outputs the result.

Through the above data read operation, the data of the selected memory cell 2s can be read.

Next, the data write operation of the data into the memory cell 2 is carried out as follows.

(1) Step S51

The write X-selector 8-1 selects one from the plurality of write word lines 3W as the selected write word line 3W based on the row address. Thus, the first MOS transistor 6 of each of the memory cells 20 connected with the selected write word lines 3W is turned on.

(2) Step S52

The write Y-selector 11-1 selects one from the plurality of first bit lines 4 as the first selected bit line 4s based on the column address. Also, in response to the write active signal WA, the Y-side current terminating circuit 14 selects one from the plurality of second bit lines 5 as the second selected bit line 5s. Thus, the selected memory cell 20s is determined. The first selected bit line 4s and the second selected bit line 5s is a pair originally. The read word line 3R is fixed on the GND voltage. At this time, the Y-side power supply circuit 19 applies a predetermined voltage Vterm to the second selected bit line 5s through the Y-side current terminating circuit 14. The Y-side current source circuit 12 supplies or draws the write electric current to or from the write Y-selector 11-1. Thus, the write electric current flows through the route of the second selected bit line 5s—the extension wiring line 29 of the selected memory cell 2s—the first MOS transistor 6 of the selected memory cell 2s—the first selected bit line 4s. The write electric current has a predetermined magnitude corresponding to the data signal Data. The direction of the write electric current is determined based on the write data. The write electric current Iw(0) flows in the direction that the write electric current flows into the Y-side current source circuit 12 in case of "0" and the write electric current Iw(1) flows in the direction that the write electric current flows out from the Y-side current source circuit 12 in case of "1".

(3) Step S53

In the selected memory cell 20s, the electric current Iw(0) (+X-axis direction) or the electric current Iw(1)(−X-axis direction) flows through the extension wiring line 29 which is in contact with the magnetic resistance element 7, and the magnetic field is generated to the −Y-axis direction or the +Y-axis direction. The direction of the spontaneous magnetization in the free layer 21 of the magnetic resistance element 7 is inverted by the magnetic field and the direction of the spontaneous magnetization corresponding to the data signal Data is stored.

Through the above data write operation, the data can be written in the selected memory cell 20s.

In this embodiment, the same effect as in the first embodiment and the second embodiment can be achieved. Also, because the second MOS transistor of the memory cell is not used, the magnetic random access memory can be made smaller by the area for the second MOS transistor.

Fourth Embodiment

The magnetic random access memory containing the magnetic memory cells according to the fourth embodiment of the present invention will be described.

Figure 15:
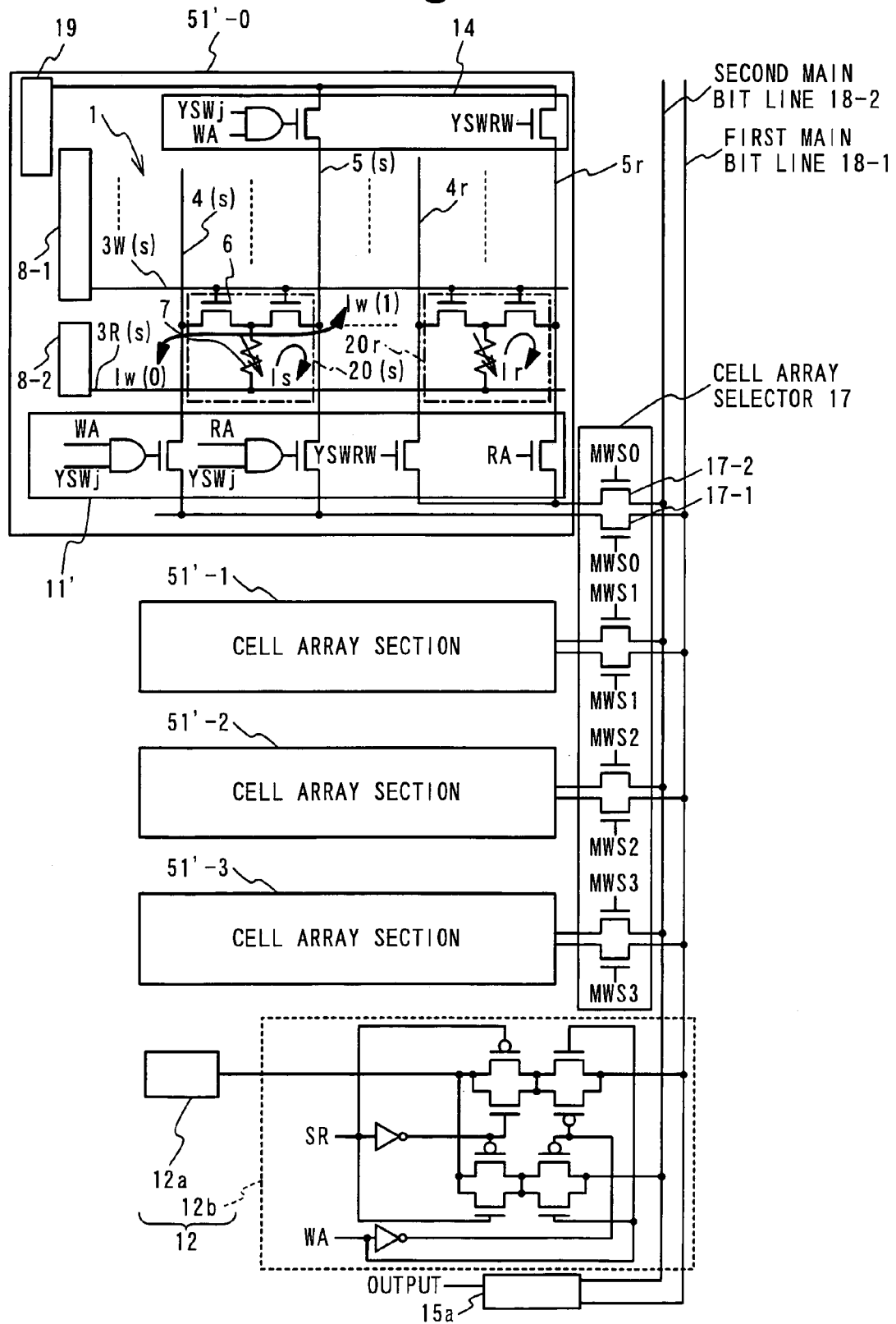
FIG. 15 is a diagram showing the structure of the magnetic random access memory containing the magnetic memory cells according to a fourth embodiment of the present invention.

FIG. 15 is a diagram showing the structure of the magnetic random access memory containing the magnetic memory cells according to the fourth embodiment of the present invention. Referring to FIG. 15, the memory cell array sections shown in FIG. 12 are arranged in a hierarchy manner in an address space. The magnetic random access memory in this embodiment is composed of the memory cell array sections 51'-0 to 51'-3, the memory cell array selector 17, first and second main bit lines 18-1 and 18-2, the Y-side current source circuit 12 and the current sense amplifier 15a.

Each of the memory cell array sections 511-0 to 51'-3 is basically the same as the memory cell array section 41 in the second embodiment shown in FIG. 11, but different from in addition of the structure of the Y-selector 11' and replacement of the X-selector 8 by a write X-selector 8-1 and a read X-selector 8-2. The memory cell array section 51'-$i$ ($i$ is an integer between 0 and 3 in this example) is composed of the plurality of memory cells 2, the plurality of write word lines 3W, the plurality of read word lines 3R, the plurality of first bit lines 4 (containing the first reference bit line 4$r$), the plurality of second bit lines 5 (containing the second reference bit line 5$r$), the write X-selector 8-1, the read X-selector 8-2, the Y-selector 11', the Y-side current terminating circuit 14, and the Y-side power supply circuit 19. The memory cell array section 51' except for the memory cells 2 and the Y-selector 11' are the same as those of the third embodiment. Therefore, the description of them is omitted. Also, the memory cell 2 is the same as that of the second embodiment. Therefore, the description of it is omitted. It should be noted that in FIG. 15, the four memory cell array sections 51 are shown but the present invention is not limited to this number.

The Y-selector 11' has the functions of the write Y-selector 11-1 and the read Y-selector 11-2 to select the first reference bit line 4$r$ and the second reference bit line 5$r$. The Y-selector 11' selects one of the plurality of first bit lines 4 as the first selected bit line 4$s$ based on the write active signal WA and the bit line selection signal YSWj in the data write operation and selects one of the plurality of second bit lines 5 as the second selected bit line 5$s$ based on the read active signal RA and the bit line selection signal YSWj in the data read operation. The Y-selector 11' connects the selected bit line with the first main bit line 18-1. Also, the Y-selector 11' selects the first reference bit line 4$r$ based on the reference write signal YSWRW in a reference data write operation and selects the second reference bit line 5$r$ based on the read active signal RA in a reference data read operation. The Y-selector 11' connects the selected reference bit line with the second main bit line 18-2.

The memory cell array selector 17 selects one from the memory cell array sections 51-0 to 51-3 as the selected memory cell array sections 51-$i$ by the pairs of the selector transistors 17-1 and 17-2 based on the memory cell array selection signal MWSi. The selected memory cell array section 51-$i$, the Y-side current source circuit 12 is connected with the current sense amplifier 15a by the first main bit line 18-1 and the second main bit line 18-2, and operate as in the third embodiment. The Y-side current source circuit 12 and the sense amplifier 15a are the same as those as the third embodiment. Therefore, the description of them will be omitted.

Next, the operation of the magnetic random access memory containing the magnetic memory cells according to the fourth embodiment of the present invention will be described.

In the magnetic random access memory shown in FIG. 15, the data read operation from the memory cell 2 is carried out as follows.

(1) Step S61

The memory cell array selector 17 turns on one of the pairs of the selector transistors 17-1 and 17-2 based on the memory cell array selection signal MWSi, and the selected memory cell array section 51-$i$ is selected. At this time, the selected memory cell array section 51-$i$ and the current sense amplifier 15 are connected by the first main bit line 18-1 and the second main bit line 18-2.

(2) Step S62

Hereinafter, the above operation of the step S41 to step S43 is carried out. It should be noted that the Y-selector 11' substitutes for the read Y-selector 11-2 in the operation of the step S41 to step S43. Also, at step S42, the Y-selector 11' selects the second reference bit line 5$r$. Also, the flow routes of the read electric current Is and the reference read electric current Ir are different form those of the third embodiment. In the fourth embodiment, the read electric current Is flows through the route of the read X-selector 8-2—the selected read word line 3R—the magnetic resistance element 7 of the selected memory cell—the extension wiring line of the selected memory cell—the second MOS transistor of the selected memory cell—the second selected bit line 5$s$—the Y-selector 11'—the first main bit line 18-1. The reference read electric current Ir flows through the route of the read X-selector 8-2—the selected read word line 3R—the magnetic resistance element 7 of the selected reference memory cell—the extension wiring line of the selected reference memory cell—the second MOS transistor of the selected reference memory cell—the second selected bit line 5$r$—the Y-selector 11'—the second main bit line 18-2.

Through the above data read operation, the data of the desired selected memory cell 2$s$ of the desired selected memory cell array section 51-$i$ can be read.

Next, the data write operation of the data into the memory cell 2 is carried out as follows.

(1) Step S71

The memory cell array selector 17 turns on one of the pairs of the selector transistors 17-1 and 17-2 based on the memory cell array selection signal MWSi and the selected memory cell array section 51-$i$ is selected. At this time, the selected memory cell array section 51-$i$ and the Y-side current source circuit 12 are connected by the first main bit line 18-1 and the second main bit line 18-2.

(2) Step S72

The Y-selector 11' selects one from the plurality of first bit lines 4 as the first selected bit line 4$s$ based on the write active signal WA and the bit line selection signal YSWj. Also, the Y-side current terminating circuit 14 selects one from the plurality of second bit lines 5 as the second selected bit line 5$s$ based on the write active signal WA and the bit line selection signal YSWj. Thus, the selected memory cell 20$s$ is determined. The first selected bit line 4$s$ and the second selected bit line 5$s$ is a pair originally. The read word line 3R is fixed on the GND voltage. At this time, the Y-side power supply circuit 19 applies a predetermined voltage Vterm to the second selected bit line 5s through the Y-side current terminating circuit 14. The Y-side current source circuit 12 supplies or draws the write electric current to or from the Y-selector 11'. Thus, the write electric current flows through the route of the second selected bit line 5s—the second MOS transistor 16 of the selected memory cell 2s—the extension wiring line 29 of the selected memory cell 2s—the first MOS transistor 6 of the selected memory cell 2s—the first selected bit line 4s. The write electric current has a predetermined magnitude corresponding to the data signal Data. The direction of the write electric current is determined based on the write data. The write electric current Iw(0) flows in the direction that the write electric current flows into the Y-side current source circuit 12 in case of "0" and the write electric current Iw(1) flows in the direction that the write electric current flows out from the Y-side current source circuit 12 in case of "1".

(3) Step S73

In the selected memory cell 20s, the electric current Iw(0) (+X-axis direction) or the electric current Iw(1)(−X-axis direction) flows through the extension wiring line 29 which is in contact with the magnetic resistance element 7, and the magnetic field is generated to the −Y-axis direction or the +Y-axis direction. The direction of the spontaneous magnetization in the free layer 21 of the magnetic resistance element 7 is inverted by the magnetic field and the direction of the spontaneous magnetization corresponding to the data signal Data is stored.

Through the above data write operation, the data can be written in the desired selected memory cell 2s in the desired selected memory cell array section 51-i. The Y-selector 11' selects the first reference bit line 4r and the Y-side current terminating circuit 14 selects the second reference bit line 5r in case of the data write operation into the reference memory cell 2r.

In this embodiment, the same effect as in the second embodiment can be achieved. Also, because the second MOS transistor is not used in the memory cell, the magnetic random access memory can be made smaller by the second MOS transistor.

Fifth Embodiment

The magnetic random access memory containing the magnetic memory cells according to the fifth embodiment of the present invention will be described. The circuit structure of the magnetic random access memory containing the magnetic memory cells according to the fifth embodiment of the present invention is the same as that of the first embodiment. That is, the magnetic random access memory in this embodiment is composed of the memory cell array section 1, the Y-side current source circuit 12, the read current load circuit 13, and the sense amplifier 15. The memory cell array section 1 contains the plurality of memory cells 2a, the plurality of word lines 3, the plurality of first bit lines 4, the plurality of second bit lines 5, the X-selector 8, the Y-selector 11, the Y-side current terminating circuit 14 and the Y-side power supply circuit 19. Therefore, the description of the structure shown in FIG. 5 is omitted.

Figure 1A:
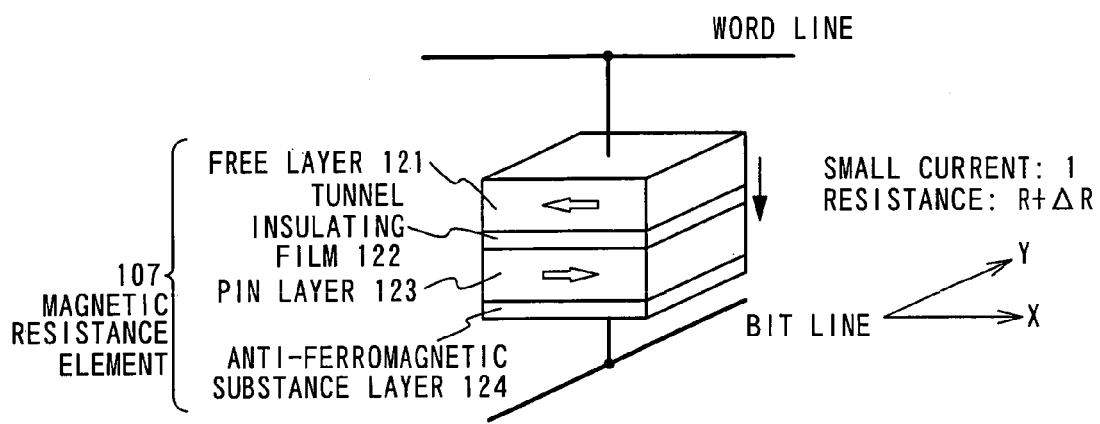
FIGS. 1A and 1B are diagrams showing the operation principle of a magnetic resistance element contained in a conventional magnetic memory cell.
Figure 1B:
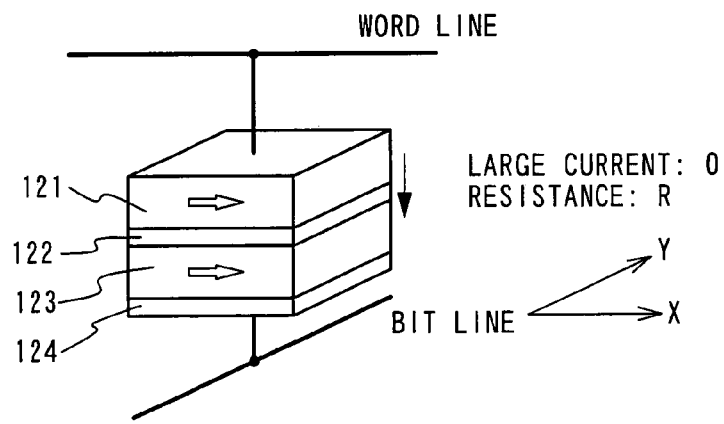
Figures 3A, 3B:
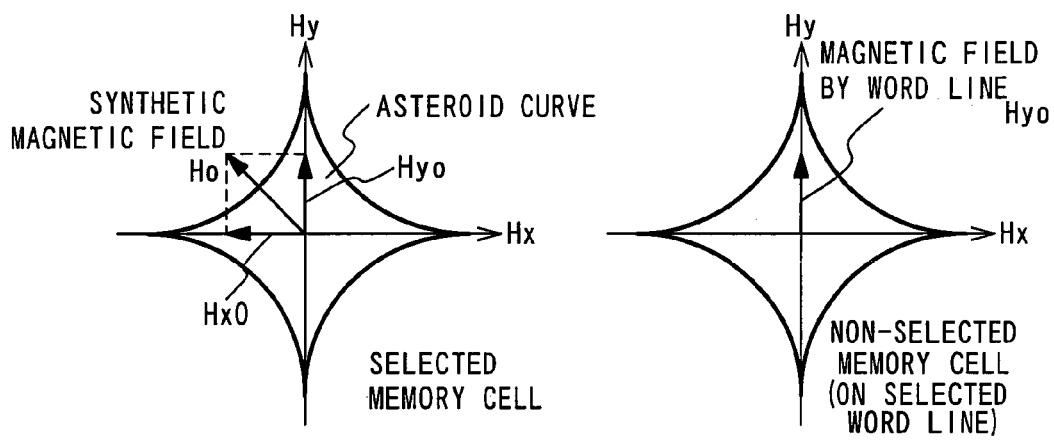
FIGS. 3A to 3C are diagrams showing the principle of a write operation of data into the magnetic resistance element.
Figure 3C:
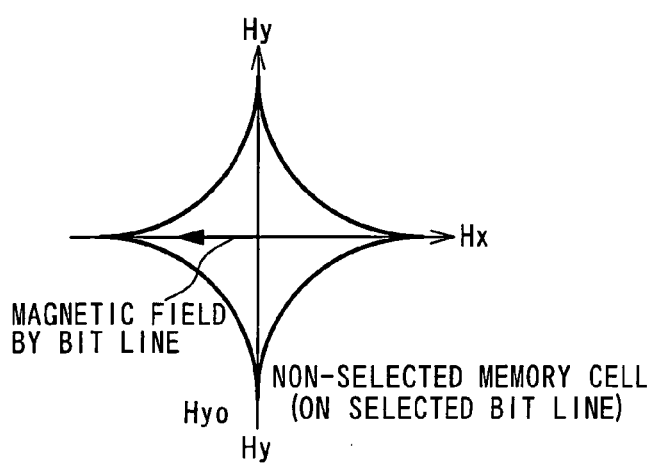
Figure 4:
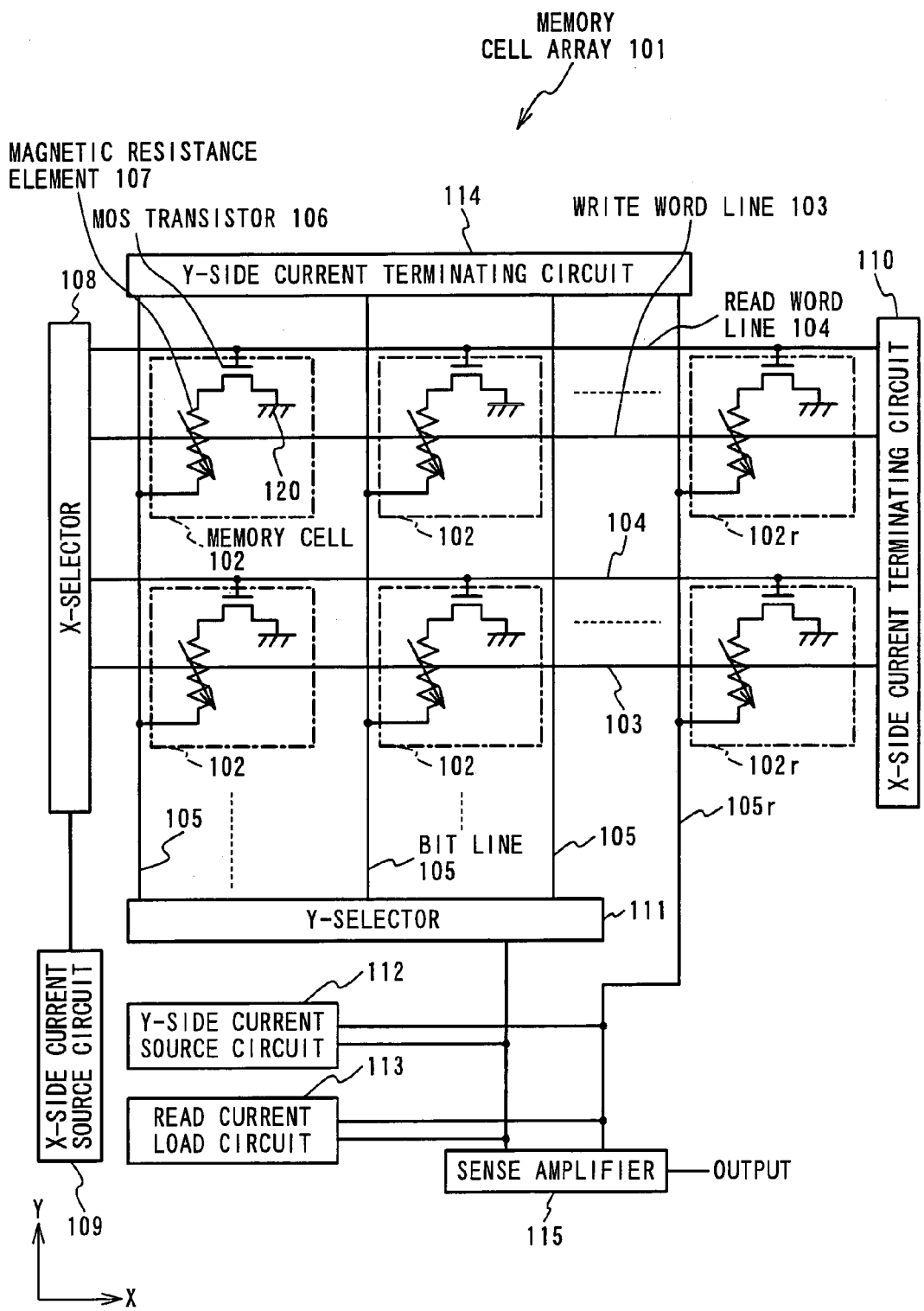
FIG. 4 is a diagram showing a conventional magnetic random access memory which uses he conventional magnetic memory cells.
Figure 16:
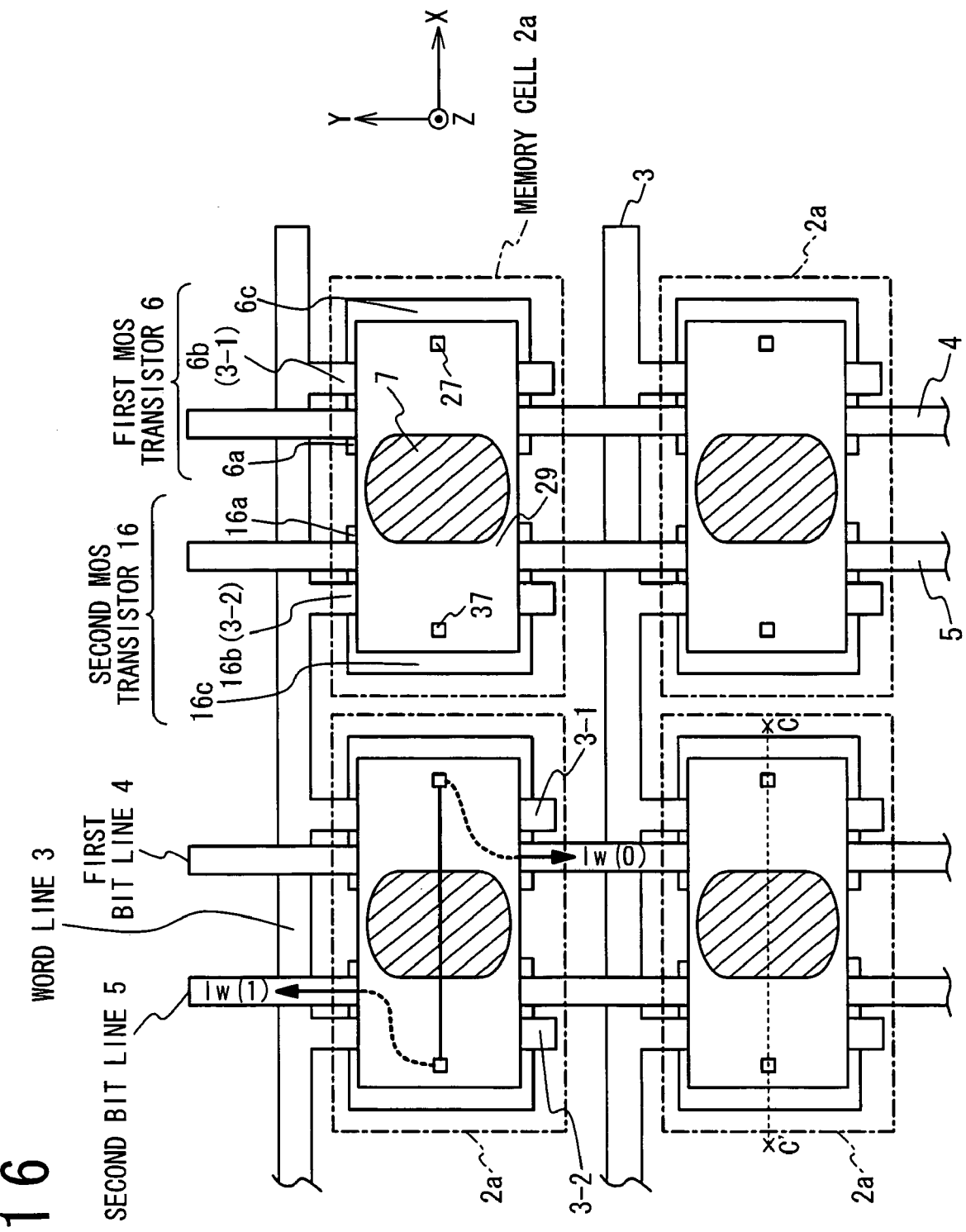
FIG. 16 is a plan view of the magnetic random access memory shown in FIG. 5.

FIG. 16 is a plan view of the memory cell array of the magnetic random access memory shown in FIG. 1. In FIG. 16, the memory cells 2a of 2×2 in the memory cell array section 1 are shown as representative cells. The memory cell 2a in this embodiment differs from that of the first embodiment shown in FIG. 6 in the point that the first bit line 4 and the second bit line 5 are provided to be put between the word line 3-1 and the word line 3-2. It should be noted that the memory cell 2a is the same as that of the first embodiment except that the arrangement of the first MOS transistor 6 and the second MOS transistor 16 is changed, and the arrangement of the first bit line 4 and the second bit line 5 is changed. Therefore, the description of the memory cell is omitted.

By employing such an arrangement, the margin of the shape of the extension wiring line 29 becomes large. Thus, the shape of the extension wiring line 29 can be taken widely and long and the magnetic resistance element 7 formed on the line 29 can be made large.

Figure 17:
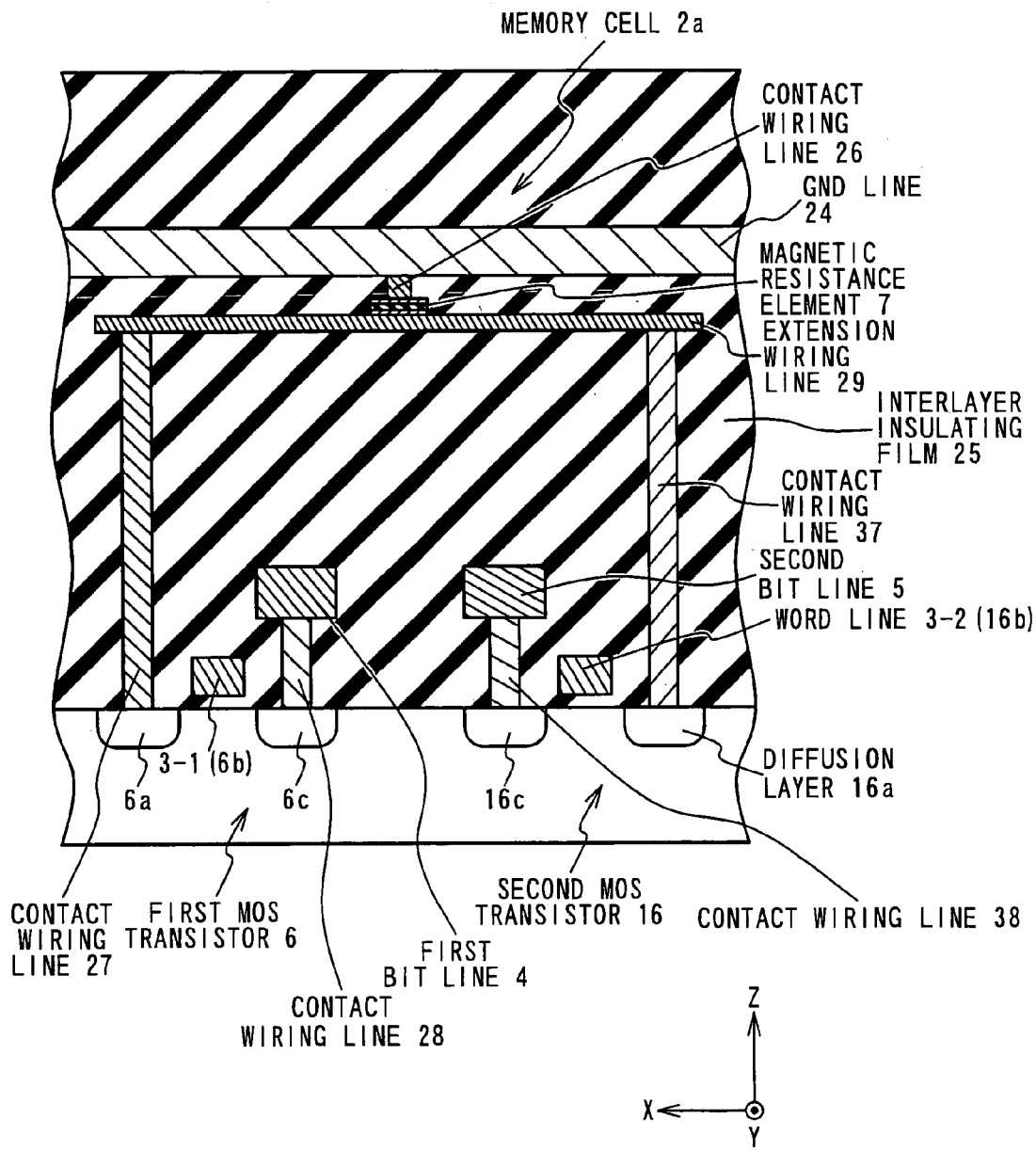
FIG. 17 is a cross sectional view of the memory cell along the CC' line at FIG. 16.

FIG. 17 is a cross sectional view of the structure of the memory cell 2a along the CC' line shown in FIG. 16. The source 6a of the first MOS transistor 6 is connected with the first bit line 4 through the contact wiring line 28 extending into the Z-axis direction. The drain 6c thereof is connected with the one end of the extension wiring line 29 through the contact wiring line 27 extending into the Z-axis direction. The gate 6b thereof is the word line 3-1 which is branched from the word line 3. It should be noted that the source 6a is provided on the inner side the memory cell 2a than the drain 6c. In the same way, the source 16a of the second MOS transistor 16 is connected with the second bit line 5 through the contact wiring line 38 extending into the Z-axis direction. The drain 16c thereof is connected with the other end of the extension wiring line 29 through the contact wiring line 37 extending into the Z-axis direction. The gate 16b thereof is the word line 3-2 which is branched from the word line 3. It should be noted that the source 16a is provided on the inner side the memory cell 2a than the drain 16c. The extension wiring line 29 is provided to cover the first bit line 4 and the second bit line 5 which pass through the memory cell 2a. The magnetic resistance element 7 is provided on the extension wiring line 29 to be connected with it at one end. The other end of the extension wiring line 29 is connected with the ground (GND) wiring line 24 through the contact wiring line 26.

The operation of the magnetic random access memory containing the magnetic memory cells according to the fifth embodiment of the present invention is the same as in the first embodiment. Therefore, the description is omitted.

The first bit line 4 and the second bit line 5 in this embodiment are provided nearer to each other, compared with both of the bit lines in the first embodiment. However, both of the bit lines in this embodiment are provided farther with respect to the magnetic resistance element 7 in the memory cell 2a, compared with the extension wiring line 29. For this reason, even if the same electric current as in the extension wiring line 29 flows through both of the bit lines, the magnetic field applied to the magnetic resistance element 7 by both of the bit lines is small. Moreover, in case of the memory cell 2a of the present invention, the magnetic field from the first bit line 4 and the second bit line 5 is applied to the direction orthogonal to the anisotropic axis of the magnetic resistance element 7.

Figure 18:
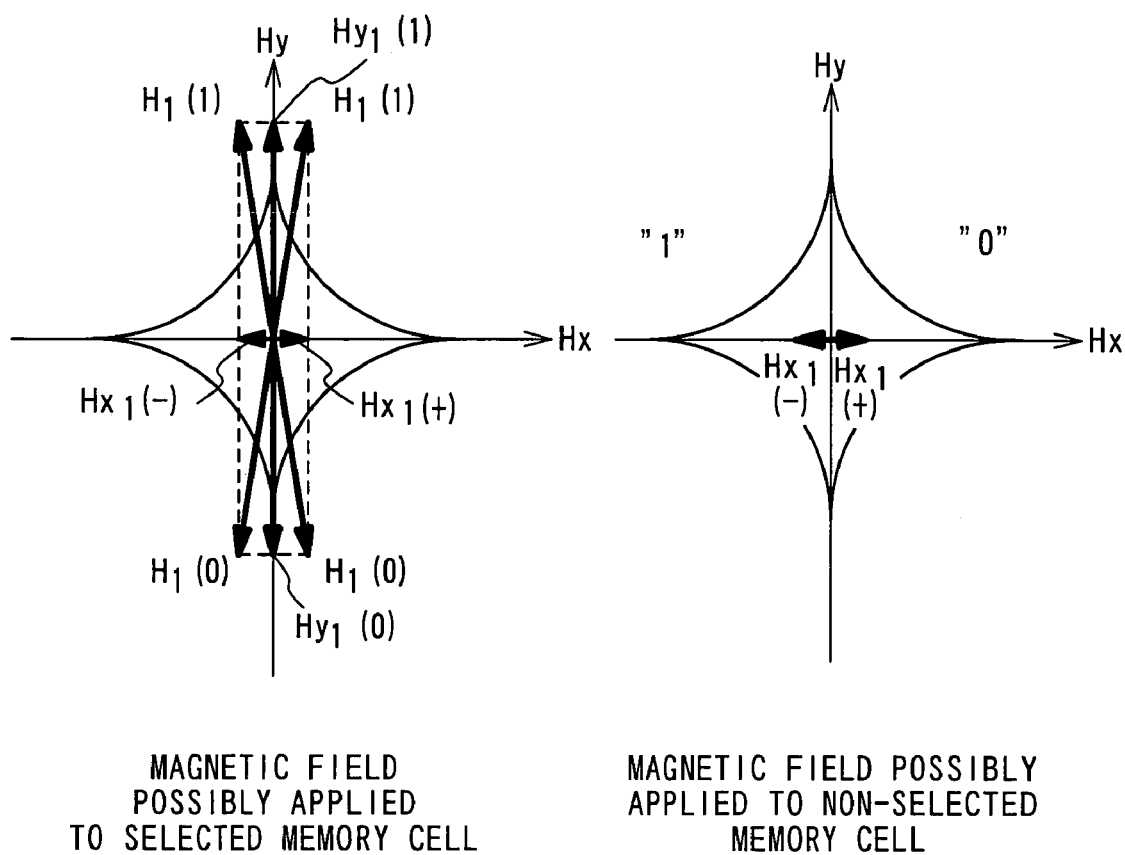
FIGS. 18A and 18B are diagrams showing the magnetic fields possibly applied to the selected memory cell and the non-selected memory cell.

FIG. 18A is a graph showing the magnetic field having a possibility to be applied to the selected memory cell, and FIG. 18B is a graph showing the magnetic field having a possibility to be applied to the non-selected memory cell. The magnetic field is applied to the non-selected memory cell shown in FIG. 18B in the X-axis direction due to the magnetic field HX1 by the electric currents flowing through the first bit line 4 and the second bit line 5. However, because the magnitude of the magnetic field is small sufficiently, there is not an influence to the magnetic resistance element 7. In case of the selected memory cell shown in FIG. 18A, the synthetic magnetic field H1 of the magnetic field HX1 by the electric currents flowing through the first bit line 4 and the second bit line 5 and the magnetic field HY1 by the electric current flowing through the extension wiring line 29 is applied to the selected memory cell. That is, the synthetic magnetic field H1 is shifted from the Hy axis by a little because of the influence of the magnetic field by the electric currents flowing through the first bit line 4 and the second bit line 5, comparing the case of the first embodiment shown in FIG. 10. However, in relation with the asteroid curve, it could be understood that the spontaneous magnetization can be inverted by the smaller magnetic field. That is, it could be understood that magnetic field HX1 by the electric currents flowing through the both bit lines functions to help inversion of the direction of the spontaneous magnetization in the selected memory cell 2s.

The same effect as in the first embodiment can be achieved in this embodiment. Also, the product yield of the magnetic random access memory can be improved because the shape of the extension wiring line 29 and the margin of the magnetic resistance element 7 become large so that a design rule can be relaxed. Moreover, it is possible to increase the magnetic resistance element 7 in size, and also it is possible to invert the direction of the spontaneous magnetization of the magnetic resistance element of the selected memory cell by the smaller write electric current Iw(0) and Iw(1) through the effect of the magnetic field generated by the electric currents flowing through the first bit line 4 and the second bit line 5.

Sixth Embodiment

The magnetic random access memory containing the magnetic memory cells according to the sixth embodiment of the present invention will be described. The structure of the magnetic random access memory containing the magnetic memory cells according to the sixth embodiment of the present invention is the same as that of the third embodiment shown in FIG. 12. That is, the magnetic random access memory in this embodiment is composed of the memory cell array section 10, the Y-side current source circuit 12, and the current sense amplifier 15a. The memory cell array section 10 is composed of the plurality of memory cells 20a, the plurality of write word lines 3W, the plurality of read word lines 3R, the plurality of first bit lines 4, the plurality of second bit lines 5, the write X-selector 8-1, the read X-selector 8-2, the write Y-selector 11-1, the read Y-selector 11-2, the Y-side power supply circuit 19, and the Y-side current terminating circuit 14. Therefore, the description of the structure of the magnetic random access memory is omitted.

Figure 19:
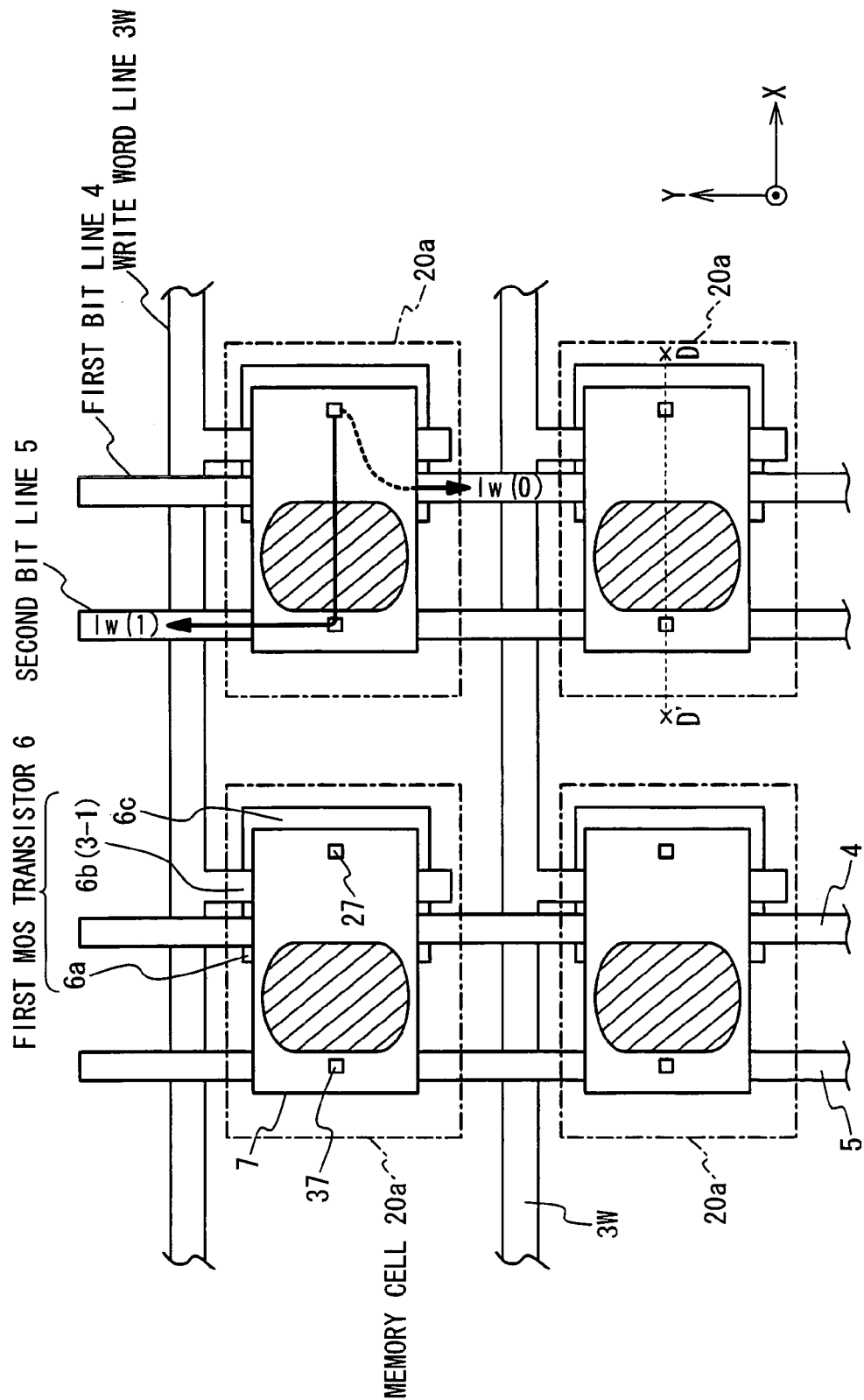
FIG. 19 is a plan view of the magnetic random access memory shown in FIG. 12.

FIG. 19 is a plan view of the memory cell array of the magnetic random access memory in the sixth embodiment. In FIG. 19, the memory cells 20a of 2×2 in the memory cell array section 1 are shown as representative cells. Also, the read word line 3R is provided on the magnetic resistance element 7 as shown in FIG. 13, but the read word line 3R is omitted in FIG. 19 from the viewpoint to easy understanding. The memory cell 20a in this embodiment is different from the third embodiment shown in FIG. 13 in the point that the first bit line 4 is provided on the inner side of the memory cell 20a than the branched write word line 3-1. Here, it should be noted that this embodiment is the same as the third embodiment other than the arrangement of the first MOS transistor 6 is changed and the arrangement of the first bit line 4 is changed, accompanied by it. Therefore, the description of the memory cells 20a is omitted. In such an arrangement, the margin of the shape of the extension wiring line 29 can be made large. Thus, the shape of the extension wiring line 29 can be taken widely and long and the magnetic resistance element 7 formed on the extension wiring line 29 can be made large.

Figure 20:
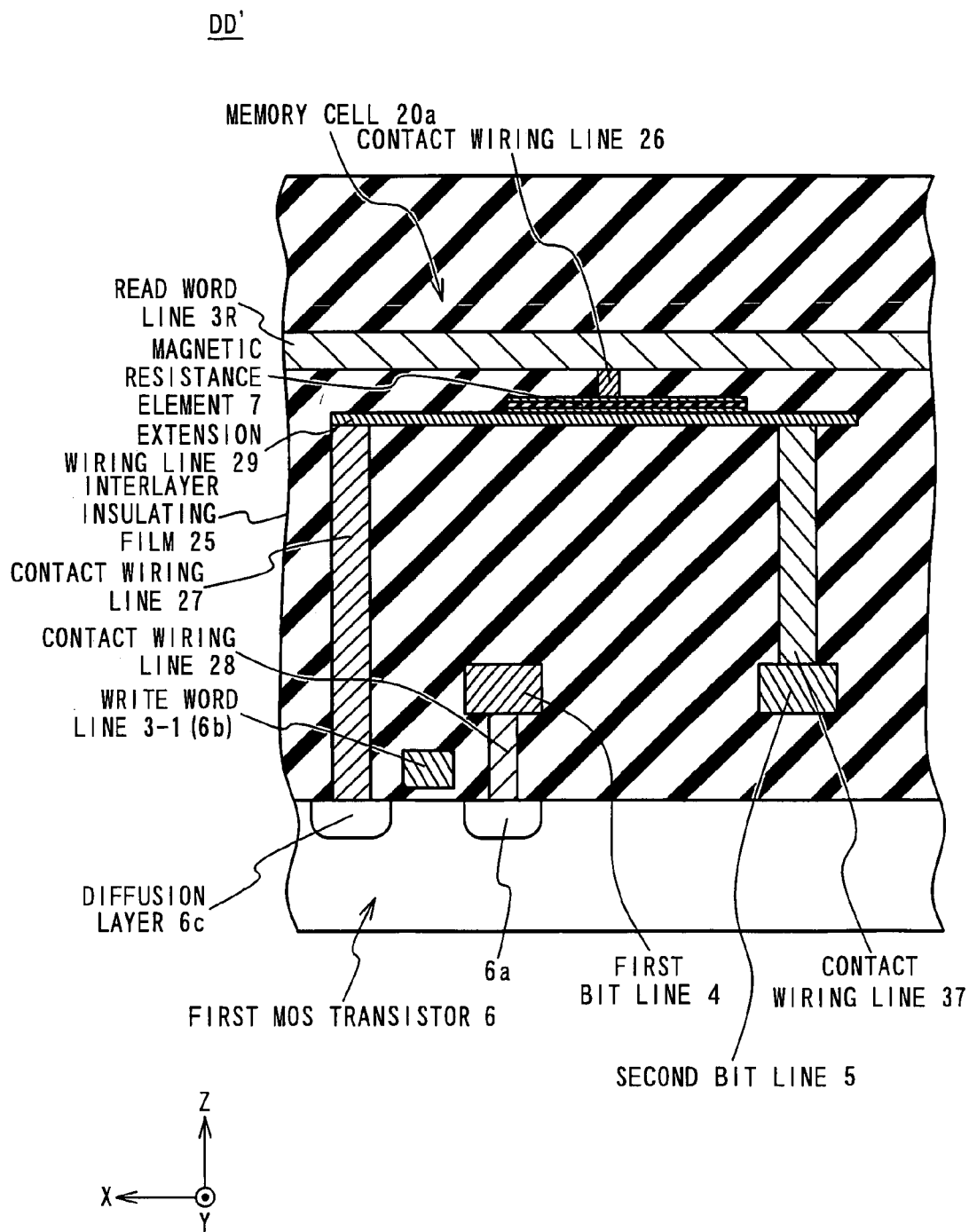
FIG. 20 is a cross sectional view of the memory cell along the DD' line at FIG. 19.

FIG. 20 is a cross sectional view of the structure of the memory cell 20a along the DD' line shown in FIG. 19. The source 6a of the first MOS transistor 6 is connected with the first bit line 4 through the contact wiring line 28 extending into the Z-axis direction. The drain 6c thereof is connected with the one end of the extension wiring line 29 through the contact wiring line 27 extending into the Z-axis direction. The gate 6b thereof is the write word line 3-1 which is branched from the write word line 3W. It should be noted that the source 6a is provided on the inner side of the memory cell 20a than the drain 6c. The extension wiring line 29 is provided to cover the first bit line 4 which passes through the memory cell 20a. The magnetic resistance element 7 is provided on the extension wiring line 29 to be connected at one end with it. The other end of the magnetic resistance element 7 is connected with the read word line 3R through the contact wiring line 26.

Next, the operation of the magnetic random access memory containing the magnetic memory cells according to the sixth embodiment of the present invention is the same as the operation of the third embodiment. Therefore, the description is omitted.

In this embodiment, the same effect as in the third and fifth embodiments can be achieved.

Seventh Embodiment

The magnetic random access memory containing the magnetic memory cells according to the seventh embodiment of the present invention will be described. The structure of the magnetic random access memory containing the magnetic memory cells according to the seventh embodiment of the present invention is the same as that of the first embodiment. That is, the magnetic random access memory in this embodiment is composed of the memory cell array section 1, the Y-side current source circuit 12, the read current load circuit 13, and the sense amplifier 15. The memory cell array section 1 is composed of the plurality of memory cells 2b, the plurality of word lines 3, the plurality of first bit lines 4, the plurality of second bit lines 5, the X-selector 8, the Y-selector 11, the Y-side power supply circuit 19, and the Y-side current terminating circuit 14 shown in FIG. 1 is the same as in the first embodiment. Therefore, the description of the structure of the magnetic random access memory in the seventh embodiment is omitted.

Figure 21:
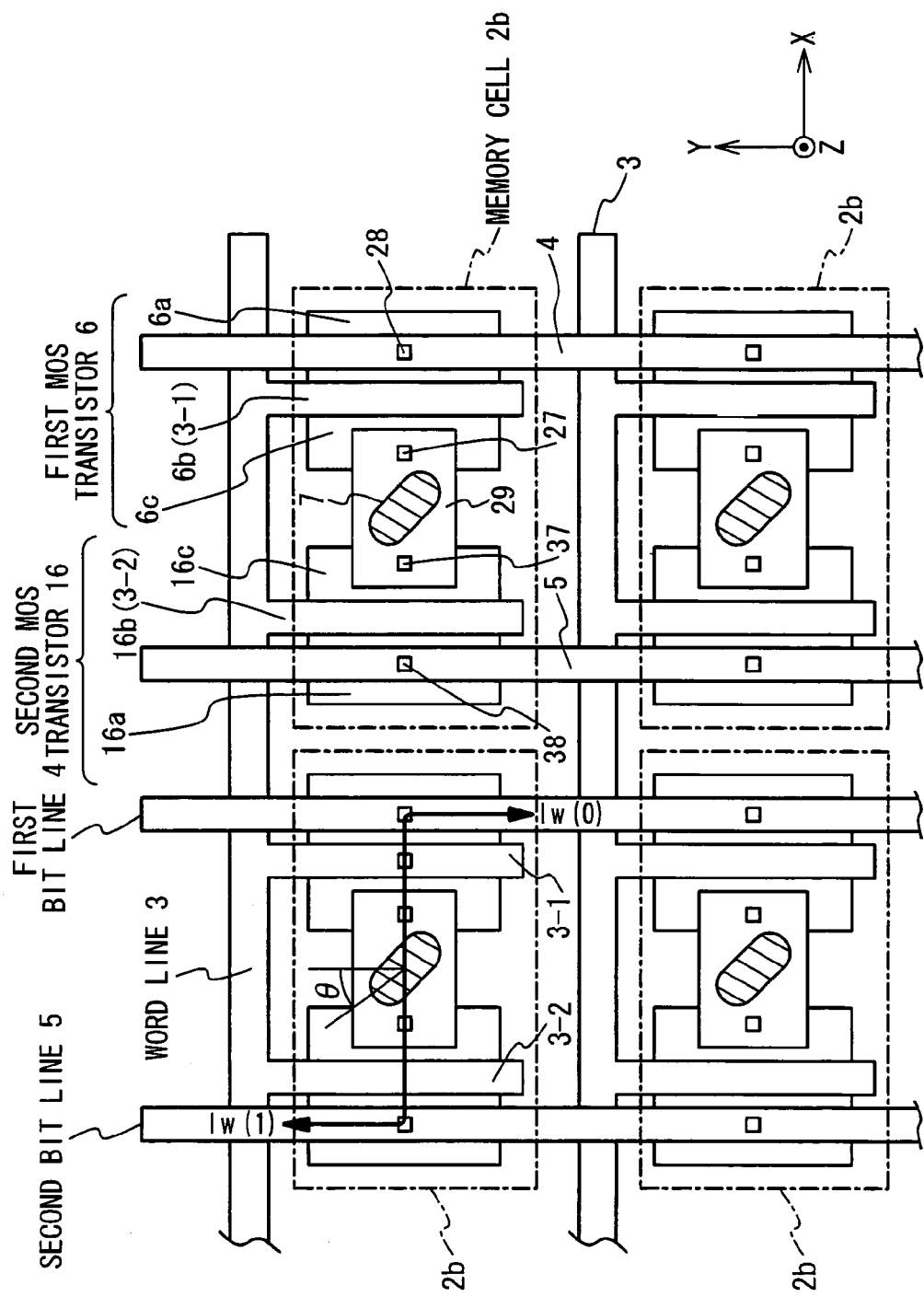
FIG. 21 is a plan view of the magnetic random access memory shown in FIG. 5.

FIG. 21 is a plan view of the memory cell array of the magnetic random access memory shown in FIG. 1. In FIG. 21, the memory cells 2b of 2×2 in the memory cell array section 1 are shown as representative cells. The magnetic resistance element 7 is provided on the extension wiring line 29. The direction of the spontaneous magnetization is inverted by the electric current which flows through the extension wiring line 29. The electric current flows through the extension wiring line 29 in the X-axis direction. Therefore, the magnetic field in the Y-axis direction is applied to the magnetic resistance element 7. In this embodiment, the anisotropic axis of the spontaneous magnetization of the magnetic resistance element 7 is tilted from the Y-axis by a predetermined angle θ. In the example shown in FIG. 21, the anisotropic axis is provided through the shape of the magnetic resistance element 7 and the magnetic resistance element 7 is tilted from the Y-axis by 45° (θ=45°). Thus, the write electric current can be set small and the electric current consumption can be reduced.

Figure 22:
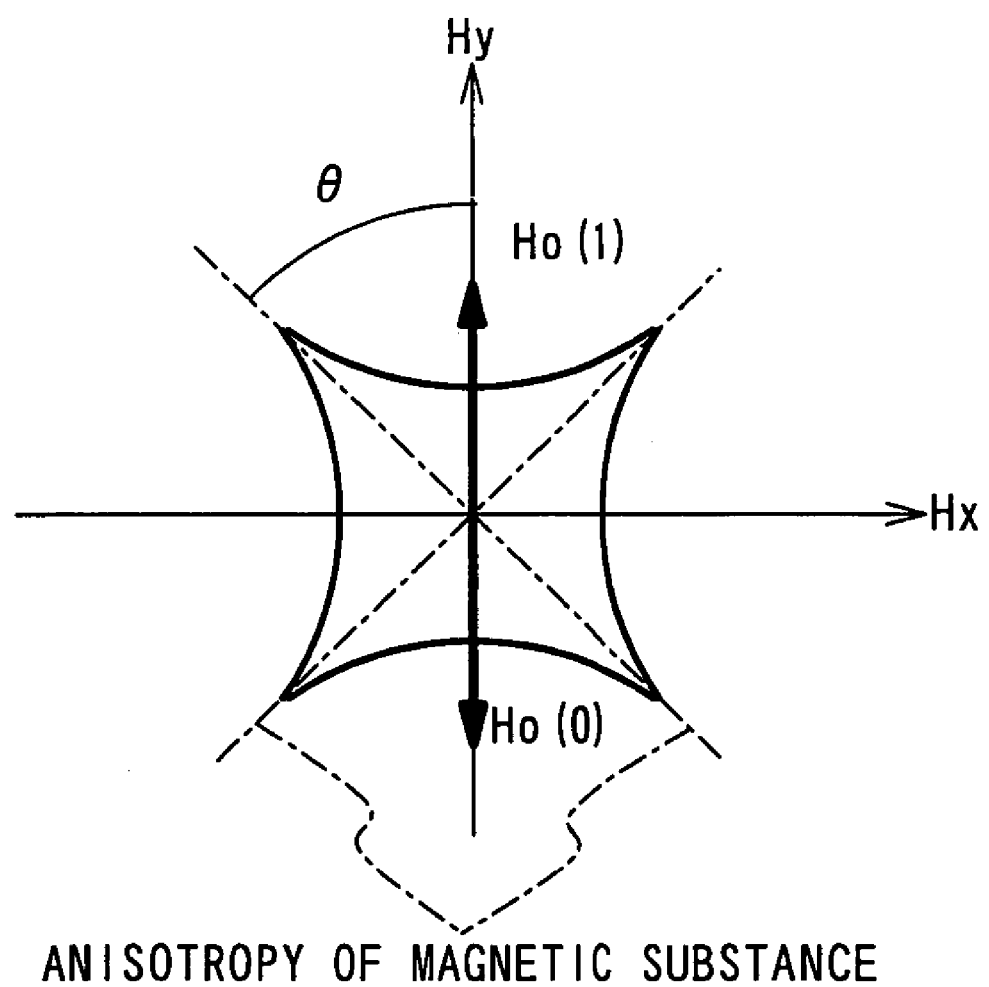
FIG. 22 is a graph showing a magnetic field generated based on a write electric current and the asteroid curve of the magnetic resistance element.

FIG. 22 is a graph showing the magnetic field generated by the write electric current and the asteroid curve showing magnetic field necessary for the direction of the spontaneous magnetization of the magnetic resistance element 7 to be inverted. In case of the memory cell 2*b* shown in FIG. 21, the magnetic field generated by the write electric current is applied in the direction shifted from the anisotropic axis of the magnetic substance of the magnetic resistance element 7 by 45°. It could be understood that the magnetic field H0 are made smaller through the comparison of the asteroid curve shown in FIG. 22 and the magnetic field H0 generated by the write electric current, comparing with the case shown in FIG. 10. That is, the write electric current can be made small and the electric current consumption can be reduced. Even if the magnetization anisotropic axis of the magnetic resistance element 7 is tilted from the Y-axis by a few predetermined angles, there is an effect. Desirably, the angle is in a range of 10° to 80°, and more desirably, it is in a range of 30° to 60°. Even if the anisotropic axis is tilted on the opposite side with respect to the Y-axis in the same way, there is a similar effect.

The description of the other components and structure shown in FIG. 21 is omitted because it is the same as in the first embodiment.

Next, the operation of the magnetic random access memory containing the magnetic memory cells according to the seventh embodiment of the present invention is the same as that of the first embodiment. Therefore, the description of the operation is omitted.

In this embodiment, the same effect as in the first embodiment can be achieved. Also, by tilting the anisotropic axis of the magnetic substance of the magnetic resistance element 7, the write electric current can be set small and can reduce an electric current consumption. Therefore, the transistor size of the memory cell 2*b* can be made small. Thus, the reduction of the cost becomes possible.

Figure 81:
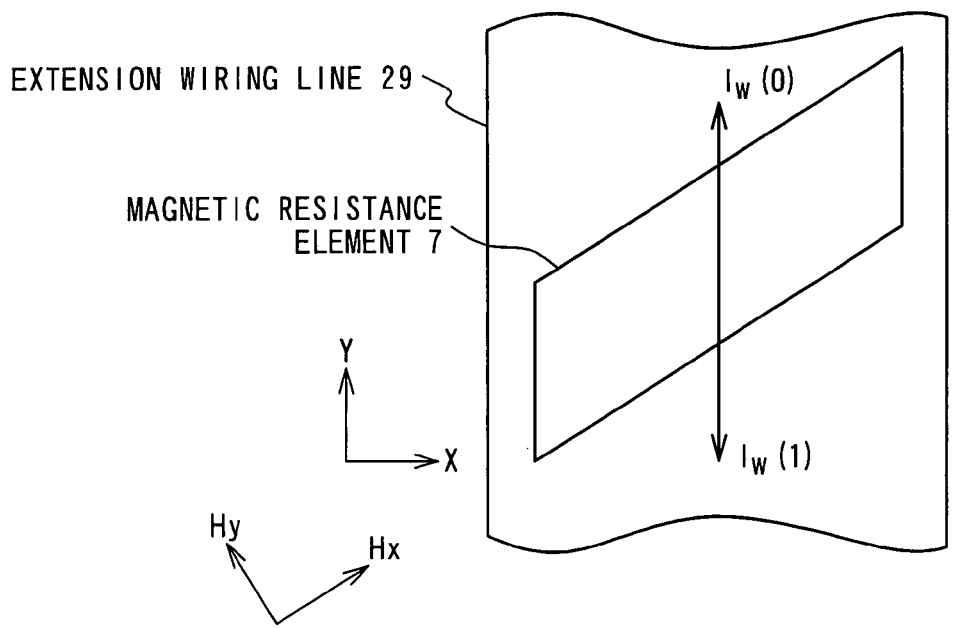
FIG. 81 is a diagram showing the structure showing another example of the magnetic random access memory containing the magnetic memory cells according to the seventh embodiment of the present invention.

In the above embodiment, the magnetic resistance element 7 is tilted. In addition, the same effect as in the above embodiments can be achieved by making the magnetic resistance element 7 asymmetry to the direction of the easy axis. FIG. 81 is a diagram showing the structure of a modification example of the magnetic random access memory containing the magnetic memory cells according to the seventh embodiment of the present invention. In FIG. 81, only a part of the extension wiring line 29 relating to the magnetic resistance element 7 is shown. In this case, the magnetic resistance element 7 is asymmetry in the easy axis direction (the Hx-axis direction), comparing with the case shown in FIG. 21.

Figure 82:
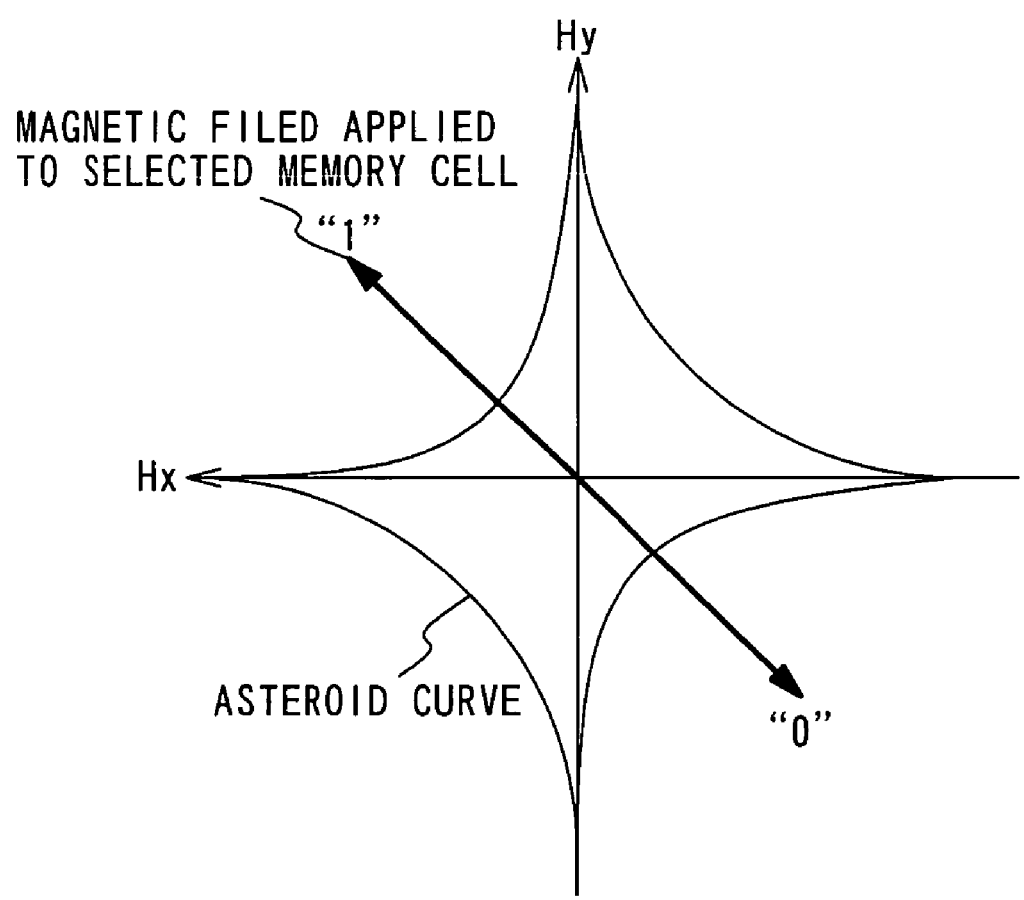
FIG. 82 is a graph showing an asteroid characteristic in case shown in FIG. 81, where the vertical axis is a magnetic field to the Y-direction and the horizontal axis is a magnetic field to the X-direction.

FIG. 82 is a graph showing an asteroid characteristic in case shown in FIG. 81. The vertical axis shows magnetic field (Hy) to the Y-axis direction and the horizontal axis shows magnetic field (Hx) to the X-axis direction. In this way, the asteroid characteristic of the magnetic substance body of the magnetic resistance element 7 with the asymmetry becomes asymmetry in two adjacent quadrants, e.g., the first quadrant and the second quadrant. In this case, when the second quadrant and a fourth quadrant are used for the data write operation, the write electric current Iw can be lowered due to the asymmetry, comparing with the case to use the first quadrant and the third quadrant and the usual case. Thus, the operation margin can be increased without increasing a chip area.

The description which is accomplished with reference to FIGS. 81 and 82 can be applied to the other memory cells and memory cell array in this Specification in the same way.

Eighth Embodiment

The magnetic random access memory containing the magnetic memory cells according to the eighth embodiment of the present invention will be described. The structure of the magnetic random access memory containing the magnetic memory cells according to the eighth embodiment of the present invention is the same as that of the third embodiment shown in FIG. 12. That is, the magnetic random access memory in this embodiment is composed of the memory cell array section 10, the Y-side current source circuit 12, and the current sense amplifier 15*a*. The memory cell array section 10 is composed of the plurality of memory cells 20*b*, the plurality of write word lines 3W, the plurality of read word lines 3R, the plurality of first bit lines 4, the plurality of second bit lines 5, the write X-selector 8-1, the read X-selector 8-2, the write Y-selector 11-1, the read Y-selector 11-2, the Y-side power supply circuit 19, and the Y-side current terminating circuit 14. The structure shown in FIG. 8 is the same as the third embodiment. Therefore, the description of the structure of the magnetic random access memory in the eighth embodiment is omitted.

Figure 23:
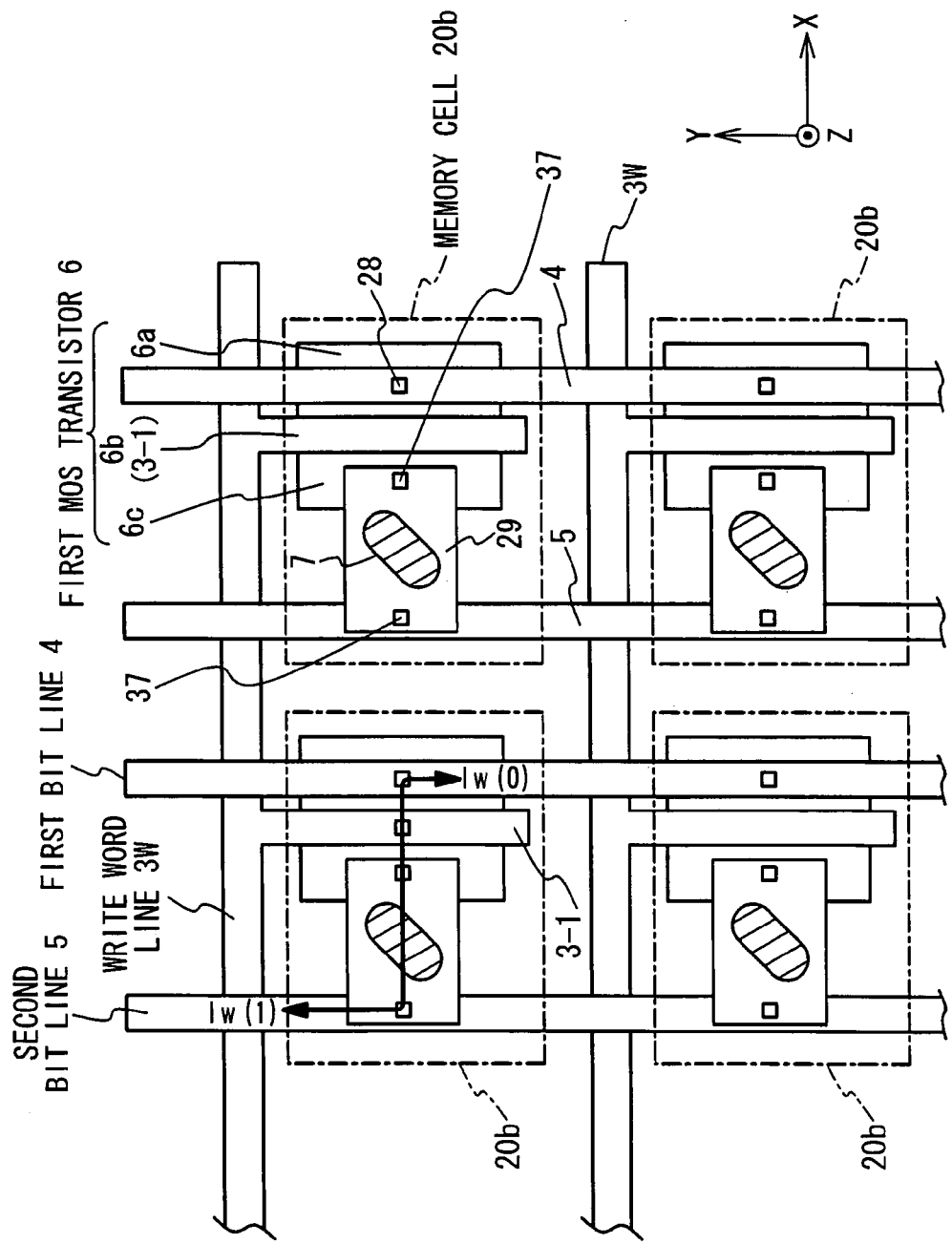
FIG. 23 is a plan view of the magnetic random access memory shown in FIG. 12.

FIG. 23 is a plan view of the memory cell array of the magnetic random access memory in the eighth embodiment. In FIG. 23, the memory cells 20*b* of 2×2 in the memory cell array section 10 are shown as representative cells. Also, the read word line 3R is provided on the magnetic resistance element 7, as shown in FIG. 13. However, from viewpoint of easy understanding, the read word line 3R is omitted in FIG. 23. The magnetic resistance element 7 is the same as in the seventh embodiment. Therefore, the description is omitted. Also, the structures of the other components shown in FIG. 23 are the same as those of the third embodiment. Therefore, the description is omitted.

Next, the operation of the magnetic random access memory containing the magnetic memory cells according to the eighth embodiment of the present invention is same as in the third embodiment. Therefore, the description of the operation is omitted.

In this embodiment, the same effect as in the third and seventh embodiments can be achieved.

Ninth Embodiment

Figure 24:
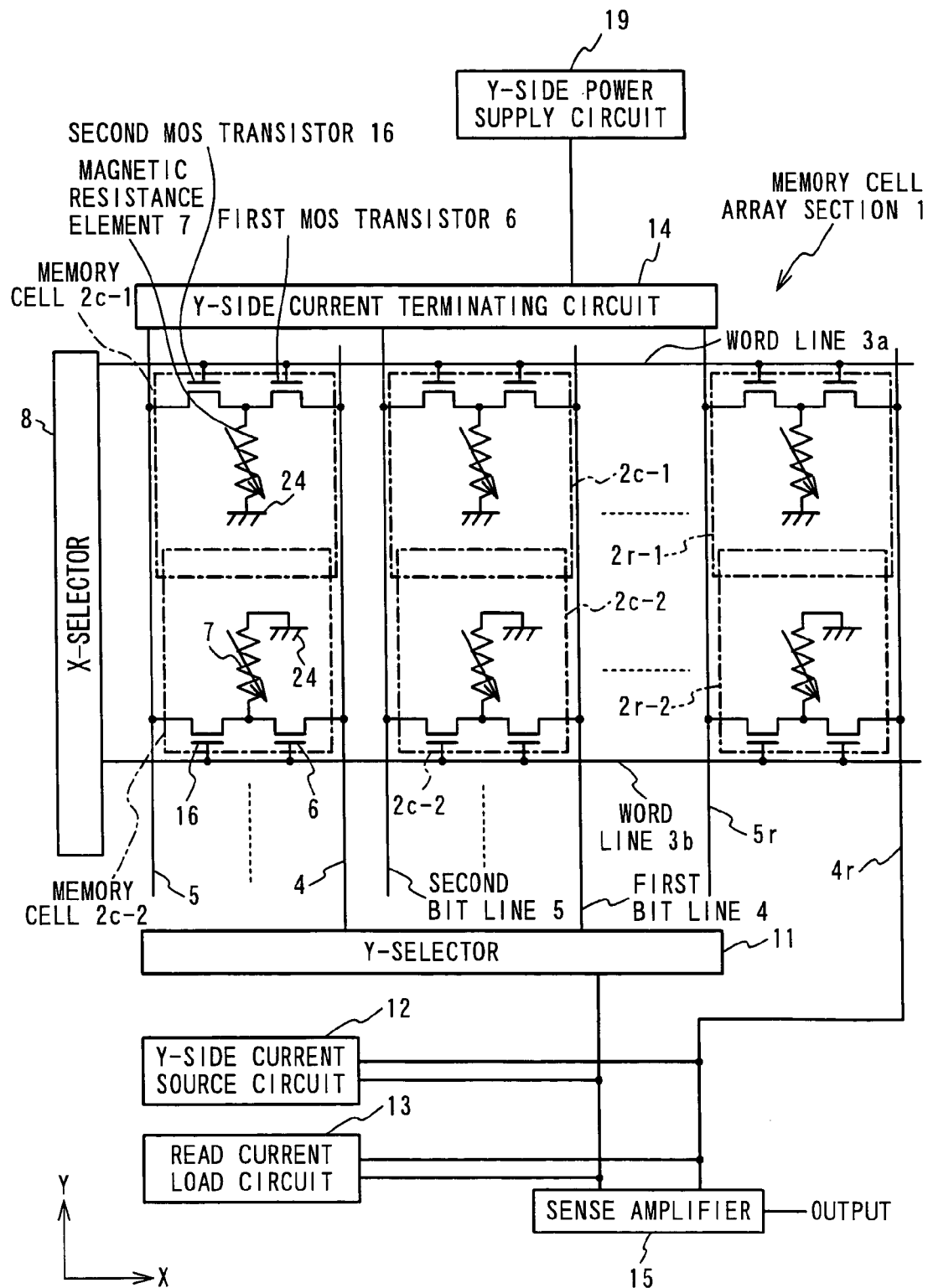
FIG. 24 is a diagram showing the structure of the magnetic random access memory containing the magnetic memory cells according to a ninth embodiment of the present invention.

The magnetic random access memory containing the magnetic memory cells according to the ninth embodiment of the present invention will be described. FIG. 24 is a diagram showing the structure of the magnetic random access memory containing the magnetic memory cells according to the ninth embodiment of the present invention. Referring to FIG. 24, the magnetic random access memory in this embodiment is composed of the memory cell array section 1, the Y-side current source circuit 12, the read current load circuit 13, and the sense amplifier 15. The memory cell array section 1 is composed of the plurality of memory cells 2*c*, the plurality of word lines 3 (in which two word lines 3*a* and one word line 3*b* form a set), the plurality of first bit lines 4, the plurality of second bit lines 5, the X-selector 8, the Y-selector 11, the Y-side power supply circuit 19, and the Y-side current terminating circuit 14.

In the memory cell array section 1, the two memory cells 2*c*-1 and 2*c*-2 form a set and the sets are arranged in a matrix. Each of the two memory cells 2*c*-1 and 2*c*-2 contains the first MOS transistor 6, the second MOS transistor 16 and the magnetic resistance element 7. It should be noted that the memory cells 2 for reference are referred to as the reference memory cells 2r-1 and 2r-2.

In the memory cell 2c-1, the gates of the first MOS transistor 6 and the second MOS transistor 16 are connected with the word line 3a. Also, in the memory cell 2c-2, the gates of the first MOS transistor 6 and the second MOS transistor 16 are connected with the word line 3b. The memory cell 2c-1 and the memory cell 2c-2 are connected with the sources of the first MOS transistors 6 and are connected with the first bit line 4 with a common wiring line to be described later, respectively. Also, the memory cell 2c-1 and the memory cell 2c-2 are connected with the sources of the second MOS transistors 16 and are connected with the second bit line 5 by the common wiring line to be described later, respectively.

In the above structure of the memory cell 2c-1 and the memory cell 2c-2, the sources of the first MOS transistors 6 and the sources of the second MOS transistors 16 are commonly connected. Thus, the circuit area of the memory cells 2 (2c-1 and 2c-2) is reduced. The word line 3a and the word line 3b are the same as the word line 3 in the first embodiment except that the word lines are a pair. Also, in the memory cell 2c-1 and the memory cell 2c-2, the first MOS transistor 6 and the second MOS transistor 16 are the same as the first MOS transistor 6 and the second MOS transistor 16 in the first embodiment except that their sources are common to as the source of the first MOS transistor 6 and the second MOS transistor 16. Therefore, the description of the circuit structure is omitted. Moreover, the other components shown in FIG. 24 are the same as those in the first embodiment. Therefore, the description of them is omitted.

Figure 25:
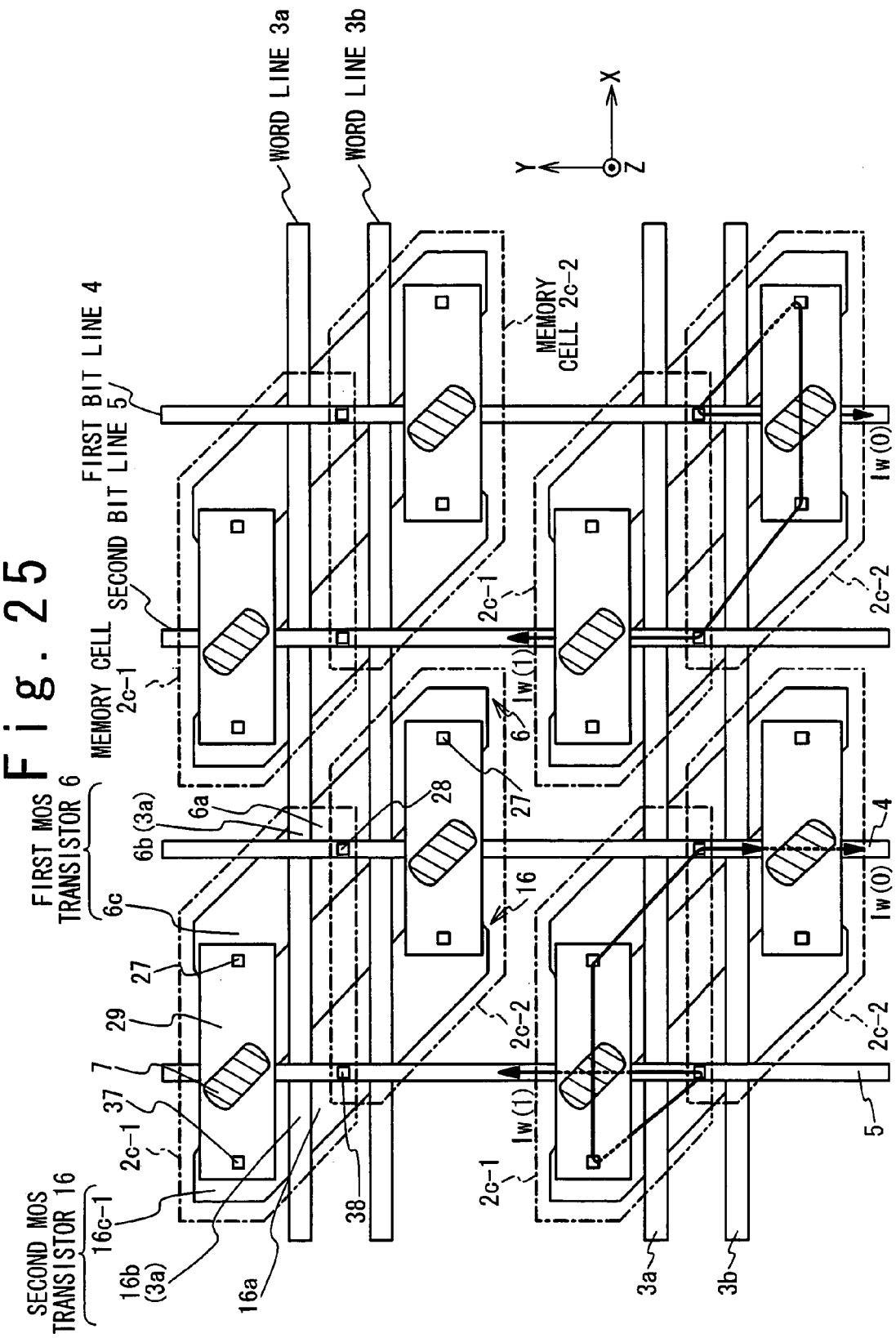
FIG. 25 is a plan view of the magnetic random access memory shown in FIG. 24.

FIG. 25 is a plan view of the memory cell array of the magnetic random access memory shown in FIG. 24. In FIG. 25, of the memory cells 2c (2c-1 and 2c-2) of 4×4 (two sets×two set) in the memory cell array section 1 are shown as representative cells. In the first MOS transistor 6 of the memory cell 2c-1, the source 6a is connected with the first bit line 4 through the contact wiring line 28. The gate 6b is the word line 3a. The drain 6c is connected with the drain 16c of the second MOS transistor 16 through the contact wiring line 27, the extension wiring line 29 and the contact wiring line 37. In the second MOS transistor 16, the gate 16b is the word line 3a. The source 16a is connected with the second bit line 5 through the contact wiring line 38. On the other hand, in the first MOS transistor 6 of the memory cell 2c-2, the source 6a is connected with the first bit line 4 through the contact wiring line 28. The gate 6b is the word line 3b. The drain 6c is connected with the drain 16c of the second MOS transistor 16 through the contact wiring line 27, the extension wiring line 29 and the contact wiring line 37. In the second MOS transistor 16, the gate 16b is the word line 3b. The source 16a is connected with the second bit line 5 through the contact wiring line 38.

The diffusion layers (the sources (6a and 16a) and drains (6c and 16c) of each MOS transistor) are laid out to have a predetermined angle φ (φ=45° in FIG. 25) with respect to the first bit line 4 and the second bit line 5. In such a layout, the arrangement density of diffusion layers can be increased and the size of the memory cell 2c can be made small. Also, in this embodiment, the wiring lines (28 and 38) to connect the first bit line 4 and the second bit line 5 and the memory cells 2c are common. Through the communes of the wiring lines, the size of the memory cells 2c can be made small. It is preferable from the viewpoint of the small size of the memory cell 2c that the predetermined angle φ is in a range of 30° to 60°. More preferably, it is in a range of 40° to 50°. The diffusion layer may be tilted with respect to either side of both bit lines 4 and 5.

Figure 26:
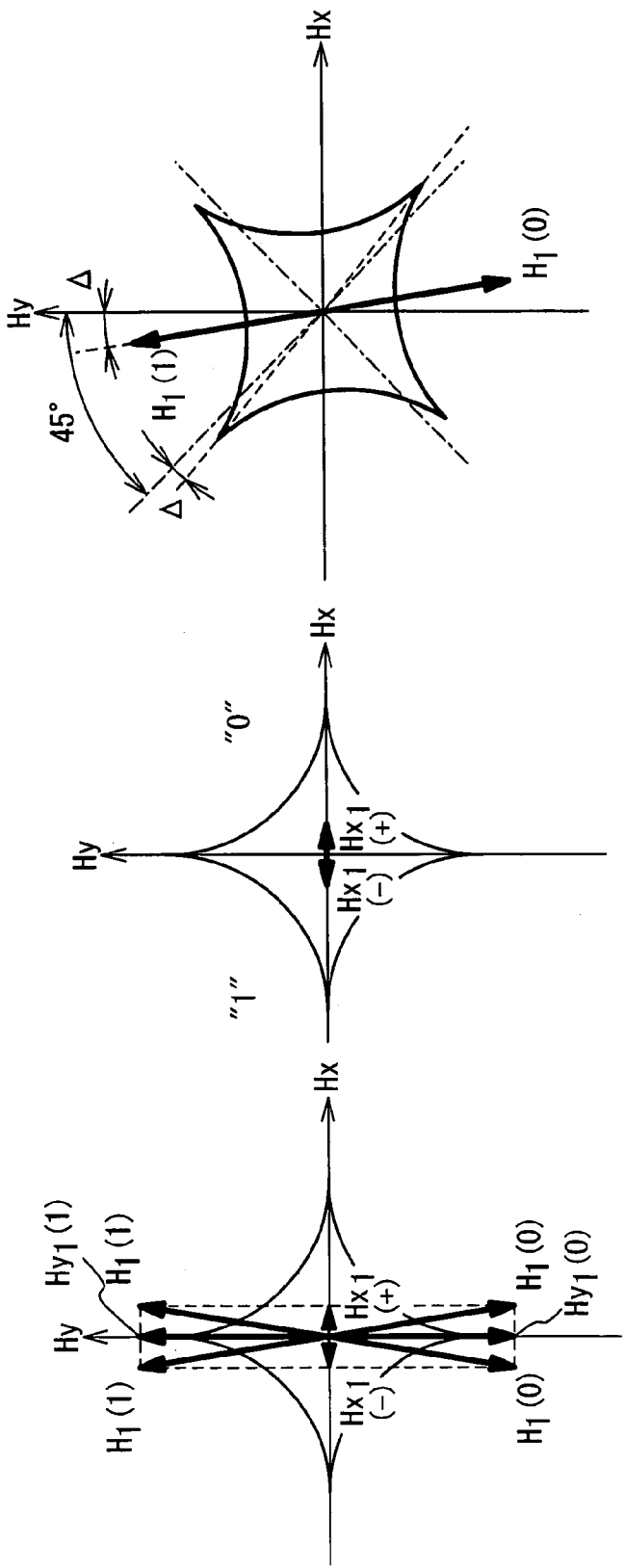
FIGS. 26A to 26C are diagrams of the magnetic fields possibly applied to the selected memory cell.

It should be noted that in this layout, the first bit line 4 and the second bit line 5 are arranged under the magnetic resistance element 7. Therefore, the magnetic fields by the electric currents flowing through both of the bit lines have an influence on the magnetic resistance element 7. The influence is as shown in FIGS. 26A to 26C. FIG. 26A is a graph showing the magnetic field having a possibility to be applied to the selected memory cell. FIG. 26B shows the magnetic field HX1 by the electric currents flowing through the first bit line 4 and the second bit line 5 having a possibility to be applied to the selected memory cell 2c. The magnitude of this magnetic field HX1 is sufficiently small so that the spontaneous magnetization of the magnetic resistance element 7 is not influenced. However, as shown in FIG. 26A, the synthetic magnetic field H1 of the magnetic field HX1 by the electric currents flowing through the first bit line 4 and the second bit line 5 and the magnetic field HY1 by the electric currents flowing through the extension wiring line 29 is applied to the selected memory cell 2c. In this case, as shown in FIG. 26C, when the direction of the magnetic resistance element 7 is shifted by 45° from the Y-axis direction as in the seventh embodiment, the design is made in consideration of the previous shift of the magnetic field HX1 by the angle Δ. If the direction of the magnetic anisotropic axis of the magnetic resistance element 7 is previously shifted by a few degrees of angle (Δ), there is no decrease of the operation margin. Because the influence of the magnitude of the write magnetic field (H1) is made large, a good result can be achieved by the magnetic field by the electric currents flowing through both bit lines. The other components in the magnetic random access memory are the same as those of the seventh embodiment. Therefore, the description of them is omitted.

Next, the operation of the magnetic random access memory containing the magnetic memory cells according to the ninth embodiment of the present invention will be described below. The wiring lines (28 and 38) to connect the first bit line 4 and the second bit line 5 and the memory cells 2c are common. Each diffusion layer is tilted by about angle φ. The first bit line 4 and the second bit line 5 are arranged under the extension wiring line 29. The operation of the magnetic random access memory containing the magnetic memory cells in the ninth embodiment is the same as that of the seventh embodiment other than the above facts. Therefore, the description is omitted.

In this embodiment, the same effect as in the seventh embodiment can be achieved. Also, through the increase of the arrangement density of the diffusion layers of each transistor and the communization of the wiring lines to connect each bit line and each memory cell 2c, the size of the memory cell 2c can be made small. Therefore, the chip size can be made small and the reduction of the cost becomes possible.

Tenth Embodiment

The magnetic random access memory containing the magnetic memory cells according to the tenth embodiment of the present invention will be described.

Figure 27:
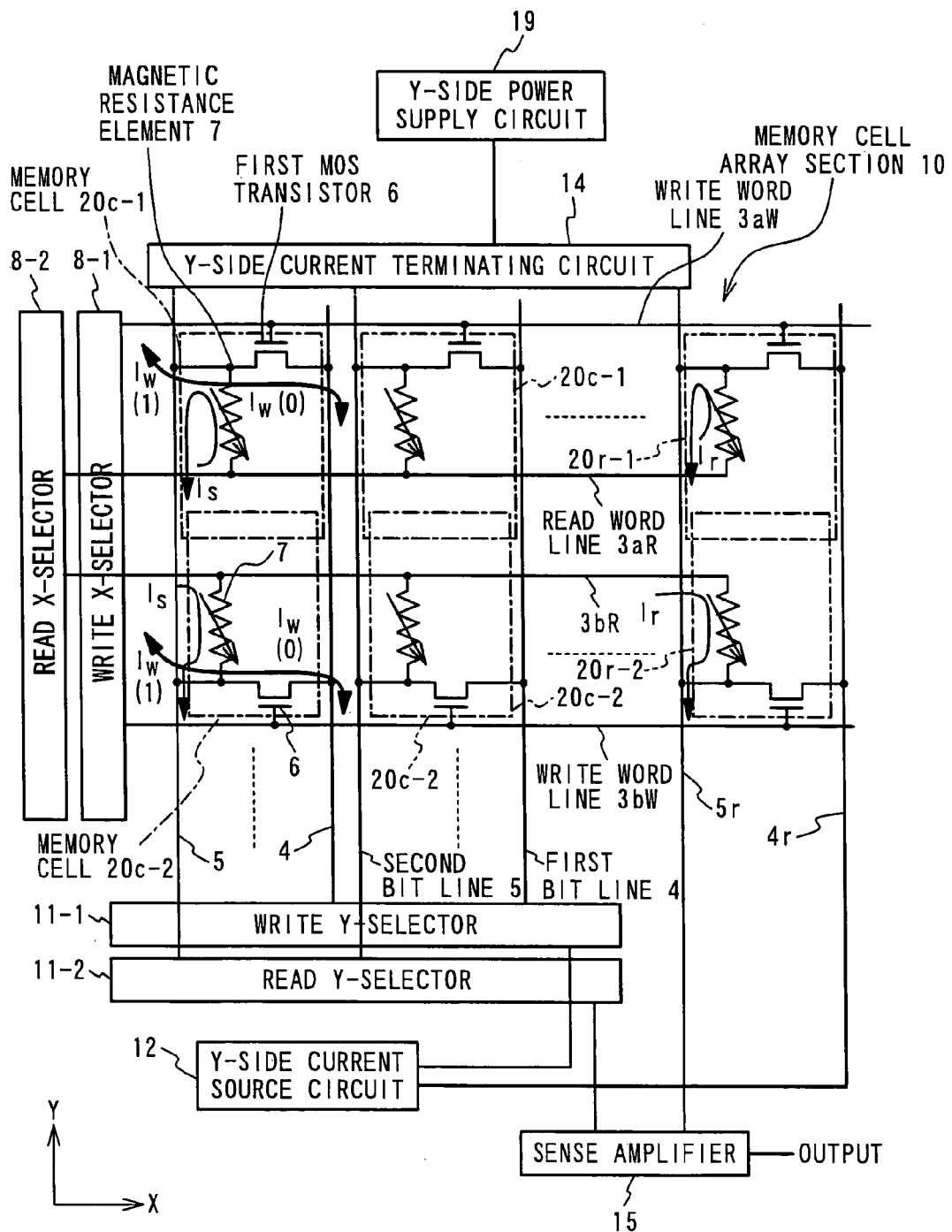
FIG. 27 is a diagram showing the structure of the magnetic random access memory containing the magnetic memory cells according to a tenth embodiment of the present invention.

First, the structure of the magnetic random access memory containing the magnetic memory cells according to the tenth embodiment of the present invention will be described. FIG. 27 is a diagram showing the structure of the magnetic random access memory containing the magnetic memory cells according to the tenth embodiment of the present invention. The magnetic random access memory in this embodiment is composed of the memory cell array section 10, the Y-side current source circuit 12, and the current sense amplifier 15a. The memory cell array section 10 is composed of the plurality of memory cells 20c, the plurality of write word lines (in which two write word lines 3aW and one write word line 3bW forms a set), the plurality of read word lines (in which two read word lines 3aR and one read word line 3bR forms a set), the plurality of first bit lines 4, the plurality of second bit lines 5, the write X-selector 8-1, the read X-selector 8-2, the write Y-selector 11-1, the read Y-selector 11-2, the Y-side power supply circuit 19, and the Y-side current terminating circuit 14.

In the memory cell array section 10, the two memory cells 20c-1 and 20c-2 constitute a set and the sets are arranged in a matrix. Each of the two memory cells 20c-1 and 20c-2 contains the first MOS transistor 6, the second MOS transistor 16 and the magnetic resistance element 7. It should be noted that the memory cells 20 for reference are referred to as the reference memory cells 20r-1 and 20r-2. In the memory cell 20c-1, the gate of the first MOS transistor 6 is connected with write word line 3aW. Also, in the memory cell 20c-2, the gate of the first MOS transistor 6 is connected with write word line 3bW. The sources of the respective first MOS transistors 6 memory cell 20c-1 and the memory cell 20c-2 are connected with the first bit line 4 by a common wiring line to be described later. In the same way, the drains of the first MOS transistors 6 are connected with the second bit line 5 by a common wiring line to be described later. As described above, in the memory cell 20c-1 and the memory cell 20c-2, the sources and drains of the first MOS transistors 6 are common. Therefore, the circuit area of the memory cell 20 (20c-1 and 20c-2) can be reduced.

It should be noted that the write word line 3aW and the write word line 3bW are the same as the write word line 3W of the third embodiment except that they are a pair structurally. Also, the read word line 3aR and the read word line 3bR are the same as the read word line 3R of the third embodiment except that they are a pair structurally. Also, the first MOS transistors 6 of the memory cell 20c-1 and the memory cell 20c-2 are the same as the first MOS transistor 6 of the third embodiment except that the sources and drains of the first MOS transistors 6 are communized. Therefore, the description of the memory cell is omitted. Moreover, the other components shown in FIG. 27 are the same as those of the third embodiment. Therefore, the description of them is omitted.

Figure 28:
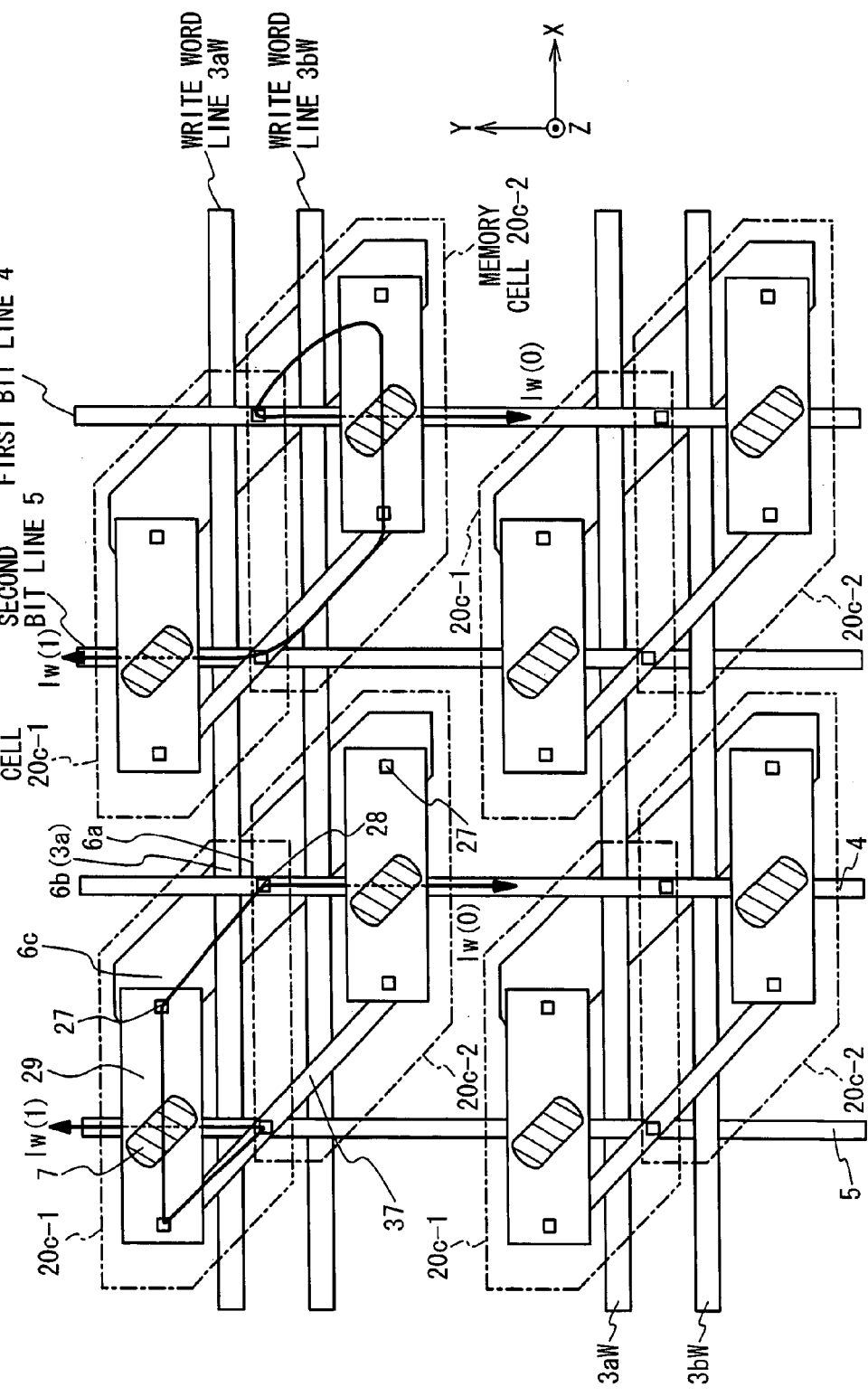
FIG. 28 is a plan view of the magnetic random access memory shown in FIG. 27.

FIG. 28 is a plan view of the memory cell array of the magnetic random access memory shown in FIG. 27. In this view, the memory cells 2c (2c-1 and 2c-2) of 4×4 (two sets×two set) in the memory cell array section 1 are shown as the representative cells. The read word line 3aR and the read word line 3bR are provided on the magnetic resistance element 7 as shown in FIG. 13. However, they are omitted from the viewpoint of easy understanding, like FIG. 13.

In the first MOS transistor 6 of the memory cell 20c-1, the source 6a is connected with the first bit line 4 through the contact wiring line 28. The gate 6b is the write word line 3aW. The drain 6c is connected with the second bit line 5 through the contact wiring line 27—the extension wiring line 29—the contact wiring line 37. On the other hand, in the first MOS transistor 6 of the memory cell 20c-2, the source 6a is connected with the first bit line 4 through the contact wiring line 28. The gate 6b is the write word line 3bW. The drain 6c is connected with the second bit line 5 through the contact wiring line 27—the extension wiring line 29—the contact wiring line 37. The other components shown in FIG. 28 are the same as those of the ninth embodiment. Therefore, the description is omitted.

Next, the operation of the magnetic random access memory containing the magnetic memory cells according to the tenth embodiment of the present invention is the same as the operation of the eighth embodiment except that the wiring lines (28 and 37) to connect the first bit line 4 and the second bit line 5 and the memory cells 20c are communized, and each diffusion layer is tilted by an angle φ, and the first bit line 4 and the second bit line 5 are provided under the extension wiring line 29. Therefore, the description of the operation is omitted.

In this embodiment, the same effect as in the eighth embodiment can be achieved. Also, through the increase of the arrangement density of the diffusion layers of each transistors and the communization of the wiring lines to connect each the bit lines and the memory cells 20c, the size of the memory cell 20c can be made small. Therefore, the chip size can be made small and the reduction of the cost becomes possible.

Eleventh Embodiment

The magnetic random access memory containing the magnetic memory cells according to the eleventh embodiment of the present invention will be described.

First, the structure of the magnetic random access memory containing the magnetic memory cells according to the eleventh embodiment of the present invention will be described. The structure of the magnetic random access memory (the magnetic random access memory) containing the magnetic memory cell according to the eleventh embodiment of the present invention is the same as that of the first embodiment as shown in FIG. 1. The magnetic random access memory in this embodiment is composed of the memory cell array section 1, the Y-side current source circuit 12, the read current load circuit 13, and the sense amplifier 15. The memory cell array section 1 is composed of the plurality of memory cells 2d, the plurality of word lines 3, the plurality of first bit lines 4, the plurality of second bit lines 5, the X-selector 8, the Y-selector 11, the Y-side power supply circuit 19, the Y-side current terminating circuit 14. The structure shown in FIG. 1 is the same as in the first embodiment. Therefore, the description of the structure of the magnetic random access memory in the eleventh embodiment is omitted.

Figure 29:
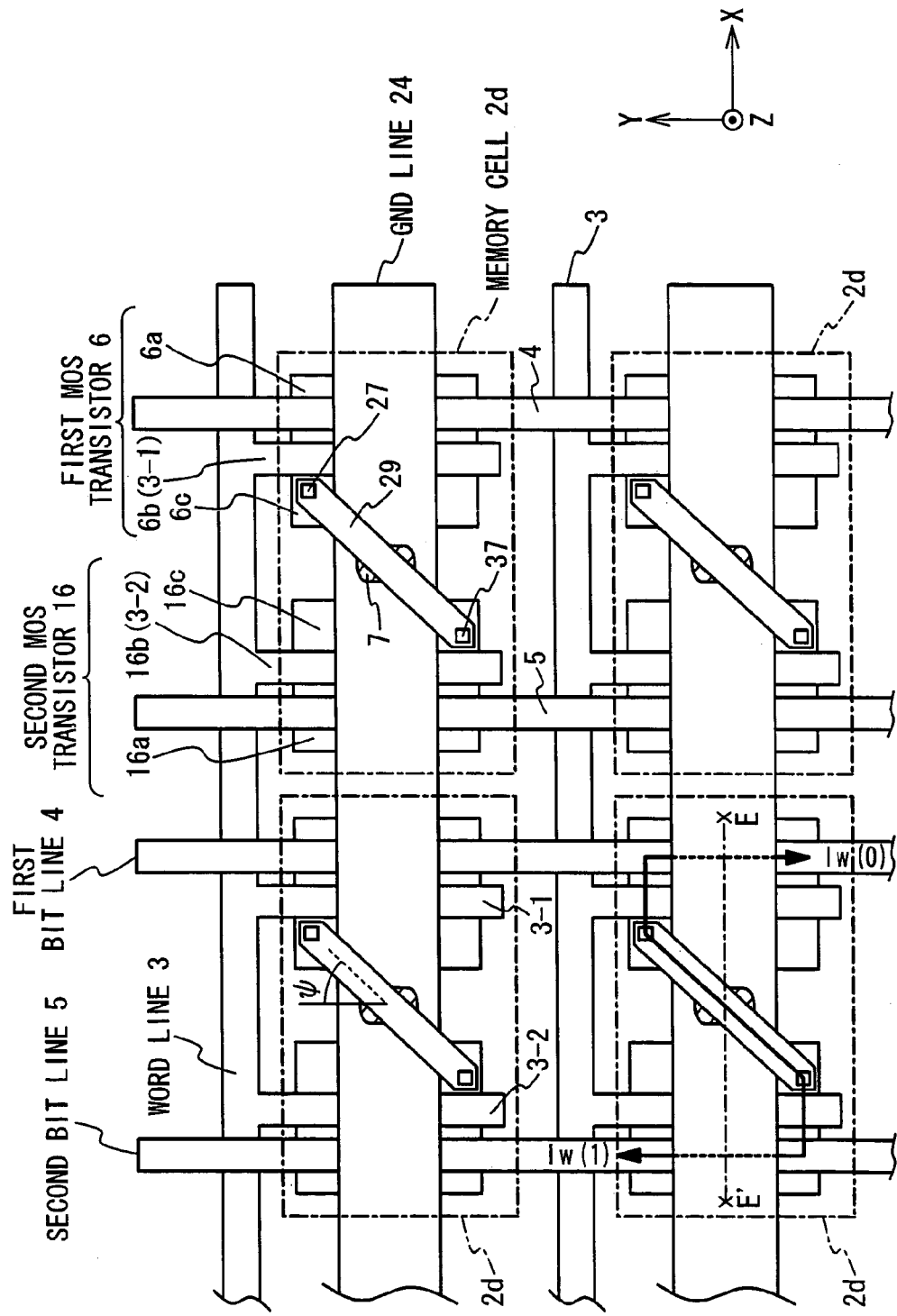
FIG. 29 is a plan view of the magnetic random access memory shown in FIG. 5.

FIG. 29 is a plan view of the memory cell array of the magnetic random access memory in the eleventh embodiment. In FIG. 29, the memory cells 2d of 2×2 in the memory cell array section 1 are shown as the representative cells. In the memory cell array section 1 in this embodiment, the ground wiring line 24 is extended to the X-axis direction between the two adjacent word lines 3 to each other. Also, the ground wiring line 24 is provided under the extension wiring line 29 (on the side of the semiconductor substrate) in the memory cell 2d arranged in the X-axis direction. Thus, the magnetic resistance element 7 is provided on the ground wiring line 24. Also, the magnetic resistance element 7 is connected at one end with the ground wiring line 24 and is connected at the other end with the extension wiring line 29. Also, the extension wiring line layer 29 is tilted or provided to have a predetermined angle φ (45° in FIG. 25) with respect to the magnetic resistance element 7 formed on the ground wiring line 24 such that the direction of the magnetic anisotropic axis is parallel to the Y-axis direction. Thus, like the seventh embodiment, the write electric current can be set small and it is possible to reduce the electric current consumption.

It should be noted that even if the tilt angle of the predetermined angle φ between the extension wiring line 29 and the direction of the magnetization anisotropic axis of the magnetic resistance element 7 is a little, there is an effect, as shown in the seventh embodiment. In this case, it is desirable that the tilt angle is in a range of 30° to 60°, more desirable that the tile angle is in a range of 40° to 50°.

The other structure of the memory cell array section 1 and the other components shown in FIG. 29 are the same as those of the first embodiment. Therefore, the description of the other structure is omitted.

In such an arrangement, the thickness of the extension wiring line 29 can be easily made thick. Thus, when the thickness of the extension wiring line 29 should be made thick for increase of the write electric current and to improve reliability, it is possible to change the thickness of the extension wiring line 29 easily.

Figure 30:
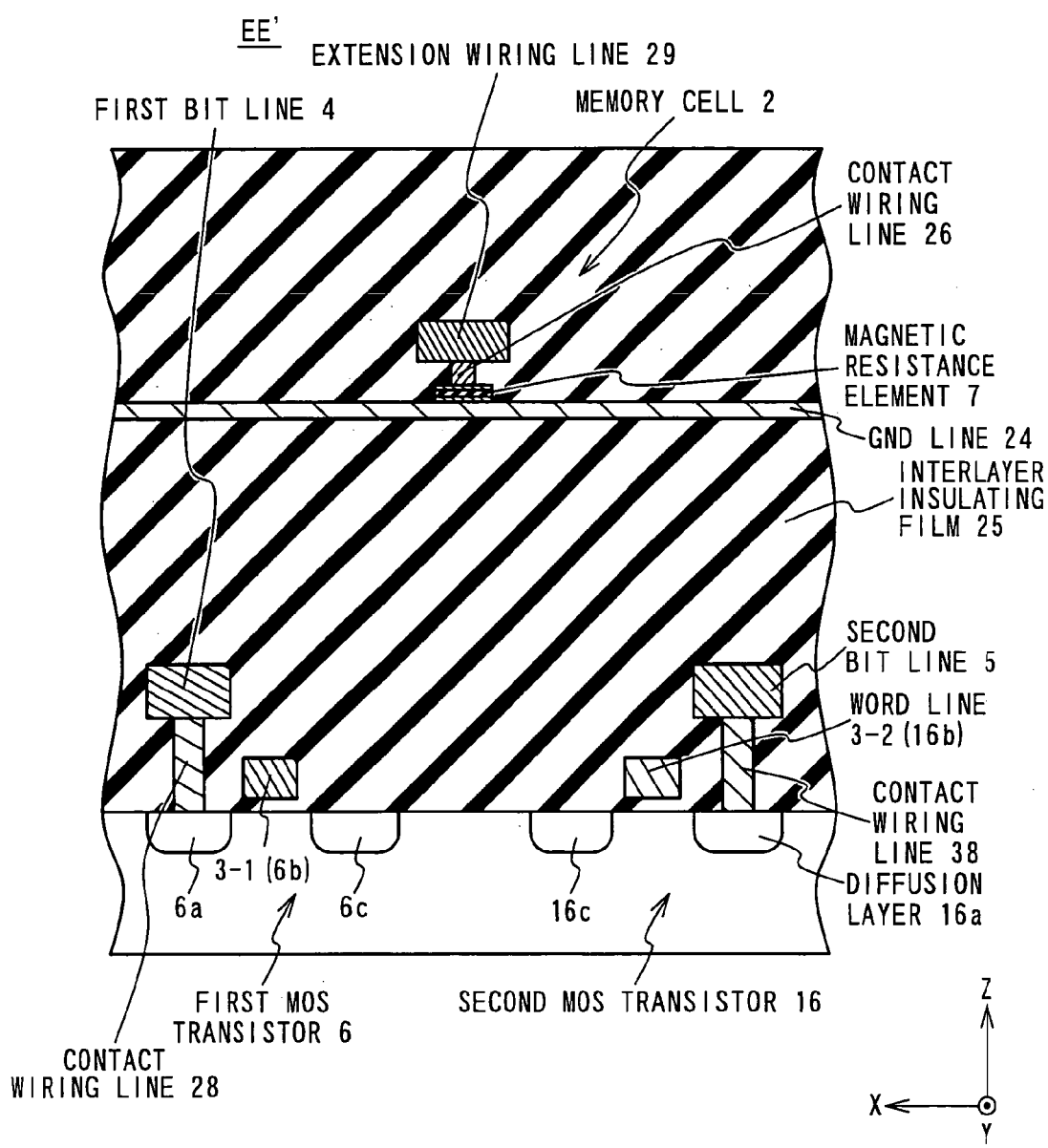
FIG. 30 is a cross sectional view of the memory cell along the EE' line shown in FIG. 29.

FIG. 30 is a cross sectional view of the memory cell 2*d* along the EE' line shown in FIG. 29. The magnetic resistance element 7 is provided on the ground wiring line 24 extending in parallel to the word line 3, and the extension wiring line 29 is provided on the magnetic resistance element 7. Although the both ends of the extension wiring line 29 are not shown, one end of the extension wiring line 29 is connected with the drain 16*c* of the second MOS transistor 16 through the contact wiring line 37 extending into the Z-axis direction and the other end thereof is connected with the drain 6*c* of the first MOS transistor 6 through the contact wiring line 27 extending into the Z-axis direction. The other components of the memory cell 2*d* are the same as those of the first embodiment. Therefore, the description is omitted.

Next, the operation of the magnetic random access memory containing the magnetic memory cells according to the eleventh embodiment of the present invention is the same as in the first embodiment. Therefore, the description is omitted.

The same effect as in first and seventh embodiments can be achieved in this embodiment. Also, the margin in the shape, i.e., the thickness of the extension wiring line 29 can be made large, and the extension wiring line 29 can be formed in accordance with the magnitude of the write electric current. Thus, the reliability of the memory cell 2 can be improved.

Twelfth Embodiment

The magnetic random access memory containing the magnetic memory cells according to the twelfth embodiment of the present invention will be described.

First, the structure of the magnetic random access memory containing the magnetic memory cells according to the twelfth embodiment of the present invention is the same as those of the third embodiment as shown in FIG. 12. The magnetic random access memory in this embodiment is composed of the memory cell array section 10, the Y-side current source circuit 12, and the current sense amplifier 15*a*. The memory cell array section 10 is composed of the plurality of memory cells 20*d*, the plurality of write word lines 3W, the plurality of read word lines 3R, the plurality of first bit lines 4, the plurality of second bit lines 5, the write X-selector 8-1, the read X-selector 8-2, the write Y-selector 11-1, the read Y-selector 11-2, the Y-side power supply circuit 19, and the Y-side current terminating circuit 14. The other components are the same as those of the third embodiment shown in FIG. 12. Therefore, the description of them is omitted.

Figure 31:
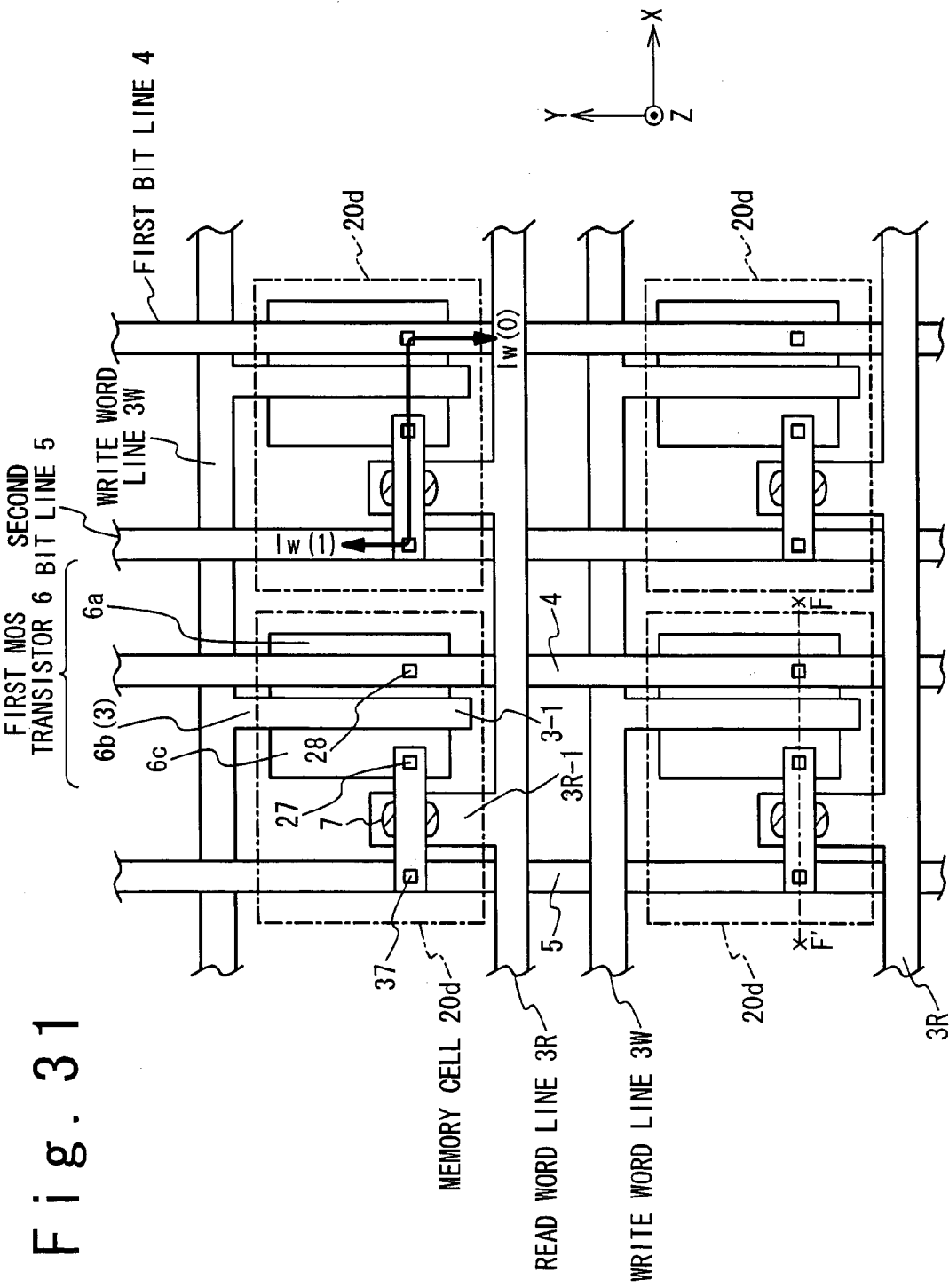
FIG. 31 is a plan view of the magnetic random access memory shown in FIG. 12.

FIG. 31 is a plan view of the memory cell array of the magnetic random access memory in the twelfth embodiment. In FIG. 31, the memory cells 20*d* of 2×2 in the memory cell array section 10 are shown as the representative cells. In the memory cell array section 10 in this embodiment, the read word line 3R is provided between the two write word lines 3W adjacent to each other and extends into the X-axis direction not to overlap with the memory cells 20*d*. Also, the read word line 3R has the read word line 3R-1 which is branched every memory cell 20*d*. The read word line 3R-1 is provided under the extension wiring line 29 (on the side of the semiconductor substrate) in the memory cells 20*d* arranged in the X-axis direction. Thus, the magnetic resistance element 7 is provided on the read word line 3R-1. The magnetic resistance element 7 is connected at one end with the read word line 3R-1 and is connected at the other end with the extension wiring line 29.

The other components of the memory cell array section 10 and the other structure shown in FIG. 31 are the same as those of the third embodiment. Therefore, the description of them is omitted.

In such an arrangement, the thickness of the extension wiring line 29 can be easily made thick. When the thickness of the extension wiring line 29 should be made thick for increase of the write electric current and the reliability should be improved, it is possible to change the thickness of the extension wiring line 29 into a appropriate thickness easily.

Figure 32:
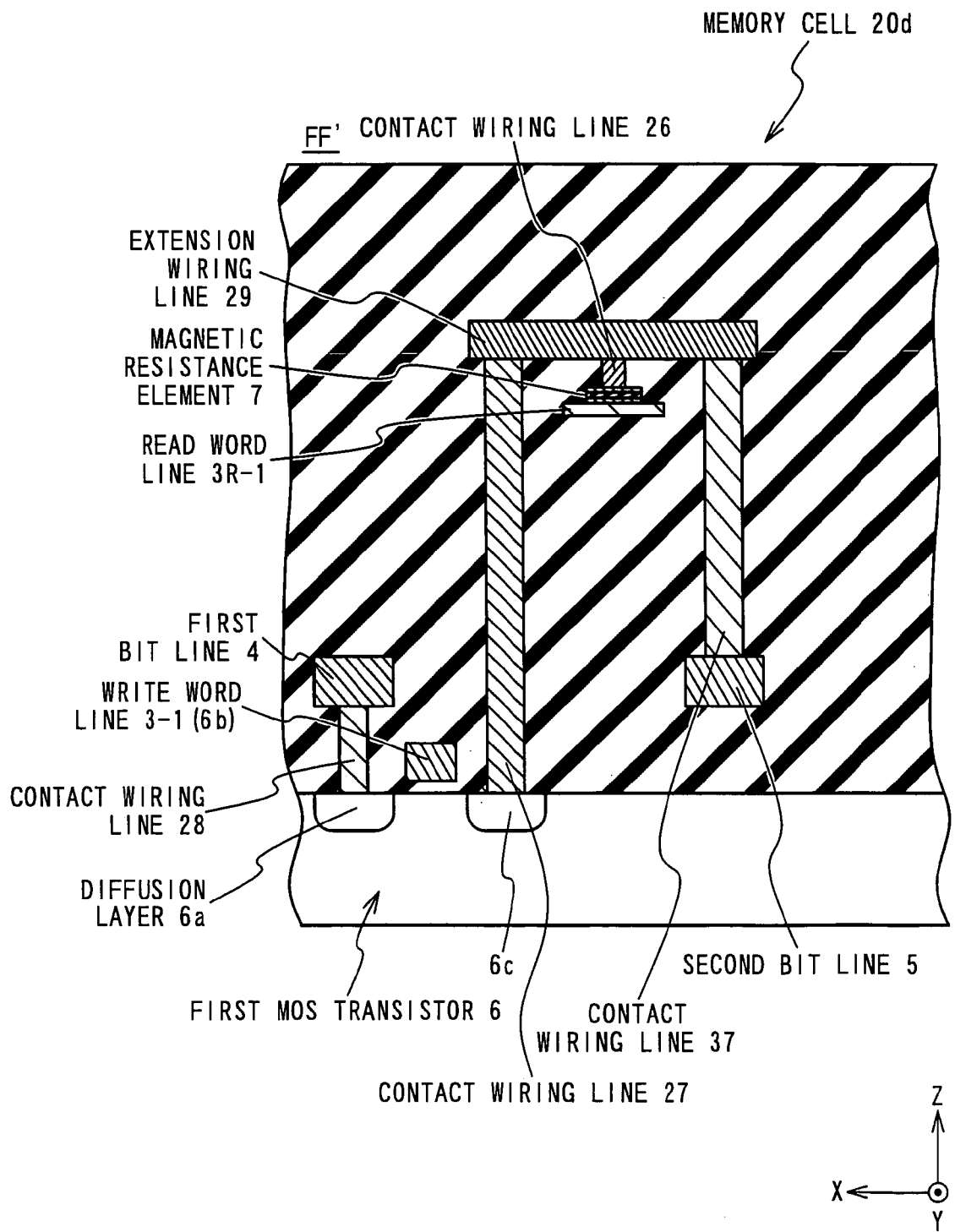
FIG. 32 is a cross sectional view of the memory cell along the FF' line shown in FIG. 31.

FIG. 32 is a cross sectional view showing the memory cell 20*d* along the FF' line shown in FIG. 31. The magnetic resistance element 7 is provided on the read word line 3R-1 which is branched from the read word line 3R to extend into parallel to the write word line 3W, and the extension wiring line 29 is provided on the magnetic resistance element 7. The extension wiring line 29 is connected at one end with the drain 6*c* of the first MOS transistor 6 through the contact wiring line 27 extending into the Z-axis direction and at the other end with the second bit line 5 through the contact wiring line 37 extending into the Z-axis direction. The other structure of the memory cell 20*d* is same as that of the third embodiment. Therefore, the description is omitted.

Next, the operation of the magnetic random access memory containing the magnetic memory cells according to the twelfth embodiment of the present invention is the same as that of the third embodiment. Therefore, the description is omitted.

The same effect as in the third embodiment can be achieved in this embodiment. Also, the margin of the shape, e.g., the thickness of the extension wiring line 29 can be made large and the shape of the extension wiring line 29 can be formed in accordance with the magnitude of the write electric current. Thus, the reliability of the memory cell 20 can be improved.

Thirteenth Embodiment

The magnetic random access memory containing the magnetic memory cells according to the thirteenth embodiment of the present invention will be described.

Figure 33:
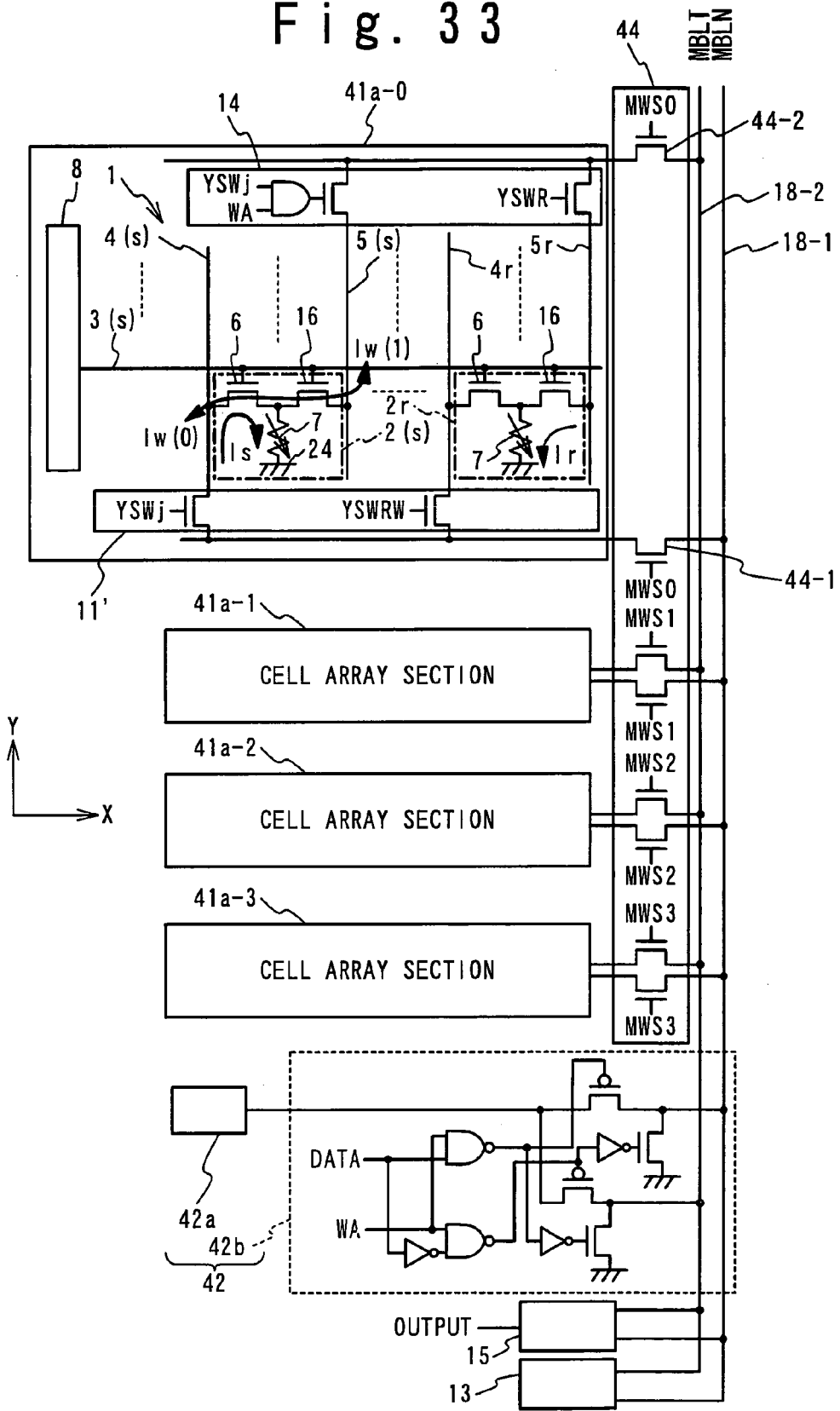
FIG. 33 is a diagram showing the structure of the magnetic random access memory containing the magnetic memory cells according to a thirteenth embodiment of the present invention.

FIG. 33 is a diagram showing the structure of the magnetic random access memory containing the magnetic memory cells according to the thirteenth embodiment of the present invention. A circuit arrangement of the magnetic random access memory in the thirteenth embodiment is the same as the first embodiment except that a small change is applied to the circuit. The magnetic random access memory in this embodiment is composed of the memory cell array sections 41a-0 to 41a-3, a cell array selector 44, a memory cell array selector 44, a Y-side current source circuit 42, the read current load circuit 13 and the sense amplifier 15.

Each of the memory cell array sections 41a-0 to 41a-3 is composed of the plurality of memory cells 2, the plurality of word lines 3, the plurality of first bit lines 4 (containing the first reference bit line 4r), the plurality of second bit lines 5 (containing the second reference bit line 5r), the X-selector 8, the Y-selector 11', and the Y-side current terminating circuit 14. The magnetic random access memory in the thirteenth embodiment is the same as that in the first embodiment except that the Y-selector 11', the Y-side current terminating circuit 14 and the Y-side power supply circuit 19. Therefore, the description of the same components of the magnetic random access memory in the thirteenth embodiment will be omitted, and the difference will be described. The Y-selector 11' selects one of the plurality of first bit lines 4 as the first selected bit line 4s based on the bit line selection signal YSWj and the first reference bit line 4r based on the reference read write signal YSWRW. The Y-side current terminating circuit 14 selects one of the plurality of second bit lines 5 as the second selected bit line 5s based on the write active signal WA and the bit line selection signal YSWj and the second reference bit line 5r based on the reference read signal YSWR. The Y-side power supply circuit 19 is omitted.

It should be noted that four memory cell array sections 41a are shown in FIG. 33, but the present invention is not limited to this number.

The memory cell array selector 44 selects one of the memory cell array sections 41a-0 to 41a-3 as the selected memory cell array section 41a-i by the pairs of the selector transistors 44-1 and 44-2 based on the memory cell array selection signal MWSi (i is an integer between 0 to 3). The selected memory cell array section 41a-i is connected with the Y-side current source circuit 42, the read current load circuit 13 and the sense amplifier 15 by the first main bit line 18-1 and the second main bit line 18-2, and carries out the data write operation and the data read operation. Here, the first main bit line 18-1 is connected with the Y-selector 11' and the second main bit line 18-2 is connected with the Y-side current terminating circuit 14.

The Y-side current source circuit 42 is composed of a constant current source 42a to supply the write predetermined write electric current and a selection section 42b to select the flow path of the write electric current from the first and second main bit lines 18-1 and 18-2 based on the write data signal DATA in the data write operation. For example, in case of the write operation of the data of "1", the Y-side current source circuit 42 supplies the write electric current through the route of the first main bit line 18-1—the memory cell array selector 44—the selected memory cell array section 41a-i and the route of the Y-selector 11'—the first selected bit line 4s—the selected memory cell 2s—the second selected bit line 5s—the Y-side current terminating circuit 14—the memory cell array selector 44—the second main bit line 18-2 (which is fixed to the ground voltage). In case of the write operation of the data of "0", oppositely, the Y-side current source circuit 42 supplies the electric current through the second main bit line 18-2—the memory cell array selector 44—the selected memory cell array section 41a-i—the Y-side current terminating circuit 14—the second selected bit line 5s—the selected memory cell 2s—the first selected bit line 4s—the Y-selector 11'—the memory cell array selector 44—the first main bit line 18-1 (which is fixed to the ground voltage).

The read current load circuit 13 supplies a predetermined read electric current to the first selected bit line 4s of the selected memory cell array section 41a-i in case of the data read operation. At the same time, the read current load circuit 13 supplies a predetermined reference read electric current to the second reference bit line 5r of the selected memory cell array section 41a-i. That is, in case of the data read operation, the read electric current flows through a route of the first main bit line 18-1—the memory cell array selector 44—the Y-selector 11'—the selected memory cell 2s. At the same time, the reference read electric current flows through the second main bit line 18-2—the memory cell array selector 44—the Y-side current terminating circuit 14—the reference memory cell 2r. The sense amplifier 15 outputs the read data of the selected memory cell 2s based on the difference between the voltage of the second main bit line 18-2 connected with the reference memory cell 2r and the voltage of the first main bit line 18-1 connected with the selected memory cell 2s.

Next, the operation of the magnetic random access memory containing the magnetic memory cells according to the thirteenth embodiment of the present invention will be described below.

In the magnetic random access memory shown in FIG. 33, the data read operation from the memory cell 2 is carried out as follows.

(1) Step S81

In the memory cell array selector 44, the pair of the selector transistors 44-1 and 44-2 is turned on based on the memory cell array selection signal MWSi and the memory cell array sections 41a-i is selects as the selected memory cell array section 41a-i. At this time, the selected memory cell array section 41a-i, the read current load circuit 13 and the sense amplifier 15 are connected by the first main bit line 18-1 and the second main bit line 18-2.

(2) Step S82

The X-selector 8 of the selected memory cell array section 41a-i selects one from the plurality of word lines 3 as the selected word line 3s based on a row address. The first MOS transistor 6 and the second MOS transistor 16 in the memory cells 2 connected with the selected word line 3s are turned on.

(3) Step S83

The Y-selector 11' of the selected memory cell array section 41a-i selects one from the plurality of first bit lines 4 as the first selected bit line 4s based on the bit line selection signal YSWj. At the same time, the Y-side current terminating circuit 14 selects the second reference bit line 5r based on the reference read write signal YSWR. In response to the read active signal RA, the read current load circuit 13 supplies the read electric current Is to the ground wiring line 24 via the route of the first main bit line 18-1—the memory cell array selector 44—the Y-selector 11'—the first selected bit line 4s—the first MOS transistor 6 of the selected memory cell 2s—the magnetic resistance element 7. At the same time, the read current load circuit 13 supplies the reference read electric current Ir to the ground wiring line 24 via the route of the second main bit line 18-2—the memory cell array selector 44—the Y-side current terminating circuit 14—the second reference bit line 5r—the second MOS transistor 16 of the selected reference memory cell 2r—the magnetic resistance element 7.

(4) Step S84

In response to the read active signal RA, the sense amplifier 15 outputs either of "1" or "0" based on the voltage difference between the voltage of the first main bit line 18-1 and the voltage of the second main bit line 18-2.

Through the above data read operation, the data of the desired selected memory cell 2s in the desired selected memory cell array section 41a-i can be read.

Next, the data write operation of the data into the memory cell 2 is carried out as follows.

(1) Step S91

In the memory cell array selector 44, the pair of the selector transistors 44-1 and 44-2 is turned on based on the memory cell array selection signal MWSi and one of the memory cell array sections 41a-0 to 41a-3 is selected as the selected memory cell array section 41a-i. At this time, the selected memory cell array section 41a-i and the Y-side current source circuit 42 are connected by the first main bit line 18-1 and the second main bit line 18-2.

(2) Step S92

The X-selector 8 of the selected memory cell array section 41a-i selects one from the plurality of word lines 3 as the selected word line 3s based on the row address. The first MOS transistor 6 and the second MOS transistor 16 in the memory cell 2 connected with the selected word line 3s are turned on.

(3) Step S93

The Y-selector 11' of the selected memory cell array section 41a-i selects one from the plurality of first bit lines 4 as the first selected bit line 4s based on the bit line selection signal YSWj. Also, the Y-side current terminating circuit 14 selects one from the plurality of second bit lines 5 as the second selected bit line 5s based on the write active signal Wa and the bit line selection signal YSWj. The first selected bit line 4s and the second selected bit line 5s which have been provided as a pair are selected.

A) In Case of the Write Operation of the Data of "1":

The second main bit line 18-2 is fixed to the ground voltage. That is, the second selected bit line 5s is fixed to the ground voltage via the Y-side current terminating circuit 14. The Y-side current source circuit 42 supplies the write electric current having a predetermined magnitude corresponding to the data signal DATA. The write electric current Iw(1) flows through the route the route of the first main bit line 18-1—the memory cell array selector 44—the Y-selector 11'—the first selected bit line 4s—the selected memory cell 2s—the second selected bit line 5s—the Y-side current terminating circuit 14—the second main bit line 18-2—the ground voltage.

B) In Case of the Write Operation of the Data of "0":

The first main bit line 18-1 is fixed to the ground voltage. That is, the first selected bit line 4s is fixed to the ground voltage via the Y-selector 11'. The Y-side current source circuit 42 having a predetermined magnitude corresponding to the data signal based on the write active signal and the data signal("0"). The write electric current Iw(0) flows through the second main bit line 18-2—the memory cell array selector 44—the Y-side current terminating circuit 14—the second selected bit line 5s—the selected memory cell 2s—the first selected bit line 4s—the Y-selector 11'—the first main bit line 18-1—the ground voltage.

(4) Step S94

In the selected memory cell 2s, the electric current Iw(0) (−X-axis direction) or the electric current Iw(1) (+X-axis direction) flows through the extension wiring line 29 which is contact with the magnetic resistance element 7 so that the magnetic field into the +Y-axis direction or −Y-axis direction is generated. The magnetic field inverts the direction of the spontaneous magnetization of the free layer 21 in the magnetic resistance element 7 and the spontaneous magnetization corresponding to the data signal is stored.

Through the above data write operation, the data can be written in the desired selected memory cell 2s in the desired selected memory cell array section 41a-i.

The magnetic random access memory can be made small in the present invention by arranging the memory cell arrays and using a partial of the magnetic random access memory in common. Also, it is sufficient that the constant current source 42a of the Y-side current source circuit 12 can supply the electric current into one direction (in the direction in which the electric current flows out in this embodiment), and the degree of freedom of the design can be improved.

Fourteenth Embodiment

The magnetic random access memory containing the magnetic memory cells according to the fourteenth embodiment of the present invention will be described.

Figure 34:
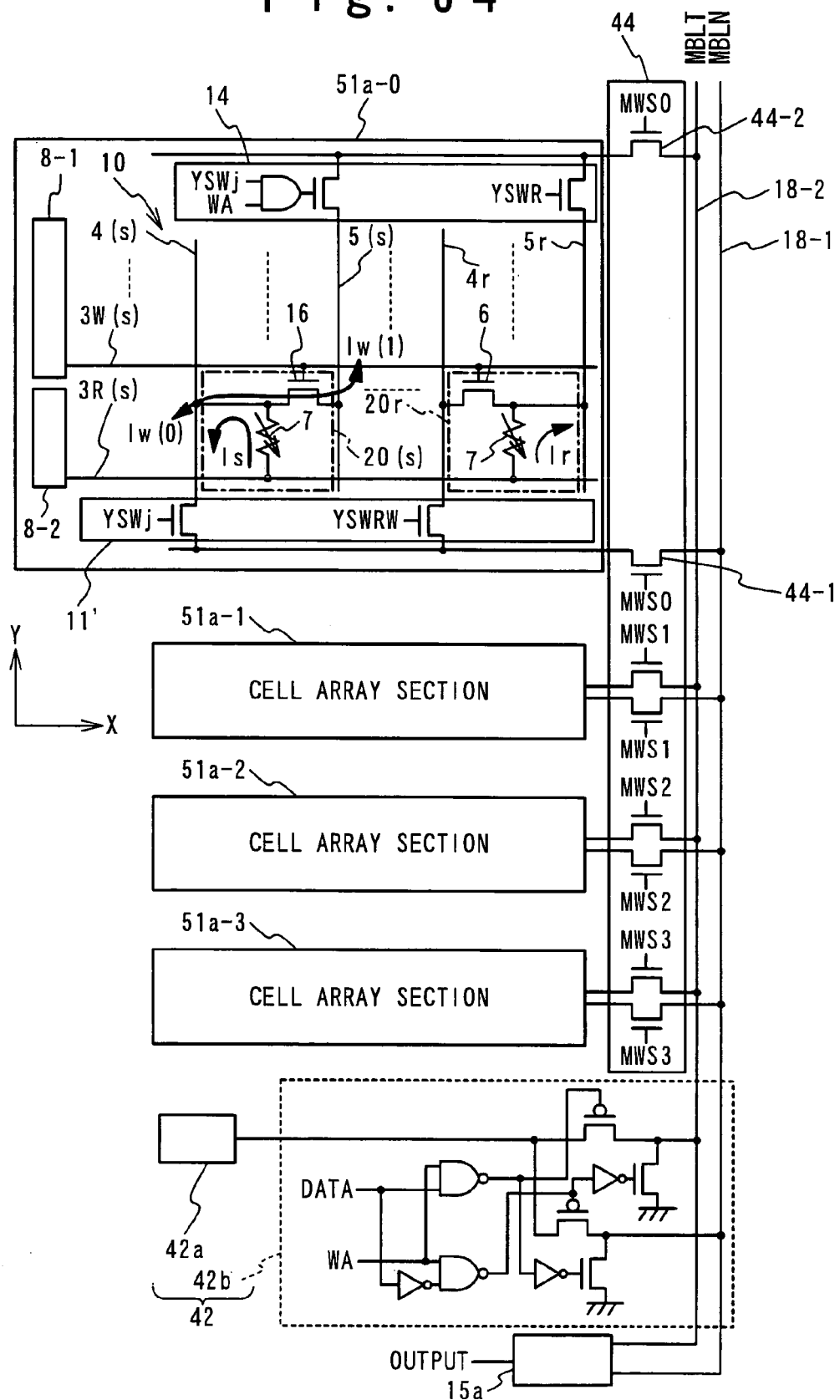
FIG. 34 is a diagram showing the structure of the magnetic random access memory containing the magnetic memory cells according to a fourteenth embodiment of the present invention.

FIG. 34 is a diagram showing the structure of the magnetic random access memory containing the magnetic memory cells according to the fourteenth embodiment of the present invention. Referring to FIG. 34, the circuit examples of the memory cell array according to the third embodiment are arranged to be distributed in address space and a part of the magnetic radon access memory is changed. The magnetic random access memory in this embodiment is composed of the memory cell array sections 51a-0 to 51a-3, the first and second main bit lines 18-1 and 18-2, the memory cell array selector 44, the Y-side current source circuit 42 and the current sense amplifier 15a.

Each of the memory cell array sections 51a-0 to 51a-3 is composed of the plurality of memory cells 20, the plurality of write word lines 3W, the plurality of read word lines 3R, the plurality of first bit lines 4 (containing the first reference bit line 4r), the plurality of second bit lines 5 (containing the second reference bit line 5r), the write X-selector 8-1, the read X-selector 8-2, the Y-selector 11', and the Y-side current terminating circuit 14.

The memory cell array section 51a-i is similar to that of the third embodiment. However, in the memory cells 20 of the memory cell array section 51a-i except for the reference memory cells 20r, the second MOS transistor 16 is provided and the first MOS transistor 6 is omitted. The gate of the second MOS transistor 16 is connected with the write word line 3W, the source is connected with the second bit line 5 and the drain is connected with one end of the magnetic resistance element 7 and the first bit line 4 via the extension wiring line 29. In the reference memory cells 20r, the first MOS transistor 6 is provided and the second MOS transistor 16 is omitted. The reference memory cell 20r is the same as that of the third embodiment.

The first bit line 4 is provided to extend into the Y-axis direction and is connected with the Y-selector 11'. The first reference bit line 4 connected with the reference memory cells 20r is referred to as the first reference bit line 4r. The second bit line 5 forms a pair together with the first bit line 4 and is provided to extend into the Y-axis direction and is connected with the Y-side current terminating circuit 14 at one end. The second bit line 5 for reference is referred to as the second reference bit line 5r. The write word line 3W and the read word line 3R are the same as those of the third embodiment. Each of the above memory cells 20 is provided for one of the positions where the plurality of sets of the first bit line and the second bit line and the plurality of sets of the write word line 3W and the read word line 3R intersect.

The write X-selector 8-1 and the read X-selector 8-2 are the same as those of the third embodiment. The Y-selector 11' selects one of the plurality of first bit lines 4 as the first selected bit line 4s based on the bit line selection signal YSWj in case of the data write operation and the data read operation. Also, in case of the reference data write operation to the reference memory cell 20r, the first reference bit line 4r is selected based on the reference write signal YSWRW. The Y-side current terminating circuit 14 selects one from the plurality of second bit lines 5 as the second selected bit line 5s based on the write active signal WA and the bit line selection signal YSWj the in case of the data write operation, and the second selected bit line 5s forms a pair together with the first selected bit line 4s. Also, the Y-side current terminating circuit 14 selects the second reference bit line 5r based on the reference read write signal YSWR in case of the reference data read operation and the data write operation of the reference memory cell 20r. The memory cell 2 is selected by the selected write/read word lines 3Ws/3Rs and the first/second selected bit lines and is referred to as the selected memory cell 2s. It should be noted that in FIG. 34, although the four memory cell array sections 51a are shown, the present invention is not limited to this number.

The memory cell array selector 44 selects one of the memory cell array sections 51a-0 to 51a-3 as selected memory cell array section 51a-i by the pairs of the selector transistors 44-1 and 44-2 based on the memory cell array selection signal MWSi (i is an integer between 0 to 3). The selected memory cell array section 51a-i is connected with the Y-side current source circuit 42 and the current sense amplifier 15a by the first main bit line 18-1 and the second main bit line 18-2 and the data write operation and the data read operation are carried out.

The Y-side current source circuit 42 is an electric current source to carry out the supply and the drawing of a predetermined write electric current between the first selected bit line 4s and the second selected bit line 5s of the selected memory cell array section 51a-i in case of the data write operation. For example, in case of the write operation of data "1", the Y-side current source circuit 42 supplies the write electric current based on the write active signal WA and the data signal DATA. The write electric current flows through the route of the first main bit line 18-1—the memory cell array selector 44—the selected memory cell array section 51a-i—the Y-selector 11'—the first selected bit line 4s—the selected memory cell 2s—the second selected bit line 5s—the Y-side current terminating circuit 14—the memory cell array selector 44—the second main bit line 18-2 (the second main bit line 18-2 is fixed to the ground voltage). In case of the data write operation of data "0", oppositely, the Y-side current source circuit 42 supplies the electric current to the route of the second main bit line 18-2. The write electric current flows through the route of the second main bit line 18-2—the memory cell array selector 44—the selected memory cell array section 51a-i—the Y-side current terminating circuit 14—the second selected bit line 5s—the selected memory cell 2s—the first selected bit line 4s—the Y-selector 11'—the memory cell array selector 44—the first main bit line 18-1 (the first main bit line 18-1 is fixed to the ground voltage). In this case, a circuit section 42a of the Y-side current source circuit 42 generates a constant current and a circuit section 42b thereof selects the route or path of the supply of the electric current. The current sense amplifier 15a reads data from the selected memory cell 2s and outputs the data based on the difference between the electric current which flows through the second reference bit line 5r connected with the reference memory cell 20r (the second main bit line 18-2) and the electric current which flows through the first selected bit line 4s connected with the selected memory cell 2s (the first main bit line 18-1).

Next, the operation of the magnetic random access memory containing the magnetic memory cells according to the fourteenth embodiment of the present invention will be described below.

In the magnetic random access memory shown in FIG. 34, the data read operation from the memory cell 2 is carried out as follows.

(1) Step S101

In the memory cell array selector 44, one pair of the selector transistors 44-1 and 44-2 is turned on based on the memory cell array selection signal MWSi and a corresponding one of the memory cell array sections 51a-0 to 51a-3 is selected as the selected memory cell array section 51a-i. At this time, the selected memory cell array section 51a-i and the electric current sense amplifier 15 are connected by the first main bit line 18-1 and the second main bit line 18-2.

(2) Step S102

The read X-selector 8-2 of the selected memory cell array section 51a-i selects one from the plurality of read word lines 3R as the selected read word line 3Rs based on a row address.

(3) Step S103

The Y-selector 11' of the selected memory cell array section 51a-i selects one from the plurality of first bit lines 4 as the first selected bit line 4s based on the bit line selection signal YSWj. Thus, the selected memory cell 20s is determined. At the same time, the Y-side current terminating circuit 14 also selects the second reference bit line 5r. Thus, the read electric current Is which reflects the data of the selected memory cell 20s flows through the route of the read X-selector 8-2—the selected read word line 3Rs—the magnetic resistance element 7 of the selected memory cell 20s—the first selected bit line 4s—the Y-selector 11'—the first main bit line 18-1—the current sense amplifier 15a due to the voltage difference between the read X-selector 8-2 and the current sense amplifier 15a. On the other hand, the reference read electric current Ir which reflects the data "0" of the reference memory cell 20r flows through the route of the read X-selector 8-2—the selected read word line 3Rs—the magnetic resistance element 7 of the reference memory cell 20r—the second reference bit line 5r—the second main bit line 18-2—the current sense amplifier 15a.

(4) Step S104

The current sense amplifier 15a determines based on the difference of the read electric current Is and the reference read electric current Ir that the read data is "0" if the difference between the read electric current Is and the reference read electric current Ir is small and "1" if both are different (for example, the difference is larger), and outputs the result.

Through the above data read operation, the data of the desired selected memory cell 2s in the desired selected memory cell array section 51a-i can be read.

Next, the data write operation of the data into the memory cell 2 is carried out as follows.

(1) Step S111

In the memory cell array selector 44, one of the pairs of the selector transistors 44-1 and 44-2 based on the memory cell array selection signal MWSi and a corresponding one the memory cell array sections 51a-0 to 51a-3 is selected as the selected memory cell array section 51a-i. At this time, the selected memory cell array section 51a-i and the Y-side current source circuit 42 are connected by the first main bit line 18-1 and the second main bit line 18-2.

(2) Step S112

The write X-selector 8-1 of the selected memory cell array section 51*a*-*i* selects one from the plurality of write word lines 3W as the selected write word line 3W based on the row address. The second MOS transistors 16 of the memory cells 20 connected with the selected write word line 3Ws and the first MOS transistor 6 of the selected reference memory cell 20*r* are turned on.

(3) Step S113

The Y-selector 11' of the selected memory cell array section 51*a*-*i* selects one from the plurality of first bit lines 4 as the first selected bit line 4*s* based on the bit line selection signal YSWj in the data write operation. Thus, the selected memory cell 20*s* is determined. Also, the Y-selector 11' selects the first reference bit line 4*r* based on the reference write signal YSWRW in the reference data write operation. Also, the Y-side current terminating circuit 14 selects one from the plurality of second bit lines 5 as the second selected bit line 5*s* based on the write active signal WA and the bit line selection signal YSWj in the data write operation. Also, the Y-side current terminating circuit 14 selects the second reference bit line 5*r* based on the reference read write signal YSWR in the reference data write operation.

A) In Case of the Data Write Operation of "1"

The second main bit line 18-2 is fixed to the ground voltage. That is, the second selected bit line 5*s* is fixed to the ground voltage via the Y-side current terminating circuit 14. The Y-side current source circuit 42 supplies the write electric current Iw(1) having a predetermined magnitude corresponding to the data signal based on the data signal ("1") and the write active signal. The write electric current Iw(1) flow out from the Y-side current source circuit 42, and flows through the route of the first main bit line 18-1—the memory cell array selector 44—the Y-selector 11'—the first selected bit line 4*s*—the selected memory cell 2*s*—the second selected bit line 5*s*—the Y-side current terminating circuit 14—the second main bit line 18-2—the ground voltage.

B) In Case of the Data Write Operation of "0"

The first main bit line 18-1 is fixed to the ground voltage. That is, the first selected bit line 4*s* is fixed to the ground voltage via The Y-selector 11'. The Y-side current source circuit 42 supplies the write electric current Iw(0) having a predetermined magnitude corresponding to the data signal based on the write active signal and the data signal ("0"). The write electric current Iw(0) flow out from the Y-side current source circuit 42 and flows through the route of the second main bit line 18-2—the memory cell array selector 44—the Y-side current terminating circuit 14—the second selected bit line 5*s*—the selected memory cell 2*s*—the first selected bit line 4*s*—the Y-selector 11'—the first main bit line 18-1—the ground voltage.

(4) Step S114

In the selected memory cell 2*s*, the write electric current Iw(0)(−X-axis direction) or the write electric current Iw(1) (+X-axis direction) flows through the extension wiring line 29 which is contact with the magnetic resistance element 7 and the magnetic field is generated into the +Y-axis direction or −Y-axis direction. The magnetic field inverts the direction of the spontaneous magnetization of the free layer 21 in the magnetic resistance element 7 and the spontaneous magnetization corresponding to the data signal is stored.

Through the above data write operation, the data can be written in the desired selected memory cell 2*s* in the desired selected memory cell array section 51*a*-*i*.

In the present invention, the memory cell arrays are arranged in an address space and a part of the magnetic random access memory circuit is used in common to the memory cell arrays. Thus, the magnetic random access memory can be made small. Also, it is sufficient if a constant current source 42*a* of the Y-side current source circuit 12 correspond only to one direction (the direction in which the electric current flows out in this embodiment), and the degree of freedom of the design can be improved.

Fifteenth Embodiment

The magnetic random access memory containing the magnetic memory cells according to the fifteenth embodiment of the present invention will be described.

Figure 35:
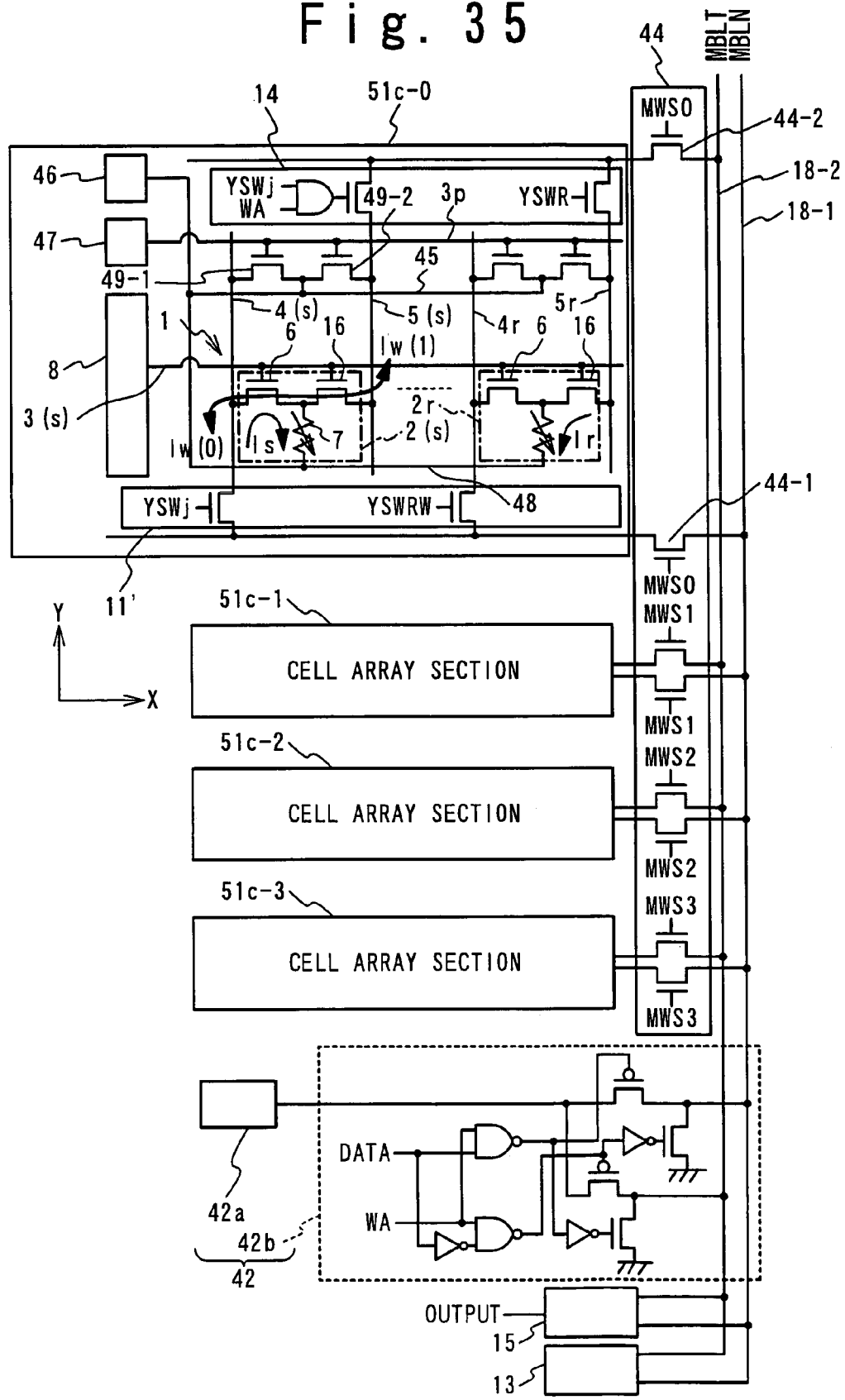
FIG. 35 is a diagram showing the structure of the magnetic random access memory containing the magnetic memory cells according to a fifteenth embodiment of the present invention.

FIG. 35 is a diagram showing the structure of the magnetic random access memory containing the magnetic memory cells according to the fifteenth embodiment of the present invention. Referring to FIG. 35, the circuit examples of the memory cell array in the first embodiment are arranged in an address space and a part of the magnetic random access memory is changed. The magnetic random access memory in this embodiment is composed of the memory cell array sections 41*c*-0 to 41*c*-3, the memory cell array selector 44, the first and second main bit lines 18-1 and 18-2, the Y-side current source circuit 42, the read current load circuit 13 and the sense amplifier 15.

Each of the memory cell array sections 41*c*-0 to 41*c*-3 is composed of the plurality of memory cells 2, the plurality of word lines 3, the plurality of first bit lines 4 (containing the first reference bit line 4*r*), the plurality of second bit lines 5 (containing the second reference bit line 5*r*), the X-selector 8, the Y-selector 11', the Y-side current terminating circuit 14, a precharge word line 3*p*, a precharge power supply circuit 46, a precharge selector 47 and a set of precharge transistors 49 (49-1 and 49-2). It should be noted that in FIG. 35, the four memory cell array sections 41*c* are shown but the present invention is not limited to this number.

In the memory cell array section 1, the memory cells 20 are arranged in a matrix. Each of the memory cells 2 contains the first MOS transistor 6, the second MOS transistor 16 and the magnetic resistance element 7. It should be noted that the memory cell 2 for reference is referred to as the reference memory cell 2*r*. The first MOS transistor 6 and the second MOS transistor 16 are the same as in the thirteenth embodiment shown in FIG. 33. The magnetic resistance element 7 is connected at one end with the drain of each of the above transistors and is connected at the other end with the precharge voltage line 48. The magnetic resistance element 7 has the spontaneous magnetization, and the direction of the spontaneous magnetization is inverted in accordance with a write data. In the data read operation, the first MOS transistor 6 connects the magnetic resistance element 7 with the first bit line 4 and is used to flow the read electric current through the first bit line 4—the extension wiring line 29—the magnetic resistance element 7—the precharge voltage line 48. In the data write operation, the first MOS transistor 6 and the second MOS transistor 16 are connected with the first bit line 4 and the second bit line 5, and are used to supply the write electric current in the neighborhood of the magnetic resistance element 7.

The precharge power supply circuit 46 applies a predetermined precharge voltage Vpr to the precharging line 45 and the plurality of precharge voltage lines 48. I case of the data write operation to the memory cell 2, the precharge voltage Vpr is set to be equal to a voltage of the extension wiring line 29 at the node to which the first MOS transistor 6, the second MOS transistor 16 and the magnetic resistance element 7 are connected. The precharge selector 47 activates the precharge word line 3p. The precharge word line 3p is provided to extend into the X-axis direction (the direction of the word line) and is connected with the precharge selector 47. The precharging line 45 is provided to extend into the X-axis direction (the direction of the word line) and is connected with the precharge power supply circuit 46. Thus, the precharge voltage Vpr is supplied to the first bit line 4 and the second bit line 5 through the precharge transistors 49-1 and 49-2. The plurality of precharge voltage lines 48 are provided to extend into the X-axis direction (the direction of the word line) and are connected with the precharge power supply circuit 46. Each of the plurality of precharge voltage lines 48 is provided for one of columns of the memory cells 2, and the precharge voltage Vpr is applied to the other end of the magnetic resistance element 7 which is opposite to the one end of the magnetic resistance element 7 where the first MOS transistor 6 and the second MOS transistor 16 are connected. In the precharge transistor 49-1, the gate is connected with the precharge word line 3p, the drain is connected with the precharging line 45, and the source is connected with the first bit line 4. In the precharge transistor 49-2, the drain is connected with the precharging line 45, the source is connected with the second bit line 5, and the gate is connected with the precharge word line 3p.

The other structure of the memory cell array section 41c is the same as in the thirteenth embodiment. Therefore, the description of the structure is omitted.

The memory cell array selector 44, the Y-side current source circuit 42, the read current load circuit 13 and the sense amplifier 15 are the same as those of the thirteenth embodiment. Therefore, the description of them is omitted.

Next, the operation of the magnetic random access memory containing the magnetic memory cells according to the fifteenth embodiment of the present invention will be described.

In the magnetic random access memory shown in FIG. 35, the precharge transistor 49-1 and the precharge transistor 49-2 are turned on through the activation of the precharge word line 3p by the precharge selector 47 in case of the non-selection of the first bit line 4 and the second bit line 5. Thus, the first bit line 4 and the second bit line 5 are precharged to the precharge voltage Vpr through the precharging line 45, the precharge transistor 49-1 and the precharge transistor 49-2 from the precharge power supply circuit 46.

The data read operation from the memory cell 2 and the data write operation in to the memory cell 2 in the magnetic random access memory shown in FIG. 35 are the same as those of the thirteenth embodiment except that the read electric current Is and the reference read electric current Ir in case of the data read operation flow to not the ground wiring line 24 but the precharge power supply circuit 46 through the precharge voltage line 48. Therefore, the description of the operation is omitted.

In the present invention, in case of the data write operation, both ends of the magnetic resistance element 7 are set to the same voltage (the precharge voltage Vpr) so that any voltage difference is not present. Therefore, the loss of the write electric current in the memory cell 2 can be prevented. That is, the precision of the write electric current can be improved.

Also, the first bit line 4 and the second bit line 5 are set to the precharge voltage Vpr. Therefore, it can be prevented that data is written in the memory cell 2 due to an electric current flowing as the result of that the first bit line 4 and the second bit line 5 are respectively set to difference voltages.

Also, the magnetic random access memory can be made small in size because the memory cell arrays are arranged in the address space and a part of the magnetic random access memory circuit is used in common to the memory cell arrays.

Sixteenth Embodiment

The magnetic random access memory containing the magnetic memory cells according to the sixteenth embodiment of the present invention will be described.

Figure 36:
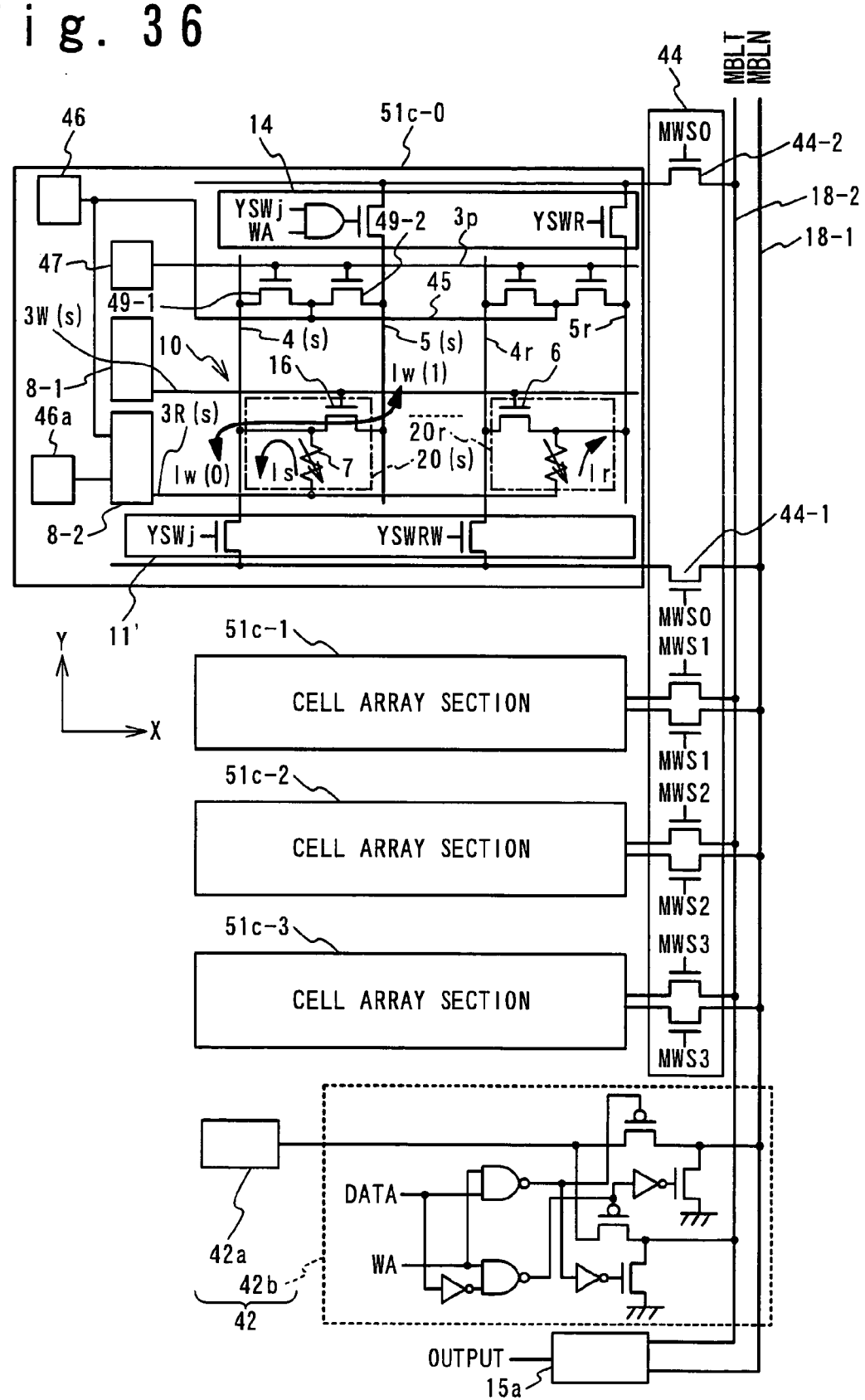
FIG. 36 is a diagram showing the structure of the magnetic random access memory containing the magnetic memory cells according to a sixteenth embodiment of the present invention.

FIG. 36 is a diagram showing the structure of the magnetic random access memory containing the magnetic memory cells according to the sixteenth embodiment of the present invention. The circuit examples of the memory cell array in the third embodiment shown in FIG. 12 are arranged in an address space and a part of the magnetic random access memory circuit is changed. The magnetic random access memory in this embodiment is composed of the memory cell array sections 51c-0 to 51c-3, the memory cell array selector 44, the Y-side current source circuit 42 and electric current sense amplifier 15a.

Each of the memory cell array section 51c-0 to 51c-3 is composed of the plurality of memory cells 20, the plurality of write word lines 3W, the plurality of read word lines 3R, the plurality of first bit lines 4 (containing the first reference bit line 4r), the plurality of second bit lines 5 (containing the second reference bit line 5r), the write X-selector 8-1, the read X-selector 8-2, the Y-selector 11' (also carrying out selection/non-selection of the first reference bit line 4r), the Y-side current terminating circuit 14, an X-side power supply circuit 46a, a precharge word line 3p, a precharging line 45, a precharge power supply circuit 46, the precharge selector 47 and the precharge transistors 49 (49-1 and 49-2). It should be noted that in FIG. 36, the four memory cell array sections 51c are shown but the present invention is not limited to this number.

The precharge power supply circuit 46 applies a predetermined precharge voltage Vpr to the read word line 3R through the precharging line 45 and the read X-selector 8-2. In case of the data write operation into the memory cell 20, the precharge voltage Vpr is set to be equal to the voltage of the extension wiring line 29 at a node to which the first MOS transistor 6, the second MOS transistor 16 and the magnetic resistance element 7 are connected. In case of the data read operation, the X-side power supply circuit 46a applies a predetermined read voltage Vread to the read word line 3R through the read X-selector 8-2. The precharge selector 47, the precharge word line 3p, precharging line 45, the precharge transistors 49-1 and 49-2 are the same as those of the fifteenth embodiment. The other structure of the memory cell array section 51c is the same as that of the fourteenth embodiment shown in FIG. 34. Therefore, the description is omitted.

The memory cell array selector 44, the Y-side current source circuit 42 and the current sense amplifier 15a are the same as those of the fourteenth embodiment. Therefore, the description of them is omitted.

Next, the operation of the magnetic random access memory containing the magnetic memory cells according to the sixteenth embodiment of the present invention will be described below.

In the magnetic random access memory shown in FIG. 36, the precharge transistor 49-1 and the precharge transistor 49-2 are turned on through the activation of the precharge word line 3p by the precharge selector 47 in case of the non-selection of the first bit line 4 and the second bit line 5. Thus, the first bit line 4 and the second bit line 5 are precharged to the precharge voltage Vpr from the precharge power supply circuit 46 through the precharging line 45 and the set of the precharge transistor 49-1 and the precharge transistor 49-2.

The data read operation from the memory cell 20 and the data write operation to the memory cell 20 in the magnetic random access memory shown in FIG. 36 are the same as those of the fourteenth embodiment. Therefore, the description of the operation is omitted.

In the present invention, the same effect as in the fifteenth embodiment can be achieved. The magnetic random access memory can be made small in size because the memory cell array sections are arranged in the address space and a part of the magnetic random access memory circuit is used in common to the memory cell arrays.

Seventeenth Embodiment

The magnetic random access memory containing the magnetic memory cells according to the seventeenth embodiment of the present invention will be described.

Figure 37:
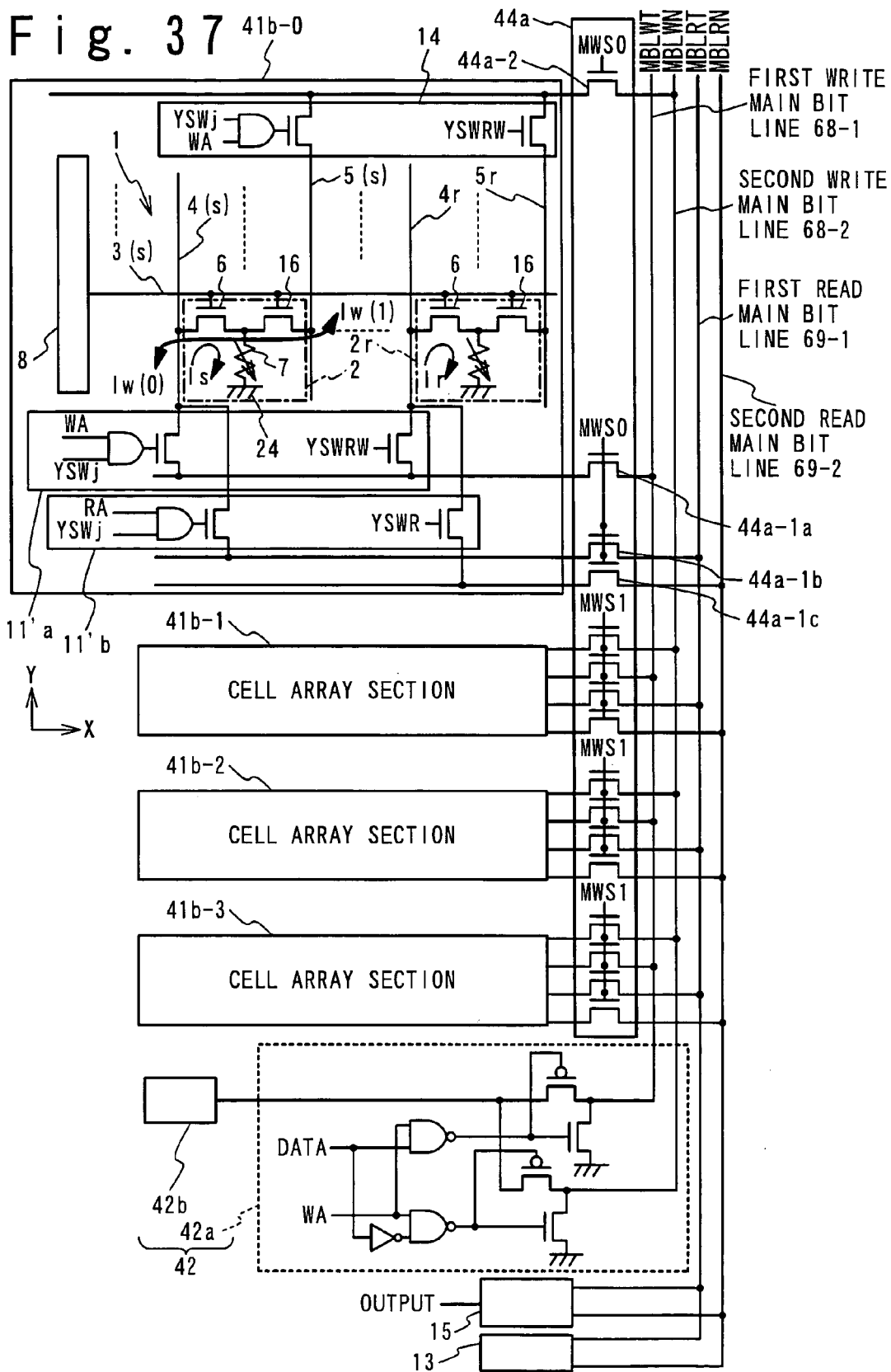
FIG. 37 is a diagram showing the structure of the magnetic random access memory containing the magnetic memory cells according to a seventeenth embodiment of the present invention.

FIG. 37 is a diagram showing the structure of the magnetic random access memory containing the magnetic memory cells according to the seventeenth embodiment of the present invention. Referring to FIG. 37, the circuit examples of the memory cell arrays in the first embodiment shown in FIG. 5 are arranged in an address space and a part of the magnetic random access memory is changed. The magnetic random access memory in this embodiment is composed of the memory cell array sections 41b-0 to 41b-3, the memory cell array selectors 44a, the Y-side current source circuit 42, the read current load circuit 13 and the sense amplifier 15.

Each of the memory cell array sections 41b-0 to 41b-3 is composed of the plurality of memory cells 2, the plurality of word lines 3, the plurality of first bit lines 4 (containing the first reference bit line 4r), the plurality of second bit lines 5 (containing the second reference bit line 5r), the X-selector 8, a first Y-selector 11'a used in the data write operation, a second Y-selector 11'b used in the data read operation, and the Y-side current terminating circuit 14. It should be noted that in FIG. 37, the four memory cell array sections 41b-i are shown but the present invention is not limited to this number. The first Y-selector 11'a carries out the same operation as the Y-selector 11 of the first embodiment in case of the data write operation. In addition, the first Y-selector 11'a carries out the selection/non-selection of the first reference bit line 4r. Also, the second Y-selector 11'b carries out the same operation as the Y-selector 11 of the first embodiment in case of the data read operation. In addition, the second Y-selector 11'b carries out the selection/non-selection of the first reference bit line 4r. Also, the Y-side current terminating circuit 14 selects one of the plurality of second bit lines 5 as the second selected bit line based on the bit line selection signal YSWj in the data write operation, and the second reference bit line in the reference data write operation based on the reference write signal YSWRW. The other structures of the memory cell array 41b-i except for the first Y-selector 11'a, the second Y-selector 11'b and the Y-side current terminating circuit 14 are the same as those in the first embodiment. Therefore, the description of the structure will be omitted.

The memory cell array selector 44a selects one of the memory cell array sections 41b-0 to 41b-3 by sets of the selector write transistor 44a-1a, the selector read transistor 44a-1b, the selector read transistor 44a-1c and the selector write transistor 44a-2 based on the memory cell array selection signal MWSi (i is an integer between 0 to 3, and corresponds to the number of memory cell array sections 41b in this example) and the selected memory cell array section 41-i is selected. The selected memory cell array section 41b-i is connected with the Y-side current source circuit 42 by the first write main bit line 68-1 and the second write main bit line 68-2, and the data write operation or the reference data write operation is carried out. Also, the selected memory cell array section 41-i is connected with the read current load circuit 13 and the sense amplifier 15 by the first read main bit line 69-1 and the second read main bit line 69-2 and the data read operation is carried out.

The Y-side current source circuit 42 is composed of an electric current source which carries out the supply and drawing-out of a predetermined write electric current between the first selected bit line 4s or the second selected bit line 5s of the selected memory cell array section 41b-i in case of the reference data write operation through the first and second write main bit lines 68-1 and 68-2 and the predetermined write electric current between the first reference bit line 4r or the second reference bit line 5r of the selected memory cell array section 41b-i in case of the reference data write operation through the first and second write main bit lines 68-1 and 68-2. For example, in case of the write operation of data "1", the Y-side current source circuit 42 supplies the write electric current which flows through the route of the first write main bit line 68-1—the selector write transistor 44a-1 of the memory cell array selector 44a—the selected memory cell array section 41b-i—the first Y-selector 11'a—the first selected bit line 4s—the selected memory cell 2s—the second selected bit line 5s—the Y-side current terminating circuit 14—the selector write transistor 44a-2 of the memory cell array selectors 44a—the first write main bit line 68-2 (the second write main bit line 68-2 is fixed to the ground voltage). In case of the data write operation of data "0", oppositely, the Y-side current source circuit 42 supplies the write electric current which flows through the route of the second write main bit line 68-2—the selector write transistor 44a—of the memory cell array selector 44a —the selected memory cell array section 41a-i—the Y-side current terminating circuit 14—the second selected bit line 5s—the selected memory cell 2s—the first selected bit line 4s—the first Y-selector 11'a—the selector write transistor 44a-1a of the memory cell array selector 44—the first write main bit line 68-1 (the first main bit line 68-1 is fixed to the ground voltage). In this case, a circuit section 42a of the Y-side current source circuit 42 generates a constant current and a selection section 42b thereof selects the direction of the supply of the write electric current.

The read current load circuit 13 supplies a predetermined read electric current to the first selected bit line 4s of the selected memory cell array section 41b-i in case of the data read operation. At the same time, the read current load circuit 13 supplies a predetermined read electric current to the first reference bit line 4r of the selected memory cell array section 41b-i. That is, in the case of the data read operation, the electric current flows through the route of the first read main bit line 69-1—the selector read transistor

44a-1b of the memory cell array selector 44a—the second Y-selector 11'b—the first selected bit line 4s—the selected memory cell 2s. At the same time, the electric current flows through the route of the second read main bit line 69-2—the selector read transistor 44a-1c of the memory cell array selector 44—the second Y-selector 11'b—the first reference bit line 4r—the selected reference memory cell 2r. The sense amplifier 15 outputs the read data from the selected memory cell 2s based on the difference between the voltage of the second read main bit line 69-2 connected with the reference memory cell 2r and the voltage of the first read main bit line 69-1 connected with the selected memory cell 2s.

Next, the operation of the magnetic random access memory containing the magnetic memory cells according to the seventeenth embodiment of the present invention will be described below.

In the magnetic random access memory shown in FIG. 37, the data read operation from the memory cell 2 is carried out as follows.

(1) Step S121

In the memory cell array selector 44a, the selector read transistor 44a-1c and the selector read transistor 44a-1b are turned on based on the memory cell array selection signal MWSi and one of the memory cell array sections 41b-0 to 41b-3 is selected as the selected memory cell array section 41b-i. At this time, the selected memory cell array section 41b-i, the read current load circuit 13 and the sense amplifier 15 are connected by the first read main bit line 69-1 and the second read main bit line 69-2.

(2) Step S122

The X-selector 8 of the selected memory cell array section 41b-i selects one from the plurality of word lines 3 as the selected word line 3s based on a row address. The first MOS transistor 6 and the second MOS transistor 16 in each of the memory cells 2 are turned on.

(3) Step S123

The second Y-selector 111b of the selected memory cell array section 41b-i selects one from the plurality of first bit lines 4 as the first selected bit line 4s based on the bit line selection signal YSWj in the data read operation. At the same time, the second Y-selector 11'b selects the first reference bit line 4r based on the reference read wire signal YSWR. In response to the read active signal, the read current load circuit 13 supplies the read electric current Is through of the route of the first read main bit line 69-1—the second Y-selector 11'b—the first selected bit line 4s and the electric current flows into the ground wiring line 24 through the route of the first MOS transistor 6 of the selected memory cell 2s—the magnetic resistance element 7. At the same time, the read current load circuit 13 supplies the reference read electric current Ir into the ground wiring line 24 through the route of the second read main bit line 69-2—the second Y-selector 11'b—the first reference bit line 4r—the first MOS transistor 6 of the selected reference memory cell 2r (the reference memory cell 2r is provided for the point of intersection of the selected word line 3s and the first reference bit line 4r)—the magnetic resistance element 7.

(4) Step S124

In response to the read active signal, the sense amplifier 15 outputs either of "1" or "0" based on the voltage difference between the voltage of the second read main bit line 69-2 and the voltage of the first read main bit line 69-1.

Through the above data read operation, the data of the desired selected memory cell 2s in the desired selected memory cell array section 41b-i can be read.

Next, the data write operation of the data into the memory cell 2 is carried out as follows.

(1) Step S131

In the memory cell array selector 44a, the selector write transistor 44a-1a and the selector write transistor 44a-2 are turned on based on the memory cell array selection signal MWSi and one of the memory cell array sections 41b-0 to 41b-3 is selected as the selected memory cell array section 41b-i. At this time, the selected memory cell array section 41b-i, the Y-side current source circuit 42 and the sense amplifier 15 are connected by the second write main bit line 68-2 and the first write main bit line 68-1.

(2) Step S132

The X-selector 8 of the selected memory cell array section 41b-i selects one from the plurality of word lines 3 as the selected word line 3s based on the row address. The first MOS transistor 6 and the second MOS transistor 16 in each of the memory cells 2 are turned on.

(3) Step S133

The first Y-selector 11'a of the selected memory cell array section 41b-i selects one from the plurality of first bit lines 4 as the first selected bit line 4s based on the bit line selection signal YSWj and the write active signal. Also, the Y-side current terminating circuit 14 selects one from the plurality of second bit lines 5 as the second selected bit line 5s in response to the bit line selection signal YSWj and the write active signal. The first selected bit line 4s and the second selected bit line 5s forms a pair originally.

A) In Case of the Data Write Operation of "1"

The second write main bit line 68-2 is fixed to the ground voltage. That is, the second selected bit line 5s is fixed to the ground voltage via the Y-side current terminating circuit 14. The Y-side current source circuit 42 supplies the write electric current Iw(1) having a predetermined magnitude corresponding to the data signal in the direction that the write electric current Iw(1) flows from the Y-side current source circuit 42 based on the write active signal and the data signal ("1"), and the write electric current flows through the route of the first write main bit line 68-1—the memory cell array selector 44a—the first Y-selector 11'a—the first selected bit line 4s—the selected memory cell 2s—the second selected bit line 5s—the Y-side current terminating circuit 14—the memory cell array selector 44a—the second write main bit line 68-2—the ground voltage.

B) In Case of the Data Write Operation of "0"

The first write main bit line 68-1 is fixed to the ground voltage. That is, the first selected bit line 4s is fixed to the ground voltage via the first Y-selector 11'a. The Y-side current source circuit 42 supplies the write electric current Iw(0) having a predetermined magnitude corresponding to the data signal in the direction that the write electric current Iw(0) flows out from the Y-side current source circuit 42 based on the write active signal and the data signal ("0"), and the electric current flows through the route of the second write main bit line 68-2—the memory cell array selector 44a—the Y-side current terminating circuit 14—the second selected bit line 5s—the selected memory cell 2s—the first selected bit line 4s—the first Y-selector 11'a—the memory cell array selector 44a—the first write main bit line 68-1—the ground voltage.

(4) Step S134

In the selected memory cell 2s, the write electric current Iw(0) (−X-axis direction) or the write electric current Iw(1) (+X-axis direction) flows through the extension wiring line 29 which is contact with the magnetic resistance element 7 and the magnetic field is generated into the +Y-axis direction or −Y-axis direction. The direction of the spontaneous magnetization of the free layer 21 of the magnetic resistance element 7 is inverted by the magnetic field and the spontaneous magnetization corresponding to the data signal is stored.

Through the above data write operation, the data can be written in the desired selected memory cell 2s in the desired selected memory cell array section 41b-i.

Because the read transistors and the write transistors can be provided independently in the memory cell array selector 44a, the transistor size can be controlled even when the magnitudes of the write electric current and the read electric current are different. Thus, the data write operation and the data read operation can be carried out stably even when the magnitudes of the write electric current and the read electric current are different. Also, in the present invention, the memory cell arrays are arranged in the address space and a part of the magnetic random access memory circuit is used in common to the memory cell arrays so that the magnetic random access memory can be made small in size.

Eighteenth Embodiment

The magnetic random access memory containing the magnetic memory cells according to the eighteenth embodiment of the present invention will be described.

Figure 38:
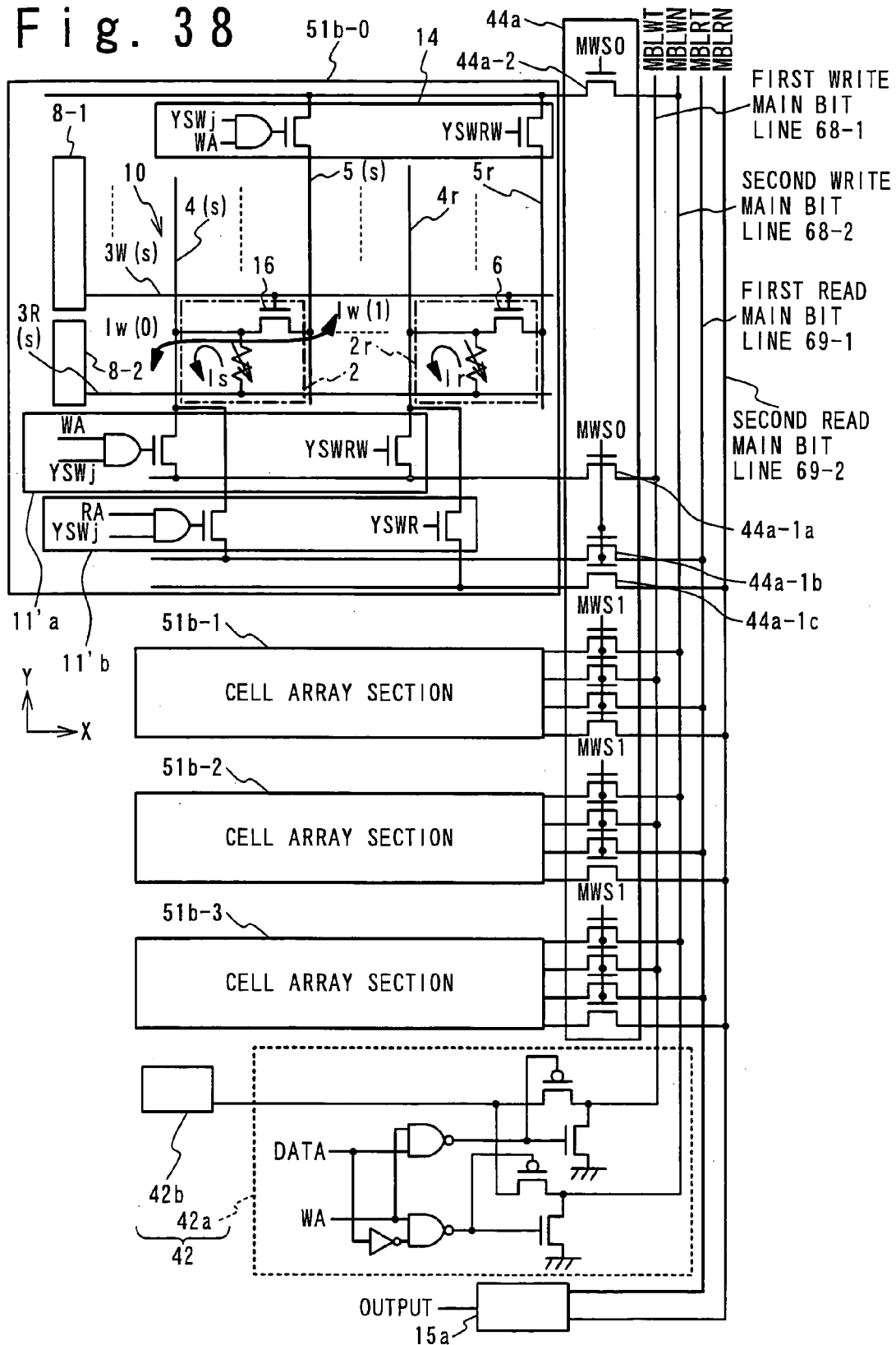
FIG. 38 is a diagram showing the structure of the magnetic random access memory containing the magnetic memory cells according to an eighteenth embodiment of the present invention.

FIG. 38 is a diagram showing the structure of the magnetic random access memory containing the magnetic memory cells according to the eighteenth embodiment of the present invention. Referring to FIG. 38, compared with the structure of the magnetic random access memory in the fourteenth embodiment shown in FIG. 34, the first Y-selector 11'a is provided in place of the Y-selector 11', and the first and second main bit lines 68-1 and 68-2 are provided in place of the first and second main bit line 18-1 and 18-2, for the data write operation. In case of the data write operation, they are used. Also, the second Y-selector 11'b is provided in place of the Y-selector 11', and the first and second main bit lines 69-1 and 69-2 are provided in place of the first and second main bit lines 18-1 and 18-2 for the data read operation. In case of the data read operation, they are used. In case of the data write operation, the memory cell array selector 44a selects one of the memory cell array sections 51b-0 to 51b-3 as the selected memory cell array section 51b-i by a set of a selector write transistor 44a-1a and a selector write transistor 44a-2 based on the memory cell array selection signal MWSi (i is an integer between 0 to 3). In case of the data read operation, the memory cell array selector 44a selects one of the memory cell array sections 51b-0 to 51b-3 as the selected memory cell array section 51b-i. The other structures are the same as those of the fourteenth embodiment. Therefore, the description is omitted.

Next, the operation of the magnetic random access memory containing the magnetic memory cells according to the eighteenth embodiment of the present invention is the same as that of the fourteenth embodiment except that the write exclusive use structure (the first Y-selector 11'a, the first and second main bit lines 68-1 and 68-2, the selector write transistor 44a-1a and the selector write transistor 44a-2) is used in the data write operation and the read exclusive use structure (the second Y-selector 11'b, the first and second main bit lines 69-1 and 69-2, the selector read transistor 44a-1b and the selector read transistor 44a-1c) is used in the data read operation. Therefore, the description is omitted.

The present invention can achieve the same effect as that of the seventeenth embodiment.

Nineteenth Embodiment

The magnetic random access memory containing the magnetic memory cells according to the nineteenth embodiment of the present invention will be described.

Figure 39:
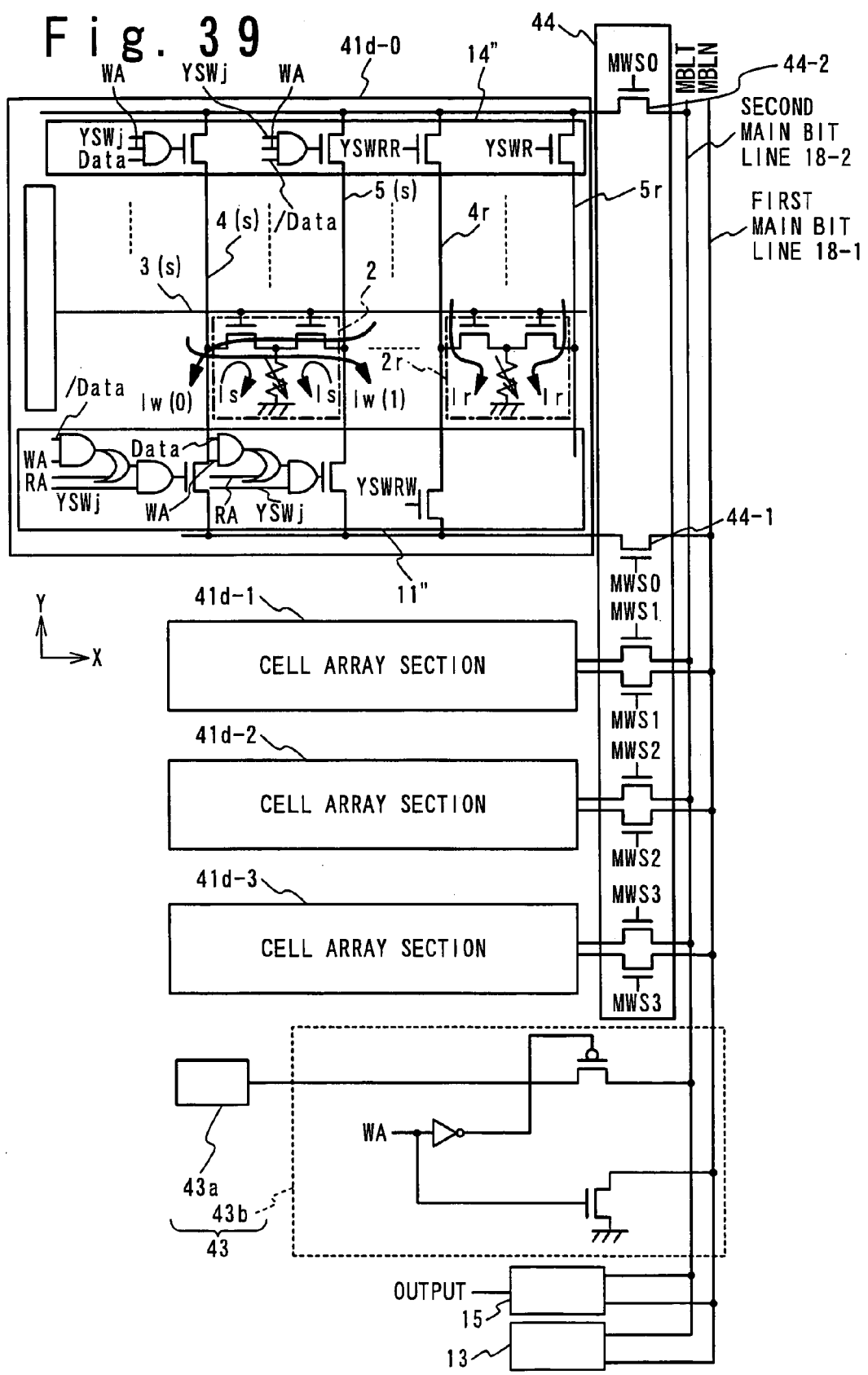
FIG. 39 is a diagram showing the structure of the magnetic random access memory containing the magnetic memory cells according to a nineteenth embodiment of the present invention.

FIG. 39 is a diagram showing the structure of the magnetic random access memory containing the magnetic memory cells according to the nineteenth embodiment of the present invention. The magnetic random access memory in this embodiment is composed of the memory cell array sections 41d-0 to 41d-3, the first and second main bit lines 18-1 and 18-2, the memory cell array selector 44, the Y-side current source circuit 43, the read current load circuit 13 and the sense amplifier 15. It should be noted that in FIG. 39, the four memory cell array sections 41d are shown but the present invention is not limited to this number.

Each of the memory cell array section 41d-0 to 41d-3 is composed of the plurality of memory cells 2, the plurality of word lines 3, the plurality of first bit lines 4 (containing the first reference bit line 4r), the plurality of second bit lines 5 (containing the second reference bit line 5r), the X-selector 8, the Y-selector 11" (carrying out the selection/non-selection of the first reference bit line 4r), and the Y-side current terminating circuit 14" (carrying out the selection/non-selection of the first reference bit line 4r). The memory cell array section 41d is the same as that of the first embodiment except for the Y-side current terminating circuit 14" and the Y-selector 11".

The first bit line 4 is provided to extend into the Y-axis direction (the direction of the bit line), and is connected at one end with the Y-selector 11" and is connected at the other end with the Y-side current terminating circuit 14". The second bit line 5 forms a pair together with the first bit line 4 originally and is provided to extend into the Y-axis direction, and is connected at one end with the Y-selector 11" and is connected at the other end with the Y-side current terminating circuit 14". The word line 3 is provided to extend into the X-axis direction (the direction of the word line) and is connected with the X-selector 8. Each of the above memory cells 2 is provided for one of the positions where the plurality of sets of the first bit line 4 and the second bit line 5 and the plurality of word lines intersect.

The X-selector 8 selects one of the plurality of word lines 3 extending in the X-axis direction (the direction of the word line) as the selected word line 3s based on a row address in any case of the data read operation and data write or reference data write operation.

In case of the data read operation, the Y-selector 11" selects one from the plurality of first bit lines 4 and one from the plurality of second bit lines 5 as the first selected bit line 4s and the second selected bit line 5s which forms a pair originally, based on the bit line selection signal YSWj. Also, in case of the data write operation, the Y-selector 11" selects either of the first selected bit line 4s or the second selected bit line 5s based on to a write data (either of "0" or "1") and the bit line selection signal YSWj. In case of the reference data write operation, the Y-selector 11" selects the first reference bit line 4r based on the reference read write signal YSWRW to write the reference data of "0"

The Y-side current terminating circuit 14" dose not select the first selected bit line 4s and the second selected bit line 5s in the data read operation. The Y-side current terminating circuit 14" selects one of the first selected bit line 4s and the second selected bit line 5s, which is not selected by the Y-selector 11", based on the write data and the bit line selection signal YSWj in case of the data write operation. Also, Y-side current terminating circuit 14" selects the first reference bit line 4r based on the reference read signal YSWRR and the second reference bit line 5r based on the reference read write signal YSWR in case of the reference data write operation.

The Y-side current source circuit 43 is an electric current source which carries out the supply of a predetermined write electric current to the first selected bit line 4s or the second selected bit line 5s through the second main bit line 18-2 in case of the data write operation. A circuit section 43a of the Y-side current source circuit 43 generates a constant current and a selection section 43b thereof supplies the generated constant current onto the second main bit line 18-2. The predetermined write electric current flows from the Y-side current source circuit 43 through the route of the second main bit line 18-2—the memory cell array selector 44—the Y-side current terminating circuit 14" of the selected memory cell array section 41a-i—the first or second selected bit line 4s or 5s—the selected memory cell 2s—the second or first selected bit line 5s or 4s—the Y-selector 11"—the memory cell array selector 44—the first main bit line 18-1 in the data write operation. The predetermined write electric current flows from the Y-side current source circuit 43 through the route of the second main bit line 18-2—the memory cell array selector 44—the Y-side current terminating circuit 14" of the selected memory cell array section 41a-i—the second reference bit line 5r—the selected reference memory cell 2r—the first reference bit line 4r—the Y-selector 11"—the memory cell array selector 44—the first main bit line 18-1 in case of the reference data write operation. Then, the predetermined write electric current returns to the Y-side current source circuit 43.

The read current load circuit 13 supplies a predetermined read electric current to the selected memory cell 2s through the first main bit line 18-1 in case of the data read operation. In the same way, in case of the data read operation, the read current load circuit 13 supplies the predetermined read electric current to the selected reference memory cell 2r through the second main bit line 18-2. The reference memory cell 2r has the same basic structure as the usual memory cell 2. When the data read operation is carried out to the other memory cells 2, the reference memory cell 2r is referred to.

The memory cell array selector 44 and the sense amplifier 15 are the same as those of the seventeenth embodiment. Therefore, the description will be omitted.

Next, the operation of the magnetic random access memory containing the magnetic memory cells according to the nineteenth embodiment of the present invention will be described below.

In the magnetic random access memory shown in FIG. 39, the data read operation from the memory cell 2 is carried out as follows.

(1) Step S141

In the memory cell array selector 44, one of the pairs of the selector transistors 44-1 and 44-2 is turned on based on the memory cell array selection signal MWSi (i is an integer between 0 to 3) to select it as the selected memory cell array section 41d-i. At this time, the selected memory cell array section 41d-i, the read current load circuit 13 and the sense amplifier 15 are connected by the first main bit line 18-1 and the second main bit line 18-2.

(2) Step S152

The X-selector 8 of the selected memory cell array section 41d-i selects one from the plurality of word lines 3 as the selected word line 3s based on a row address. The first MOS transistor 6 and the second MOS transistor 16 in each of the memory cells 2 connected with the selected word line 3s are turned on.

(3) Step S153

In response to the bit line selection signal YSWj, the Y-selector 11" of the selected memory cell array section 41d-i selects one from the plurality of first bit lines 4 as the first selected bit line 4s and one from the plurality of second bit lines 5 as the second selected bit line 5s, which forms a pair with the first selected bit line 4s originally. At the same time, the Y-side current terminating circuit 14" selects the first reference bit line 4r and the second reference bit line 5r in response to the reference read signal YSWRR and the reference read write signal YSWR. In response to the read active signal RA, the read current load circuit 13 supplies the read electric current Is into the ground wiring line 24 through the route of the first main bit line 18-1—the Y-selector 11"—the first selected bit line 4s and the second selected bit line 5s—the first MOS transistor 6 and the second MOS transistor 16 of the selected memory cell 2s—the magnetic resistance element 7. At the same time, the read current load circuit 13 supplies the reference read electric current into the ground wiring line 24, and the reference read electric current flows through the route of the second main bit line 18-2—the Y-side current terminating circuit 14"—the first reference bit line 4r and the second reference bit line 5r—the selected reference memory cell 2r (the reference memory cell 2r provided for the point of intersection of the selected word line 3s and the first reference bit line 4r)—the first MOS transistor 6 and the second MOS transistor 16—the magnetic resistance element 7.

(4) Step S154

In response to the read active signal, the sense amplifier 15 outputs either of "1" or "0" based on the voltage difference between the voltage of the first main bit line 18-1 and the voltage of the second main bit line 18-2.

Through the above data read operation, the data of the desired selected memory cell 2s in the desired selected memory cell array section 41d-i can be read.

Next, the data write operation of the data into the memory cell 2 is carried out as follows.

(1) Step S161

In the memory cell array selector 44, the pair of the selector transistors 44-1 and 44-2 is turned on based on the memory cell array selection signal MWSi and one of the memory cell array sections 41d-0 to 41d-3 is selected as the selected memory cell array section 41d-i. At this time, the selected memory cell array section 41d-i, the Y-side current source circuit 12 and the sense amplifier 15 are connected by the first main bit line 18-1 and the second main bit line 18-2.

(2) Step S162

The X-selector 8 of the selected memory cell array section 41d-i selects one from the plurality of word lines 3 as the selected word line 3s based on the row address. The first MOS transistor 6 and the second MOS transistor 16 in each of the memory cells 2 connected with the selected word line 3s are turned on.

(3) Step S163

The Y-selector 11' of the selected memory cell array section 41d-i receives the bit line selection signal YSWj and the data signal Data and selects the first selected bit line 4s or the second selected bit line 5s in accordance with the data signal. Also, the Y-side current terminating circuit 14" selects the second selected bit line 5s or the first selected bit line 4s in accordance with the data signal based on the bit line selection signal YSWj and the data signal Data. The first selected bit line 4s and the second selected bit line 5s are selected to form a pair.

A) In Case of the Data Write Operation of "1"

The Y-side current terminating circuit 14 selects the first selected bit line 5s. The Y-side current terminating circuit 14" selects the first selected bit line 4s which forms a pair with the first selected bit line 5s. The Y-side current source circuit 43 supplies the write electric current Iw(1) having predetermined magnitude through the route of the Y-side current source circuit 43—the second main bit line 18-2—the Y-side current terminating circuit 14"—the first selected bit line 4s—the selected memory cell 2s—the second selected bit line 5s—the Y-selector 11"—the first main bit line 18-1—the Y-side current source circuit 43.

B) In Case of the Data Write Operation of "0"

The Y-side current terminating circuit 14" selects the second selected bit line 5s. The Y-selector 11" selects the first selected bit line 4s which forms a pair with the second selected bit line 5s. The Y-side current source circuit 43 supplies the write electric current Iw(0) having predetermined magnitude through the route of the Y-side current source circuit 43—the second main bit line 18-2—the Y-side current terminating circuit 14"—the second selected bit line 5s—the selected memory cell 2s—the first selected bit line 4s—the Y-selector 11"—the first main bit line 18-1—the Y-side current source circuit 43.

(4) Step S164

In the selected memory cell 2s, the write electric current Iw(0)(−X-axis direction) or the write electric current Iw(1) (+X-axis direction) flows through the extension wiring line 29 which is contact with the magnetic resistance element 7 and the magnetic field is generated the +Y-axis direction or −Y-axis direction. The direction of the spontaneous magnetization in the free layer 21 of the magnetic resistance element 7 is inverted by the magnetic field and the spontaneous magnetization corresponding to the data signal is stored.

Through the above data write operation, the data can be written in the desired selected memory cell 2s in the desired selected memory cell array section 41a-i.

In the present invention, the selecting circuit of the main bit line in the Y-side current source circuit 43 can be omitted and a simple power supply connection circuit 43b can be used. Also, the read electric currents Is and Ir are read using the two MOS transistors. Therefore, the influence of the deviation of the MOS transistor in the memory cell can be restrained. Moreover, the magnetic random access memory can be made small in size by arranging the memory cell arrays in the address space and using a part of the magnetic random access memory circuit in common to the memory cell arrays.

Twentieth Embodiment

The magnetic random access memory containing the magnetic memory cells according to the twentieth embodiment of the present invention will be described.

Figure 40:
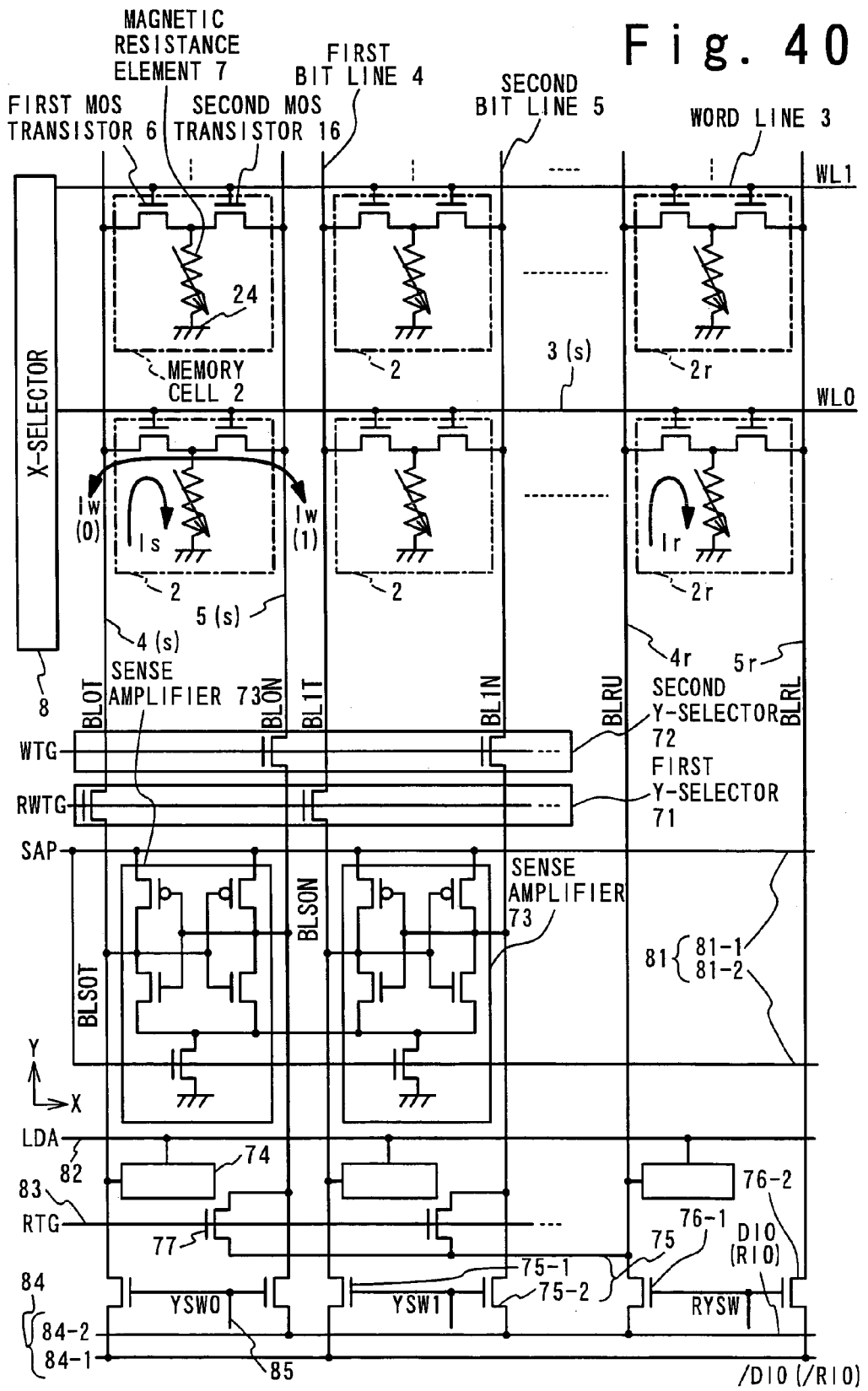
FIG. 40 is a diagram showing the structure of the magnetic random access memory containing the magnetic memory cells according to a twentieth embodiment of the present invention.

FIG. 40 is a diagram showing the structure of the magnetic random access memory containing the magnetic memory cells according to the twentieth embodiment of the present invention. The magnetic random access memory in this embodiment is composed of the memory cell array section 1, and a data processing section 90. The memory cell array section 1 is composed of the plurality of memory cells 2, the plurality of word lines 3, the plurality of first bit lines 4 (containing the first reference bit line 4r), the plurality of second bit lines 5 (containing the second reference bit line 5r), the X-selector 8, a first Y-selector 71, and a second Y-selector 72. The data processing section 90 is composed of a plurality of sense amplifiers 73, a plurality of read current load circuits 74, a plurality of third transistors 77, a plurality of column selection transistors 75 (75-1 and 75-2), reference selection transistors 76 (76-1 and 76-2), sense lines 81 (81-1 and 81-2), a read current signal line 82, a comparison signal line 83, data bus lines 84 (84-1 and 84-2), and column signal lines 85. That is, the data processing section 90 is a section from the sense line 81-1 to the data bus line 84.

The memory cell array section 1 (containing the memory cell 2) is the same as in the first embodiment. Therefore, the description is omitted.

The first bit line 4 is provided to extend into the Y-axis direction (the direction of the bit line) and is connected at one end with the first Y-selector 71, and extends from the first Y-selector 71 to the data bus line 84. A signal on the first bit line 4 is referred to as a signal BLiT (i is an integer between 0 to n, and n+1 is the number of the first bit lines 4). The second bit line 5 forms a pair with the first bit line 4 and is provided to extend into the Y-axis direction and is connected at one end with the second Y-selector 72, and extends from the second Y-selector 72 to the data bus line 84. A signal on the second bit line 5 is referred to as a signal BLiN (i is an integer between 0 to n, and n+1 is the number of the first bit lines 4). The word line 3 is provided to extend into the X-axis direction (the direction of the word line) perpendicular to the Y-axis direction and is connected with the X-selector 8. A signal on the word line 3 is referred to as a signal WLk (k is an integer between 0 to m, and m+1 is the number of the word lines 3). Each of the above memory cells 2 is provided for one of the positions where the plurality of sets of the first bit line 4 and the second bit line 5 and the plurality of word lines intersect.

The X-selector 8 selects one from the plurality of word lines 3 as the selected word line 3s in either case of the data read operation and the data write operation. The first Y-selector 71 selects one from the plurality of first bit lines 4 as the first selected bit line 4s in case of the data read operation and in the data write operation. The second Y-selector 72 selects one from the plurality of second bit lines 5 as the second selected bit line 5s in case of the data write operation. The sense amplifier 73 is provided for an area which is surrounded by the first bit line 4 and the second bit line 5 extending in the Y-axis direction, and the sense line 81-1 and the sense line 81-2 extending into the X-axis direction. The sense amplifier 73 is activated by the signal SAP from the sense lines 81-1 and 81-2 and amplifies a voltage difference between the first bit line 4 and the second bit line 5 at high speed.

Each of the read current load circuits 74 is provided for one of the intersecting points of the first bit lines 4 (or the first reference bit line 4) extending into the Y-axis direction and the read electric current signal line 82 extending into the X-axis direction. In case of the data read operation, the read current load circuit 74 is activated in response to the signal LDA from the read electric current signal line 82, and supplies a predetermined read electric current to the selected memory cell 2s (or the reference memory cell 2r) through the first selected bit line 4s (or the first reference bit line 4r). Here, the reference memory cell 2r has the same basic structure as a usual memory cell 2. However, the reference memory cell 2r has a resistance value fixed to a predetermined value (a resistance value corresponding to a middle value between a voltage drop of the magnetic resistance element 7 having the data of "1" and the voltage drop of the magnetic resistance element 7 having the data of "0" caused by the predetermined electric current supplied from the read current load circuit 13). The reference memory cell 2r is referred to when the data read operation is carried out to the other memory cell 2.

The gate of the third transistor 77 is connected with a comparison signal line 83, one of the other two terminals thereof is connected with the second bit line 5 and the remaining one thereof is connected with the first reference bit line 4r. The third transistor 77 is turned on based on the signal RTG on the comparison signal line 83 and sets the voltage of the second bit line 5 to a voltage equal to the voltage of the first reference bit line 4r. Of the column selection transistors 75-1 and 75-2, the gates are connected with each other and are connected with the bit line section signal line 85, one of the other two terminals thereof is connected with the first bit line 4 and the second bit line 5 on the side of the memory cell array section 1 and the remaining one thereof is connected with the first bit line 4 and the second bit line 5 on the side of the data bus line 84. The column selection transistors 75-1 and 75-2 output the voltage (BLiT) signal of the first bit line 4 and the voltage (BLiN) signal of the second bit line 5 to data bus lines 84-1 and 84-2 based on the signal YSWi on the column signal line 85, respectively. Of the reference selection transistors 76-1 and 76-2, the gates are connected with each other and with the column signal line 85, one of the other two terminals is connected with the first reference bit line 4r or the second reference bit line 5r on the side of the memory cell array section 1 and the remaining one is connected with the data bus lines 84. The reference selection transistors 76-1 and 76-2 output the voltage (BLRU) signal of the first reference bit line 4r and the voltage (BLRL) signal of the second reference bit line 5r to the data bus lines 84-1 and 84-2 based on the signal RYSW on the column signal line 85, respectively.

The sense line 81 (81-1 and 81-2) transfers the signal SAP to the sense amplifier 73. The read electric current signal line 82 transfers the signal LDA to the read current load circuit 74. The comparison signal line 83 transfers the signal RTG to the third transistor 77. The data bus lines 84 (84-1 and 84-2) transfer the voltages as the data from the first bit line 4 and the second bit line 5. The column signal line 85 transfers the signal YSWi or the signal RYSW.

Next, the operation of the magnetic random access memory containing the magnetic memory cells according to the twentieth embodiment of the present invention will be described below.

Figure 41:
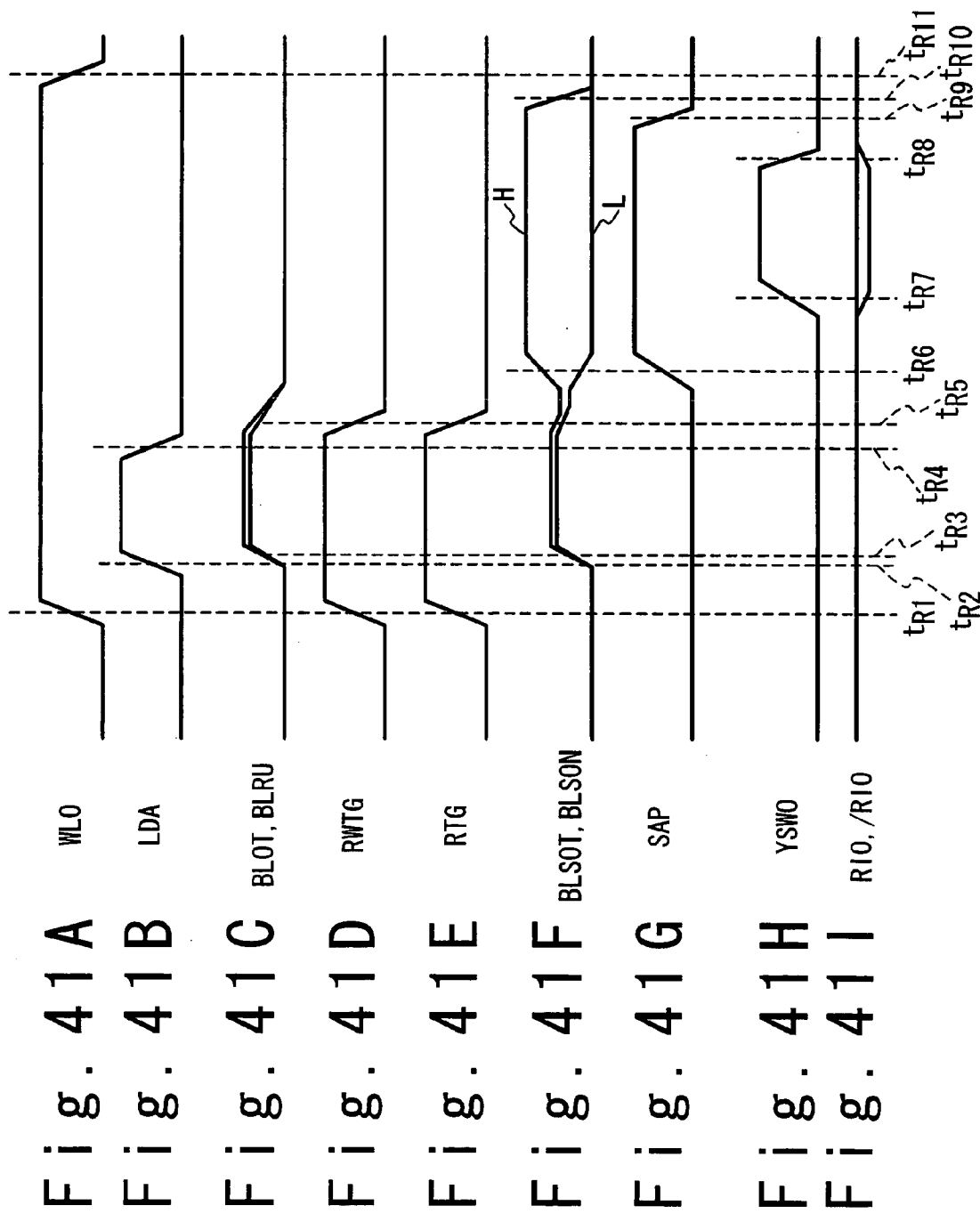
FIGS. 41A to 41I are a diagram showing the change of each of signals in a data read operation from the magnetic random access memory shown in FIG. 40.

FIG. 41 is a timing chart showing the changes of the respective (voltage) signals of the magnetic random access memory shown in FIG. 40 in the data read operation. The data read operation from the memory cell 2 is carried out as follows.

A: In Case of the Data Read Operation from a Single Selected Memory Cell 2s

Here, the memory cell 2 selected by the 0-th one of the first bit lines 4 the 0-th one of the second bit line 5 and the 0-th one of the word lines is supposed to be the selected memory cell 2s.

(1) Step S171

At a time tR1, the X-selector 8 selects the selected word line 3s based on the signal WL0 of a high level. At the same time, the first Y-selector 71 selects the first selected bit line 4s based on the signal RWTG of the high level. Through these operations, the selected memory cell 2s is selected.

Moreover, the third transistor 77 is turned on based on the signal RTG of the high level, and sets the voltage of one end of the second selected bit line 5s, forming a pair with the first selected bit line 4s, on the side of the data processing department 90 to be equal to the voltage of the first reference bit line 4r.

(2) Step S172

At a time tR2, the read current load circuit 74 connected with the first selected bit line 4s supplies an read electric current Is with a predetermined magnitude to the first selected bit line 4s based on the signal LDA of the high level. In the same way, the read current load circuit 74 connected with the first reference bit line 4r supplies an reference read electric current Ir with a predetermined magnitude to the first reference bit line 4r based on the signal LDA of the high level. The read electric current Is flows into the ground wiring line 24 through the magnetic resistance element 7 of the selected memory cell 2s and the reference read electric current Ir flows into the ground wiring line 24 through the magnetic resistance element 7 of the reference memory cell 2r. At this time, during a period from a time tR3 to a time tR5, the voltage which reflects the data stored in the magnetic resistance element 7 of the selected memory cell 2s appears as a signal BLOT. Also, the voltage which reflects the previously set (fixed) data stored in the magnetic resistance element 7 of the reference memory cell 2r appears as a BLRU signal. Thus, at time tR3, the voltage BLSOT on the side of the first selected bit line 4s of the sense amplifier 81 provided between the first selected bit line 4s and the second selected bit line 5s becomes the voltage which reflects the signal BLOT. In the same way, the voltage BLSON on the side of the second selected bit line 5s becomes the voltage which reflects the signal BLRU.

(3) Step S173

At a time tR4, the signal LDA goes to the low level and the electric current from each of the read current load circuits 74 stops. At the time tR5, a signal RWTG and a signal RTG are set to the low level and the data processing department 90 and the memory cell array section 1 are separated. At this time, a relative relation of the voltage BLSOT and the voltage BLSON is held in the sense amplifier 81.

(4) Step S174

At a time tR6, the sense amplifier 73 is activated based on the signal SAP of the high level. The voltage difference between the voltage BLSOT and voltage BLSON is amplified to have the voltage which reflects the read data (corresponding to the voltage BLSOT of the sense amplifier 81). For example, if the read data is "1", the voltage BLSOT is amplified, as shown in "H" in the figure and the voltage BLSON becomes small as shown in "L" in the figure. If the data is "0", the voltages are opposite.

(5) Step S175

At a time tR7, the signal YSW0 is inputted and the column selection transistor 75 is turned on. In this way, the voltage BLSOT amplified or attenuated is outputted to the data bus line 84-1 and the voltage BLSON is outputted to the data bus line 84-2. During a period from a time tR7 to a time tR8, the output signal/RIO of the data bus line 84-1 and the output signal RIO of data bus line 84-2 are taken out.

(6) Step S176

At the time tR8, the signal YSW0 is set to the low level and at a time tR9, the signal SAP is set to the low level. Thus, the voltage BLSOT and the voltage BLSON are set to the low level at a time tR10. At a time tR10, the WL0 signal is set to the low level.

Through the above data read operation, the data of the desired selected memory cell 2s can be read.

Figure 42:
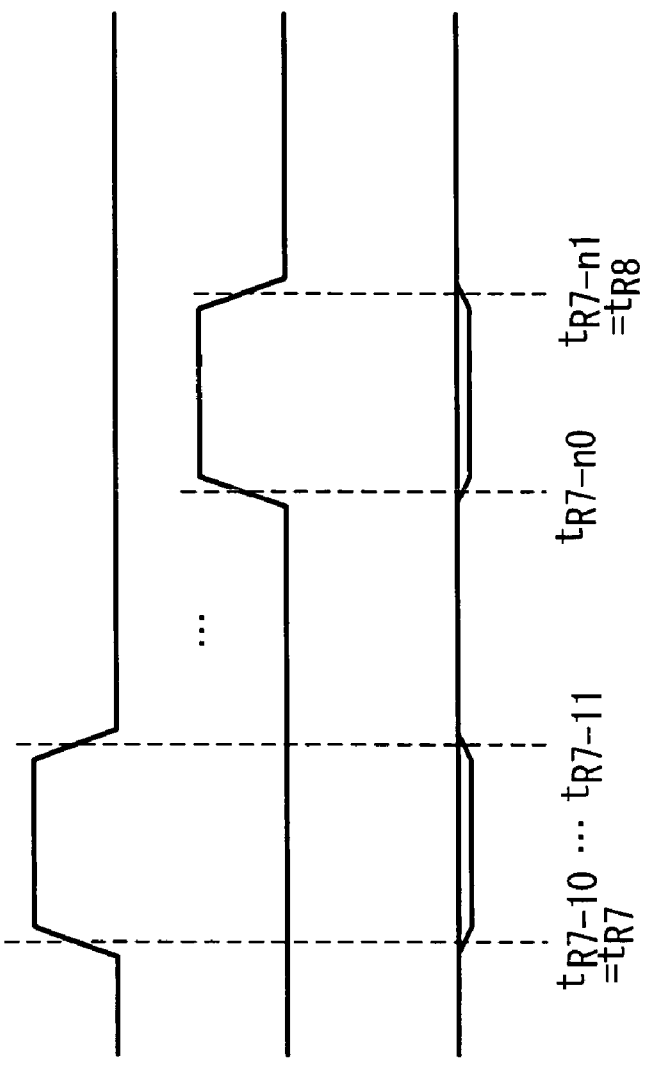
FIGS. 42A to 42C are a diagram showing the change of each signal in the data read operation from the magnetic random access memory shown in FIG. 40.

B: In Case of the Data Read Operation From all the Memory Cells 2 Connected with the Selected Word Line 3s FIG. 42 is a diagram showing the changes of the respective (voltage) signals in the data read operation in the magnetic random access memory shown in FIG. 40. Referring to FIGS. 41 and 42, the data read operation from all the memory cells 2 on the selected word line 3s is carried out in following operation at the above-mentioned step S175.

In this case, it should be noted that in FIG. 41, the signal BLOT is replaced by the signal BLkT (k is an integer between 1 to n, and n+1 is the number of pairs of the first bit line 4 and the second bit line 5) and the signals BLOTS and BLLSON are replaced by the signals BLSkT and BLLSkN. Also, signals YSW0, RIO and/RIO are as shown in the timing chart of FIG. 42. Also, the respective sense amplifiers 73 collectively read the data of the memory cells 2 on the selected word line 3s during a period from the time tR2 to the time tR5. At the time tR6, the voltage signal BLSkT and the voltage signal BLSkN amplified or attenuated are generated.

(5-1) Step S175-1

The signal YSWk is inputted to the k-th column selection transistors 75 continuously from k=1 to n for each of the periods of time tR7=time tR7_10 to time tR7_11, . . . , time tR7_k0 to time tR7_k1, . . . , time tR7_n0 to time tR7_n1=time tR8. Thus, the k-th column selection transistors 75 are turned on, the voltage signal BLSkT amplified is outputted to the data bus line 84-1 and the voltage signal BLSkN is outputted to the data bus line 84-2. The data from the k-th memory cell 2 is taken out during the period from time tR7_k0 to time tR7_k1 as the output signal/RIO of the data bus line 84-1 and the output signal RIO of the data bus line 84-2 and the data from the n-th memory cell 2 is taken out during the period from time tR7_n0 to time tR7_n1. That is, the data of the respective memory cells 2 are collectively read out to the sense amplifiers 73. Therefore, the data can be continuously read out by continuously activating the signal YSW. Thus, the throughput of the data read operation can be increased.

Through the above data read operation, the data of all the memory cells 2 on the desired selected word line 3s can be read collectively.

Figure 43:
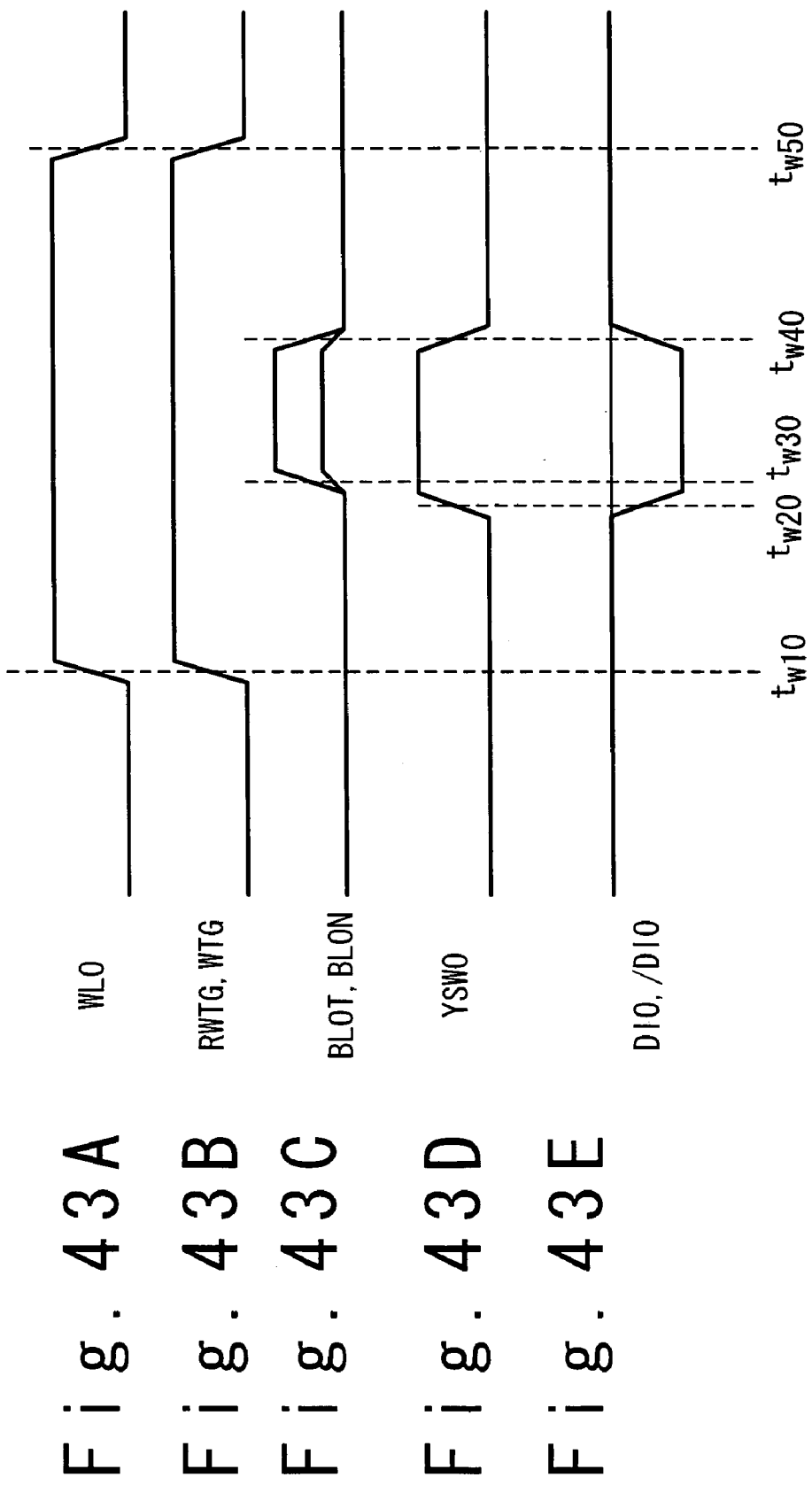
FIGS. 43A to 43E are a diagram showing the change of each signal in a data write operation into the magnetic random access memory shown in FIG. 40.

FIG. 43 is a diagram showing the changes of the respective (voltage) signals in the data write operation in the magnetic random access memory shown in FIG. 40. The data write operation into the memory cell 2 is carried out as follows.

A: In Case the Data Write Operation in a Single Selected Memory Cell 2s

Here, the memory cell 2 which is selected by the 0-th ones of the first bit lines 4 and the second bit lines 5 and the 0-th word line is supposed to be the selected memory cell 2s.

(1) Step S181

At a time tW10, the X-selector 8 sets the signal WL0 to the high level and selects the selected word line 3s. At this time, the gate voltages of the first MOS transistor 6 and the second MOS transistor 16 are set to a higher voltage by a predetermined voltage Vα than a usual power supply voltage. At the same time, the first Y-selector 71 sets the signal RWTG to the high level and selects the first selected bit line 4s. Moreover, the second Y-selector 72 sets the signal WTG to the high level and selects the second selected bit line 5s. Through these operations, the selected memory cell 2s is selected.

(2) Step S182

At a time tW20, the data signal DIO is outputted onto the data bus line 84-1 and the inverted data signal/DIO of the signal DIO is outputted onto the data bus line 84-2. At the same time, the column selection transistors 75-1 and 75-2 are turned on based on the signal YSW0 of the high level. Thus, the first selected bit line 4s and the second selected bit line 5s are selected on the side of data processing department 90 and the signal DIO and the signal/DIO are transferred to them, respectively.

(3) Step S183

At a time tW30, the voltage signal BLOT as the voltage of the first selected bit line 4s and the voltage signal BLON as the voltage of the second selected bit line 5s become the voltage corresponding to the data. In accordance with the voltage difference between the voltage BLOT and the voltage BLON, the write electric current flows between the first selected bit line 4s and the second selected bit line 5s through (the first MOS transistor 6 and the second MOS transistor of) the selected memory cell 2s. The write electric current flows based on the signal DIO and the signal/DIO.

(4) Step S184

The signal YSW0 is set to the low level at a time tR40 and the signal DIO and the signal/DIO stop. Thus, the voltage signal BLOT and the voltage signal BLON are set to the low level. Thus, the data write operation ends. The signal WL0, the signal RWTG, and the signal WTG are set to the low level at a time tR50.

Through the above data write operation, the data can be written in the desired selected memory cell 2s. When all data on the selected word line 3s are not necessary to be written, a method can be used in which the signal YSW is activated in the state that the selected word line 3s is activated and the data is written from the data bus lines 84 without passing through the sense amplifier 73. This method is desirable from the viewpoint of the throughput and the electric current consumption.

Figure 44:
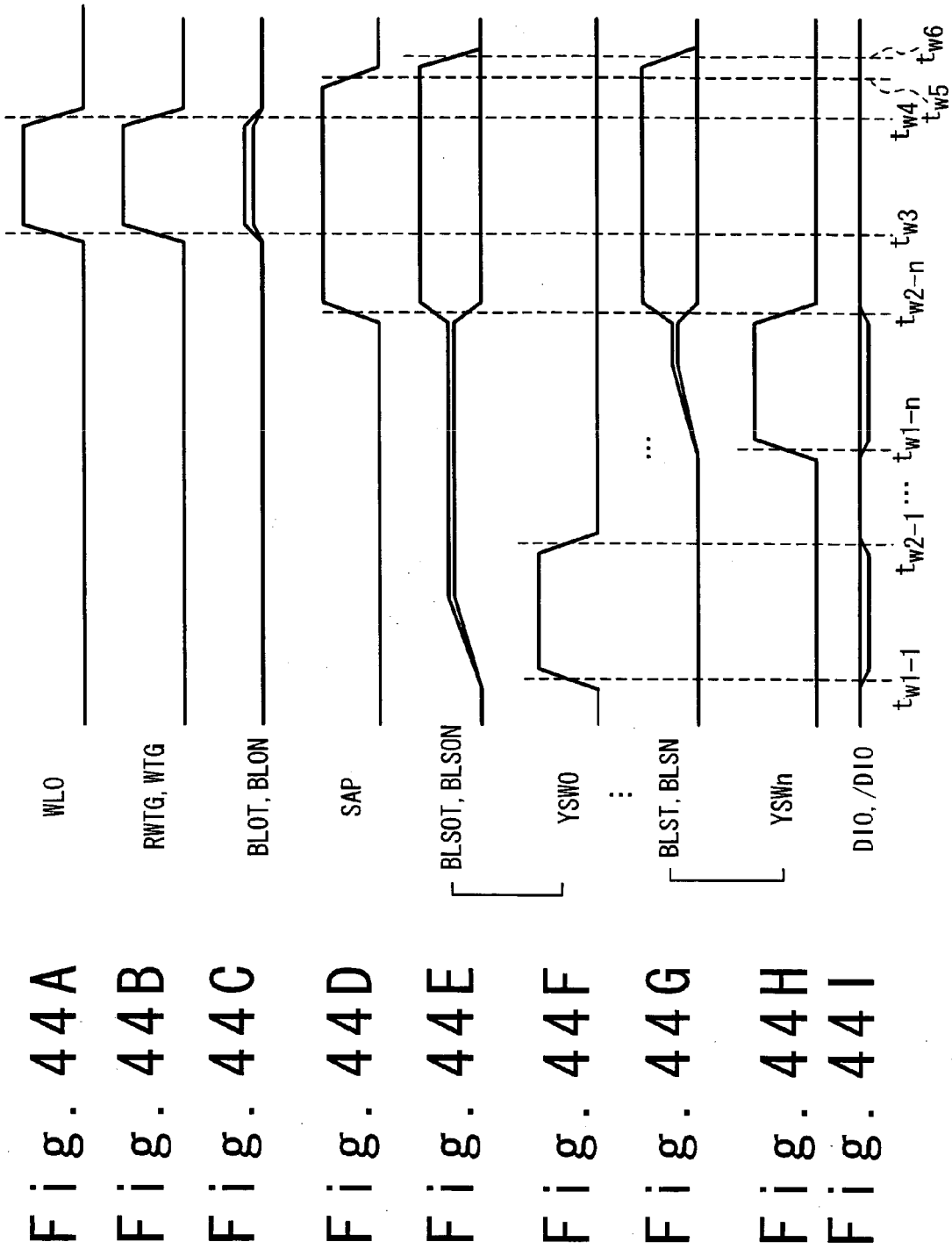
FIGS. 44A to 44I are a diagram showing the change of each signal in the data write operation into the magnetic random access memory shown in FIG. 40.

B. In Case of the Data Write Operation to all the Memory Cells 2 on the Selected Word Line 3s FIG. 44 is a diagram showing the change of the respective (voltage) signals in the data write operation in the magnetic random access memory shown in FIG. 40. The data write operation of all the memory cells 2 on the selected word line 3s is carried out as follows.

(1) Step S191

For each of the periods of time tW1-1 to time tW2-1, . . . , time tW1-k to time tW2-k, . . . , time tW1-n to time tW2-n, the data to be written in the k-th memory cell 2 on the selected word line 3s (the signal DIO and the signal/DIO) are outputted onto the data bus lines 84-1 and 84-2 continuously from k=1 to n, and the signal YSWk is set to the high level. The k-th column selection transistors 75-1 and 75-2 are turned on every period and the voltage signal BLSOT and the voltage signal BLSON corresponding to the k-th data are generated in the both ends of the k-th sense amplifier 73.

(2) Step S192

At a time tW2-n, all the sense amplifiers 73 are activated based on the high level of the signal SAP. The larger one of the voltage signal BLSOT and the voltage signal BLSON is amplified and the smaller one is made attenuated.

(3) Step S193

At a time tW3, the X-selector 8 sets to the signal WL0 to the high level and selects the selected word line 3s. At this time, the gate voltages of the first MOS transistor 6 and the second MOS transistor 16 are set to a voltage higher by a predetermined the voltage Vα than a usual power supply voltage. At the same time, the first Y-selector 71 sets to the signal RWTG to the high level and selects all the first selected bit lines 4s. Moreover, the second Y-selector 72 sets the signal WTG to the high level and selects all the second selected bit lines 5s. Through these operations, all the memory cells 2 on the selected word line 3s are selected. At this time, in accordance with the difference between the voltage signal BLSOT and the voltage signal BLSON, in each of all the memory cells 2 on the selected word line 3s, the write electric current flows between the first bit lines 4s and the second bit lines 5s through the first MOS transistor 6 and the second MOS transistor. In this case, the electric current source of the write electric current is the sense amplifiers 73. It should be noted that the predetermined voltage Vα is approximately equal to an increase of the voltage at a channel section of the transistor due to the ON resistance of the transistor when the write electric current flows.

(4) Step S194

At a time tR4, the signal WL0, the signal RWTG, and the signal WTG are set to the low level. Thus, the data write operation ends. The signal SAP and the signal SAN are set to the low level at a time tR5. Thus, the voltage signal BLSOT and the voltage signal BLSON are set to the low level at a time tR6.

Through the above data write operation, the data can be written in all the memory cells 2 on the desired selected word line 3s collectively. Thus, the throughput of the data processing is improved.

In case of the data write operation, the gate voltages of the first MOS transistor 6 and the second MOS transistor 16 are set to a higher voltage by a predetermined voltage Vα than a usual power supply voltage. Therefore, the larger write electric current can be supplied. Thus, the data can be more surely written in the selected memory cells. It should be noted that when the voltage higher than the power supply voltage is applied to the gate, a load is imposed on the gate oxide film. However, the write electric current flows during the data write operation, and the voltage of the channel section of the transistor increases due to the ON resistance of the transistor. Therefore, there is no problem.

In the present invention, it is possible to carry out the data read operation and the data write operation using the sense amplifier provided for each bit line between the first bit line 4 and the second bit line 5, like a DRAM.

Twenty-first Embodiment

The magnetic random access memory containing the magnetic memory cells according to the twenty-first embodiment of the present invention will be described.

Figure 45:
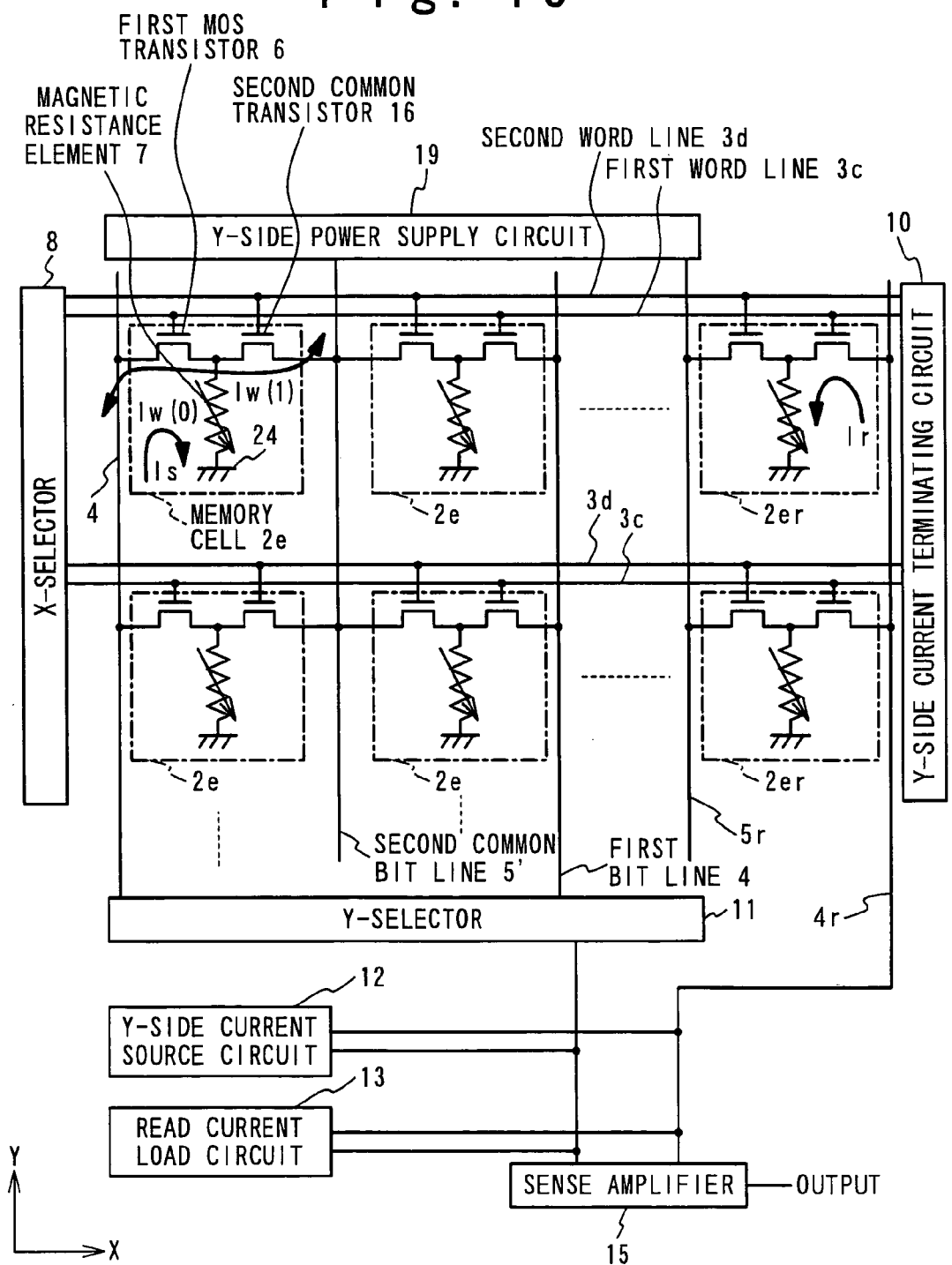
FIG. 45 is a diagram showing the structure of the magnetic random access memory containing the magnetic memory cells according to a twenty-first embodiment of the present invention.

FIG. 45 is a diagram showing the structure of the magnetic random access memory containing the magnetic memory cells according to the twenty-first embodiment of the present invention. The magnetic random access memory in this embodiment is composed of the memory cell array section 1, the Y-side current source circuit 12, the read current load circuit 13 and the sense amplifier 15. The memory cell array section 1 is composed of the plurality of memory cells 2e, the plurality of first word lines 3c, the plurality of second word lines 3d, the plurality of first bit lines 4, the plurality of second common bit lines 5', the X-selector 8, the Y-selector 11, and a Y-side power supply circuit 19.

In the memory cell array section 1, the memory cells 2e are arranged in a matrix. The memory cell 2e contains the first MOS transistor 6, the second MOS transistor 16 and the magnetic resistance element 7. It should be noted that the memory cell 2 for reference is referred to as a reference memory cell 2er. In the first MOS transistor 6, the gate is connected with the first word line 3c, the source is connected with the first bit line 4, and the drain is connected with one end of the magnetic resistance element 7 and the drain of the second MOS transistor 16. In the second MOS transistor 16, the gate is connected with the second word line 3d, the source is connected with the second common bit line 5' and the drain is connected with one end of the magnetic resistance element 7 and the drain of the first MOS transistor 6. In the data read operation, the first MOS transistor 6 is used to connect the magnetic resistance element 7 with the first bit line 4 and to flow an electric current through the route of the magnetic resistance element 7—the first bit line 4. In the data write operation, the first MOS transistor 6 and the second MOS transistor 16 are used to connect the first bit line 4 and the second common bit line 5' and to supply an electric current to the neighborhood of the magnetic resistance element 7. The magnetic resistance element 7 is connected at one end with the above respective transistors and at the other end with the ground wiring line 24. The magnetic resistance element 7 has the spontaneous magnetization, and the direction of the spontaneous magnetization is inverted in accordance with the stored data.

The first bit line 4 is provided to extend into the Y-axis direction (the direction of the bit line) and is connected with the Y-selector 11. In FIG. 45, the bit line on the left side of the second common bit line 5 is referred to as a first bit line 4L and the bit line on the right side of the second common bit line 5 is referred to as the first bit line 4R. It should be noted that the first bit line 4 for the reference is referred to as the first reference bit line 4r. The second common bit line 5' is provided to form a set together with the two first bit lines 4 which are provided on the both sides of the bit line 5' and to extend into the Y-axis direction and is connected with the Y-side power supply circuit 19. It should be noted that the second bit line 5 for reference is referred to as the second reference bit line 5r. The first word line 3c is provided to extend into the X-axis direction (the direction of the word line) perpendicular to the Y-axis direction and is connected with the X-selector 8. The second word line 3d is provided to form a pair together with the first word line 3c and to extend into the X-axis direction (the direction of the word line) and is connected with the X-selector 8. Each of the above memory cells 2e is provided for one of the positions where the sets of the first bit line 4 and the second common bit line 5' and the sets of the first word line 3c and the second word line 3d intersect.

The X-selector 8 selects one from the plurality of first word lines 3c as the first selected word line 3cs in case of the data read operation. Also, in case of the data write operation, the X-selector 8 selects one from the plurality of first word lines 3c as the first selected word line 3cs and selects one from the plurality of second word lines 3d as the second selection the word line 3ds. The Y-selector 11 selects one of the plurality of first bit lines 4 as the first selected bit line 4s in any case of the data read operation and the data write operation. In this case, the selected memory cell 2es is the memory cell 2e which is selected by the selected word line 3s, the first selected bit line 4s and the selected second common bit line 5's.

The Y-side current source circuit 12 is an electric current source which carries out the supply or drawing-out of a predetermined electric current to or from the first selected bit line 4s in case of the data write operation. The Y-side power supply circuit 19 always supplies a predetermined voltage to the second common bit line 5'. The predetermined electric current by the Y-side current source circuit 12 flows through the route of the first selected bit line 4s—the selected memory cell 2es—the selected second common bit line 5's (the second common bit line 5' provided for the first selected bit line 4s) in accordance with the write data in the direction which the electric current flows out from the Y-selector 11 or flows into the Y-selector 11.

The read current load circuit 13 supplies a predetermined electric current to the first selected bit line 4s in case of the data read operation. In the same way, in case of the data read operation, the read current load circuit 13 supplies a predetermined electric current to the first reference bit line 4r. The sense amplifier 15 outputs the data read out from the selected memory cell 2es based on the voltage difference between the voltage of the first reference bit line 4r connected with the reference memory cell 2er and the voltage of the first selected bit line 4s connected with the selected memory cell 2es.

Here, the reference memory cell 2r has the same basic structure as the usual memory cell 2. It should be noted that the reference memory cell 2r has a predetermined fixed resistance value corresponding to a middle value between the voltage drop of the magnetic resistance element 7 having the data of "1" and the voltage drop of the magnetic resistance element 7 having the data of "0" when the predetermined electric current is supplied from the read current load circuit 13. The reference memory cell 2r is referred to when the data read operation is carried out to the other memory cells 2.

Figure 46:
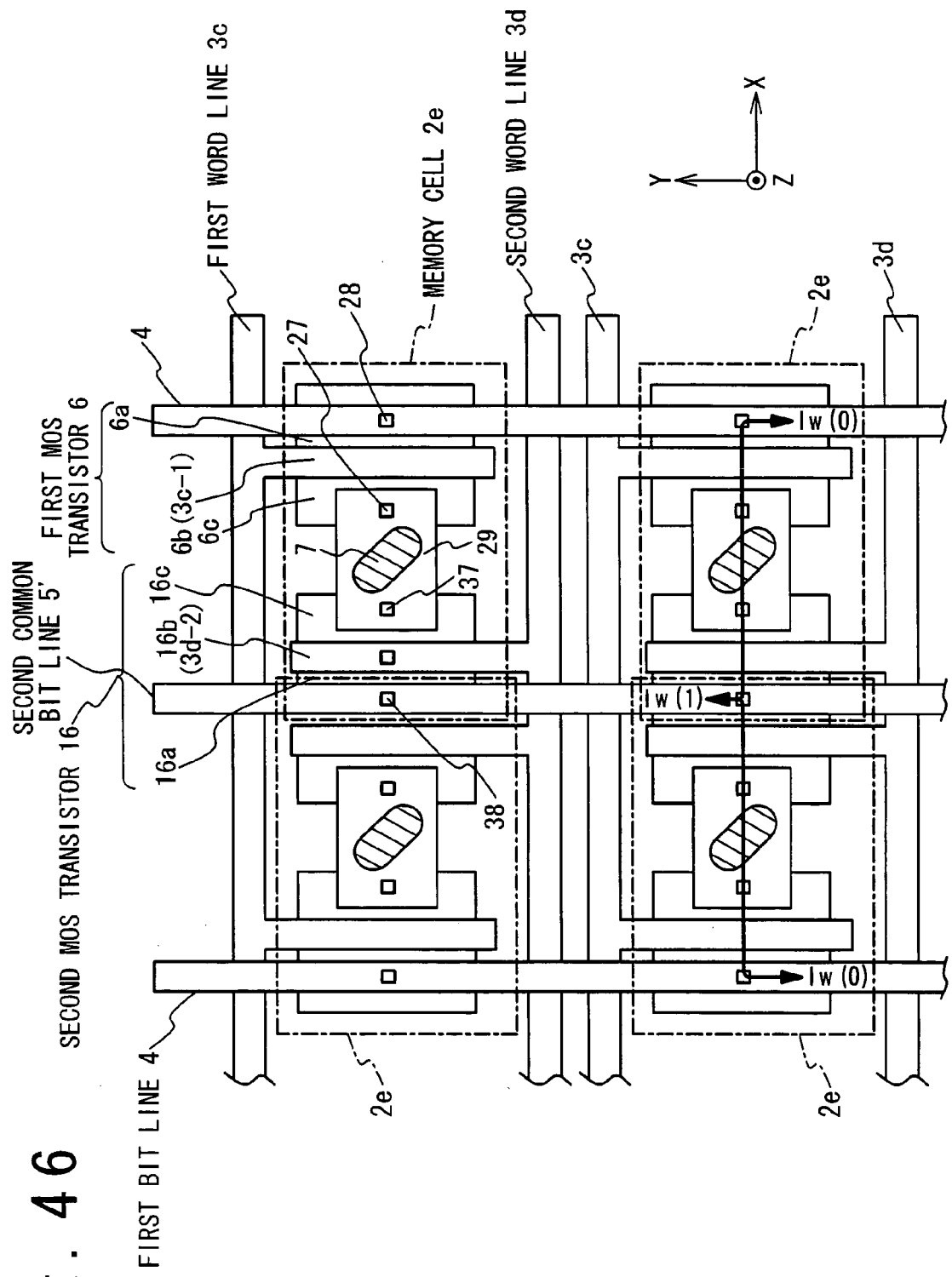
FIG. 46 is a plan view of the magnetic random access memory shown in FIG. 45.

FIG. 46 is a plan view of the memory cell array of the magnetic random access memory shown in FIG. 45. In FIG. 46, the memory cells 2e of 2×2 in the memory cell array section 1 are shown as representative cells. In the first MOS transistor 6 of the memory cell 2e, the source 6a is connected with the first bit line 4 through the contact wiring line 28. The gate 6b is a part of the first word line 3c-1 which is branched into the Y-axis direction from the first word line 3c. The drain 6c is connected with the drain 16c of the second MOS transistor 16 through the route of the contact wiring line 27—the extension wiring line 29—the contact wiring line 37. In the second MOS transistor 16, the gate 16b is a part of the second word line 3d-2 which is branched into the Y-axis direction from the second word line 3d. The source 16a is connected with the second common bit line 5' through the contact wiring line 38. The memory cell 2e is arranged in the area which is surrounded by the second common bit line 5', the first word line 3c, the second word line 3d and the first bit line 4. The magnetic resistance element 7 is provided on the extension wiring line 29. The direction of the spontaneous magnetization of the magnetic resistance element 7 is inverted by the electric current which flows through the extension wiring line 29. The electric current flows through the extension wiring line 29 in the X-axis direction, and the magnetic field is applied to the magnetic resistance element 7 in the Y-axis direction. In this embodiment, the axis direction of the magnetization anisotropical axis of the magnetic resistance element 7 is tilted by a predetermined angle with respect to the Y axis. In an example shown in FIG. 45, the magnetic resistance element 7 is formed to have the magnetization anisotropy based on the shape of the magnetic resistance element 7 and is tilted with respect to the Y axis by 45°. Thus, the write electric current can be made small and the electric current consumption can be reduced (refer to the description relating to FIG. 22). Even if the axis direction of the magnetization anisotropy of the magnetic resistance element 7 is tilted with respect to the Y axis by a small angle, there is an effect. It is desirable that the tilt angle is in a range of 10° to 80°, and more desirable, in a range of 30° to 60°. Even if the axis direction of the magnetization anisotropy of the magnetic resistance element 7 is tilted into the opposite side with respect to the Y axis in the same way, there is a similar effect. The ground (GND) wiring line 24 is provided to cover the whole memory cell array far above the memory cell array section 1 shown in FIG. 45.

Next, the operation of the magnetic random access memory containing the magnetic memory cells according to the twenty-first embodiment of the present invention will be described below.

The data read operation from the memory cell 2e is carried out as follows.

(1) Step S201

The X-selector 8 selects one from the plurality of first word lines 3c as the first selected word line 3cs based on a row address. The X-side power supply circuit 9 applies a predetermined voltage V1 to the selected word line 3s. The first MOS transistor 6 of each memory cell 2e is turned on.

(2) Step S202

The Y-selector 11 selects one from the plurality of first bit lines 4 as the first selected bit line 4s based on the column address. In response to the read active signal RA, the read current load circuit 13 supplies a predetermined read electric current Is to the first selected bit line 4s and supplies a predetermined reference read electric current Ir to the first reference bit line 4r. At this time, the predetermined read electric current Is is supplied from the read current load circuit 13 into the ground wiring line 24 via the first selected bit line 4s, and the electric current flows through the route of the first MOS transistor 6 of the selected memory cell 2s—the magnetic resistance element 7. In the same way, the predetermined reference read electric current Ir flows into the ground wiring line 24 through the route of the read current load circuit 13—the first reference bit line 4r—the first MOS transistor 6 of the selected reference memory cell 2r (the reference memory cell 2er provided for the point of intersection of the first selected word line 3cs and the first reference bit line 4r)—the magnetic resistance element 7.

(3) Step S203

In response to the read active signal RA, the sense amplifier 15 outputs either of "1" or "0" based on the difference between the voltage of the first selected bit line 4s and the voltage of the first reference bit line 4r.

Through the above data read operation, the data of the selected memory cell 2es can be read.

Next, the data write operation of the data into the memory cell 2 is carried out as follows.

(1) Step S211

The X-selector 8 selects one from the plurality of first word lines 3c as the first selected word line 3cs based on the row address. At the same time, the X-selector 8 selects one from the plurality of second word lines 3d as the second selected word line 3ds, which forms a pair together with the first selected word line 3cs. The first MOS transistor 6 and the second MOS transistor 16 of each of the memory cells 2e are turned on which are connected with the first selected word line 3cs and the second selection the word line 3ds.

(2) Step S212

The Y-selector 11 selects one from the plurality of first bit lines 4 as the first selected bit line 4s based on the column address. The Y-side power supply circuit 19 applies a predetermined voltage Vterm fixedly to the plurality of second common bit lines 5' containing the selected second common bit line 5's. The second reference bit line 5r is contained in the plurality of second common bit lines 5' and the second common bit line 5' forms a pair with the first selected bit line 4s. The Y-side current source circuit 12 supplies the write electric current Iw(0) (in the direction that the current flows into the Y-side current source circuit 12) having a predetermined magnitude corresponding to the data signal or the write electric current Iw(1) (in the direction that the current flows out from the Y-side current source circuit 12) having a predetermined magnitude corresponding to the data signal to the selected memory cell 2es based on the write active signal and the data signal ("1" or "0"). The write electric current Iw(0) or the write electric current Iw(1) flows through the route of the selected second common bit line 5's—the second MOS transistor 16 of the selected memory cell 2es (–the extension wiring line 29 of the selected memory cell 2es)—the first MOS transistor 6 of the selected memory cell 2es—the first selected bit line 4s in the forward or reverse direction.

(3) Step S213

In the selected memory cell 2es, the write electric current Iw(0) (+X-axis direction) or the write electric current Iw(1) (–X-axis direction) flows through the extension wiring line 29 which is contact with the magnetic resistance element 7 and the magnetic field is generated to the Y-axis direction or the +Y-axis direction. The magnetic field inverts the direction of the spontaneous magnetization in the free layer 21 of the magnetic resistance element 7 and the spontaneous magnetization corresponding to the data signal Data is stored.

Through the above data write operation, the data can be written in the selected memory cell 2es.

In the present invention, the same effect as in the first embodiment can be achieved, excluding that there is a single word line of the X-axis direction.

In the present invention, the second bit line 5 can be shared by the two memory cells 2, so that the circuit area can be reduced. Also, because the Y-side current terminating circuit is not needed, the circuit area can be reduced. That is, the chip size can be made small and the cost can be reduced.

Twenty-second Embodiment

The magnetic random access memory containing the magnetic memory cells according to the twenty-second embodiment of the present invention will be described.

Figure 47:
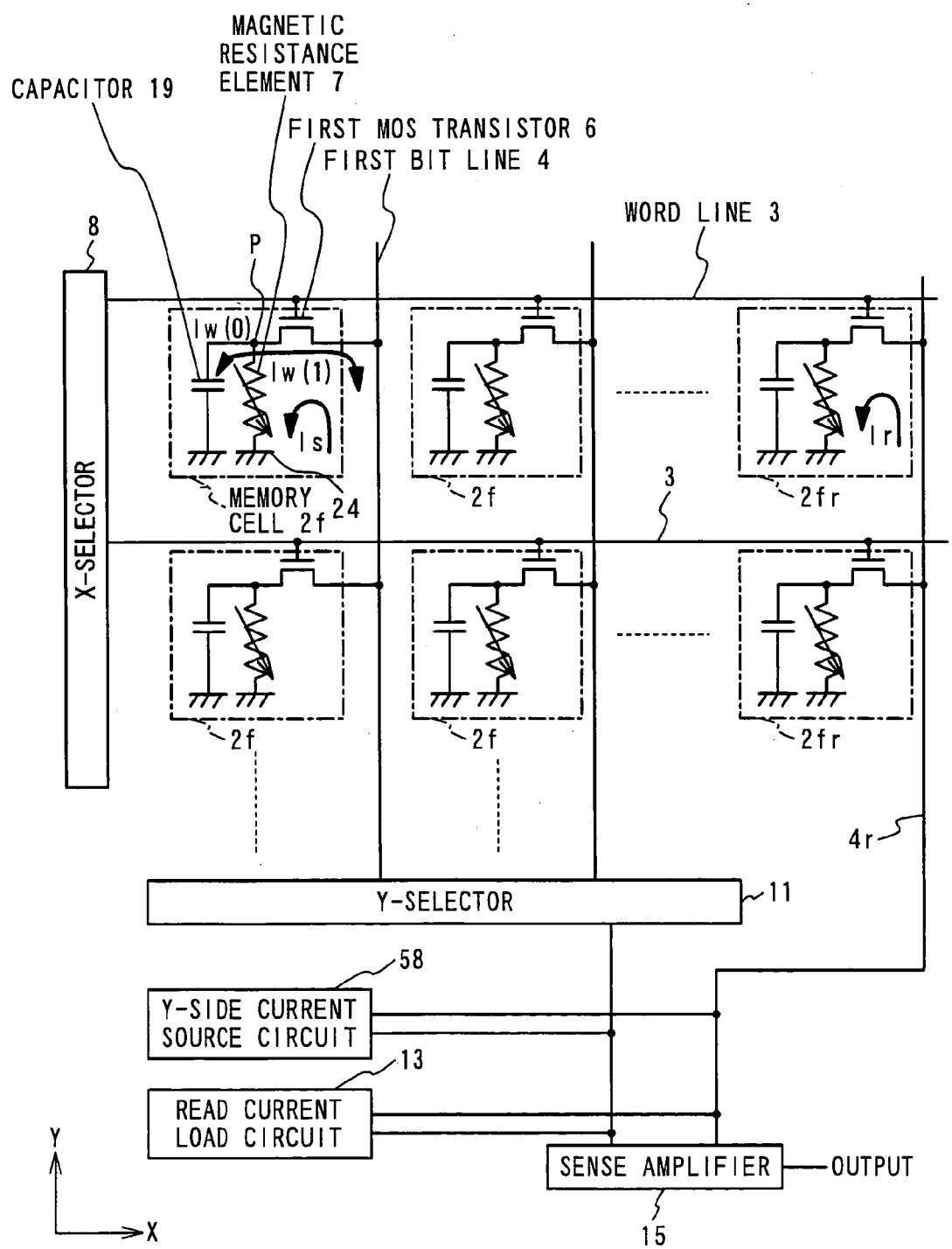
FIG. 47 is a diagram showing the structure of the magnetic random access memory containing the magnetic memory cells according to a twenty-second embodiment of the present invention.

FIG. 47 is a diagram showing the structure of the magnetic random access memory containing the magnetic memory cells according to the twenty-second embodiment of the present invention. The magnetic random access memory in this embodiment is composed of the memory cell array section 10, a Y-side current source circuit 58, the read current load circuit 13 and the sense amplifier 15. The memory cell array section 10 is composed of the plurality of memory cells 2f, the plurality of word lines 3, the plurality of first bit lines 4, the X-selector 8, and the Y-selector 11.

In the memory cell array section 10, the memory cells 2f are arranged in a matrix. The memory cell 2f contains the first MOS transistor 6, the magnetic resistance element 7 and a capacitor 19. It should be noted that the memory cell 2f for reference is referred to as a reference memory cell 2fr. In the first MOS transistor 6, the gate is connected with the word line 3, the source is connected with the first bit line 4 and the drain is connected with one end of the magnetic resistance element 7 and one end of the capacitor 19 through the extension wiring line 29. The capacitor 19 is connected at one end with the drain of the first MOS transistor 6 and is connected at the other end with the ground wiring line 24. In the data read operation, the first MOS transistor 6.1s used to connect the magnetic resistance element 7 with the first bit line 4 and to flow an electric current to the route of the magnetic resistance element 7—the first bit line 4. In the data write operation, the first MOS transistor 6 is used to connect the first bit line 4 and capacitor 19 and to supply an electric current to the neighborhood of the magnetic resistance element 7. The magnetic resistance element 7 is connected with the above first MOS transistor 6 at one end and connected with the ground wiring line 24 at the other end. The magnetic resistance element 7 has the spontaneous magnetization, and the direction of the spontaneous magnetization is inverted in accordance with a write data.

The first bit line 4 is provided to extend into the Y-axis direction (the direction of the bit line) and is connected with the Y-selector 11. The word line 3 is provided to extend into the X-axis direction (the direction of the word line) perpendicular to the Y-axis direction and is connected with the X-selector 8. Each of the above memory cells 2f is provided for one of the positions where the plurality of first bit lines 4 and the plurality of word lines 3 intersect.

The X-selector 8 selects one of the plurality of word lines 3 as the selected word line 3s in case of the data read operation and the data write operation. The X-side power supply circuit 9 is the power supply which supplies a predetermined voltage to the selected word line 3s in case of the data read operation and the data write operation. The Y-selector 11 selects one of the plurality of first bit lines 4 as the first selected bit line 4s in case of the data read operation and the data write operation. The Y-side power supply circuit 58 supplies a predetermined voltage corresponding to the data to the first selected bit line 4s in case of the data write operation.

The read current load circuit 13 supplies a predetermined electric current to the first selected bit line 4s in case of the data read operation. In the same way, in case of the data read operation, the read current load circuit 13 supplies a predetermined electric current to the first reference bit line 4r. Here, the reference memory cell 2r has the same basic structure as the usual memory cell 2f. The reference memory cell 2r has a predetermined fixed resistance value corresponding to a middle value between the voltage drop of the magnetic resistance element 7 having the data of "1" and the voltage drop of the magnetic resistance element 7 having the data of "0", when the predetermined electric current is supplied from the read current load circuit 13. The reference memory cell 2r is referred to when the data read operation is carried out to the other memory cells 2. The sense amplifier 15 outputs the read data of the selected memory cell 2s based on the difference between the voltage of the first reference bit line 4r connected with the reference memory cell 2r and the voltage of the first selected bit line 4s connected with the selected memory cell 2s.

Figure 48:
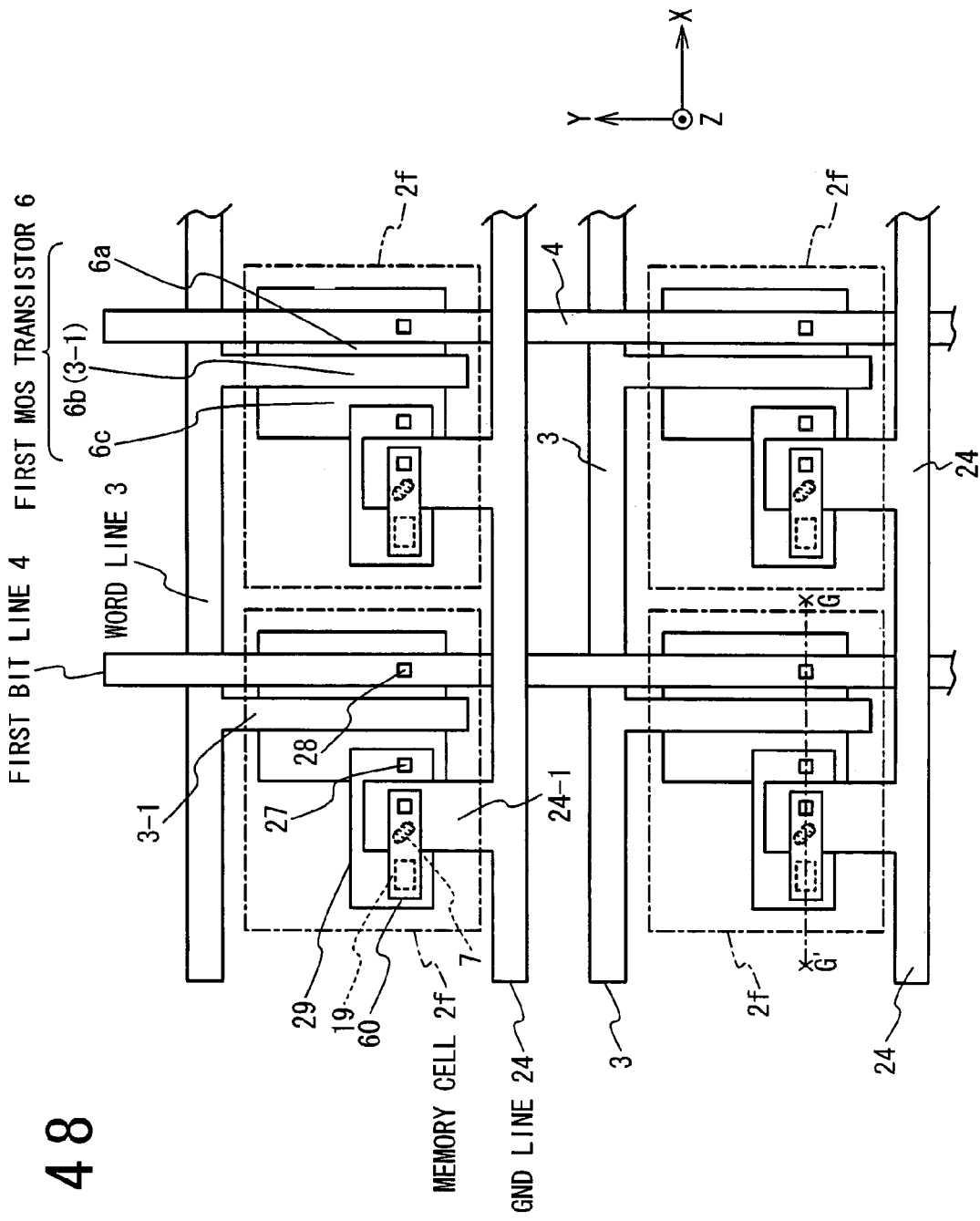
FIG. 48 is a plan view of the magnetic random access memory shown in FIG. 47.

FIG. 48 is a plan view of the memory cell array of the magnetic random access memory shown in FIG. 47. In FIG. 48, the memory cells 2f of 2×2 in the memory cell array section 1 are shown as representative cells. In the first MOS transistor 6 of the memory cell 2f, the source 6a is connected with the first bit line 4 through the contact wiring line 28. The gate 6b is a part of the word line 3-1 which is branched in the Y-axis direction from the word line 3. The drain 6c is connected with the capacitor 19 and the magnetic resistance element 7 through the route of the contact wiring line 27—the extension wiring line 29. The grounding wiring line 24 forms a pair with each of the plurality of word lines 3 and extends in parallel to the word line 3 to the X-axis direction.

The grounding wiring line 24 has a ground wiring line 24-1 which is branched from the line 24 for each memory cell 2*f*. The grounding wiring line 24-1 at each memory cell 2*f* is connected with the magnetic resistance element 7 and the capacitor 19. The magnetic resistance element 7 is provided on the extension wiring line 29. The direction of the spontaneous magnetization is inverted by the electric current which flows through the extension wiring line 29. The electric current flows through the extension wiring line 29 in the X-axis direction, and the magnetic field is applied to the magnetic resistance element 7 in the Y-axis direction. In this embodiment, the axis direction of the magnetization anisotropic axis of the magnetic resistance element 7 is tilted by a predetermined angle with respect to the Y axis. In an example shown in FIG. 47, the magnetization anisotropic axis of with respect to the Y axis is given to the magnetic resistance element 7 by a predetermined angle based on the shape of the magnetic resistance element 7, and the angle between the axis direction of the magnetization anisotropic axis of the magnetic resistance element 7 and the Y axis is 45°. Thus, the write electric current can be set small and the electric current consumption can be reduced (refer to the description relating to FIG. 22). Even if the tilt angle of the magnetization anisotropy of the magnetic resistance element 7 with respect to the Y axis is small, there is an effect, and the tilt angle is desirable in a range of 10° to 80°, and more desirable in a range of 30° to 60°. Even if the axis direction of the magnetization anisotropy is tilted on the opposite side with respect to the Y axis, there is a similar effect.

Figure 49:
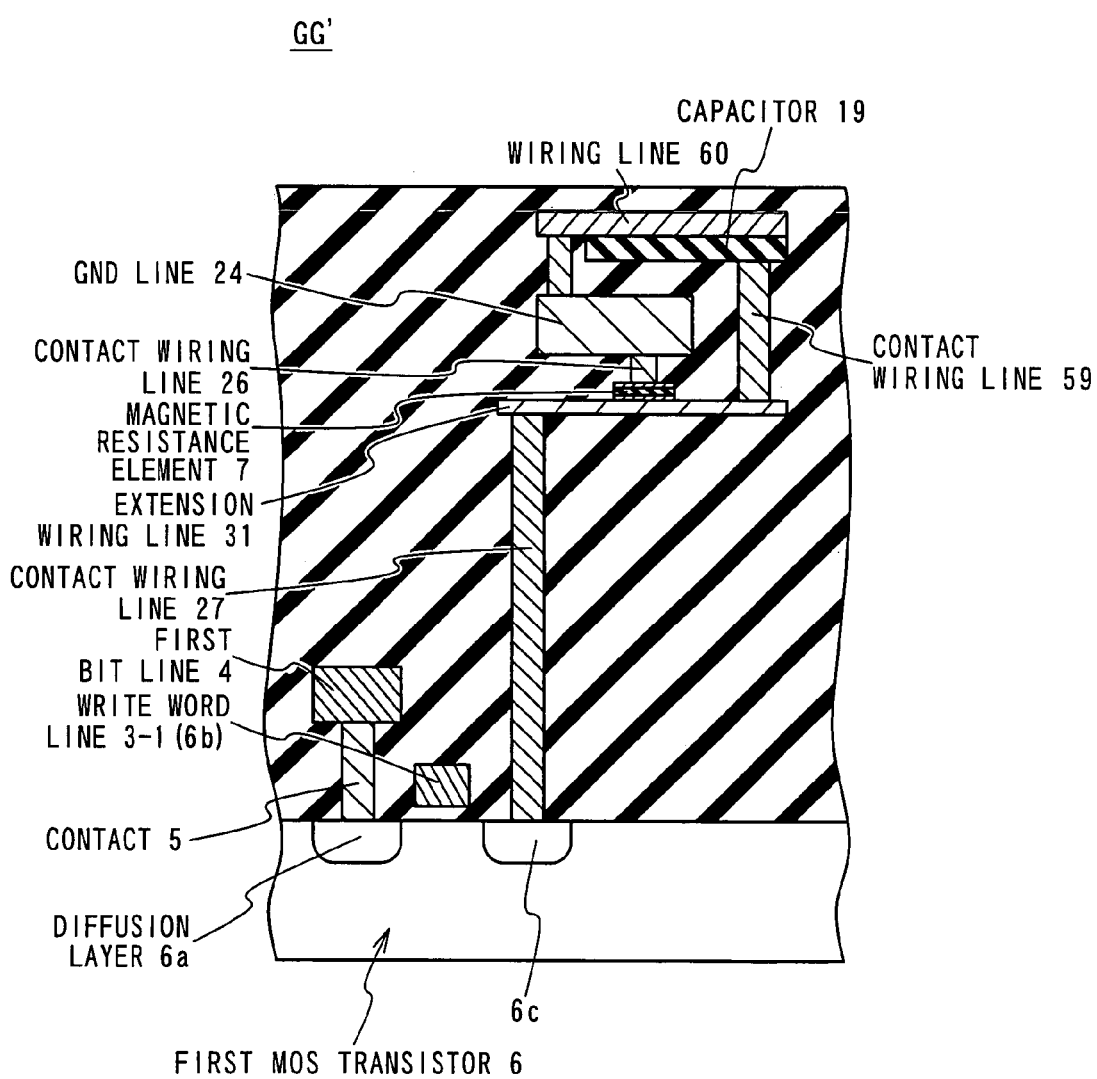
FIG. 49 is a cross sectional view of the memory cell along the GG" line shown in FIG. 47.

FIG. 49 is a cross sectional view showing the memory cell 2*f* along the GG' line shown in FIG. 48. The first MOS transistor 6 is formed in the surface section of the semiconductor substrate. The source 6*a* is provided as the first diffusion layer in the semiconductor substrate and is connected with the first bit line 4 through the contact wiring line 28 extending into the Z-axis direction. The drain 6*c* as the second diffusion layer is connected with one end of the under side of the extension wiring line 29 through the contact wiring line 27 extending into the Z-axis direction. The gate 6*b* as the first gate is a part of the word line 3-1 which is branched from the word line 3. The drain 6*c* is provided inside the memory cell 2*a* than the source 6*a*. The magnetic resistance element 7 is provided on the extension wiring line 29 and connected with the extension wiring line 29 at one end. The other end of the magnetic resistance element 7 is connected with the under side of the ground wiring line 24-1 which is branched from the ground (GND) line 24 through the contact wiring line 26. The capacitor 19 is connected at one end with the other end of the extension wiring line 29 through the contact wiring line 59 extending below and at the other end with the wiring line 60 formed to cover the extension wiring line 29. The wiring line 60 is connected at one end with the ground wiring line 24-1 by the contact wiring line 61 extending downward.

Next, referring to FIG. 48, the operation of the magnetic random access memory containing the magnetic memory cells according to the twenty-second embodiment of the present invention will be described below.

The data read operation from the memory cell 2*f* is carried out as follows.

(1) Step S221

The Y-selector 11 selects one from the plurality of first bit lines 4 as the first selected bit line 4*s* based on q column address. The first selected bit line 4*s* is set to a predetermined middle voltage Vm.

(2) Step S222

The X-selector 8 selects one from the plurality of word lines 3 as the selected word line 3*s* based on a row address. The X-selector 8 increases the voltage a little by a little, and applies a predetermined voltage V1 to the selected word line 3*s*, taking a long time. The predetermined time is determined in such a manner that the electric current which flows into the capacitor 19 to charge the capacitor 19 to the predetermined middle voltage Vm is so small that it cannot write data in the magnetic resistance element 7 of the memory cell 2*f*. The capacitor 19 is charged in the predetermined time.

(3) Step S223

In response to the read active signal RA, the read current load circuit 13 supplies a predetermined read electric current Is to the first selected bit line 4*s* and supplies a predetermined reference read electric current Ir to the first reference bit line 4*r*. At this time, the read electric current Is flows from the read current load circuit 13 to the ground wiring line 24 through the route of the first selected bit line 4*s*—the first MOS transistor 6 of the selected memory cell 2*fs*—the magnetic resistance element 7. In the same way, the reference read electric current Ir flows into the ground wiring line 24 through the route of the first MOS transistor 6 of the read current load circuit 13—the first reference bit line 4*r*—the selected reference memory cell 2*r* (the reference memory cell 2*fr* provided for the point of intersection of the selected word line 3*s* and the first reference bit line 4*r*)—the magnetic resistance element 7.

(4) Step S224

In response to the read active signal RA, the sense amplifier 15 outputs either of "1" or "0" based on the difference between the voltage of the first selected bit line 4*s* and the voltage of the first reference bit line 4*r*.

Through the above data read operation, the data of the selected memory cell 2*fs* can be read.

Next, the data write operation of the data into the memory cell 2 is carried out as follows.

(1) Step S231

The Y-selector 11 selects one from the plurality of first bit lines 4 as the first selected bit line 4*s* based on the column address. The first selected bit line 4*s* is set to a predetermined middle voltage Vm.

(2) Step S232

The X-selector 8 selects one from the plurality of word lines 3 as the selected word line 3*s* based on the row address. The capacitor 19 is charged to a middle voltage Vm.

(3) Step S233

The Y-side power supply circuit 58 applies the voltage with a predetermined magnitude corresponding to the data signal to the selected memory cell 2*fs* based on the write active signal WA and the data signal ("1" or "0"). For example, in case of the data signal "1", the voltage is higher than the middle voltage Vm, and in case of the data signal "0", the voltage is lower than the middle voltage Vm. Thus, in case of the voltage which is higher than middle voltage Vm, the write electric current Iw(1) flows (in the direction which the current flows out from the Y-side power supply circuit 58), and in case of the voltage with which is lower than middle voltage Vm, the write electric current Iw(0) flows (in the direction which the current flows into the Y-side power supply circuit 58), which accompanies discharge from the capacitor 19.

(4) Step S234

The write electric current Iw(0) (+X-axis direction) or the write electric current Iw(1)(−X-axis direction) flows through the extension wiring line 29 which is contact with the magnetic resistance element 7 in the selected memory cell 2fs, and the magnetic field is generated into the Y-axis direction or the +Y-axis direction. The magnetic field inverts the direction of the spontaneous magnetization in the free layer 21 of the magnetic resistance element 7 and the spontaneous magnetization corresponding to the data signal is stored.

Through the above data write operation, the data can be written in the selected memory cell 2fs.

In the present invention, the same effect as in the first embodiment can be achieved, excluding the effect of a single word line extending into the X-axis direction.

The electric currents Iw(0) and Iw(1) in case of the data write operation never flow through the memory cells 2 and the neighborhood of it other than the selected memory cell 2s. Therefore, the electric currents Iw(0) and Iw(1) do not have an influence on the other memory cells 2 and can improve the selectivity when one of the memory cells 2 is selected, and the reliability of the memory cell.

The X-selector 8 in this embodiment is different from the conventional technique in that the selection of the memory cell in the X-axial direction is carried out only by the word line 3. Therefore, it is possible to reduce the circuit area of the X-selector 8 and the circuit area of one kind of word lines. Also, the Y-side current terminating circuit is not used. Therefore, it is possible to reduce the circuit area. That is, the chip size can be made small.

Also, the magnetic resistance element 7 is provided very near the extension wiring line 29 in the selected memory cell 2fs, as shown in FIG. 49. Therefore, the write electric currents Iw(0) and Iw(1) supplied to the extension wiring line 29 can be made smaller.

It should be noted that the circuits such as the X-selector, the Y-selector, the Y-side current terminating circuit, the Y-side current source circuit, the read current load circuit, the sense amplifier, and the memory cell array selector in each of the above embodiments are not limited to the circuit shown in each figure. A modification is possible within the sprit of the present invention Twenty-third Embodiment The magnetic random access memory containing the magnetic memory cells according to the twenty-third embodiment of the present invention will be described.

Figure 50:
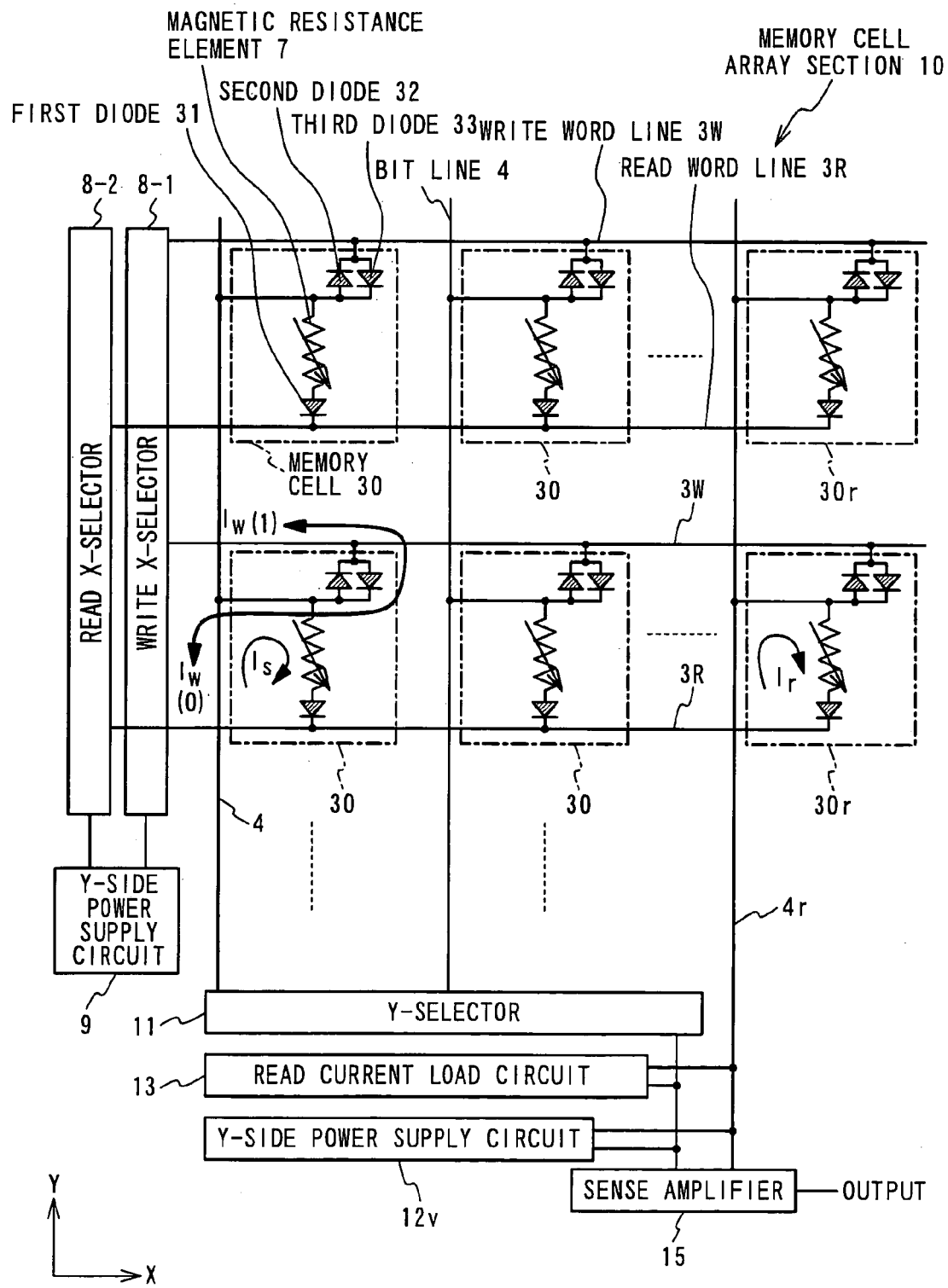
FIG. 50 is a diagram showing the structure of the magnetic random access memory containing the magnetic memory cells according to a twenty-third embodiment of the present invention.

FIG. 50 is a diagram showing the structure of the magnetic random access memory containing the magnetic memory cells according to the twenty-third embodiment of the present invention. The magnetic random access memory in this embodiment is composed of the memory cell array section 10, the Y-side power supply circuit 12v, the read current load circuit 13, and the sense amplifier 15. The memory cell array section 10 is composed of the plurality of memory cells 30, the plurality of write word lines 3W, the plurality of read word lines 3R, the plurality of bit line 4, the write X-selector 8-1, the read X-selector 8-2, the X-side power supply circuit 9, and the Y-selector 11.

In the memory cell array section 10, the memory cells 30 are arranged in a matrix. The memory cell 30 contains a first diode 31, a second diode 32, a third diode 33 and the magnetic resistance element 7. It should be noted that the memory cell 30 for reference is referred to as the reference memory cell 30r. In the reference memory cell 30r, "0" is written, and the data write operation is generally not carried out.

The cathode of the first diode 31 and the anode of the second diode 32 are connected with the write word line 3W. The anode of the first diode 31 and the cathode of the second diode 32 are connected with the bit line 4 and the magnetic resistance element 7. The first diode 31 and the second diode 32 are used to connect the bit line 4 and the write word line 3W in the data write operation, and to supply an electric current to the neighborhood of the magnetic resistance element 7. The anode of the third diode 33 is connected with the magnetic resistance element 7 and the cathode of the third diode 33 is connected with the read word line 3R. The third diode 33 is used to connect the bit line 4 and the read word line 3R in the data read operation and to supply an electric current to the magnetic resistance element 7 to a predetermined direction.

Figure 51A:
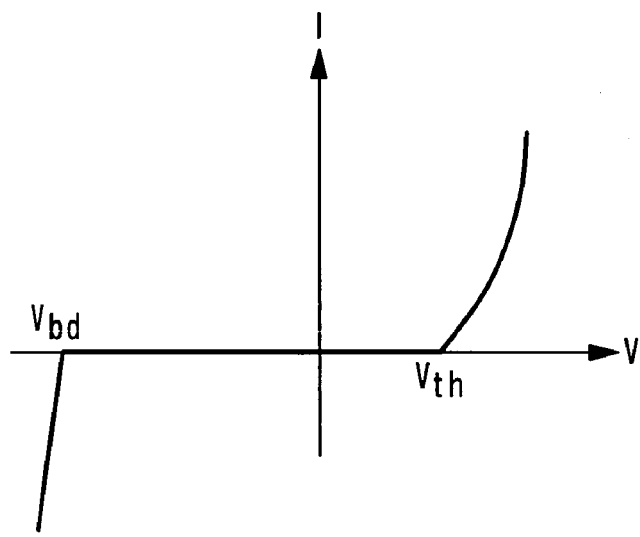
FIGS. 51A and 51B are graphs showing the characteristic of a diode.
Figure 51B:
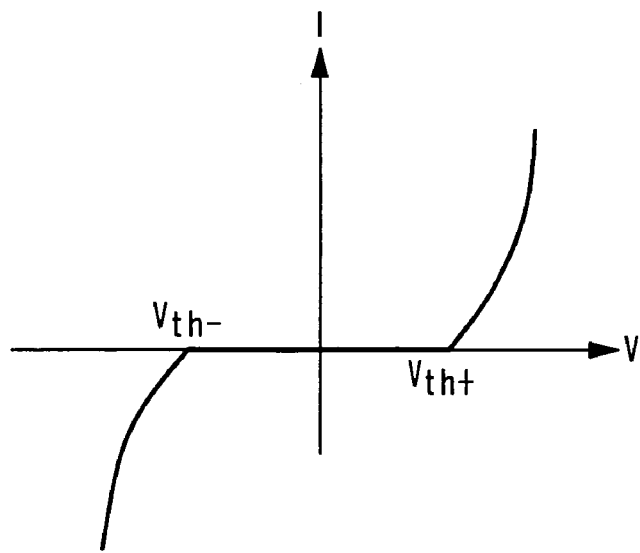

Here, the characteristic of each diode will be described. FIGS. 51A and 51B are graphs showing the characteristic of the diode. The vertical axis is the electric current which flows through the diode, and the horizontal axis is the voltage applied to the diode. The value Vth indicates a threshold voltage in the forward direction and a value Vbd indicates a breakdown voltage in the reverse direction. FIG. 51A shows the characteristic of one diode. The absolute value of the threshold voltage Vth (for example, 0.7 V) is smaller than the absolute value of the breakdown voltage Vbd. FIG. 51B shows the characteristic when the first diode 31 and the second diode 32 are connected in the opposite direction and in parallel (see the memory cell 30). That is, the anode of the diode 31 and the cathode of the diode 32 are connected with each other at a first node and the cathode of the diode 31 and the anode of the diode 32 are connected with each other at a second node. In this case, when a voltage is applied between the first node and the second node, the voltage is a forward direction in one of the diodes. Therefore, in case of the voltage in the +direction, the diode set has the threshold voltage Vth+ (for example, +0.7 V) and in case the voltage in the −direction, the diode set has a threshold voltage Vth− (for example, −0.7 V). That is, the diode set is turned off if the applied voltage Van is Vth−<Van<Vth+ and is turned on otherwise.

Referring to FIG. 50, the magnetic resistance element 7 is connected at one end with the anode of the diode 33, and at the other end with the bit line 4. The cathode of the diode 33 is connected with the read word line 3R. The magnetic resistance element 7 has the spontaneous magnetization, and the direction of the spontaneous magnetization is inverted in accordance with a write data.

The bit line 4 is provided to extend into the Y-axis direction (the direction of the bit line) and is connected with the Y-selector 11. The bit line 4 for the reference is referred to as the first reference bit line 4r. The write word line 3W is provided to extend into the X-axis direction (the direction of the word line) perpendicular to the Y-axis direction. The write word line 3W is connected with the write X-selector 8-1. The read word line 3R forms a pair originally together with the write word line 3W and is provided to extend into the X-axis direction (the direction of the word line), and is connected with the read X-selector 8-2. Each of the above memory cells 20 is provided for one of the positions where the bit lines 4 and the plurality of sets of the write word line 3W and the read word line 3R intersect.

The write X-selector 8-1 precharges the plurality of write word lines 3W to a middle voltage Vhalf (for example, Vhalf=1.25 V in case of the power supply voltage=2.5 V). In case of the data write operation, the write X-selector 8-1 selects one from the plurality of write word lines 3W as the selected write word line 3W. At this time, the write X-selector 8-1 sets the selected write word line 3W to the voltage of Vh+ or Vh− in accordance with the write data (D). For example, the voltage Vh+ is 1.75 V and the voltage Vh− is 0.75 V. The read X-selector 8-2 precharges the plurality of read word lines 3R to the middle voltage Vhalf (for example, Vhalf=1.25 V). In case of the data read operation, the read X-selector 8-2 selects one from the plurality of read word lines 3R as the selected read word line 3R. At this time, the read X-selector 8-2 sets the selected read word line 3R to the voltage of Vh− (for example, Vh−=0.75 V). The Y-selector 11 precharges the plurality of bit lines 4 to the middle voltage Vhalf (for example, Vhalf=1.25 V). The Y-selector 11 selects one from the plurality of bit line as the selected bit line 4s in case of the data write operation and in the case of read of the operation. In case of the data write operation, the Y-selector 11 sets the selected bit line 4s to the voltage of Vh− or Vh+ which is opposite to the voltage of the selected write word line 3W. In case of the data read operation, the Y-selector 11 sets the selected bit line 4s to the voltage of Vh+ (for example, Vh+=1.75 V). The memory cell 30 is selected by the selected write/read word line 3Ws/3Rs and the selected bit line 4s and is referred to as the selected memory cell 30s.

The Y-side power supply circuit 12v is a power supply circuit to apply a predetermined voltage to the Y-selector 11 (the selected bit line 4s) in case of the data write operation. The read current load circuit 13 is a current source circuit to supply a predetermined voltage to the Y-selector 11 (the selected bit line 4s) and the reference bit line 4r in case of the data read operation. The sense amplifier 15 reads data from the selected memory cell 30s based on the difference of the electric current which flows through the reference bit line 4r connected with the reference memory cell 30r and the electric current which flows through the selected bit line 4s connected with the selected memory cell 30s, and outputs the data. The X-side power supply circuit 9 supplies the write X-selector 8-1 and the read X-selector 8-2 with the predetermined voltage (the precharge voltage Vhalf, and the write/read voltage Vh+ or Vh−).

Figure 52:
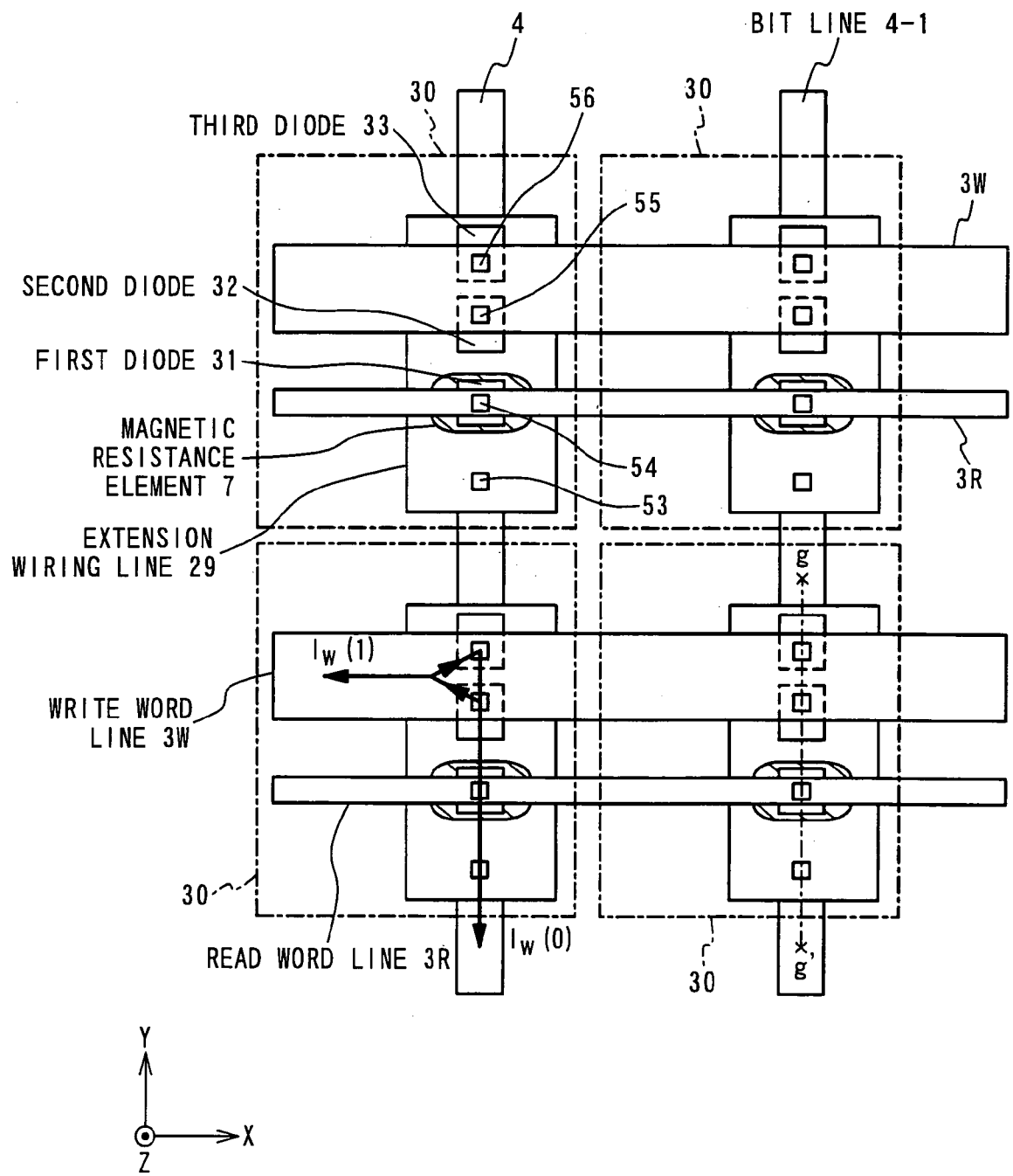
FIG. 52 is a plan view of the magnetic random access memory shown in FIG. 50.

FIG. 52 is a plan view of the memory cell array of the magnetic random access memory shown in FIG. 50. In FIG. 50, the memory cells 30 of 2×2 in the memory cell array section 10 are shown as representative cells. The first diode 31 of the memory cell 30 is provided through a contact wiring line 55, and the second diode 32 is provided between the extension wiring line 29 and the write word line 3W through a contact wiring line 56. Also, the third diode 33 is provided between the read word line 3R and the magnetic resistance element 7 through a contact wiring line 54.

The magnetic resistance element 7 is provided on the extension wiring line 29. The direction of the spontaneous magnetization is inverted by the electric current which flows through the extension wiring line 29. The electric current flows through the extension wiring line 29 in the Y-axis direction. Therefore, the magnetic field is applied to the magnetic resistance element 7 in the X-axis direction. Therefore, the magnetic resistance element 7 is formed to have the easy axis of the magnetization in the X-axis direction. For example, the magnetic resistance element 7 has an ellipse shape having the long axis parallel to the X-axis direction or a shape similar to the ellipse. The extension wiring line 29 is connected with the bit line 4 through the contact 53.

FIG. 53 is a cross sectional view showing the structure of the memory cell 30 along the gg' line shown in FIG. 52. The memory cell 30 is provided on an interlayer insulating film 35 which is provided above the semiconductor substrate 110. The bit line 4 is provided on the substrate 10 through the interlayer insulating film 35. The bit line 4 is provided to extend in the Y-axis direction in parallel to the surface of the semiconductor substrate 110. The extension wiring line 29 is connected at one end with the bit line 4 through a contact wiring line 53 extending upwardly from the bit line 4. The extension wiring line 29 is provided to extend in parallel to the surface of the semiconductor substrate 110. The first diode 31 is formed to extend upwardly from the extension wiring line 29 and is provided on the contact wiring line 55. The second diode 32 is provided on the contact wiring line 56 to extend upwardly from the extension wiring line 29. The magnetic resistance element 7 is connected with the extension wiring line 29 at one end. The third diode 33 is provided on the contact wiring line 54 extending upwardly from the other end of the magnetic resistance element 7. The write word line 3W is connected with the cathode of the first diode 31 through the contact wiring line 55 and is connected with the anode of the second diode 32 through the contact wiring line 56, and extends to the X-axis direction in parallel to the surface of the semiconductor substrate 110. The read word line 3R is connected with the cathode of the third diode 33 through the contact wiring line 54, and extends into the X-axis direction in parallel to the surface of the semiconductor substrate 110. The position of the one end f the extension wiring line 29 is nearer the position on which the contact wiring line 53 and the extension wiring line 29 are connected with each other than the position on which the contact wiring line 55 and the contact wiring line 56 and the extension wiring line 29 are connected with each other.

By this structure, the data can be written in the magnetic resistance element 7 which is contact with the extension wiring line 29 when the electric current flows through the route of the bit line 4—the extension wiring line 29—the first diode 31 or second diode 32.

Figure 54:
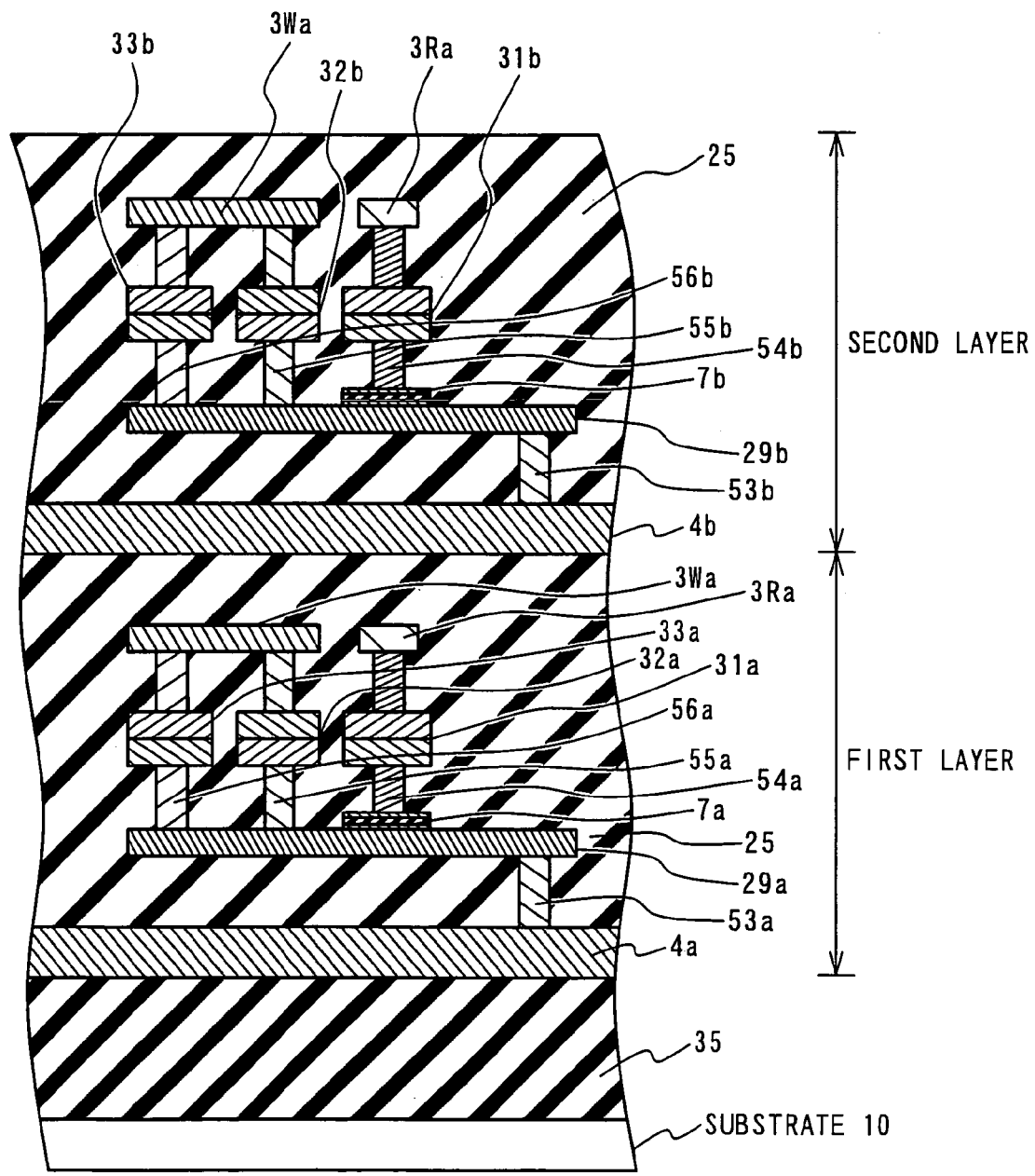
FIG. 54 is a cross sectional view showing structure of the magnetic random access memory when the memory cell is stacked.

The memory cell 30 shown in FIG. 53 does not use any element such as a MOS transistor on the semiconductor substrate 110 such as a silicon substrate. Therefore, the memory cell array section 10 can be stacked. This is shown in FIG. 54. FIG. 54 is a cross sectional view showing the structure when the memory cells 30 are stacked. In this case, the memory cells 30 are stacked in two layers. In this way, the memory cells 30 in this embodiment can be provided in the Z-axis direction in a plurality of layers. Therefore, the effective cell area can be made small.

Next, the operation of the magnetic random access memory containing the magnetic memory cells according to the twenty-third embodiment of the present invention will be described below.

The data read operation from the memory cell 30 is carried out as follows. In this case, the write word line 3W, the read word line 3R, and the bit line 4 are precharged to the middle voltage Vhalf (for example, the power supply voltage=2.5 V, and Vhalf=1.25 V).

(1) Step S241

The read X-selector 8-2 selects one from the plurality of read word lines 3R as the selected read word line 3R based on a row address and the signal RA (Read Active). The selected read word line 3R is set to the voltage of Vh− (for example, Vh−=0.75 V)

(2) Step S242

The Y-selector 11 selects one from plurality of bit line 4 as the selected bit line 4s based on a column address. The Y-selector 11 sets the selected bit line 4s to the voltage of Vh+ (for example, Vh+=1.75 V). Thus, the voltage of Vh− from the read X-selector 8-2 and the voltage of Vh+ from the Y-selector 11 are applied to the selected memory cell 30s. This voltage difference ((Vh+)−(Vh−)=1.0 V) is set to become larger than the threshold voltage Vth (for example, 0.7 V) of the third diode 33 (see FIG. 51A). Therefore, the read electric current Is which reflects the data of the selected memory cell 30s flows through the route of the read X-selector 8-2—the selected read word line 3Rs—(the magnetic resistance element 7 of) the selected memory cell 30s—the selected bit line 4s—the Y-selector 11—the sense amplifier 15. In the same way, the reference read electric current Ir which reflects the data "0" of the reference memory cell 30r flows through the route of the read X-selector 8-2—the selected read word line 3Rs—(the magnetic resistance element 7 of) the reference memory cell 30r—the reference bit line 4r—the sense amplifier 15.

(3) Step S243

The sense amplifier 15 determines based on the difference between the read electric current Is and the reference read electric current Ir that the read data is "0" if the difference between the read electric current Is and the reference read electric current Ir is in a predetermined range and the read data "1" if the difference is large (for example, the read electric current Is is smaller than the reference read electric current Ir), and outputs the result.

Through the above data read operation, the data of the selected memory cell 30s can be read.

The write operation of the data into the memory cell 2 is carried out as follows. In this case, the write word line 3W, the read word line 3R, and the bit line 4 are precharged to the middle voltage Vhalf (for example, the power supply voltage=2.5 V, and Vhalf=1.25 V).

(1) Step S251

The write X-selector 8-1 selects one from the plurality of write word lines 3W as the selected write word line 3W based on the row address and the signal WA (Write Active). The write X-selector 8-1 sets the selected write word line 3W to the voltage of Vh+ or Vh− in accordance with the write data (D). For example, the voltage Vh+ is 1.75 V and the voltage Vh− is 0.75 V.

(2) Step S252

The Y-selector 11 selects one from plurality of bit line 4 as the selected bit line 4s based on the column address. The Y-selector 11 sets the selected bit line 4s to the voltage of Vh− or Vh+ opposite to the voltage of the selected write word line 3W. Thus, the voltage of Vh+ or Vh− from the write X-selector 8-1 and the voltage of Vh− or Vh+ from the Y-selector 11 are applied to the selected memory cell 30s. This voltage difference ((Vh+ or Vh−)−(Vh− or Vh+)=±1.0 V) is set to become larger than the threshold voltage Vth+ or Vth− (for example, ±0.7 V) when the first diode 31 and the second diode 32 are connected in parallel (see FIG. 51B). Therefore, the write electric current Iw(0) (in the direction that the electric current flows into the Y-selector 11 in case of "0") or the write electric current Iw(1) (in the direction that the electric current flows into the write selector 8-1 in case of "1") which has a predetermined magnitude corresponding to the data signal D flows through the route of the write X-selector 8-1—the selected write word line 3Ws—(the neighborhood of the magnetic resistance element 7 of) the selected memory cell 30s—the selected bit line 4s—the Y-selector 11.

(3) Step S253

In the selected memory cell 30s, the write electric current Iw(1) (+Y-axis direction) or the write electric current Iw(0) (−Y-axis direction) flows through the extension wiring line 29 which is contact with the magnetic resistance element 7, and the magnetic field is generated into the +X-axis direction or −X-axis direction. The magnetic field inverts the direction of the spontaneous magnetization in the free layer 21 of the magnetic resistance element 7 and the spontaneous magnetization corresponding to the data signal D is stored.

Through the above data write operation, the data can be written in the selected memory cell 30s. In this case, the electric current can be supplied to only the selected memory cell in the case of the data write operation and in case of the data read operation. The electric current flows through only the selected memory cell for the data to be written. Thus, the problem of multiple selection can be solved.

In this embodiment, the same effect as in the first embodiment can be achieved. Also, any element formed on the silicon substrate is not used. Therefore, the memory cells 30 can be stacked. Thus, the effective cell area can be made small.

Twenty-fourth Embodiment

The magnetic random access memory containing the magnetic memory cells according to the twenty-fourth embodiment of the present invention will be described.

Figure 55:
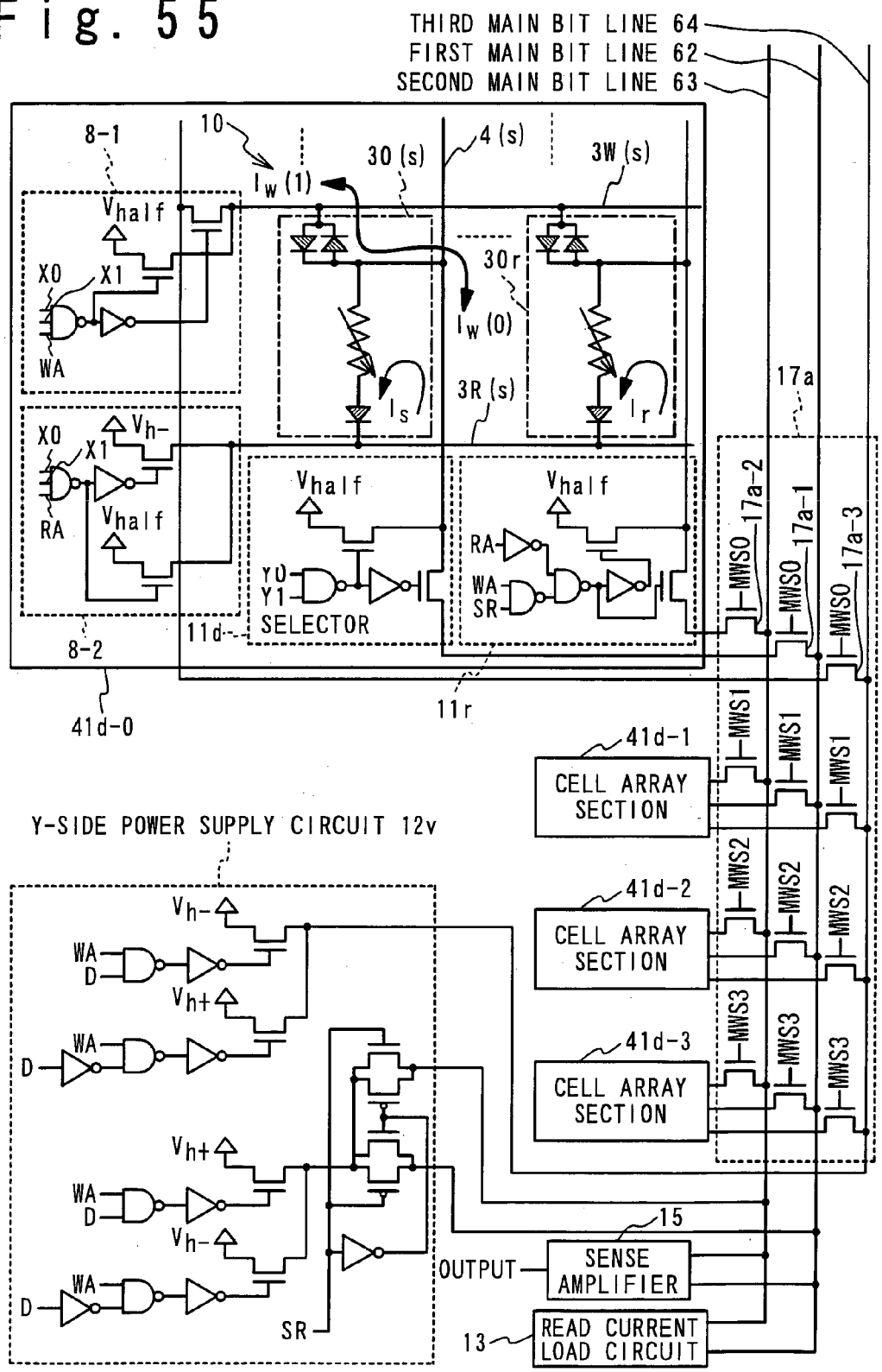
FIG. 55 is a diagram showing the structure of the magnetic random access memory containing the magnetic memory cells according to a twenty-fourth embodiment of the present invention.

FIG. 55 is a diagram showing the structure of the magnetic random access memory containing the magnetic memory cells according to the twenty-fourth embodiment of the present invention. FIG. 55 shows the structure in which the circuit examples of the magnetic random access memory shown in FIG. 50 are arranged in a physical space to have an address hierarchal structure. The magnetic random access memory in this embodiment is composed of the memory cell array sections 41d-0 to 41d-3, the memory cell array selector 17a, first to third main bit lines 62 to 64, the Y-side power supply circuit 12v, the read current load circuit 13 and the sense amplifier 15.

Each of the memory cell array sections 41d-i (i is an integer between 0 to 3) is similar to the memory cell array section 10, which is composed of the plurality of memory cells 30, the plurality of write word lines 3W, the plurality of read word lines 3R, the plurality of bit lines 4 (containing the first reference bit line 4r), the write X-selector 8-1, the read X-selector 8-2, the Y-selector 11d, and the reference Y-selector 11r. The structure and operation of each component are the same as those of the twenty-third embodiment. However, the Y-selector 11d sets the first bit line 4 to the precharge voltage Vhalf and connects the first selected bit line 4s with the cell array selector 17a, based on a column address. The reference Y-selector 11r sets the first reference bit line 4r to the precharge voltage Vhalf and connects the first selected bit line 4s with the cell array selector 17a, based on the read active signal RA, the write active signal WA and the reference selection signal SR. In this case, the precharge voltage Vhalf to each selector is supplied from the X-side power supply circuit 9 (not shown) to each selector. Also, the voltage of Vh− is supplied from the X-side power supply circuit 9 (not shown) to the read X-selector 8-2 in case of the data read operation. It should be noted that in FIG. 55, the four memory cell array sections 41d are shown but the present invention is not limited to this number.

The memory cell array selector 17a selects one of the memory cell array section 41d-0 to 41d-3 by the selector transistors 17a-1 to 17a-3 based on the memory cell array selection signal MWSi and the selected memory cell array section 41d-i is selected. The selected memory cell array section 41d-i is connected with the Y-side power supply circuit 12v, the read current load circuits 13 and the sense amplifiers 15 by a first main bit line 62, a second main bit line 63 and a third main bit line 64 and carries out the same operation as that of the twenty-third embodiment.

The Y-side current source circuit 12v, the read current load circuit 13 and the sense amplifier 15 are the same as those of the twenty-third embodiment except that they are provided out of the memory cell array section 41d and are common to the memory cell array sections 41d-i. Therefore, the description is omitted.

Next, the operation of the magnetic random access memory containing the magnetic memory cells according to the twenty-fourth embodiment of the present invention will be described below. In this example, WA is the write active signal, RA is the read active signal and SR is the signal which sets the reference memory cell 30r to an active state in case of the data write operation to the reference memory cell 30r. These are the same in this Specification.

In the magnetic random access memory shown in FIG. 55, the data read operation from the memory cell 30 is carried out as follows. In this case, the write word line 3W, the read word line 3R, and the bit line 4 are precharged to the middle voltage Vhalf (for example, the power supply voltage=2.5 V, and Vhalf=1.25 V).

(1) Step S261

In the memory cell array selector 17a, the selector transistors 17a-1, 17a-2 and 17a-3 are turned on based on the memory cell array selection signal MWSi and the memory cell array sections 41d-i (i is an integer between 0 to n, and n+1 is the number of the selector arrays) is selected as the selected memory cell array section 41d-i. At this time, the selected memory cell array section 41d-i, the read current load circuit 13 and the sense amplifier 15 are connected by the first main bit line 62 and the second main bit line 63.

(2) Step S262

The read X-selector 8-2 selects one from the plurality of read word lines 3R as the selected read word line 3R based on a row address and the read active signal RA. The read X-selector 8-2 sets the selected read word line 3R to the voltage of Vh− (for example, Vh−=0.75 V).

(3) Step S263

The Y-selector 11d select one from plurality of bit line 4 as the selected bit line 4s based on the column address. The Y-selector 11d sets the selected bit line 4s to the voltage of Vh+ (for example, Vh+=1.75 V). The voltage of Vh+ is applied to the read current load circuit 13 through the first main bit line 62. The reference Y-selector 11r sets the reference bit line 4r to the voltage of Vh+ (for example, Vh+=1.75 V) based on the signal RA. The voltage of Vh+ is applied to the read current load circuit 13 through the second main bit line 63. Thus, the voltage of Vh− from the read X-selector 8-2 and the voltage of Vh+ from the Y-selector 11d are applied to the selected memory cell 30s. This voltage difference ((Vh+)−(Vh−)=1.0V) is set to be larger than the threshold voltage Vth (for example, 0.7 V) of the third diode 33. Therefore, the read electric current Is which reflects the data of the selected memory cell 30s flows through the route of the read X-selector 8-2—the selected read word line 3Rs—the magnetic resistance element 7 of the selected memory cell 30s—the selected bit line 4s—the Y-selector 11d—the memory cell array selector 17a—the sense amplifier 15. In the same way, the reference read electric current Ir which reflects the data "0" of the reference memory cell 30r flows through the route of the read X-selector 8-2—the selected read word line 3R—the magnetic resistance element 7 of the reference memory cell 30r—the reference bit line 4r—the reference Y-selector 11r—the memory cell array selector 17a—the sense amplifier 15.

(3) Step S264

The sense amplifier 15 determines based on the difference of the read electric current Is and the reference read electric current Ir that the read data is "0" if the difference is within a predetermined range, and the read data is "1" if the read electric current Is and the reference read electric current Ir are different (the difference is larger) and outputs the result.

Through the above data read operation, the data of the desired selected memory cell 30s in the desired selected memory cell array section 41d-i can be read.

Next, the data write operation of the data into the memory cell 30 is carried out as follows. In this case, the write word line 3W, the read word line 3R, and the bit line 4 are precharged to the middle voltage Vhalf (for example, the power supply voltage=2.5 V, and Vhalf=1.25 V).

(1) Step S271

In the memory cell array selector 17a, the selector transistors 17a-1, 17a-2 and 17a-3 are turned on based on the memory cell array selection signal MWSI and the memory cell array sections 41d-i is selected as the selected memory cell array section 41d-i. At this time, the selected memory cell array section 41d-i is connected with the Y-side power supply circuit 12v and the sense amplifier 15, by the first main bit line 62, the second main bit line and the third main bit line 64.

(2) Step S272

The write X-selector 8-1 selects one from the plurality of write word lines 3W as the selected write word line 3W based on the row address and the signal WA. The write X-selector 8-1 sets the selected write word line 3W to the voltage of Vh+ or Vh− in accordance with the write data (D). For example, the voltage Vh+ is 1.75 V and the voltage Vh− is 0.75 V. The voltage of Vh+ or Vh− is applied to the Y-side power supply circuit 12v through the third main bit line 64.

(3) Step S273

The Y-selector 11d select one from the plurality of bit lines 4 as the selected bit line 4s based on the column address. The Y-selector 11d sets the selected bit line 4s to the voltage of Vh− or Vh+which is opposite to the voltage of the selected write word line 3W. The voltage of Vh− or Vh+ is applied to the Y-side power supply circuit 12v through the first main bit line 62. Thus, the voltage of Vh+ or Vh− from the write X-selector 8-1 and the voltage of Vh− or Vh+ from the Y-selector 11 are applied to the selected memory cell 30s. This voltage difference ((Vh+ or Vh−)−(Vh− or Vh+)=±1.0 V) is set to be larger than the threshold voltage Vth+ or Vth− (for example, ±0.7 V) when the first diode 31 and the second diode 32 are connected in parallel. Therefore, the write electric current Iw(0) (in the direction that the electric current flows into the Y-selector 11d in case of "0") or the write electric current Iw(1) (in the direction that the electric current flows into the write selector 8-1 in case of "1"), which has a predetermined magnitude corresponding to the data signal D, flows through the route of the write X-selector 8-1—the selected write word line 3Ws—the neighborhood of the magnetic resistance element 7 of the selected memory cell 30s—the selected bit line 4s—the Y-selector 11d—the memory cell array selector 17a—the Y-side power supply circuit 12v.

(3) Step S274

In the selected memory cell 30s, the write electric current Iw(1) (+Y-axis direction) or the write electric current Iw(0) (−Y-axis direction) flows through the extension wiring line 29 which is contact with the magnetic resistance element 7, and the magnetic field is generated into the +X-axis direction or −X-axis direction. The magnetic field inverts the direction of the spontaneous magnetization in the free layer 21 of the magnetic resistance element 7 and the spontaneous magnetization corresponding to the data signal D is stored.

Through the above data write operation, the data can be written in the desired selected memory cell 2s in the desired selected memory cell array section 41d-i.

It should be noted that when the data write operation is carried out to the reference memory cell 2r, the reference bit line 4r is selected by the reference Y-selector 11r based on the reference active signal SR.

In this embodiment, the same effect as in the twenty-third embodiment can be achieved. Also, the magnetic random access memory can be made small by stacking the memory cell arrays to have the physical hierarchy structure and using a part of the magnetic random access memory circuit in common to the memory cell arrays.

Twenty-fifth Embodiment

The magnetic random access memory containing the magnetic memory cells according to the twenty-fifth embodiment of the present invention will be described.

Figure 56:
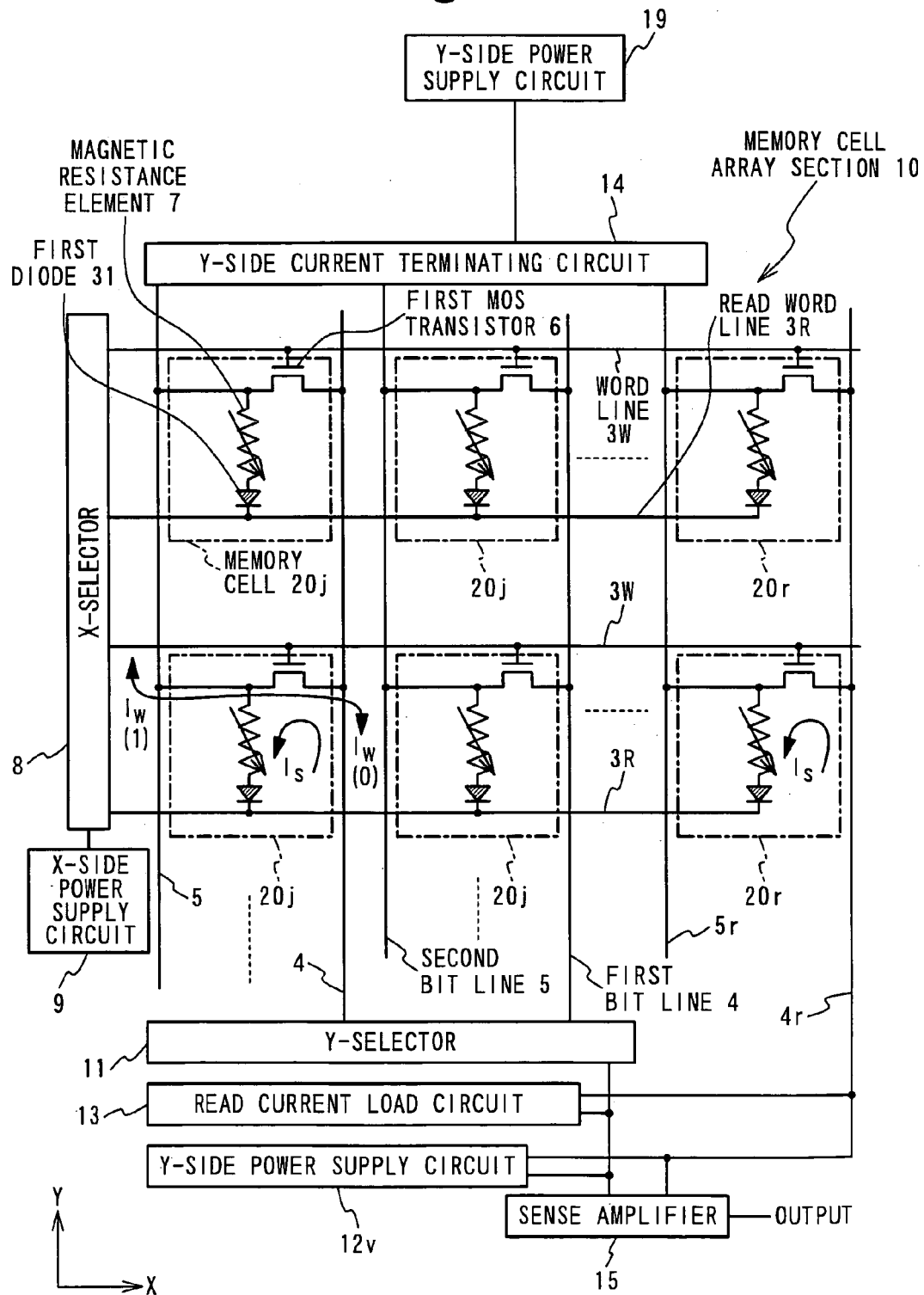
FIG. 56 is a diagram showing the structure of the magnetic random access memory containing the magnetic memory cells according to a twenty-fifth embodiment of the present invention.

FIG. 56 is a diagram showing the structure of the magnetic random access memory containing the magnetic memory cells according to the twenty-fifth embodiment of the present invention. The magnetic random access memory in this embodiment is composed of the memory cell array section 10, the Y-side power supply circuit 12v, the read current load circuit 13, and the sense amplifier 15. The memory cell array section 10 is composed of the plurality of memory cells 20j, the plurality of write word lines 3W, the plurality of read word lines 3R, the plurality of first bit lines 4, the plurality of second bit lines 5, the X-selector 8, the X-side current source circuit 9, the Y-selector 11, the Y-side current terminating circuit 14, and the Y-side power supply circuit 19.

In the memory cell array section 10, the memory cells 20j are arranged in a matrix. The memory cell 20j contains the first MOS transistor 6, the magnetic resistance element 7 and the third diode 33. It should be noted that the memory cell 20j for reference is referred to as the reference memory cell 20r. In the reference memory cell 20r, "0" is written, and generally the data write operation is not carried out to the reference memory cell 20r.

In the first MOS transistor 6, the gate is connected with the write word line 3W, the source is connected with the first bit line 4, and the drain is connected with one end of the magnetic resistance element 7 and the second bit line 5. The first MOS transistor 6 is used to select one of the memory cells 20j in the case of the data write operation and in case of the data read operation. The magnetic resistance element 7 is connected at one end with the drain of the first MOS transistor 6 and is connected at the other end with the anode of the third diode 33. The direction of the magnetization of the spontaneous magnetization is inverted in accordance with a write data. The third diode 33 is connected with the magnetic resistance element 7 at the anode and is connected with the read word line 3R at the cathode. The third diode 33 is used to connect the first bit line 4 and the read word line 3R in the data read operation, and to supply an electric current in predetermined direction to the magnetic resistance element 7. The third diode 33 is as described in the twenty-third embodiment (FIG. 51).

The first bit line 4 is provided to extend into the Y-axis direction (the direction of the bit line) and is connected with the Y-selector 11. It should be noted that the first bit line 4 for reference is referred to as the first reference bit line 4r. The second bit line 5 forms a pair with the first bit line 4 and is provided to extend into the Y-axis direction and is connected with the Y-side current terminating circuit 14. It should be noted that the second bit line 5 for reference is referred to as the second reference bit line 5r. The write word line 3W is provided to extend into the X-axis direction (the direction of the word line) perpendicular to the Y-axis direction and is connected with the X-selector 8. The read word line 3R forms a pair together with the write word line 3W and is provided to extend into the X-axis direction (the direction of the word line) and is connected with the X-selector 8. Each of the above memory cells 20j is provided for one of the positions where the plurality of sets of the first bit line 4 and the second bit line 5 and the plurality of sets of the write word line 3W and the read word line 3R intersect.

The X-selector 8 precharges the plurality of read word lines 3R to a middle voltage Vhalf (for example Vhalf=1.25 V in case of the power supply voltage=2.5 V). In case of the data write operation, the X-selector 8 selects one from the plurality of write word lines 3W as the selected write word line 3W. Also, in case of the data read operation, the X-selector 8 selects one from the plurality of write word lines 3W as the selected write word line 3W. At the same time, the X-selector 8 selects one from the plurality of read word lines 3R as the selected read word line 3R. At this time, the X-selector 8 sets the selected read word line 3R to the voltage of Vh− (for example, Vh−=0.75 V). The Y-selector 11 sets the plurality of first bit lines 4 to a middle voltage Vhalf (for example, Vhalf=1.25 V) through a precharging operation. In case of the data write operation, the Y-selector 11 selects one of the plurality of first bit lines 4 as the first selected bit line 4s. At this time, the Y-selector 11 sets the first selected bit line 4s to the voltage of Vh+ or Vh− in accordance with write data (D). For example, the voltage Vh+ is 1.75 V and the voltage Vh− is 0.75 V. Also, in case of the data read operation, the Y-selector 11 selects one of the plurality of first bit lines 4 as the first selected bit line 4s. At this time, the Y-selector 11 sets the selected bit line 4s to the voltage of Vh+ (for example, Vh+=1.75 V). The Y-side current terminating circuit 14 sets the plurality of second bit lines 5 to a middle voltage Vhalf (for example, Vhalf=1.25 V) through a precharging operation. In case of the data write operation, the Y-side current terminating circuit 14 selects one from the plurality of second bit lines 5 as the second selected bit line 5s, which forms a pair with the first selected bit line 4s. The Y-side current terminating circuit 14 sets the second selected bit line 5s to the voltage Vh− or Vh+ opposite to the voltage of the first selected bit line 4s. The memory cell 20j which is selected by using the selected write/read word line 3Ws/3Rs, and the first/second selected bit line 4s/5s is referred to as the selected memory cell 20js.

The Y-side power supply circuit 12v applies a predetermined voltage to the Y-selector 11 (the first selected bit line 4s) in case of the data write operation. The Y-side power supply circuit 19 applies a predetermined voltage to the Y-side current terminating circuit 14 (the second selected bit line 5s) in case of the data write operation. The read current load circuit 13 is a power supply circuit which carries out the application of a predetermined voltage to the Y-selector 11 (the selected bit line 4s) and the reference bit line 4r in case of the data read operation. The sense amplifier 15 reads data from the selected memory cell 20js based on the difference of the electric current which flows through the reference bit line 4r connected with the reference memory cell 20r and the electric current which flows through the selected bit line 4s connected with the selected memory cell 20js and outputs the data. The X-side power supply circuit 9 supplies the X-selector 8 with a predetermined voltage (the turning on of the first MOS transistor, the precharge voltage Vhalf, and the read voltage Vh+ or Vh−).

Figure 57:
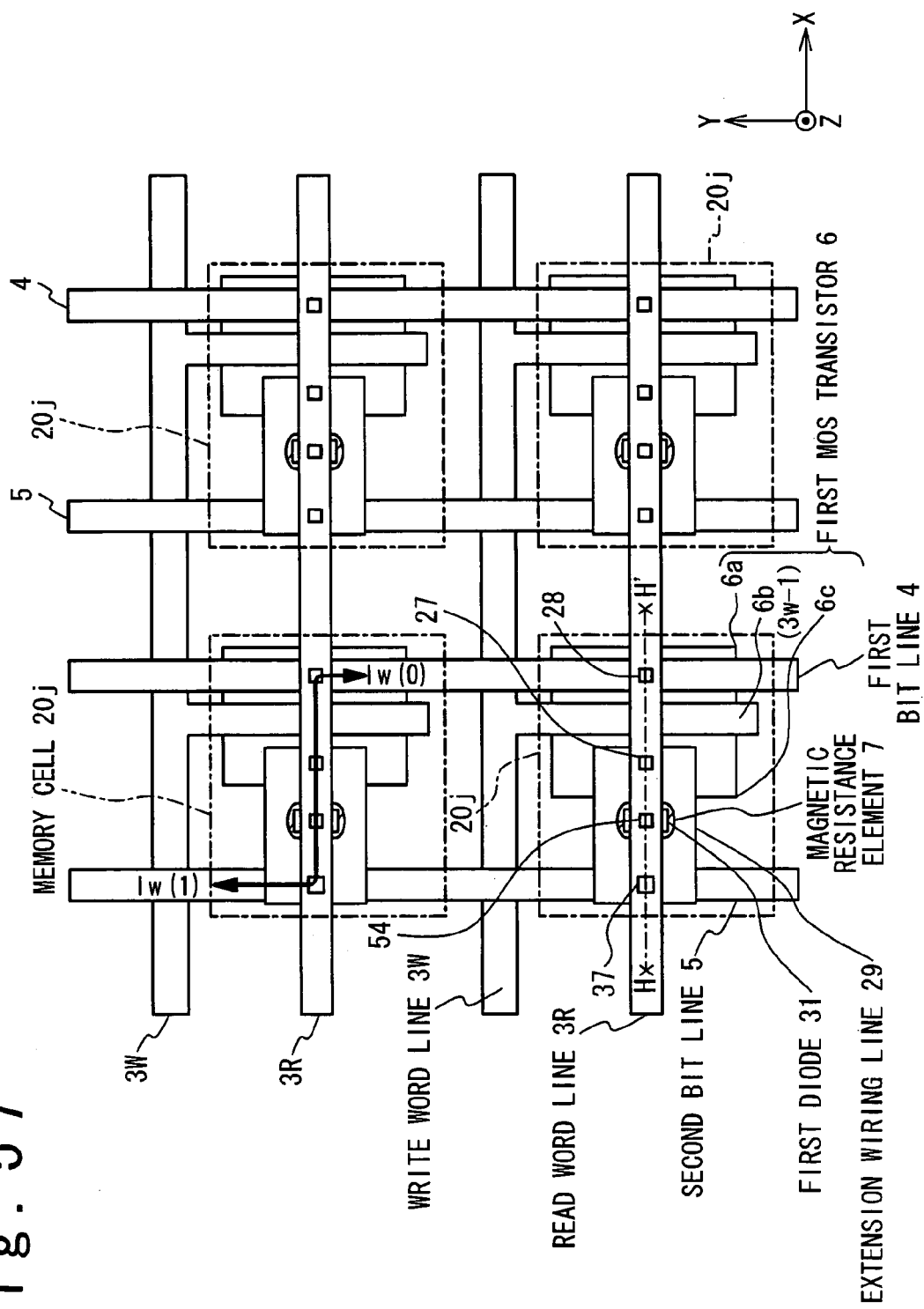
FIG. 57 is a plan view of the magnetic random access memory shown in FIG. 12.

FIG. 57 is a plan view of the memory cell array of the magnetic random access memory shown in FIG. 56. In FIG.

57, the memory cells 20j of 2×2 in the memory cell array section 10 are shown as representative cells. In the first MOS transistor 6 of the memory cell 20, the source 6a is connected with the first bit line 4 through the contact wiring line 28. The gate 6b is a part of the write word line 3W-1 which is branched in the Y-axis direction from the write word line 3W. The drain 6c is connected with the second bit line 5 through the contact wiring line 27—the extension wiring line 29—the contact wiring line 37.

The magnetic resistance element 7 is provided onto the extension wiring line 29. The direction of the spontaneous magnetization is inverted by the electric current which flows through the extension wiring line 29. The electric current flows through the extension wiring line 29 in the X-axis direction, and the magnetic field is applied to the magnetic resistance element 7 in the Y-axis direction. Therefore, the magnetic resistance element 7 is provided to have the shape in which an easy axis of the magnetization is formed in the Y-axis direction. For example, the shape is the ellipse having a long axis which is parallel in the Y-axis direction or a shape similar to the ellipse. The one end of the magnetic resistance element 7 is connected with the extension wiring line 29 and the other end thereof is connected with the read word line 3R through the contact wiring line 54—the third diode 33.

In this structure, the data can be written in the magnetic resistance element 7 which is contact with the extension wiring line 29 when the electric current flows through the route of the first bit line 4—the first MOS transistor 6—the extension wiring line 29—the second bit line 5.

Figure 58:
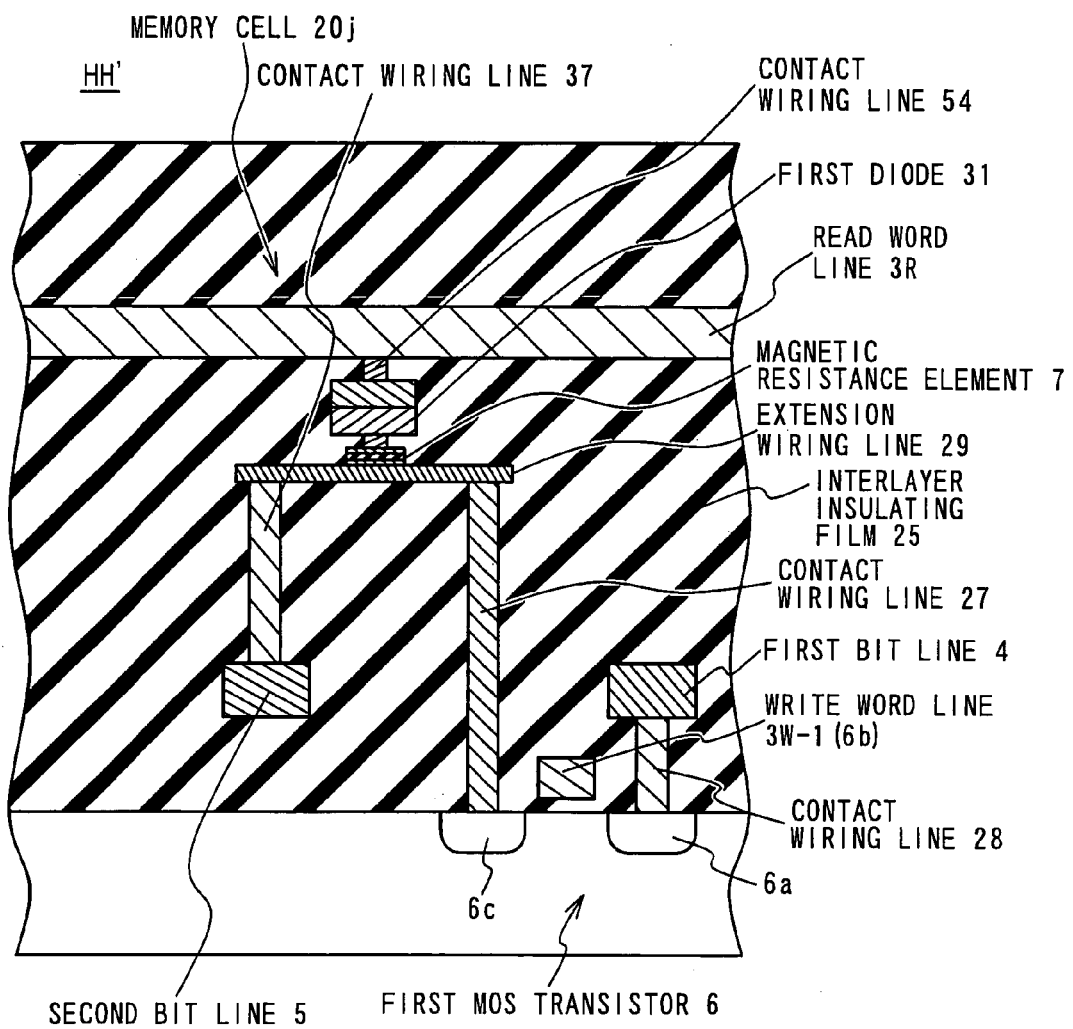
FIG. 58 is a cross sectional view of the memory cell along the HH' line shown in FIG. 57.

FIG. 58 is a cross sectional view showing the memory cell 20j along the HH' line shown in FIG. 57. The first MOS transistor 6 is formed in the surface section of the semiconductor substrate. The source 6a is provided in the semiconductor substrate and connected with the first bit line 4 through the contact wiring line 28 extending into the Z-axis direction. The drain 6c is connected with the one end of the extension wiring line 29 through the contact wiring line 27 extending into the Z-axis direction. The gate 6b is a part of the write word line 3W-1 which is branched from the write word line 3W. In this case, the drain 6c is provided on the inner side of the memory cell 20j than the source 6a. The other end of the extension wiring line 29 is connected with the contact wiring line 37 extending into the Z-axis direction from the second bit line 5. The extension wiring line is provided in parallel to the semiconductor substrate. The magnetic resistance element 7 is provided on the extension wiring line 29 to be connected at one end with it an. The other end thereof is connected with the contact wiring line 54. The contact wiring line 54 contains the third diode 33 on the way and is connected with the read word line 3R.

Next, the operation of the magnetic random access memory containing the magnetic memory cells according to the twenty-fifth embodiment of the present invention will be described below.

The data read operation from the memory cell 2 is carried out as follows. In this case, the read word line 3R, the first bit line 4 and the second bit line 5 are set to the middle voltage Vhalf (for example, the power supply voltage=2.5 V, Vhalf=1.25 V) through a precharging operation.

(1) Step S281

The X-selector 8 selects one from the plurality of read word lines 3R as the selected read word line 3R based on the row address and the RA signal. The X-selector 8 sets the selected read word line 3R to the voltage of Vh− (for example, the voltage Vh−=0.75 V). At the same time, the X-selector 8 selects one from the plurality of write word lines 3W as the selected write word line 3W. Thus, the first MOS transistor is turned on.

(2) Step S282

The Y-selector 11 selects one from the plurality of first bit lines 4 as the first selected bit line 4s based on the column address. The Y-selector 11 sets the first selected bit line 4s to the voltage of Vh+ (for example, the voltage Vh+=1.75 V). Thus, the voltage of Vh− from the X-selector 8 and the voltage of Vh+ from the Y-selector 11 are applied to the selected memory cell 20js. This voltage difference ((Vh+)−(Vh−)=1.0V) is set to be larger than the threshold voltage Vth (for example, 0.7 V) of the third diode 33. Therefore, the read electric current Is which reflects the data of the selected memory cell 20js flows through the route of the X-selector 8—the selected read word line 3Rs —(the magnetic resistance element 7 of) the selected memory cell 20js—the first selected bit line 4s—the Y-selector 11—the sense amplifier 15. In the same way, the reference read electric current Ir which reflects the data "0" of the reference memory cell 30r flows through the route of the X-selector 8, the selected read word line 3Rs—(the magnetic resistance element 7 of) the reference memory cell 20r—the reference bit line 4r—the sense amplifier 15.

(3) Step S283

The sense amplifier 15 determines based on the difference between the read electric current Is and the reference read electric current Ir that the read data is "o" if the difference between them is in a predetermined range and is "1" if the both of the read electric current Is and the reference read electric current Ir is different (the difference is larger), and outputs the result.

Through the above data read operation, the data of the selected memory cell 20js can be read.

Next, the data write operation of the data into the memory cell 2 is carried out as follows. In this case, the read word line 3R, the first bit line 4 and the second bit line 5 are set to the middle voltage Vhalf (for example, the power supply voltage=2.5 V, Vhalf=1.25 V) through a precharging operation.

(1) Step S291

The X-selector 8 selects one from the plurality of write word lines 3W the selected write word line 3W based on the row address. The first MOS transistor 6 of each memory cell 20j is turned on.

(2) Step S292

The Y-selector 11 selects one from the plurality of first bit lines 4 as the first selected bit line 4s based on the column address. The Y-selector 11 sets the first selected bit line 4s to the voltage of Vh+ or Vh− in accordance with write data (D). For example, the voltage Vh+ is 1.75 V and the voltage Vh− is 0.75 V. Also, the Y-side current terminating circuit 14 selects one from the plurality of second bit lines 5 as the second selected bit line 5s based on the column address. The first selected bit line 4s and the second selected bit line 5s forms a pair. The second selected bit line 5s is set to the voltage of Vh− or Vh+, which is opposite to the voltage of the first selected bit line 4s. Thus, the voltage of Vh+ or Vh− from the Y-selector 11 and the voltage of Vh− or Vh+ from the Y-side current terminating circuit 14 are applied to the selected memory cell 20js. Due to this voltage difference ((Vh+ or Vh−)−(Vh− or Vh+)=1.0 V), the write electric current Iw(0) (in the direction that the electric current flows into the Y-selector 11 in case of "0") or the write electric current Iw(1) (in the direction that the electric current flows into the Y-side current terminating circuit 14 in case of "1"), which has a predetermined magnitude corresponding to the data signal D, flows through the route of the Y-selector 11—the first selected bit line 4s—(the neighborhood of the magnetic resistance element 7 of) the selected memory cell 20js—the second selected bit line 5s—the Y-side current terminating circuit 14.

(3) Step S293

The write electric current Iw(0) (+X-axis direction) or the write electric current Iw(1) (−X-axis direction) flows through the extension wiring line 29 which is contact with the magnetic resistance element 7 in the selected memory cell 20js, and the magnetic field is generated into the Y-axis direction or the +Y-axis direction. The magnetic field inverts the direction of the spontaneous magnetization in the free layer 21 of the magnetic resistance element 7 and the spontaneous magnetization corresponding to the data signal D is stored.

Through the above data write operation, the data can be written in the selected memory cell 20js.

In this embodiment, the same effect as in the first embodiment and the third embodiment can be achieved. Also, because the third diode 33 is used, the selectivity of the electric current in the data read operation can be more improved as compared with the case that the diode is not used. Thus, the data read operation can be made faster.

Twenty-sixth Embodiment

The magnetic random access memory containing the magnetic memory cells according to the twenty-sixth embodiment of the present invention will be described.

Figure 59:
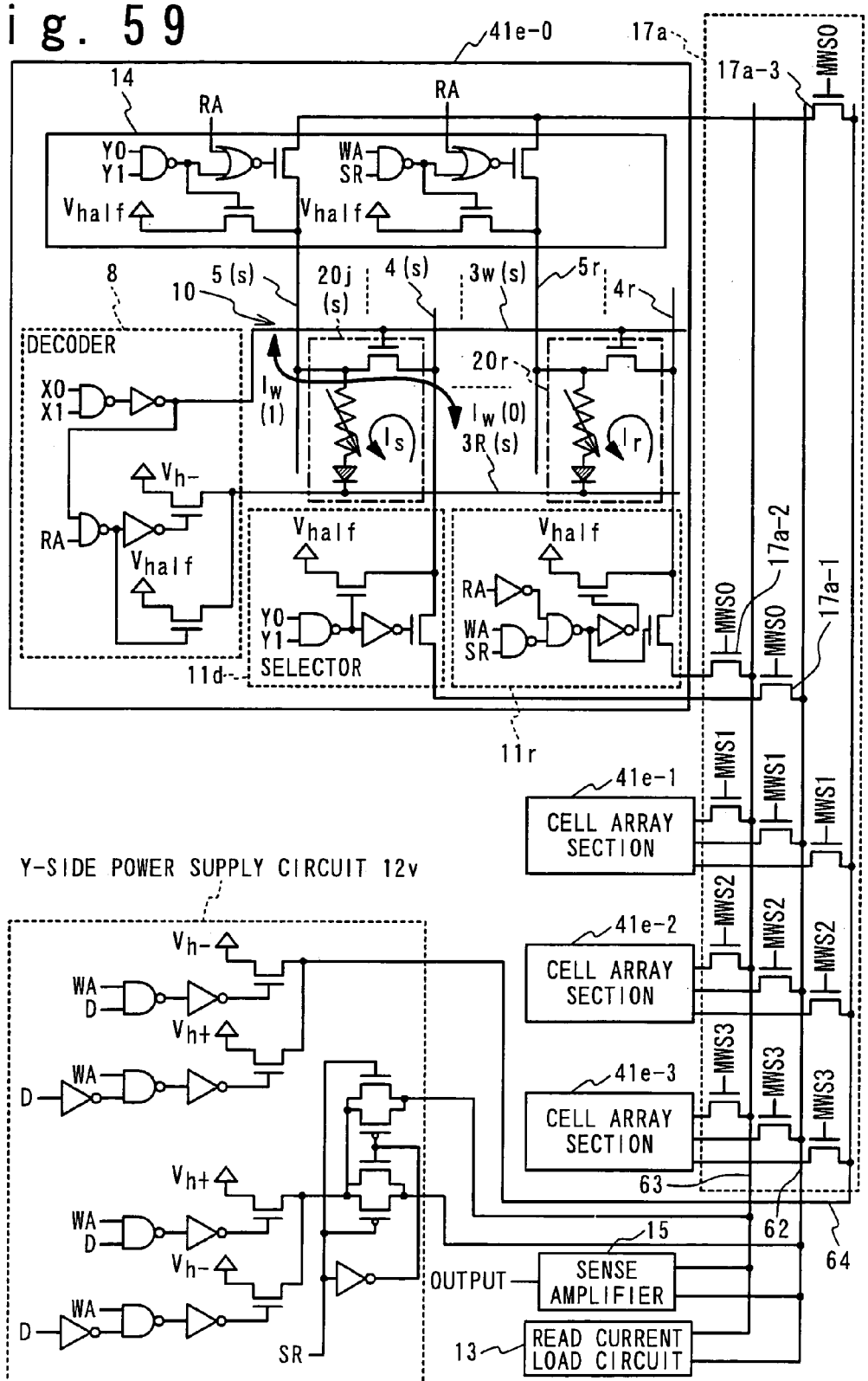
FIG. 59 is a diagram showing the structure of the magnetic random access memory containing the magnetic memory cells according to a twenty-sixth embodiment of the present invention.

FIG. 59 is a diagram showing the structure of the magnetic random access memory containing the magnetic memory cells according to the twenty-sixth embodiment of the present invention. FIG. 59 shows the structure in which the circuit example of the magnetic random access memory shown in FIG. 56 are arranged in an address hierarchy structure. The magnetic random access memory in this embodiment is composed of the memory cell array section 41e-0 to 41e-3, the memory cell array selector 17a, the Y-side power supply circuit 12v, the read current load circuit 13 and the sense amplifier 15.

Each of the memory cell array sections 41e-i (the integer of i=0 to 3) is similar to the memory cell array section 10, and is composed of the plurality of memory cells 20j, the plurality of write word lines 3W, the plurality of read word lines 3R, the plurality of first bit lines 4 (containing the first reference bit line 4r), the plurality of second bit lines 5 (containing the second reference bit line 5r), the X-selector 8, the Y-selector 11d, reference Y-selector 11r, the Y-side current terminating circuit 14. Each component is the same as that of the twenty-fifth embodiment. Therefore, the description is omitted. The Y-selector 11d is the same as the Y-selector 11 but it does not have a select function of reference bit line 4 unlike the Y-selector 11. The reference Y-selector 11r has the select function of the reference bit line 4. Here, the precharge voltage Vhalf is supplied to each selector by a power supply circuit (not shown). Also, the voltage of Vh− is supplied to the X-selector 8 from the X-side power supply circuit 9 (not shown) in case of the data read operation. It should be noted that in FIG. 59, the four memory cell array sections 41e are shown but the present invention is not limited to this number.

The memory cell array selector 17a selects one of the memory cell array sections 41e-0 to 41e-3 by the selector transistor 17a-1 to 17a-3 based on the memory cell array selection signal MWSi (i is an integer between 0 to 3). The selected memory cell array section 41e-i is connected with the Y-side power supply circuit 12v, the read current load circuits 13 and the sense amplifiers 15, by the first main bit line 62, the second main bit line 63 and the third main bit line 64, and carries out the same operation as in the twenty-fifth embodiment.

The Y-side power supply circuit 12v, the read current load circuit 13 and the sense amplifier 15 are the same as those of the twenty-fifth embodiment except that they are provided out of the memory cell array section 41e and are shared by the memory cell array sections 41e-i. Therefore, the description is omitted.

Next, the operation of the magnetic random access memory containing the magnetic memory cells according to the twenty-sixth embodiment of the present invention will be described below.

In the magnetic random access memory shown in FIG. 59, the data read operation from the memory cell 20j is carried out as follows. In this case, the read word line 3R, the first bit line 4 and the second bit line 5 are set to the middle voltage Vhalf (for example, the power supply voltage=2.5 V, Vhalf=1.25 V) through a precharging operation.

(1) Step S301

In the memory cell array selector 17a, the selector transistors 17a-1, 17a-2 and 17a-3 are turned on based on the memory cell array selection signal MWSi and one of the memory cell array sections 41e-i is selects as the selected memory cell array section 41e-i. At this time, the selected memory cell array section 41e-i, the read current load circuit 13 and the sense amplifier 15 are connected by the first main bit line 62 and the second main bit line 63.

(2) Step S302

The X-selector 8 selects one from the plurality of read word lines 3R as the selected read word line 3R based on the row address and the RA signal. The X-selector 8 sets the selected read word line 3R to the voltage of Vh− (for example, the voltage Vh−=0.75 V). At the same time, the X-selector 8 selects one from the plurality of write word lines 3W as the selected write word line 3W. Thus, the first MOS transistor is turned on.

(3) Step S303

The Y-selector 11d selects one from the plurality of first bit lines 4 as the first selected bit line 4s based on the column address. The Y-selector 11d sets the selected bit line 4s to the voltage of Vh+ (for example, the voltage Vh+=1.75 V). The voltage of Vh+ is applied to the read current load circuit 13 through the first main bit line 62. The reference Y-selector 11r sets the reference bit line 4r to the voltage of Vh+ (for example, the voltage Vh+=1.75 V) based on the signal RA. The voltage of Vh+ is applied to the read current load circuit 13 through the second main bit line 63. Thus, the voltage of Vh− from the X-selector 8 and the voltage of Vh+ from the Y-selector 11d are applied to the selected memory cell 20js. This voltage difference ((Vh+)−(Vh−)=1.0V) is set to be larger than the threshold voltage Vth (for example, the voltage 0.7 V) of the third diode 33. Therefore, the read electric current Is which reflects the data of the selected memory cell 20js flows through the route of the X-selector 8—the selected read word line 3Rs —(the magnetic resistance element 7 of) the selected memory cell 20js—the first selected bit line 4s—the Y-selectors 11d—the memory cell array selector 17a—the sense amplifier 15. In the same way, the reference read electric current Ir which reflects the data "0" of the reference memory cell 30r flows through the route of The X-selector 8—the selected read word line 3Rs—(the magnetic resistance element 7 of) the reference memory cell 20r—the reference bit line 4r—the reference Y-selector 11r—the memory cell array selector 17a—the sense amplifier 15.

(4) Step S304

The sense amplifier 15 determines based on the difference between the read electric current Is and the reference read electric current Ir that the read data is "0" if the difference is in a predetermined range and is "1" if the read electric current Is and the reference read electric current Ir are different (the difference is larger), and outputs the result.

Through the above data read operation, the data of the desired selected memory cell 20js in the desired selected memory cell array section 41e-i can be read.

Next, the write operation of the data into the memory cell 2 is carried out as follows. In this case, the read word line 3R, the first bit line 4 and the second bit line 5 are set to the middle voltage Vhalf (for example, the power supply voltage=2.5 V, Vhalf=1.25 V) through a precharging operation.

(1) Step S311

In the memory cell array selector 17a, the selector transistors 17a-1, 17a-2 and 17a-3 are turned on based on the memory cell array selection signal MWSi and one of the memory cell array sections 41e-i is selected as the selected memory cell array section 41e-i. At this time, the selected memory cell array section 41e-i is connected with the Y-side power supply circuit 12v, the read current load circuit 13, and the sense amplifier 15, by the first main bit line 62 to third main bit line 64.

(2) Step S312

The X-selector 8 selects one from the plurality of write word lines 3W as the selected write word line 3W based on the row address. The first MOS transistor 6 of each the memory cell 20j is turned on.

(3) Step S313

The Y-selector 11d selects one from the plurality of first bit lines 4 as the first selected bit line 4s based on the column address. The Y-selector 11d sets the first selected bit line 4s to the voltage of Vh+ or Vh− in accordance with write data (D). For example, the voltage Vh+ is 1.75 V and the voltage Vh− is 0.75 V. The voltage of Vh+ or Vh−is applied to the Y-side power supply circuit 12v through the first main bit line 62. Also, the Y-side current terminating circuit 14 selects one from the plurality of second bit lines 5 as the second selected bit line 5s based on the column address. The first selected bit line 4s and the second selected bit line 5s are selected to form a pair. The Y-side current terminating circuit 14 sets the second selected bit line 5s to the voltage of Vh− or Vh+ which is opposite to the voltage of the first selected bit line 4s. The voltage of Vh− or Vh+ is applied to the Y-side power supply circuit 12v through the third main bit line 64. Thus, the voltage of Vh+ or Vh− from the Y-selector 11d and the voltage of Vh− or Vh+ from the Y-side current terminating circuit 14 are applied to the selected memory cell 20js. Due to this voltage difference ((Vh+ or Vh−)−(Vh− or Vh+)=±1.0 V), the write electric current Iw(0) (in the direction that the electric current flows into the Y-selector 11 in case of "0") or the write electric current Iw(1) (in the direction that the electric current flows into the Y-side current terminating circuit 14 in case of "1") which has a predetermined magnitude corresponding to the data signal D flows through the route of the Y-selector 11d—the first selected bit line 4s—(the neighborhood of the magnetic resistance element 7 of) the selected memory cell 20js—the second selected bit line 5s—the Y-side current terminating circuit 14.

(4) Step S314

In the selected memory cell 20js, the write electric current Iw(0) (+X-axis direction) or the write electric current Iw(1) (−X-axis direction) flows through the extension wiring line 29 which is contact with the magnetic resistance element 7, and the magnetic field is generated to the Y-axis direction or the +Y-axis direction. The magnetic field inverts a direction of the spontaneous magnetization in the free layer 21 of the magnetic resistance element 7 and the spontaneous magnetization corresponding to the data signal D is stored.

Through the above data write operation, the data can be written in the desired selected memory cell 20js in the desired selected memory cell array section 41e-i.

It should be noted that in case of the data write operation into the reference memory cell 20r, based on the reference active signal SR, the first reference bit line 4r is selected by the Y-selector 11d and the second reference bit line 5r is selected by the Y-side current terminating circuit 14.

In this embodiment, the same effect as in the twenty-fifth embodiment can be achieved. Also, the magnetic random access memory can be made small in size because the memory cell arrays are arranged to have the address hierarchy structure and a part of the magnetic random access memory circuit is used in common to the memory cell arrays.

Twenty-seventh Embodiment

The magnetic random access memory containing the magnetic memory cells according to the twenty-seventh embodiment of the present invention will be described.

Figure 60:
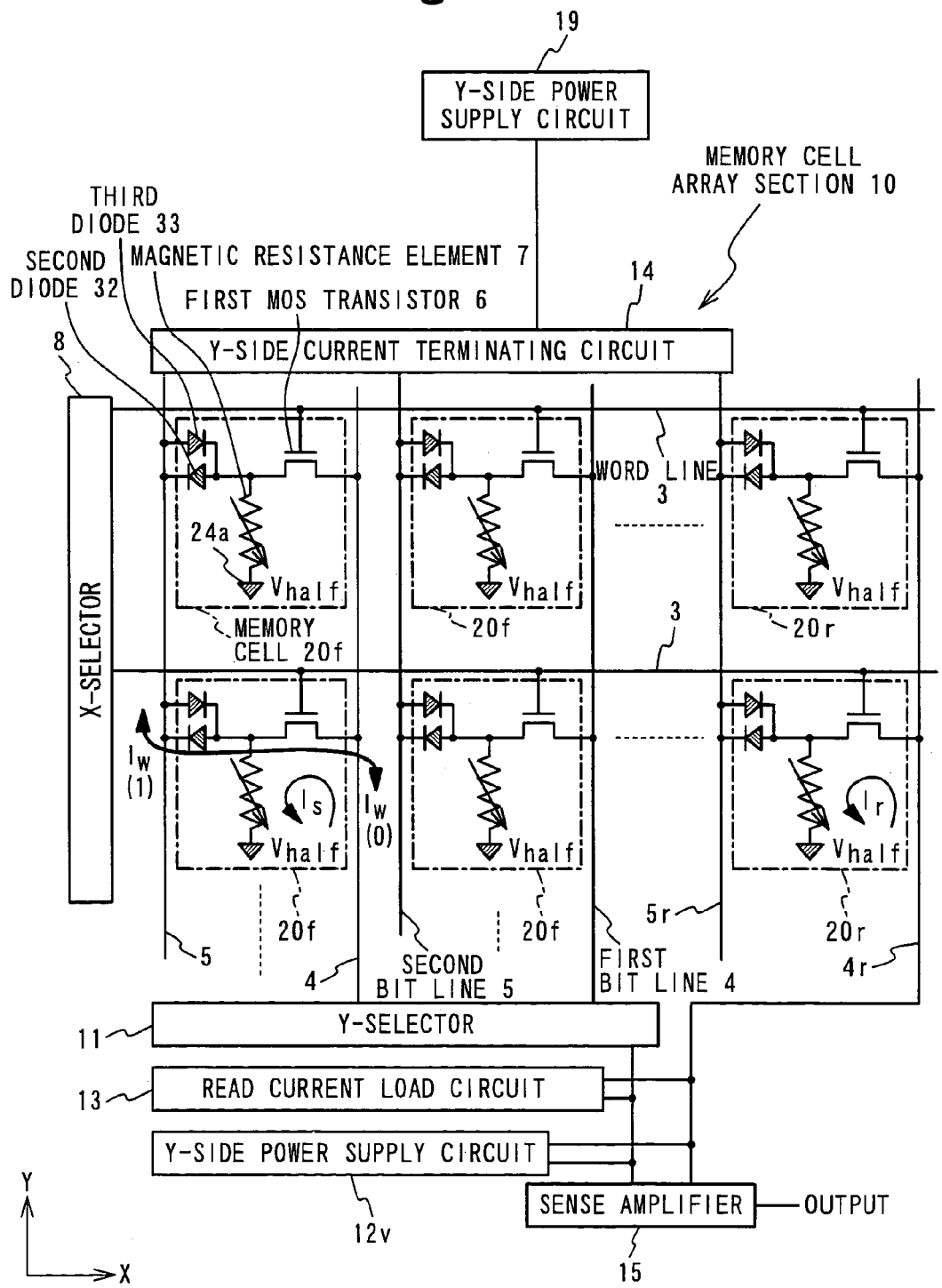
FIG. 60 is a diagram showing the structure of the magnetic random access memory containing the magnetic memory cells according to a twenty-seventh embodiment of the present invention.

FIG. 60 is a diagram showing the structure of the magnetic random access memory containing the magnetic memory cells according to the twenty-seventh embodiment of the present invention. The magnetic random access memory in this embodiment is composed of the memory cell array section 10, the Y-side power supply circuit 12v, the read current load circuit 13, and the sense amplifier 15. The memory cell array section 10 is composed of a plurality of memory cell arrays 20f, the plurality of word lines 3, the plurality of first bit lines 4, the plurality of second bit lines 5, the X-selector 8, the Y-selector 11, the Y-side current terminating circuit 14, and the Y-side power supply circuit 19.

In the memory cell array section 10, the memory cells 20f are arranged in a matrix. The memory cell 20f contains the first MOS transistor 6, the magnetic resistance element 7, the first diode 31 and the second diode 32. It should be noted that the memory cell 20f for reference is referred to as the reference memory cell 20r. In the reference memory cell 20r, "0" is written, and, the data write operation is not generally carried out.

In the first MOS transistor 6, the gate is connected with the write word line 3W, the source is connected with the first bit line 4 and the drain is connected with one end of the magnetic resistance element 7, the first diode 31 and the second diode 32. The first MOS transistor 6 is used to select one of the memory cells 20f in the case of the data write operation and in case of the data read operation. The magnetic resistance element 7 is connected with the drain of the first MOS transistor 6 at one end and is connected with a predetermined voltage source 24a (Vhalf) at the other end. The direction of the magnetization of the spontaneous magnetization is inverted in accordance with a write data. The cathode of the first diode 31 and the anode of the second diode 32 are connected with the second bit line 5. The anode of the first diode 31 and the cathode of the second diode 32 are connected with one end of the magnetic resistance element 7. The first diode 31 and the second diode 32 are used to connect the first bit line 4 and the second bit line 5 in the data write operation and to apply an electric current to the neighborhood of the magnetic resistance element 7.

The first bit line 4 is provided to extend into the Y-axis direction (the direction of the bit line) and is connected with the Y-selector 11. It should be noted that the first bit line 4 for reference is referred to as the first reference bit line 4*r*. The second bit line 5 is provided to form a pair together with the first bit line 4 and to extend into the Y-axis direction and is connected with the Y-side current terminating circuit 14. It should be noted that the second bit line 5*t* for reference is referred to as the second reference bit line 5*r*. The word line 3 is provided to extend into the X-axis direction (the direction of the word line) perpendicular substantially to the Y-axis direction and is connected with the X-selector 8. Each of the above memory cells 20*f* is provided to one of the positions where the plurality of sets of the first bit line 4 and the second bit line 5 and the word line 3 intersect.

The X-selector 8 selects one of the plurality of word lines 3 as the selected word line 3*s* in case of the data write operation and in the case of read of the operation. The Y-selector 11 sets the plurality of first bit lines 4 to the middle voltage Vhalf (for example, Vhalf=1.25 V) through a precharging operation. In case of the data write operation, the X-selector 8 selects one of the plurality of first bit lines 4 as the first selected bit line 4*s*. At this time, The X-selector 8 sets the first selected bit line 4*s* to the voltage of Vh+ or Vh− in accordance with write data (D). For example, the voltage Vh+ is 1.75 V and the voltage Vh− is 0.75 V. Also, in case of the data read operation, the X-selector 8 selects one of the plurality of first bit lines 4 as the first selected bit line 4*s*. At this time, the X-selector 8 sets the selected bit line 4*s* to the voltage of Vh+(for example, Vh+=1.75 V). The Y-side current terminating circuit 14 sets the plurality of second bit lines 5 to the middle voltage Vhalf (for example, Vhalf=1.25 V) through a precharging operation. In case of the data write operation, the Y-side current terminating circuit 14 selects one from plurality of second bit lines 5 as the second selected bit line 5*s* which forms a pair with the first selected bit line 4*s*. The Y-side current terminating circuit 14 sets the second selected bit line 5*s* to the voltage Vh− or Vh+ which is opposite to the voltage of the first selected bit line 4*s*. The memory cell 20*f* is selected by the selected write/read word line 3Ws/3Rs, and the first/second selected bit line 4*s*/5*s* and is referred to as the selected memory cell 20*fs*.

The Y-side power supply circuit 12*v*, the Y-side power supply circuit 19, the read current load circuit 13, and the sense amplifier 15 are same as those of the twenty-fifth embodiment. Therefore, the description is omitted.

Figure 61:
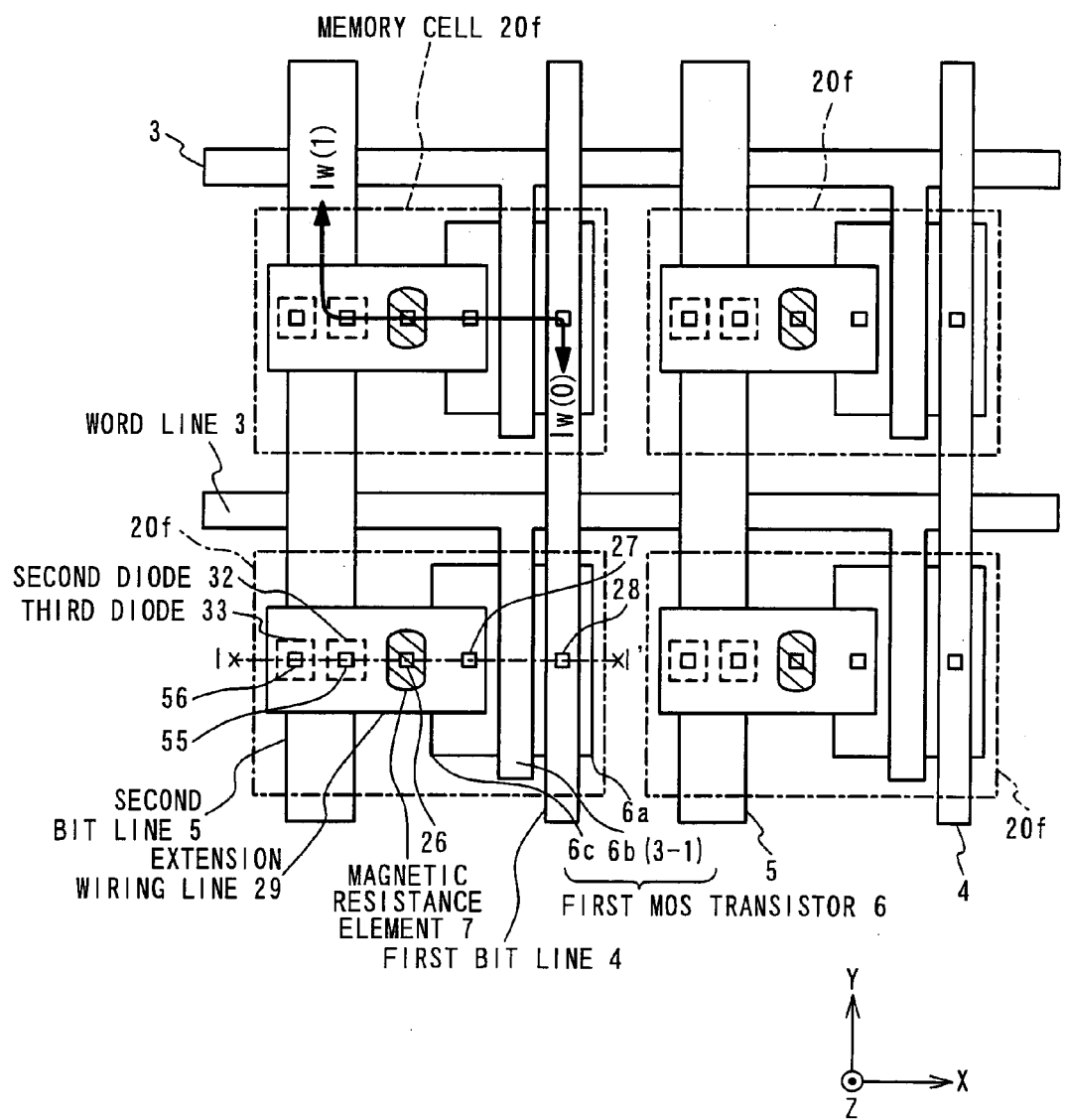
FIG. 61 is a plan view of the magnetic random access memory shown in FIG. 60.

FIG. 61 is a plan view of the memory cell array of the magnetic random access memory shown in FIG. 60. In FIG. 61, the memory cells 20*f* of 2×2 in the memory cell array section 10 are shown as representative cells. The first MOS transistor 6 of the memory cell 20, the source 6*a* is connected with the first bit line 4 through the contact wiring line 28. The gate 6*b* is a part of the word line 3-1 which is branched in the Y-axis direction from the word line 3. The drain 6*c* is connected with the second bit line 5 through the contact wiring line 27—the extension wiring line 29—the contact wiring line 55 or the contact wiring line 56. The first diode 31 and the second diode 32 are provided on the way of the contact wiring line 55 and the contact wiring line 56 respectively.

The magnetic resistance element 7 is provided on the extension wiring line 29. The direction of the spontaneous magnetization is inverted by the electric current which flows through the extension wiring line 29. The electric current flows through the extension wiring line 29 in the X-axis direction, and the magnetic field into the Y-axis direction is generated and applied to the magnetic resistance element 7. Therefore, the magnetic resistance element 7 is provided to have a shape in which the easy axis of the magnetization is formed in the Y-axis direction. For example, the magnetic resistance element 7 is an ellipse having the long axis which is parallel in the Y-axis direction and a shape similar to the ellipse. The one end of the magnetic resistance element 7 is connected with the extension wiring line 29 and the other end thereof is connected with the wiring line to the voltage source 24*a* (not shown) which supplies the voltage Vhalf.

In this structure, the data can be written in the magnetic resistance element 7 which is contact with the extension wiring line 29 when the electric current flows through the route of the first bit line 4—the first MOS transistor 6—the extension wiring line 29—the second bit line 5.

Figure 62:
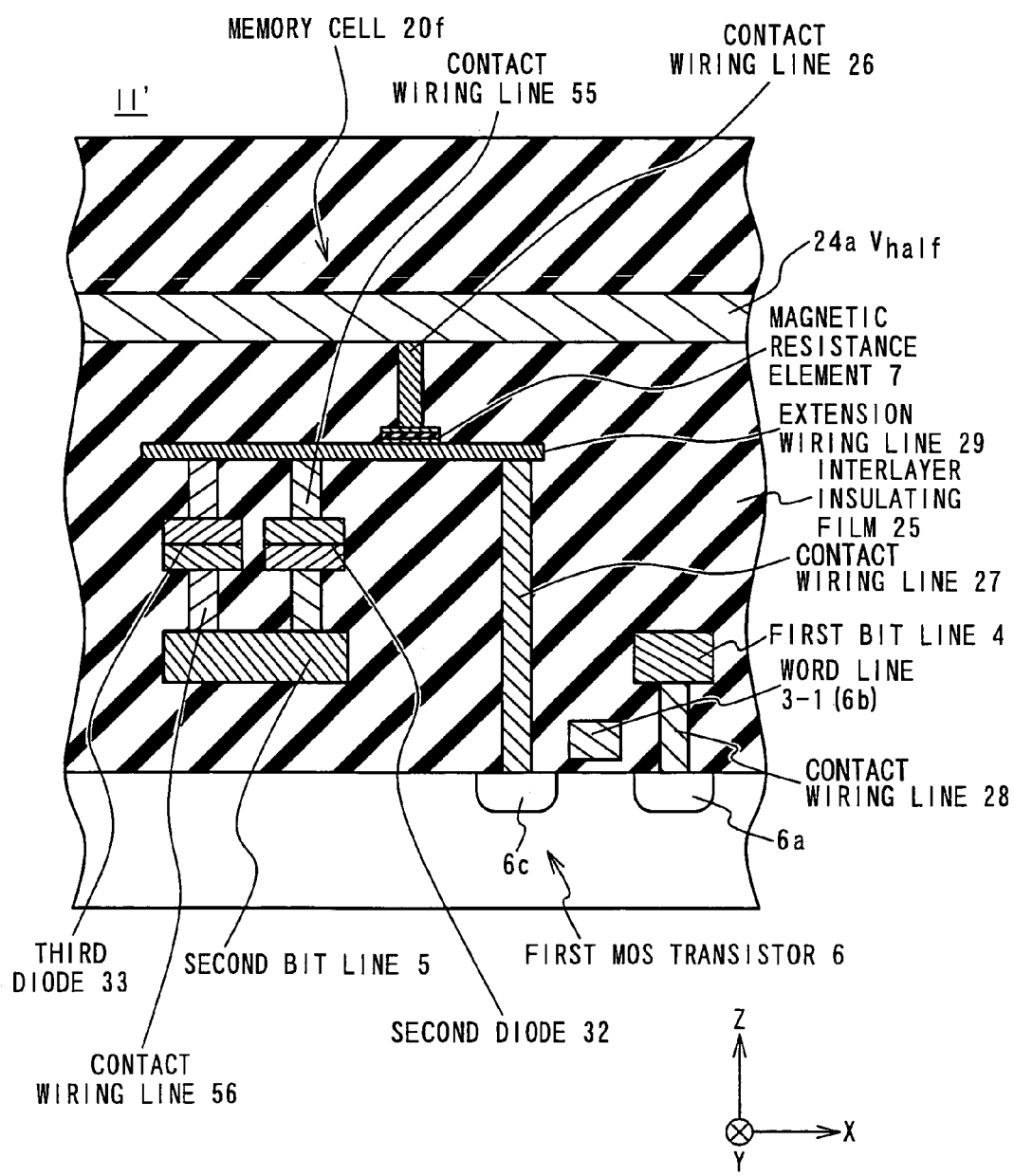
FIG. 62 is a cross sectional view of the memory cell along the II' line shown in FIG. 61.

FIG. 62 is a cross sectional view showing the memory cell 20*f* along the II' line shown in FIG. 61. The first MOS transistor 6 is formed in the surface section of the semiconductor substrate. The source 6*a* of the first MOS transistor 6 is provided in the semiconductor substrate and is connected with the first bit line 4 through the contact wiring line 28 extending into the Z-axis direction. The drain 6*c* is connected with the one end of the extension wiring line 29 through the contact wiring line 27 extending into the Z-axis direction. The gate 6*b* is a part of the word line 3-1 which is branched from the word line 3. In this case, the drain 6*c* is provided on the inner side of the memory cell 20*f* than the source 6*a*. The other end of the extension wiring line 29 is connected with the contact wiring line 55 extending into the Z-axis direction from the second bit line 5 and the contact wiring line 56. The extension wiring line is provided in parallel to the substrate. The first diode 31 and the second diode 32 are provided on the way of the contact wiring line 55 and the contact wiring line 56, respectively. The magnetic resistance element 7 is provided on the extension wiring line 29 to be connected at one end with the extension wiring line 29. The other end of the magnetic resistance element 7 is connected with the contact wiring line 26. The contact wiring line 26 is connected with the wiring line to the voltage source 24*a*.

Next, the operation of the magnetic random access memory containing the magnetic memory cells according to the twenty-seventh embodiment of the present invention will be described below.

The data read operation from the memory cell 2 is carried out as follows. In this case, the first bit line 4 and the second bit line 5 are set to the middle voltage Vhalf (for example, the power supply voltage=2.5 V, Vhalf=1.25 V) through a precharging operation.

(1) Step S321

The X-selector 8 selects one from the plurality of word lines 3 as the selected word line 3*s* based on the row address. Thus, the first MOS transistor 6 is turned on.

(2) Step S322

The Y-selector 11 selects one from the plurality of first bit lines 4 as the first selected bit line 4*s* based on the column address. The Y-selector 11 sets the selected bit line 4*s* to the voltage of Vh+ (for example, Vh+=1.75 V). Thus, the voltage of Vhalf from voltage source 24*a* and the voltage of Vh+ from the Y-selector 11 are applied to the selected memory cell 20*fs*. This voltage difference ((Vh+)−(Vhalf)

=0.5 V) is set smaller than any threshold voltage Vth of the first diode 31 and the second diode 32. Thus, the electric current does not flow through each diode and the read electric current Is which reflects the data of the selected memory cell 20fs flows through the route of the voltage source 24a—(the magnetic resistance element 7 of) the selected memory cell 20fs—the first selected bit line 4s—the Y-selector 11—the sense amplifier 15. In this case, because the threshold voltage is set to 0.7 V, the electric current never flows through the first diode 31 and the second diode 32. In the same way, the reference read electric current Ir which reflects the data "0" of the reference memory cell 30r flows through the route of the voltage source 24a—(the magnetic resistance element 7 of) the reference memory cell 20r—reference bit line 4r—the sense amplifier 15.

(3) Step S323

The sense amplifier 15 determines based on the difference of the read electric current Is and the reference read electric current Ir that the read data is "0" if the difference is in a predetermined range and is "1" if the read electric current Is and the reference read electric current Ir are different (the difference is larger), and outputs the result.

Through the above data read operation, the data of the selected memory cell 20fs can be read.

Next, the data write operation of the data into the memory cell 2 is carried out as follows. The first bit line 4 and the second bit line 5 are set to the middle voltage Vhalf (for example, the power supply voltage=2.5 V, Vhalf=1.25 V) through a precharging operation.

(1) Step S331

The X-selector 8 selects one from the plurality of word lines 3 as the selected word line 3s based on the row address. The first MOS transistor 6 of each memory cell 20f is turned on.

(2) Step S332

The Y-selector 11 selects one from the plurality of first bit lines 4 as the first selected bit line 4s based on the column address. The Y-selector 11 sets the first selected bit line 4s to the voltage of Vh+ or Vh− in accordance with write data (D). For example, the voltage Vh+ is 1.75 V and the voltage Vh− is 0.75 V. Also, the Y-side current terminating circuit 14 selects one from the plurality of second bit lines 5 as the second selected bit line 5s based on the column address. The first selected bit line 4s and the second selected bit line 5s are selected to form a pair. The Y-side current terminating circuit 14 sets the second selected bit line 5s to the voltage of Vh− or Vh+ which is opposite to the voltage of the first selected bit line 4s. Thus, the voltage of Vh+ or Vh− from the Y-selector 11 and the voltage of Vh− or Vh+ from the Y-side current terminating circuit 14 are applied to the selected memory cell 20fs. This voltage difference ((Vh+ or Vh−)−(Vh− or Vh+)=±1.0 V) is set larger than any threshold voltage Vth of the first diode 31 and second diode 32. The write electric current Iw(0) (in the direction that the electric current flows into the Y-selector 11 in case of "0") or the write electric current Iw(1) (in the direction that the electric current flows into the Y-side current terminating circuit 14 in case of "1") which has a predetermined magnitude corresponding to the data signal D flows through the route of the Y-selector 11—the first selected bit line 4s—(the neighborhood of the magnetic resistance element 7 of) the selected memory cell 20fs—the second selected bit line 5s—the Y-side current terminating circuit 14.

(3) Step S333

In the selected memory cell 20fs, the write electric current Iw(0) (+X-axis direction) or the write electric current Iw(1) (−X-axis direction) flows through the extension wiring line 29 which is contact with the magnetic resistance element 7, and the magnetic field is generated to the Y-axis direction or the +Y-axis direction. The magnetic field inverts a direction of the spontaneous magnetization in the free layer 21 of the magnetic resistance element 7, and the spontaneous magnetization corresponding to the data signal D is stored.

Through the above data write operation, the data can be written in the selected memory cell 20fs.

In this embodiment, the same effect as in the first embodiment and the third embodiment can be achieved. Also, it is not necessary to provide the read word line and the write word line. Thus, a control is easy and a decoder circuit can be made simple. In this way, the chip size can be made small.

Twenty-eighth Embodiment

The magnetic random access memory containing the magnetic memory cells according to the twenty-eighth embodiment of the present invention will be described.

Figure 63:
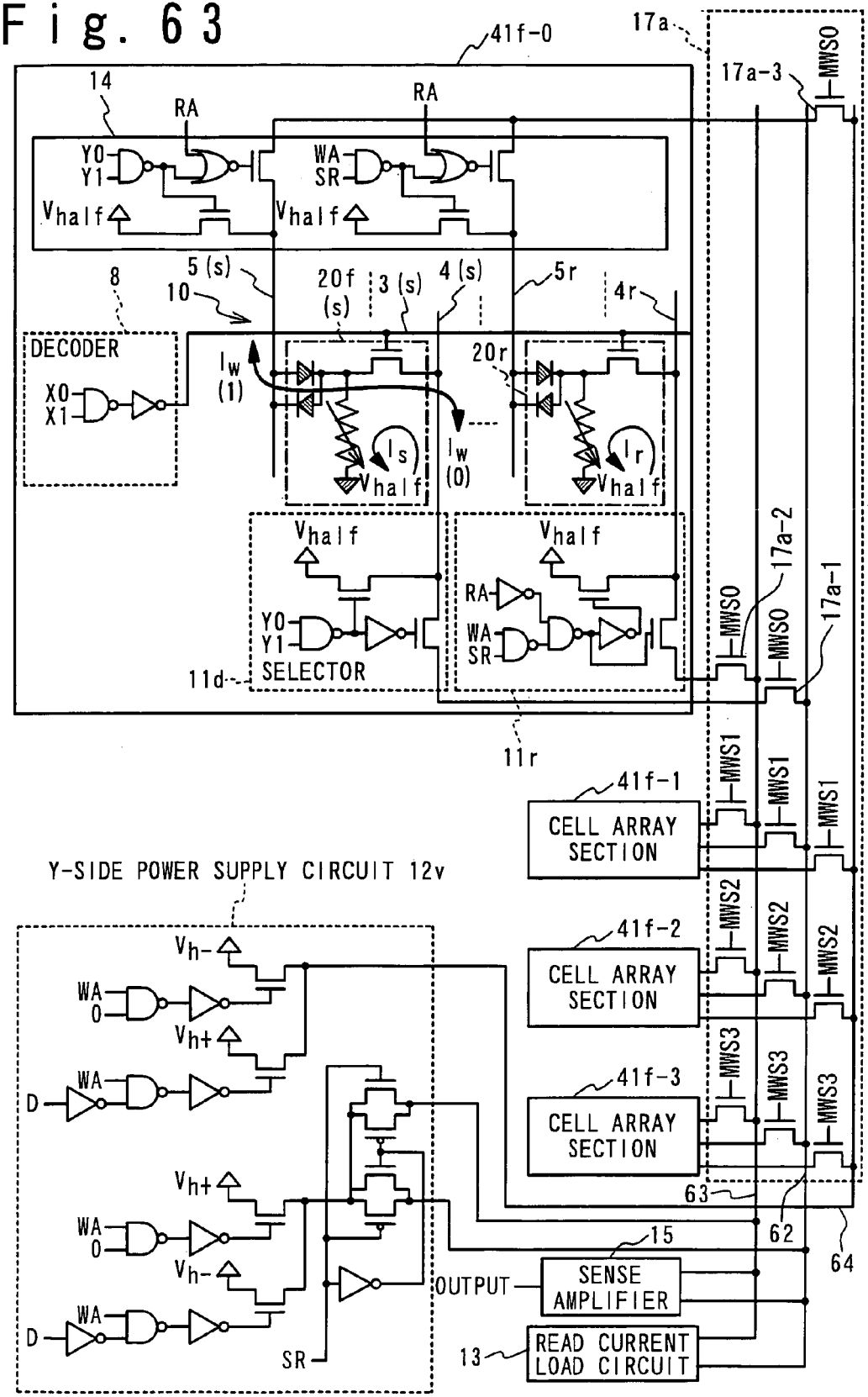
FIG. 63 is a diagram showing the structure of the magnetic random access memory containing the magnetic memory cells according to a twenty-eighth embodiment of the present invention.

FIG. 63 is a diagram showing the structure of the magnetic random access memory containing the magnetic memory cells according to the twenty-eighth embodiment of the invention. FIG. 63 shows the structure in which the circuit examples of the magnetic random access memory shown in FIG. 60 are arranged to form an address hierarchy structure. The magnetic random access memory in this embodiment is composed of memory cell array sections 41f-0 to 41f-3, the memory cell array selector 17a, the Y-side current source circuit 12v, the read current load circuit 13 and the sense amplifier 15.

Each of the memory cell array sections 41f-0 to 41f-3 is composed of the plurality of memory cells 20f, the plurality of word lines 3W, the plurality of first bit lines 4 (containing the first reference bit line 4r), the plurality of second bit lines 5 (containing the second reference bit line 5r), the X-selector 8, the Y-selector 11d, the reference Y-selector 11r, and the Y-side current terminating circuit 14. Each component is the same as the twenty-seventh embodiment. Therefore, the description is omitted. In this case, the Y-selector 11d is the same as the Y-selector 11 but does not have a select function of the reference bit line 4 unlike the Y-selector 11. The reference Y-selector 11r has the select function of the reference bit line 4. Here, the precharge voltage Vhalf is applied from a power supply circuit (not shown) to each memory cell. It should be noted that in FIG. 63, the four memory cell array sections 41f are shown but the present invention is not limited to this number.

The memory cell array selector 17a is same as that of the twenty-sixth embodiment. Therefore, the description will be omitted. Also, the Y-side current source circuit 12v, the read current load circuit 13 and the sense amplifier 15 are the same as those of the twenty-seventh embodiment except that they are provided out of the memory cell array section 41f and shared by the respective memory cell array sections 41f-i. Therefore, the description is omitted.

Next, the operation of the magnetic random access memory containing the magnetic memory cells according to the twenty-eighth embodiment of the present invention will be described below.

In the magnetic random access memory shown in FIG. 63, the data read operation from the memory cell 20f is carried out as follows. In this case, the first bit line 4 and the second bit line 5 are set to the middle voltage Vhalf (for example, the power supply voltage=2.5 V, Vhalf=1.25 V) through a precharging operation.

(1) Step S341

In the memory cell array selector 17a, the selector transistors 17a-1, 17a-2 and 17a-3 are turned on based on the memory cell array selection signal MWSi (i is an integer between 0 to n, and n; 1 is the number of the selector arrays) and one of the memory cell array sections 41f-i is selected as the selected memory cell array section 41f-i. At this time, the selected memory cell array section 41e-i, the read current load circuit 13 and the sense amplifier 15 are connected by the first main bit line 62 and the second main bit line 63.

(2) Step S342

The X-selector 8 selects one from the plurality of word lines 3 as the selected word line 3s based on the row address. Thus, the first MOS transistor 6 is turned on.

(3) Step S343

The Y-selector 11d select one from the plurality of first bit lines 4 as the first selected bit line 4s based on the column address. The Y-selector 11d sets the selected bit line 4s to the voltage of Vh+ (for example, the voltage Vh+=1.75 V). The voltage of Vh+ is applied to the read current load circuit 13 through the first main bit line 62. The reference Y-selector 11r sets the reference bit line 4r to the voltage of Vh+ (for example, the voltage Vh+=1.75 V) based on the column address and the signal RA. The voltage of Vh+ is applied to the read current load circuit 13 through the second main bit line 63. Thus, the voltage of Vhalf from the voltage source 24a and the voltage of Vh+ from the Y-selector 11d are applied to the selected memory cell 20fs. This voltage difference ((Vh+)−(Vhalf)=0.5 V) is set to be smaller than the threshold voltage Vth (0.7V) of the first diode 31 or the second diode 32. Therefore, the read electric current Is which reflects the data of the selected memory cell 20fs flows through the route of the voltage source 24a—the magnetic resistance element 7 of the selected memory cell 20fs—the first selected bit line 4s—the Y-selectors 11d—the memory cell array selector 17a—the sense amplifier 15. In the same way, the reference read electric current Ir which reflects the data "0" of the reference memory cell 30r flows through the route of the voltage source 24a—(the magnetic resistance element 7 of) the reference memory cell 20r—the reference bit line 4r—the reference Y-selector 11r—the memory cell array selector 17a—the sense amplifier 15.

(4) Step S344

The sense amplifier 15 determines based on the difference between the read electric current Is and the reference read electric current Ir that the read data is "0" if the difference is in a predetermined range and is "1" if the read electric current Is and the reference read electric current Ir are different (the difference is larger), outputs the result.

Through the above data read operation, the data of the desired selected memory cell 20fs in the desired selected memory cell array section 41f-i can be read.

Next, the data write operation of the data into the memory cell 2 is carried out as follows. In this case, the first bit line 4 and the second bit line 5 are set to the middle voltage Vhalf (for example, the power supply voltage=2.5 V, Vhalf=1.25 V) through a precharging operation.

(1) Step S351

In the memory cell array selector 17a, the selector transistors 17a-1, 17a-2 and 17a-3 are turned on based on the memory cell array selection signal MWSi and one of the memory cell array sections 41f-i is selected as the selected memory cell array section 41f-i. At this time, the selected memory cell array section 41f-i is connected with the Y-side power supply circuit 12v, the read current load circuit 13, and the sense amplifier 15 by the first main bit line 62 to third main bit line 64.

(2) Step S352

The X-selector 8 selects one from the plurality of word lines 3 as the selected word line 3s based on the row address. The first MOS transistor 6 of each memory cell 20f is turned on.

(3) Step S353

The Y-selector 11d selects one from the plurality of first bit lines 4 as the first selected bit line 4s based on the column address. The Y-selector 11d sets the first selected bit line 4s to the voltage of Vh+ or Vh− in accordance with write data (D). For example, the voltage Vh+ is 1.75 V and the voltage Vh− is 0.75 V. The voltage of Vh+ or Vh− is applied to the Y-side power supply circuit 12v through the first main bit line 62. Also, the Y-side current terminating circuit 14 selects the second selected bit line 5s from the plurality of second bit lines 5 based on the column address. The first selected bit line 4s and the second selected bit line 5s are selected to form a pair. The Y-side current terminating circuit 14 sets the second selected bit line 5s to the voltage of Vh− or Vh+ which is opposite to the voltage of the first selected bit line 4s. The voltage of Vh− or Vh+ is applied to the Y-side power supply circuit 12v through the third main bit line 64. Thus, the voltage of Vh+ or Vh− from the Y-selector 11d and the voltage of Vh− or Vh+ from the Y-side current terminating circuit 14 are applied to the selected memory cell 20fs. This voltage difference ((Vh+ or Vh−)−(Vh− or Vh+)=±1.0 V) is set larger than any threshold voltage Vth of the first diode 31 and the second diode 32. The write electric current Iw(0) (in the direction that the electric current flows into the Y-selector 11 in case of "0") or the write electric current Iw(1) (in the direction that the electric current flows into the Y-side current terminating circuit 14 in case of "1"), which has a predetermined magnitude corresponding to the data signal D, flows through the route of the Y-selector 11d—the first selected bit line 4s—(the neighborhood of the magnetic resistance element 7 of) the selected memory cell 20fs—the second selected bit line 5s—the Y-side current terminating circuit 14.

(4) Step S354

In the selected memory cell 20fs, the write electric current Iw(0) (+X-axis direction) or the write electric current Iw(1) (−X-axis direction) flows through the extension wiring line 29 which is contact with the magnetic resistance element 7, and the magnetic field is generated to the Y-axis direction or the +Y-axis direction. The magnetic field inverts a direction of the spontaneous magnetization in the free layer 21 of the magnetic resistance element 7 and the spontaneous magnetization corresponding to the data signal D is stored.

Through the above data write operation, the data can be written in the desired selected memory cell 20fs in the desired selected memory cell array section 41f-i.

It should be noted that in case of the data write operation into the reference memory cell 20r, based on reference active signal SR, the first reference bit line 4r is selected by the Y-selector 11d and the second reference bit line 5r is selected by the Y-side current terminating circuit 14.

In this embodiment, the same effect as in the twenty-seventh embodiment can be achieved. Also, the magnetic random access memory can be made small in size because the memory cell array is formed to have the address hierarchy structure and a part of the magnetic random access memory circuit is shared by the memory cell arrays.

Twenty-ninth Embodiment

The magnetic random access memory containing the magnetic memory cells according to the twenty-ninth embodiment of the present invention will be described.

Figure 64:
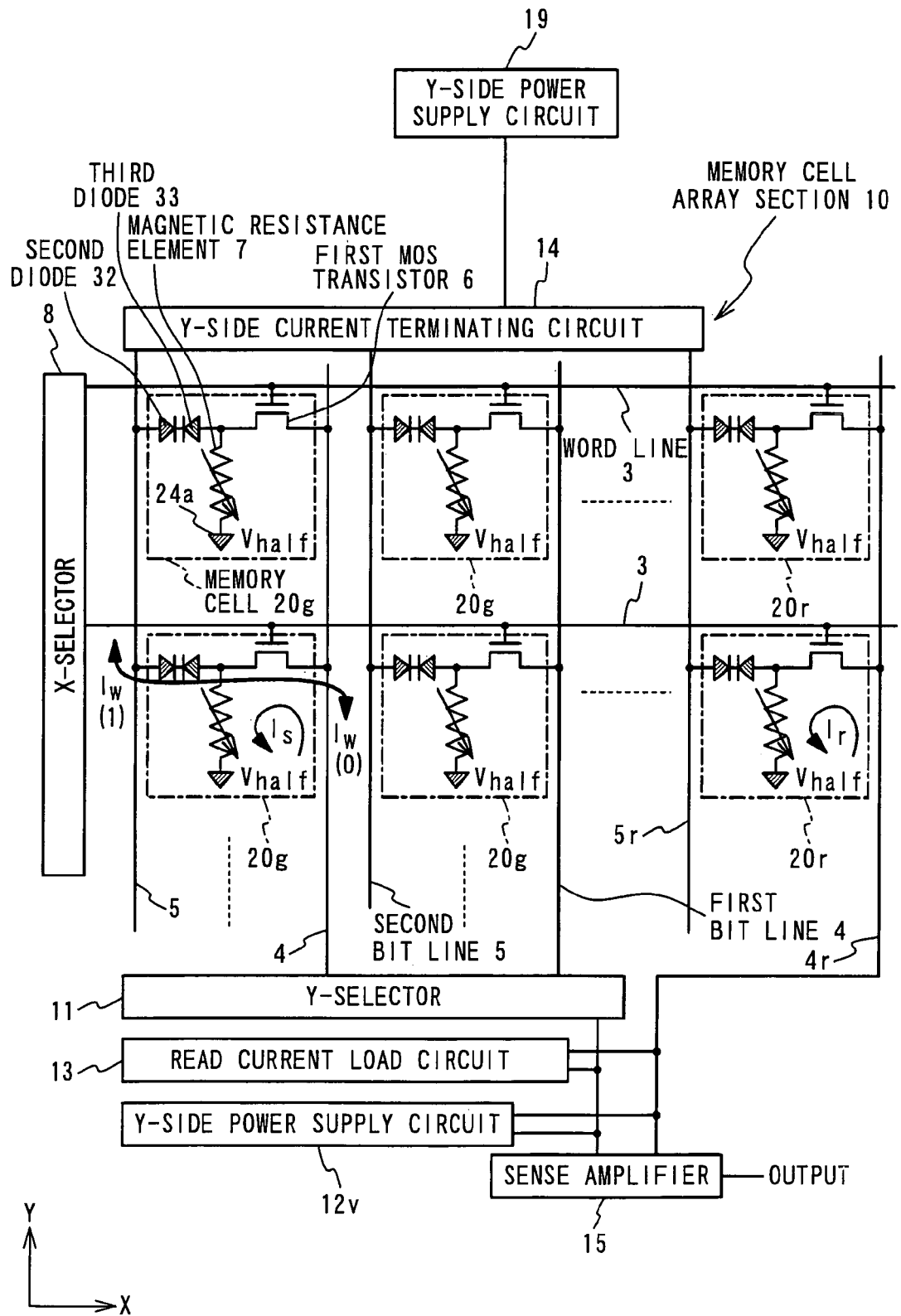
FIG. 64 is a diagram showing the structure of the magnetic random access memory containing the magnetic memory cells according to a twenty-ninth embodiment of the present invention.

FIG. 64 is a diagram showing the structure of the magnetic random access memory containing the magnetic memory cells according to the twenty-ninth embodiment the present invention. The magnetic random access memory in this embodiment is composed of the memory cell array section 10, the Y-side power supply circuit 12v, the read current load circuit 13, and the sense amplifier 15. The memory cell array section 10 is composed of a plurality of memory cell 20g, the plurality of word lines 3, the plurality of first bit lines 4, the plurality of second bit lines 5, the X-selector 8, the Y-selector 11, the Y-side current terminating circuit 14, and the Y-side power supply circuit 19.

In the memory cell array section 10, the memory cells 20g are arranged in a matrix. The memory cell 20g contain the first MOS transistor 6, the magnetic resistance element 7, the first diode 31 and the second diode 32. It should be noted that the memory cell 20g for reference is referred to as the reference memory cell 20r. In the reference memory cell 20r, "0" is written, and the data write operation is not generally carried out.

The memory cell 20g in this embodiment differ from the memory cell 20f of the twenty-seventh embodiment in the point that the cathodes of the first diode 31 and the second diode 32 are connected with each other. That is, anode of the first diode 31 is connected with the second bit line 5. The cathode of the second diode 32 is connected with the cathode of the diode 31 and the anode of the diode 32 is connected with the magnetic resistance element 7 and a drain of the first MOS transistor 6.

Figure 65:
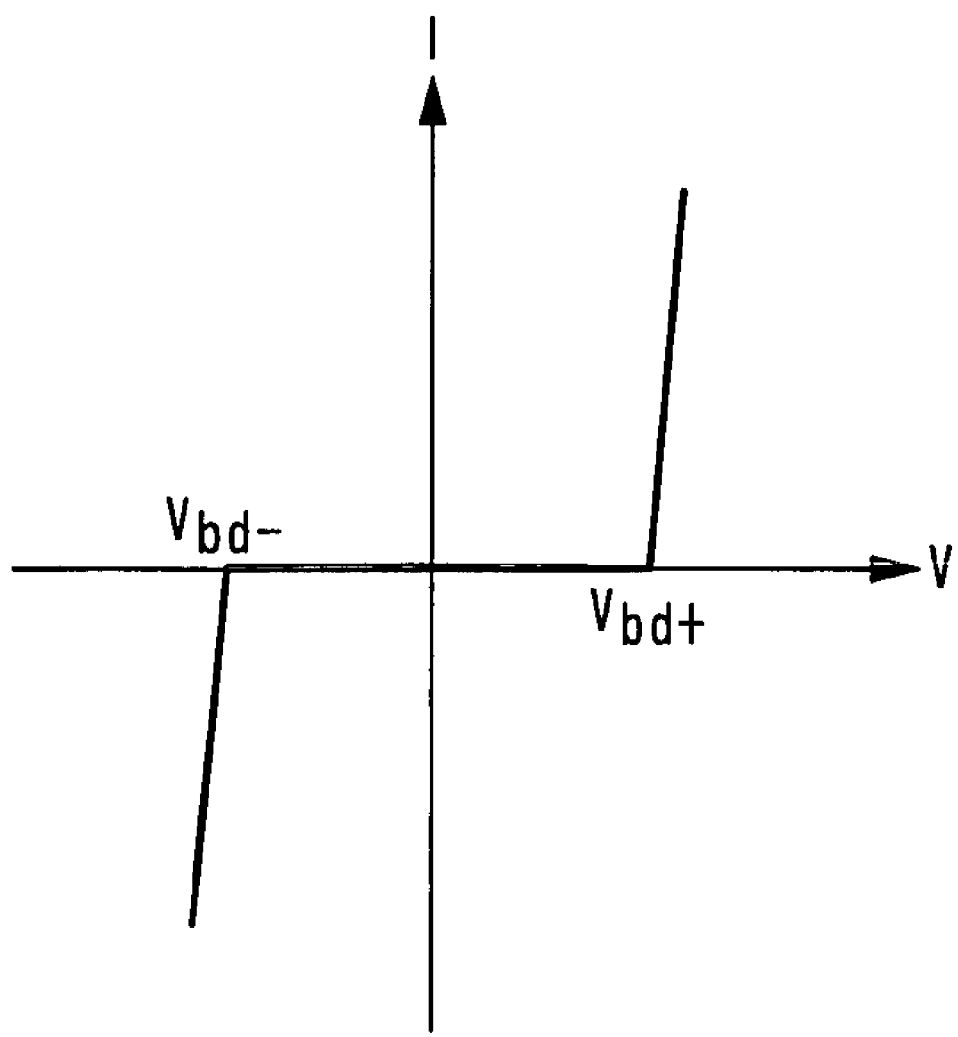
FIG. 65 is a graph showing the characteristic of a diode.

The characteristic of an element set in which the first diode 31 and the second diode 32 are connected (hereinafter, to be referred to as "a series diode element",) will be described. FIG. 65 is a graph showing the characteristic of the series diode element. The vertical axis is the electric current which flows through the diode, and the horizontal axis is the voltage which is applied to the diode. The voltage Vbd+ or Vbd− indicates the break-down voltage in each of the second diodes 32 and the third diodes 33. The series diode element does not pass an electric current ideally. However, when the element is designed in such a manner that the diode is easy to break down, the breakdown voltage (Vbd+ or Vbd−) can be exceeded in the relatively low reverse voltage. Above the breakdown voltage, the electric current can be flow through the PN junction. Thus, the series diode element can be assumed as a switching element which is turned off if the applied voltage Vin is Vbd−<Vin<Vbd+ and is turned on otherwise. FIG. 47A show the characteristic of one diode. The absolute value of the threshold voltage Vth (for example, 0.7 V) is smaller than the absolute value of the breakdown voltage Vbd.

The other structure is the same as the twenty-seventh embodiment. Therefore, the description is omitted.

Figure 66:
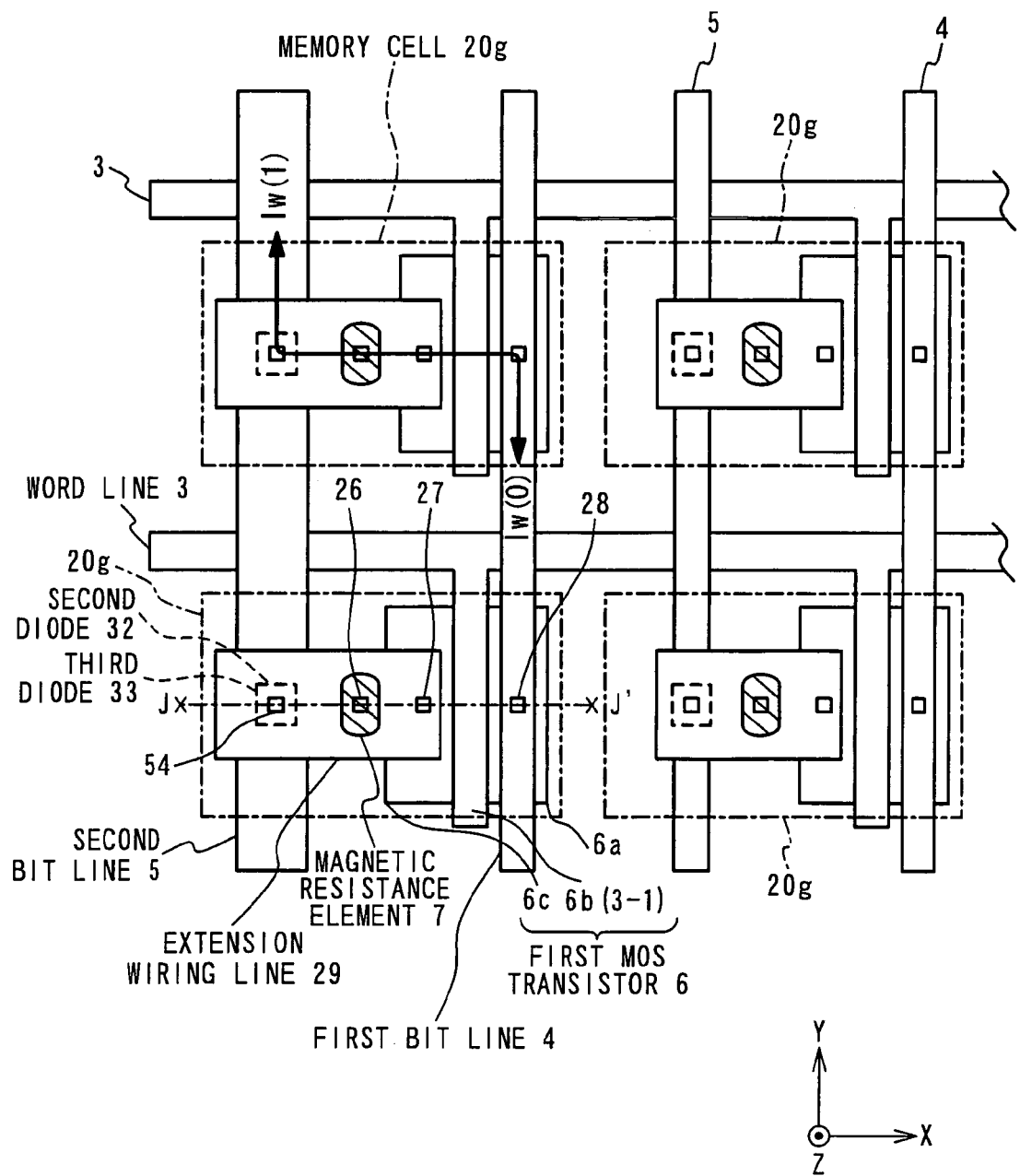
FIG. 66 is a plan view of the magnetic random access memory shown in FIG. 64

FIG. 66 is a plan view of the memory cell array of the magnetic random access memory shown in FIG. 64. In FIG. 66, the memory cells 20g of 2×2 in the memory cell array section 10 are shown as representative cells. The memory cell 20g in this embodiment differ from the memory cell 20f in the twenty-seventh embodiment in the point that the first diode 31 and second diode 32 are provided to be stacked on the way of the contact wiring line 54. The other structure is same as that of the twenty-seventh embodiment. Therefore, the description is omitted.

Figure 67:
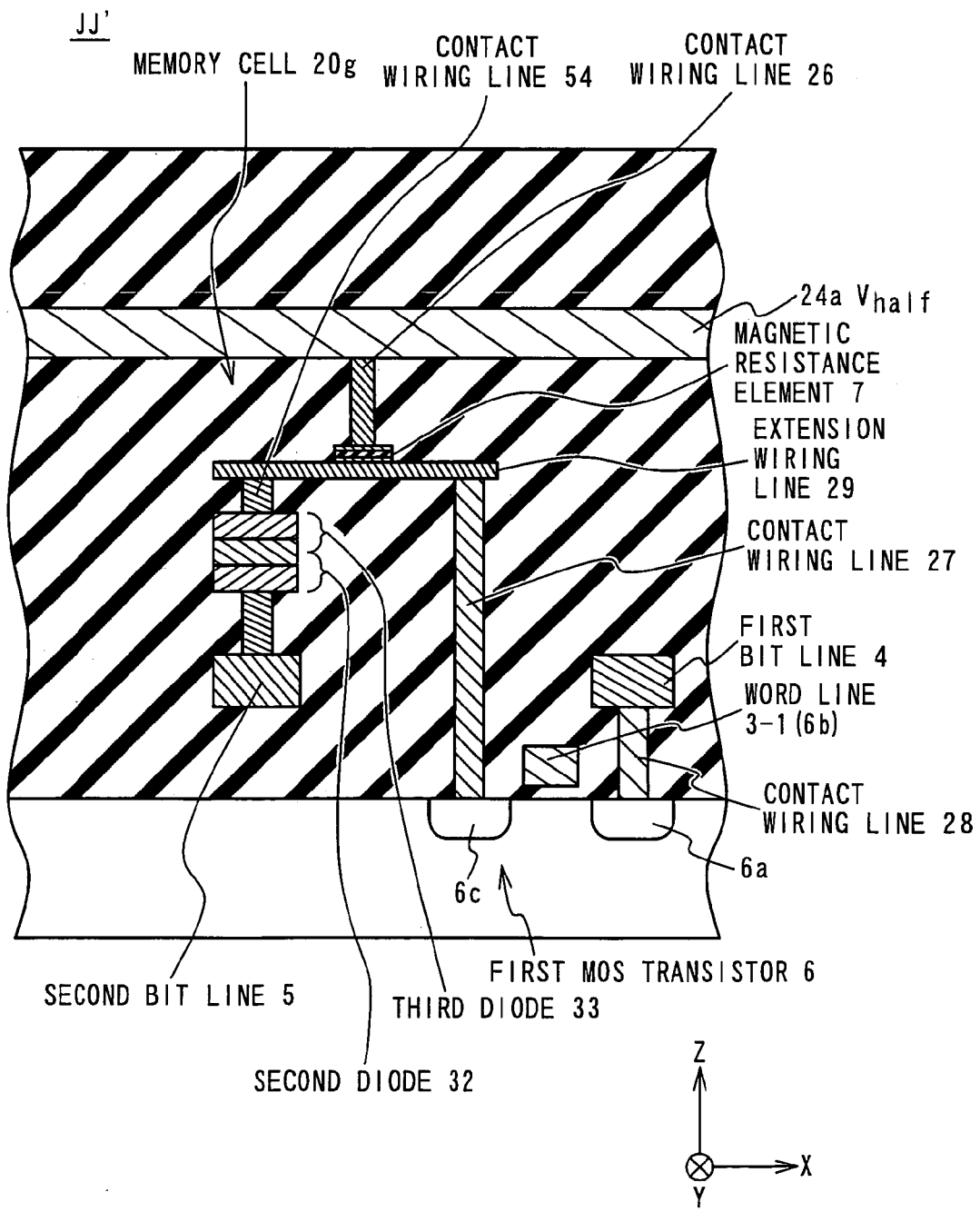
FIG. 67 is a cross sectional view of the memory cell along the JJ' line shown in FIG. 66.

FIG. 67 is a cross section view showing the structure of the memory cell 20g along the JJ' line shown in FIG. 62. The memory cell 20g in this embodiment differ from the memory cell 20f of the twenty-seventh embodiment in the point that the first diode 31 and the second diode 32 are provided to be stacked on the way of the contact wiring line 54. The other structure is same as the twenty-seventh embodiment. Therefore, the description is omitted.

Next, the operation of the magnetic random access memory containing the magnetic memory cells according to the twenty-ninth embodiment of the present invention is the same as the operation of the twenty-seventh embodiment (the steps S321 to S323, and the steps S331 to S333). Therefore, the description is omitted. In case of the data read operation, the voltage difference ((Vh+)−(Vhalf)=0.5 V) which is applied to the selected memory cell 20gs is set smaller than the breakdown voltage (Vbd+ and Vbd−) of the series diode element. Thus, the electric current does not flow through each diode. In case of the data write operation, the voltage difference ((Vh+ or Vh−)−(Vh− or Vh+)=±1.0 V) which is applied to the selected memory cell 20gs is set larger than the break-down voltage (Vbd+ and Vbd−) of the series diode element. Thus, the write electric current Iw(0) or the write electric current Iw(1), which has a predetermined magnitude corresponding to the data signal D, flows in the neighborhood of the magnetic resistance element 7 of the selected memory cell 20fs.

In this embodiment, the same effect as in the twenty-seventh embodiment can be achieved. Also, because two diodes of the memory cell stacked, the chip size can be made smaller.

Thirtieth Embodiment

The magnetic random access memory containing the magnetic memory cells according to the thirtieth embodiment of the present invention will be described.

Figure 68:
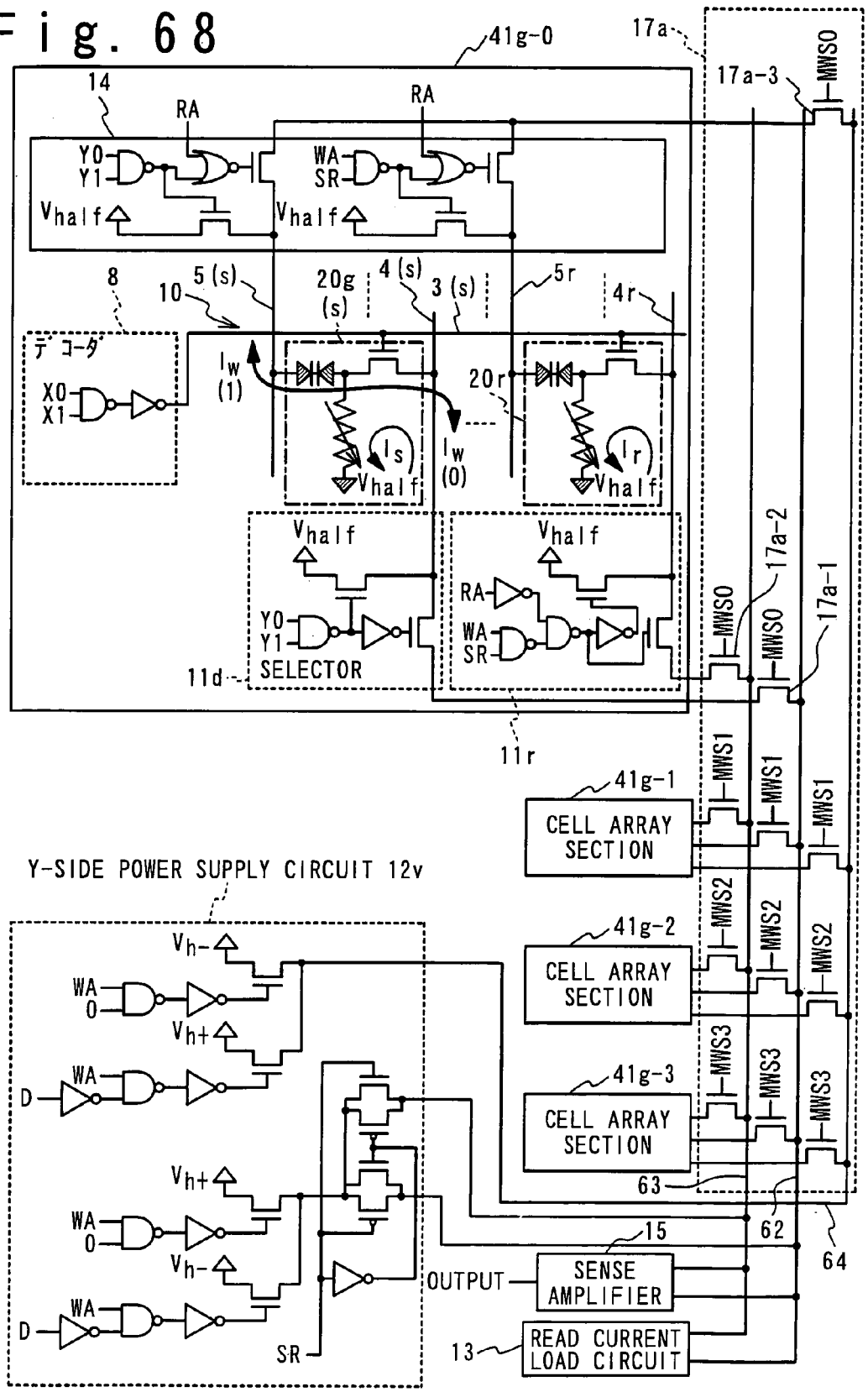
FIG. 68 is a diagram showing the structure of the magnetic random access memory containing the magnetic memory cells according to a thirtieth embodiment of the present invention.

FIG. 68 is a diagram showing the structure of the magnetic random access memory containing the magnetic memory cells according to the thirtieth embodiment of the present invention. FIG. 68 shows the structure in which the circuit examples of the magnetic random access memory shown in FIG. 64 are arranged to form an address hierarchy structure. The magnetic random access memory in this embodiment is composed of the memory cell array sections 41g-0 to 41g-3, the memory cell array selector 17a, the Y-side current source circuit 12v, the read current load circuit 13 and the sense amplifier 15.

Each of the components is the same as that of the twenty-eighth embodiments. Therefore, the description is omitted. The memory cell 20g in this embodiment differ from the memory cell 20f of the twenty-eighth embodiment in the point that the first diode 31 and the second diode 32 are stacked to mate the cathodes to each other. That is, the cathode of the first diode 31 is connected with the cathode of the second diode 32. The anode of the first diode 31 is connected with the second bit line 5.

Next, the operation of the magnetic random access memory containing the magnetic memory cells according to the thirtieth embodiment of the present invention is the same as the operation of the twenty-eighth embodiment (steps S341 to S344, steps S351 to S354). Therefore, the description is omitted.

In case of the data read operation, the voltage difference ((Vh+)−(Vhalf)=0.5 V) which is applied to the selected memory cell 20gs is set smaller than the break-down voltage (Vbd+ and Vbd−) of the series diode element. Thus, the electric current does not flow through each diode. In case of the data write operation, the voltage difference ((Vh+ or Vh−)−(Vh− or Vh+)=±1.0 V) which is applied to the selected memory cell 20gs is set larger than the break-down voltage (Vbd+ and Vbd−) of the series diode element. Thus, the write electric current Iw(0) or the write electric current Iw(1) which has a predetermined magnitude corresponding to the data signal D flows in the neighborhood of the magnetic resistance element 7 of the selected memory cell 20fs.

In this embodiment, the same effect as in the twenty-eighth embodiment can be achieved. Also, because two diodes of the memory cell are stacked, the chip size can be made smaller.

Thirty-first Embodiment

The magnetic random access memory containing the magnetic memory cells according to the thirty-first embodiment of the present invention will be described.

Figure 69:
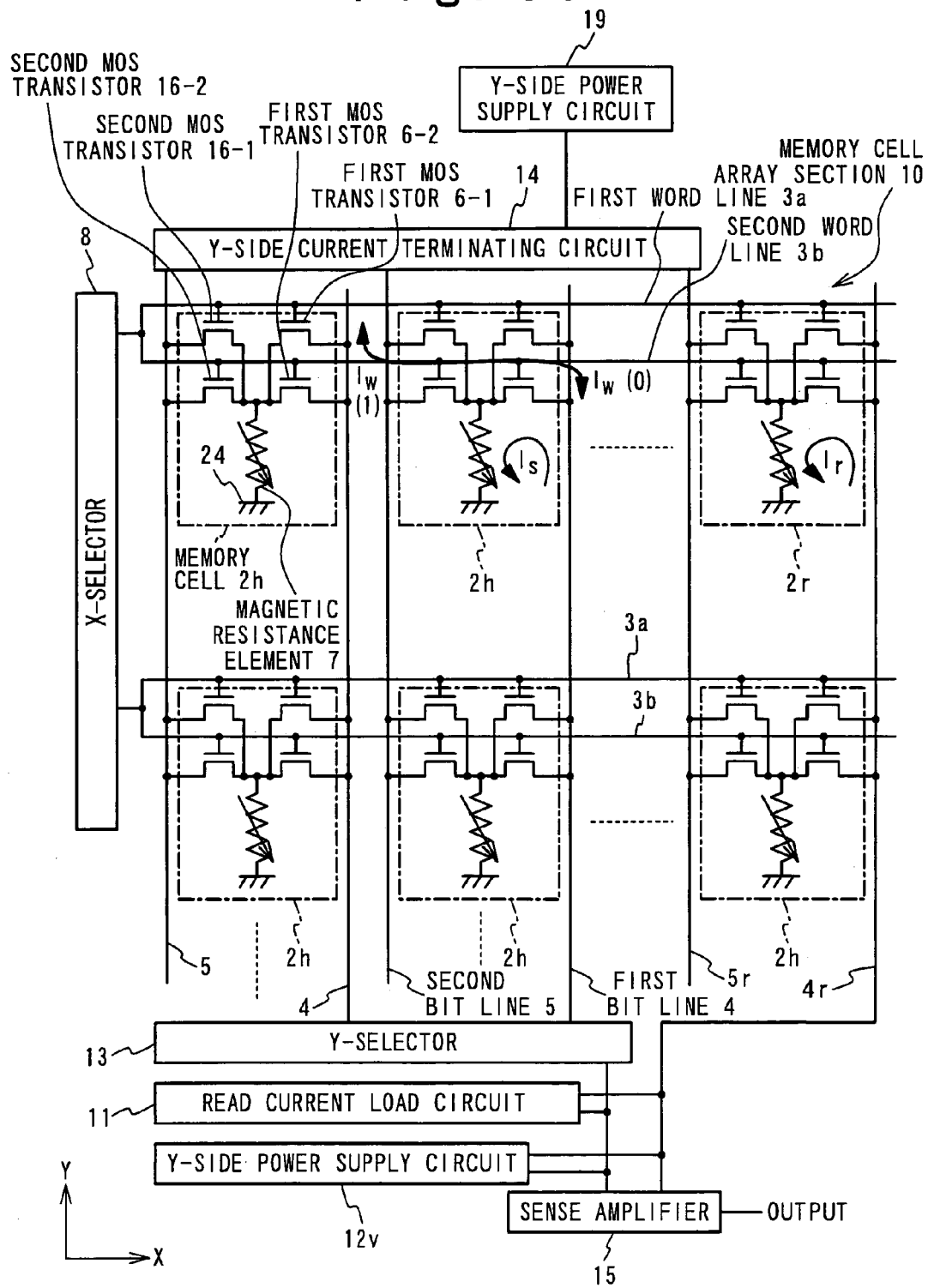
FIG. 69 is a diagram showing the structure of the magnetic random access memory containing the magnetic memory cells according to a thirty-first embodiment of the present invention.

FIG. 69 is a diagram showing the structure of the magnetic random access memory containing the magnetic memory cells according to the thirty-first embodiment of the present invention. The magnetic random access memory in this embodiment is composed of the memory cell array section 1, the Y-side current source circuit 12, the read current load circuit 13, and the sense amplifier 15. The memory cell array section 1 is composed of a plurality of memory cells 2h, the plurality of first word lines 3a, the plurality of second word lines 3b, the plurality of first bit lines 4, the plurality of second bit lines 5, the X-selector 8, the Y-selector 11, the Y-side power supply circuit 19, the Y-side current terminating circuit 14.

In the memory cell array section 1, the memory cells 2h are arranged in a matrix. The memory cell 2h contain the first MOS transistor 6-1, the second MOS transistor 16-1, the third MOS transistor 6-2, the fourth MOS transistor 16-2 and the magnetic resistance element 7. It should be noted that the memory cell 2 for reference is referred to as the reference memory cell 2r.

In the first embodiment, the magnetic resistance element 7 of the memory cell is selected by the first MOS transistor 6-1, the second MOS transistor 16-1 and the word line 3. The thirty-first embodiment is different from the first embodiment in the point that the same function is accomplished by two sets ((the first MOS transistor 6-1, the second MOS transistor 16-1 and the first bit line 3a) and (the third MOS transistor 6-2, the fourth MOS transistor 16-2 and the second bit line 3b)). In this case, the MOS transistors supplied with an electric current are twice. Therefore, it is possible to increase the electric current to flow in case of the data read operation and in the data write operation. Thus, the reliability of the memory cell array can be improved.

In the first MOS transistor 6-1, the gate is connected with the first word lines 3a, the source is connected with the first bit line 4 and the drain is connected with one end of the magnetic resistance element 7 and the drain of the second MOS transistor 16-1. In the second MOS transistor 16-1, the gate is connected with the first word lines 3a, the source is connected with the second bit line 5, and the drain is connected with one end of the magnetic resistance element 7 and the drain of the first MOS transistor 6. In the third MOS transistor 6-2, the gate is connected with the second word lines 3b, the source is connected with the first bit line 4 and the drain is connected with one end of the magnetic resistance element 7 and the drain of the first MOS transistor 6-1. In the fourth MOS transistor 16-2, the gate is connected with the second word lines 3b, the source is connected with the second bit line 5, and the drain is connected with one end of the magnetic resistance element 7 and the drain of the second MOS transistor 16-2. In the data read operation, the first MOS transistor 6-1 and the third MOS transistor 6-2 are used to connect the magnetic resistance element 7 with the first bit line 4 and to flow an electric current to the magnetic resistance element 7—the first bit line 4. In the data write operation, the first MOS transistor 6-1, the second MOS transistor 16-1, the third MOS transistor 6-2 and the fourth MOS transistor 16-2 are used to connect the first bit line 4 and the second bit line 5 and to supply an electric current to the neighborhood of the magnetic resistance element 7.

The first word lines 3a is provided to extend into the X-axis direction (the direction of the word line) perpendicular to the Y-axis direction and is connected with the X-selector 8. The second word lines 3b is provided to extend into the X-axis direction (the direction of the word line) and is connected with the X-selector 8. One word line 3 is separated into the first word line 3a and the second word line 3b by the X-selector 8. Therefore, both are always the same voltage and are selected at the same time by the X-selector 8.

The other structure is the same as in the first embodiment. Therefore, the description is omitted.

Figure 70:
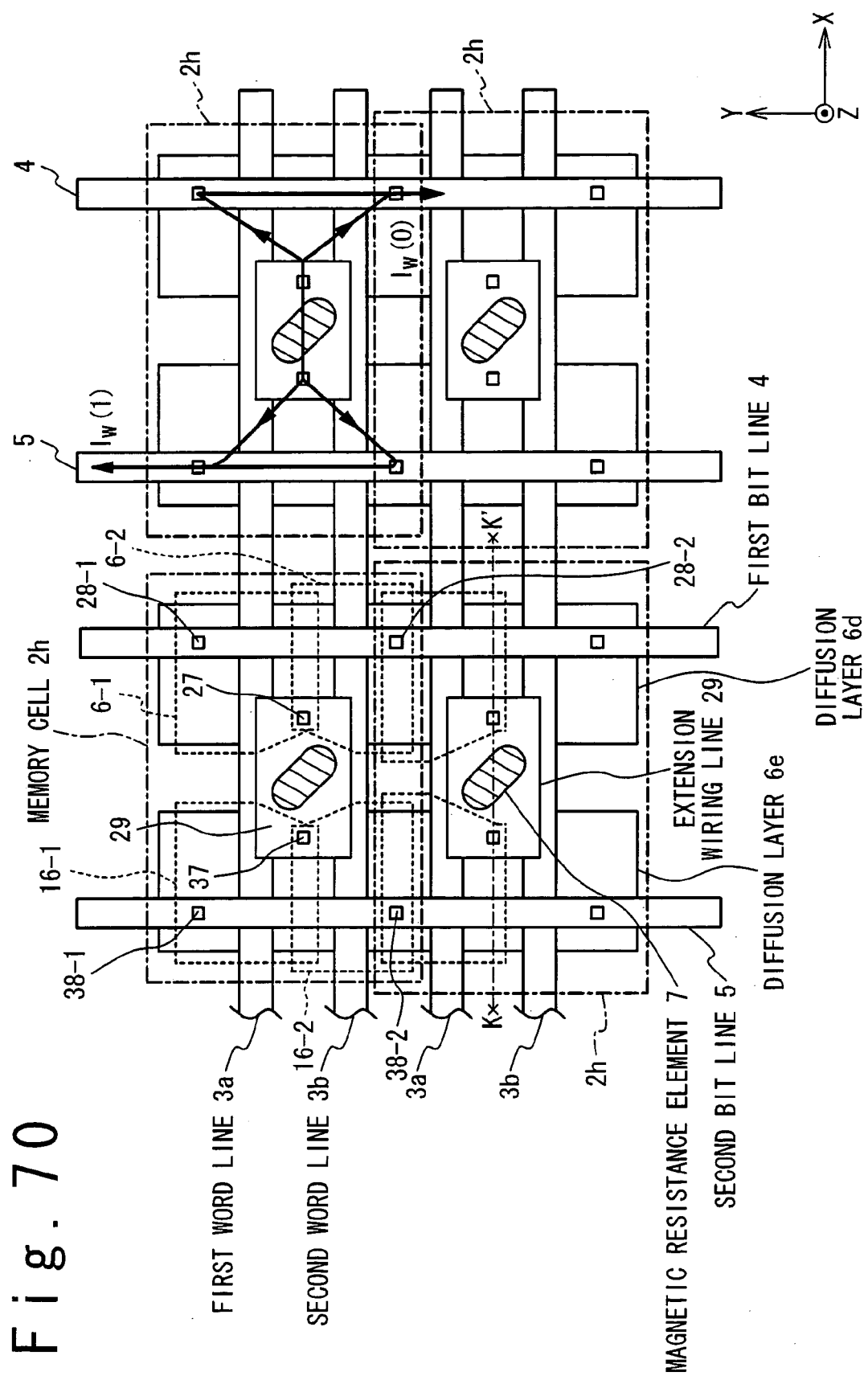
FIG. 70 is a plan view of the magnetic random access memory shown in FIG. 69.

FIG. 70 is a plan view of the memory cell array of the magnetic random access memory shown in FIG. 69. In FIG. 70, the memory cells 2 of 2×2 in the memory cell array section 1 are shown as representative cells. In the first MOS transistor 6-1 of the memory cell 2h, the source 6-1a is connected with the first bit line 4 through the contact wiring line 28-1. The gate 6-1b is a part of the first word line 3a. The drain 6-1c is connected with the contact wiring line 27. In the same way, in the third MOS transistor 6-2, the source 6-2a is connected with the first bit line 4 through the contact wiring line 28-2. The gate 6-2b is a part of the second word lines 3b. The drain 6-2c is connected with the contact wiring line 27. At this time, the drains 6-1c and 6-2c are formed as a common diffusion layer 6d. Also, the source 6-1a and the source 6-2a are formed by the different common diffusion layers 6d.

In the second MOS transistor 16-1, the source 16-1a is connected with the second bit line 5 through the contact wiring line 38-1. The gate 16-1b is a part of the first word lines 3a. The drain 16-1c is connected with the contact wiring line 37. In the same way, in the fourth MOS transistor 16-2, the source 16-2a is connected with the second bit line 5 through the contact wiring line 38-2. The gate 16-2b is a part of the second word lines 3b. The drain 16-2c is connected with the contact wiring line 37. At this time, the drains 16-1c and 16-2c are formed as a common diffusion layer 6e. Also, the source 16-1a and the source 16-2a are formed by the different common diffusion layers 6e. The contact wiring line 27 and the contact wiring line 37 are connected through the extension wiring line 29.

The magnetic resistance element 7 is provided on the extension wiring line 29. The direction of the spontaneous magnetization of the magnetic resistance element 7 is inverted by the electric current which flows through the extension wiring line 29. Because the electric current flows through the extension wiring line 29 in the X-axis direction, the magnetic field is generated and applied to the magnetic resistance element 7 into the Y-axis direction. Therefore, the magnetic resistance element 7 is provided to have the shape in which the easy axis of the magnetization is provided in the Y-axis direction. For example, the magnetic resistance element 7 has an ellipse having the long axis which is parallel in the Y-axis direction or a shape similar to the ellipse. The one end of the magnetic resistance element 7 is connected with the extension wiring line 29 and the other end is connected with the ground wiring line 24 (not shown in FIG. 70). The ground wiring line 24 on the other end side is formed unitary, as shown in FIG. 7 because it needs not to be separated for every the memory cell 2h.

In this way, a source or a drain and the contact wiring line can be shared by the neighboring MOS transistors. Therefore, a separation region between the transistors is not necessary. Thus, the memory cell can be efficiently arranged in the narrow area. That is, without extension of the area of the chip, the MOS transistors in the memory cell can be increased. Thus, the electric current which flows through the memory cell can be made large.

Figure 71:
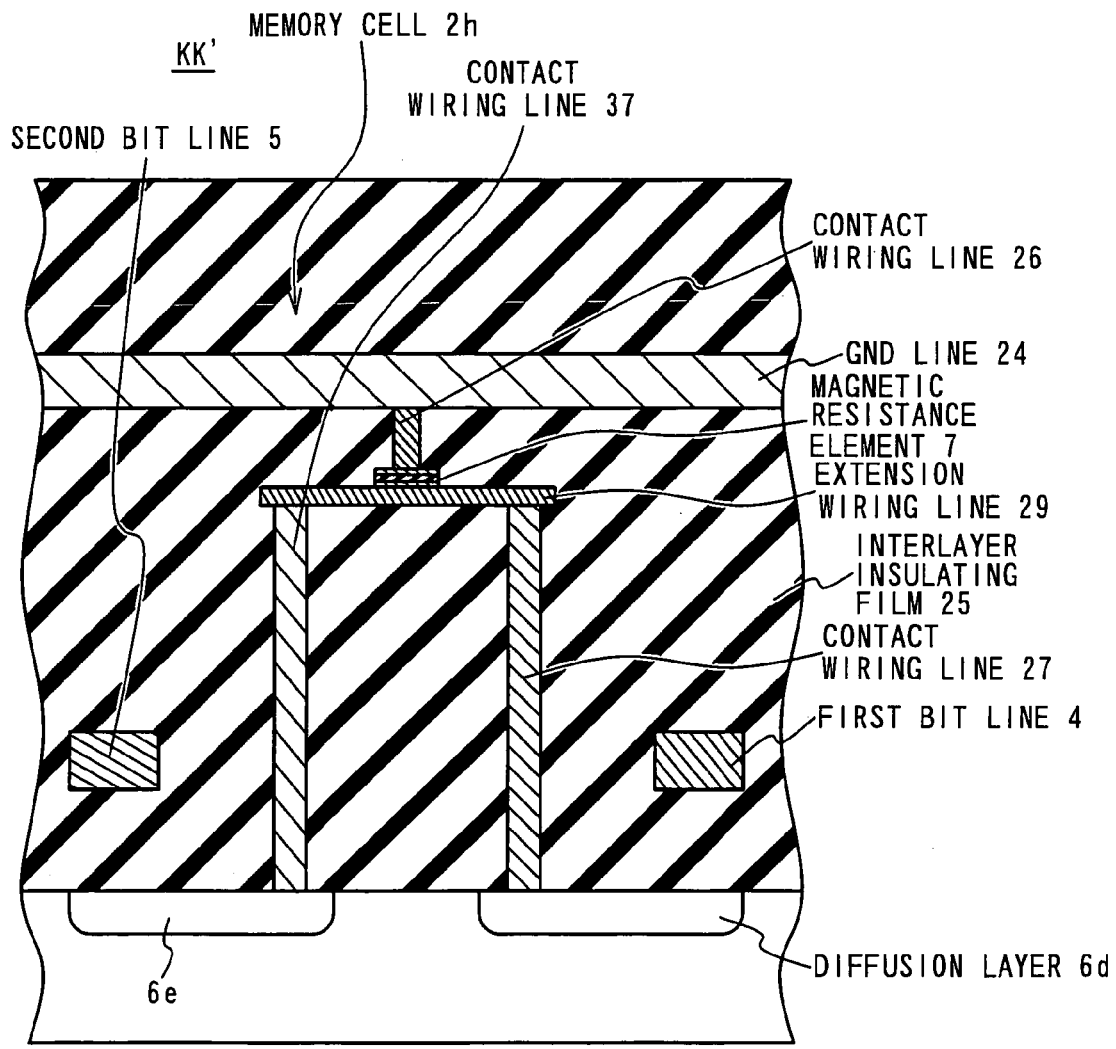
FIG. 71 is a cross sectional view of the memory cell along the KK' line shown in FIG. 70.

FIG. 71 is a cross sectional view showing the memory cell 12h along the KK' line shown in FIG. 70. This embodiment is the same as the first embodiment (FIG. 8) except that the first MOS transistor and the second MOS transistor are separated. Therefore, the description will be omitted.

Figure 72:
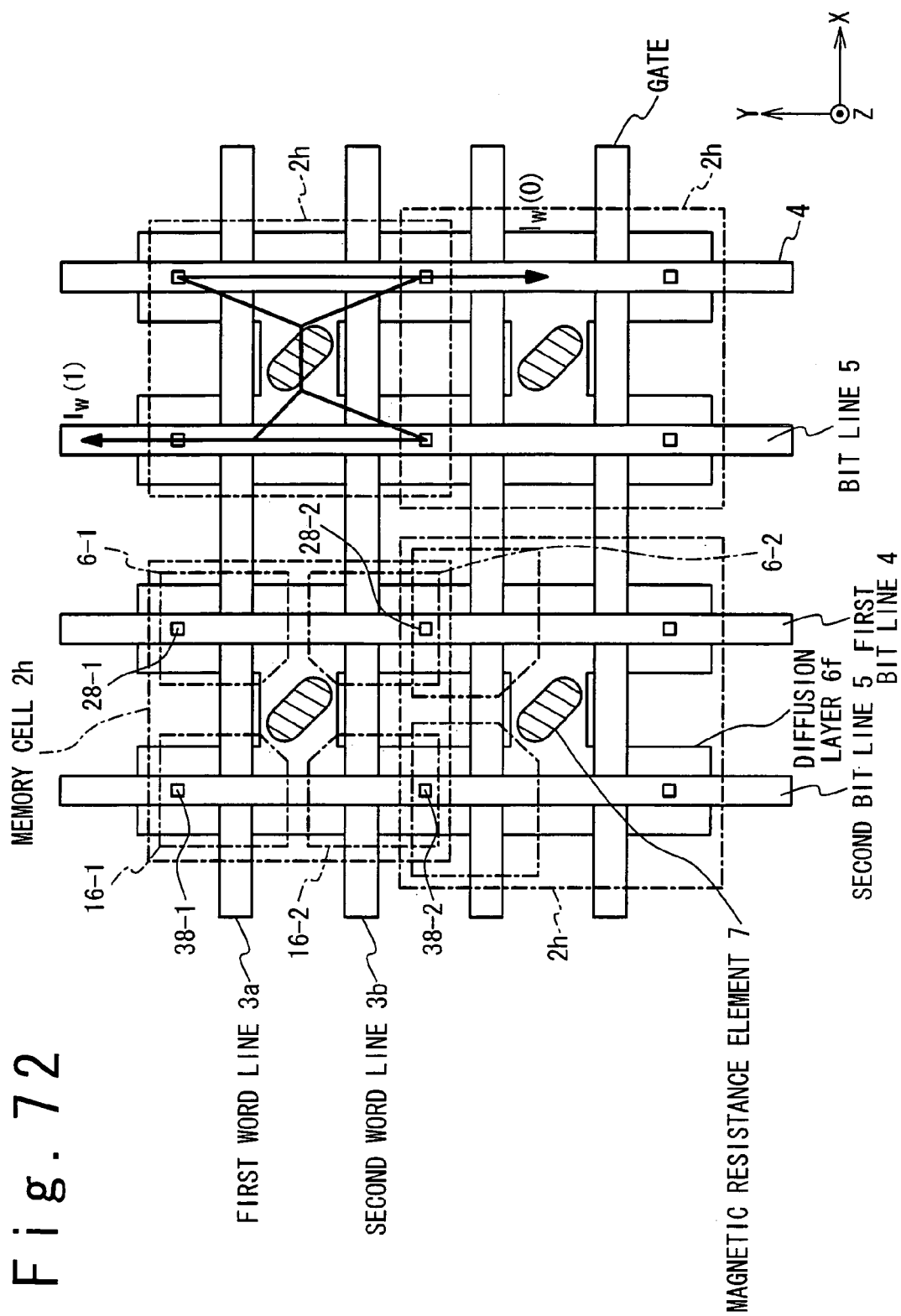
FIG. 72 is a plan view of another structure example of the magnetic random access memory shown in FIG. 69.

FIG. 72 is a plan view showing the memory cell array of the magnetic random access memory shown in FIG. 69. In FIG. 72, the memory cells 2 of 2×2 in the memory cell array section 1 are shown as representative cells. In this structure, the magnetic resistance element 7 is arranged directly on the diffusion layer. Thus, the extension wiring line 29, the contact wiring lines 27 and 37 can be omitted. The others are same as FIG. 70.

FIG. 73 is a cross sectional view showing the memory cell 2h along the LL' line shown in FIG. 72. The extension wiring line 29, the contact wiring lines 27 and 37 are omitted than FIG. 71 and the magnetic resistance element 7 is arranged directly on the diffusion layer.

In this way, the magnetic resistance element 7 is arranged under each bit line. Therefore, the area for the contact wiring line from the MOS transistor to the extension wiring line 29 is not needed. Therefore, the memory cell can be efficiently arranged in the narrow area. Also, in the direction of the height, in the memory cell, it is possible to arrange low.

Next, the operation of the magnetic random access memory containing the magnetic memory cells according to the thirty-first embodiment of the present invention is the same as in the first embodiment except that the first MOS transistor 6-1 and the second MOS transistor 16-1 in the first embodiment are changed into the first MOS transistor 6-1, the second MOS transistor 16-1, the third MOS transistor 6-2 and the fourth MOS transistor 16-2. Therefore, the description is omitted.

In the present invention, the same effect as in the first embodiment can be achieved. Also, the area for the contact wiring line from the MOS transistor to the extension wiring line 29 is not needed. Therefore, the memory cell can be efficiently arranged in the narrow area. Because the separation area between the transistors becomes not necessary, the memory cell can be efficiently arranged in the narrow area. That is, without extension of the area of the chip, the number of the MOS transistors in the memory cell can be increased. Thus, the electric current which flows through the memory cell can be taken largely.

In the magnetic random access memory of the present invention, the selectivity of the memory cell is improved in case of the data write operation. Therefore, a malfunction can be reduced remarkably. Also, the magnetic random access memory can be manufactured in a high production yield and the manufacturing cost can be reduced.

It should be noted that the above embodiments may be combined in a scope without contradiction.

The present invention is not limited to each of the above embodiments and each embodiment may be appropriately modified in the range of the spirits of the present invention.

What is claimed is:

1. A magnetic random access memory comprising a memory cell array section which comprises:
   a plurality of first word lines which extend in a first direction;
   a plurality of first bit lines which extend in a second direction different from said first direction; and
   a plurality of memory cells, which are respectively provided for positions where said plurality of first word lines and said plurality of first bit lines intersect, and each of which is connected with a corresponding one of said plurality of first word lines and a corresponding one of said plurality of first bit lines,
   a selected memory cell as one of said plurality of memory cells is selected by the corresponding one of said plurality of first word lines as a first selected word line and the corresponding one of said plurality of first bit lines as a first selected bit line,
   wherein said memory cell comprises:
   a magnetic field generating section having an extension wiring line, and connected with said first selected bit line;
   a conductive pattern; and
   a magnetic resistance element having a spontaneous magnetization, storing a data and connected between said extension wiring line and said conductive pattern,
   wherein in a data write operation into said selected memory cell, a write data is written in said magnetic resistance element of said selected memory cell by a write electric current which flows through said extension wiring line of said magnetic field generating section of said selected memory cell, and a value of said write data is determined based on a direction of said write electric current, and
   in a data read operation from said selected memory cell, a read electric current flows through said extension wiring line of said magnetic field generating section and said magnetic resistance element in said selected memory cell.

2. The magnetic random access memory according to claim 1, wherein said magnetic resistance element is formed between said extension wiring line and said conductive pattern directly or indirectly on a semiconductor substrate.

3. The magnetic random access memory according to claim 2, wherein said conductive pattern is set to a first predetermined potential.

4. The magnetic random access memory according to claim 3, wherein said conductive pattern is connected with a ground potential.

5. The magnetic random access memory according to claim 4, wherein said conductive pattern is formed to cover said plurality of memory cells.

6. The magnetic random access memory according to claim 2, wherein said conductive pattern is connected with a second predetermined potential in the data read operation and a third predetermined potential in the data write operation.

7. The magnetic random access memory according to claim 6, wherein said conductive pattern is precharged to a fourth predetermined potential in a state except for the data read operation and the data write operation.

8. The magnetic random access memory according to claim 2, wherein said selected memory cell further comprises:

a laminate ferrimagnetic structure provided on a side opposite to said magnetic resistance element with respect to said extension wiring line to generate a magnetic field to be applied to said magnetic resistance element by a magnetic field generated by said write electric current flowing through said extension wiring line.

9. The magnetic random access memory according to claim 8, wherein said laminate ferrimagnetic structure comprises:
   two ferromagnetic layers which have magnetization directions opposite to each other and are anti-ferromagnetically coupled to each other; and
   a non-magnetic layer provided between said two ferromagnetic layers.

10. The magnetic random access memory according to claim 9, wherein each of said two ferromagnetic layers is formed of NiFe, and said non-magnetic layer is formed of Ru.

11. The magnetic random access memory according to claim 8, wherein a direction of the magnetic field generated by said laminate ferrimagnetic structure is same as a direction of the magnetic field generated by said write electric current.

12. The magnetic random access memory according to claim 8, wherein a direction of the magnetic field generated by said laminate ferrimagnetic structure is tilted from a direction of the magnetic field generated by said write electric current.

13. The magnetic random access memory according to claim 2, wherein said extension wiring line is formed as a diffusion layer in a semiconductor substrate.

14. The magnetic random access memory according to claim 2, wherein said extension wiring line is provided to extend in said first direction, and
   said magnetic resistance element is provided to have a magnetization inversion easy axis in said second direction.

15. The magnetic random access memory according to claim 2, wherein said extension wiring line is provided to extend in said first direction, and
   said magnetic resistance element is provided to have a magnetization inversion easy axis in a direction tilted by a predetermined angle from said first direction.

16. The magnetic random access memory according to claim 15, wherein the predetermined angle is in a range of 30° to 60°.

17. The magnetic random access memory according to claim 2, wherein said extension wiring line is provided to extend in a direction tilted by a predetermined angle from said first direction, and said write electric current flows through said extension wiring line in the tilted direction,
   said second direction is substantially perpendicular to said first direction, and
   said magnetic resistance element is provided to have a magnetization inversion easy axis in said second direction.

18. The magnetic random access memory according to claim 2, wherein said memory cell array further comprises:
   a plurality of second bit lines as said conductive patterns, each of which is provided to form a pair together with a corresponding one of said plurality of first bit lines;
   one of said plurality of second bit lines connected with said selected memory cell is a second selected bit line;
   said selected memory cell comprises:
   said magnetic field generating section which comprises:
   a first MOS transistor connected between said first selected bit line and said extension wiring line and having a gate connected with said first selected word line,
   said extension wiring line, and
   a second MOS transistor connected between said extension wiring line and said second selected bit line and a gate connected with said first selected word line; and
   said magnetic resistance element connected between said extension wiring line and said conductive pattern.

19. The magnetic random access memory according to claim 18, wherein said selected memory cell comprises:
   a drain and a source of each of said first MOS transistor and said second MOS transistor formed in a surface portion of a semiconductor substrate; and
   a gate of each of said first MOS transistor and said second MOS transistor as a part of the corresponding first word line,
   said first selected bit line and said second selected bit line are provided on an outer side of said gates of said first MOS transistor and said second MOS transistor from said magnetic resistance element.

20. The magnetic random access memory according to claim 18, wherein said selected memory cell comprises:
   a drain and a source of each of said first MOS transistor and said second MOS transistor formed in a surface portion of a semiconductor substrate; and
   a gate of each of said first MOS transistor and said second MOS transistor as a part of said first selected word line, and
   said gates of said first MOS transistor and said second MOS transistor are provided on an outer side of said first selected bit line and said second selected bit line from said magnetic resistance element.

21. The magnetic random access memory according to claim 18, wherein an even-numbered row of said memory cells is shifted in said first direction by a half of a pitch between said memory cells in an odd-numbered row,
   two diffusion layers are formed in a surface portion of a semiconductor substrate,
   one of said two diffusion layers is shared by said first MOS transistors of adjacent two of said memory cells connected with said first selected bit line, and
   the other of said two diffusion layers is shared by said second MOS transistors of adjacent two of said memory cells connected with said second selected bit line.

22. The magnetic random access memory according to claim 18, wherein said selected memory cell comprises:
   two diffusion layers as first and second terminals of each of said first and second MOS transistors formed in a surface portion of a semiconductor substrate;
   said first word line formed as the gates of said first and second MOS transistors in an insulating film;
   the corresponding first and second bit lines formed in said insulating film to be connected with the first terminals of said first and second MOS transistors via contacts with a first height, respectively;
   said extension wiring line formed in said insulating film to be connected at both ends with said second terminals of said first and second MOS transistors via contacts with a second height which is higher than said first height;
   said magnetic resistance element formed on said extension wiring line in a center portion; and said conductive pattern formed on said magnetic resistance element via a contact.

23. The magnetic random access memory according to claim 18, wherein said selected memory cell comprises:
   two diffusion layers formed for said first and second MOS transistors in a surface portion of a semiconductor substrate, respectively;
   portions of said first word line formed as the gates of said first and second MOS transistors in an insulating film to extend over said two diffusion layers, respectively, such that first and second terminals of each of said first and second MOS transistors are formed in each of said two diffusion layers;
   said first and second selected bit lines formed in said insulating film to be connected with said first terminals of said first and second MOS transistors via contacts with a first height, respectively;
   said extension wiring line formed in said insulating film to be connected at both ends with said second terminals of said first and second MOS transistors via contacts with a second height which is higher than said first height;
   said magnetic resistance element formed on said extension wiring line in a center portion; and
   said conductive pattern formed on said magnetic resistance element via a contact.

24. The magnetic random access memory according to claim 18, wherein said selected memory cell comprises:
   a diffusion layer having first to third portion formed in a surface portion of a semiconductor substrate, wherein said first portion is provided for said first MOS transistor, said second portion is provided as said extension wiring line, and said third portion is provided for said second MOS transistor;
   portions of said first word line formed as the gates of said first and second MOS transistors in an insulating film to extend over said first and third portions, respectively, such that first and second terminals of each of said first and second MOS transistors are formed in each of said first and third portions;
   said first and second selected bit lines formed in said insulating film to be connected with said first terminals of said first and second MOS transistors via contacts with a first height, respectively;
   said magnetic resistance element formed on said extension wiring line in a center portion; and
   said conductive pattern formed on said magnetic resistance element via a contact.

25. The magnetic random access memory according to claim 18, wherein said selected memory cell comprises:
   two diffusion layers as first and second terminals of each of said first and second MOS transistors formed in a surface portion of a semiconductor substrate;
   said first word line formed as the gates of said first and second MOS transistors in an insulating film;
   said first and second selected bit lines formed in said insulating film to be connected with the first terminals of said first and second MOS transistors via contacts with a first height, respectively;
   said conductive pattern formed in said insulating film at a location which is higher than said first height;
   said magnetic resistance element formed on said conductive pattern in a center portion; and
   said extension wiring line formed on said magnetic resistance element via a contact in said insulating film to be connected at both ends with said second terminals of said first and second MOS transistors via contacts.

26. The magnetic random access memory according to claim 2, wherein said memory access array further comprises:
   a plurality of second bit lines as said conductive patterns, each of which is provided to form a pair together with a corresponding one of said plurality of first bit lines,
   one of said plurality of second bit lines connected with said selected memory cell is a second selected bit line,
   said magnetic field generating section in said selected memory cell comprises:
   said extension wiring line; and
   a first MOS transistor connected with said extension wiring line and having a gate connected with said first selected word line.

27. The magnetic random access memory according to claim 26, wherein said selected memory cell comprises:
   a drain and a source of said first MOS transistor formed in a surface portion of a semiconductor substrate; and
   a gate of said first MOS transistor as a part of the corresponding first word line, and
   said first selected bit line is provided on an outer side of said gate of said first MOS transistor from said magnetic resistance element.

28. The magnetic random access memory according to claim 26, wherein said selected memory cell comprises:
   a drain and a source of said first MOS transistor formed in a surface portion of a semiconductor substrate; and
   a gate of said first MOS transistor as a part of the corresponding first word line, and
   said gate of said first MOS transistor is provided on an outer side of the corresponding first bit line from said magnetic resistance element.

29. The magnetic random access memory according to claim 26, wherein an even-numbered row of said memory cells is shifted in a row direction by a half of a pitch between said memory cells in an odd-numbered row,
   a diffusion layer is formed in a surface portion of a semiconductor substrate, and
   said diffusion layer is shared by said first MOS transistors of adjacent two of said memory cells connected with said first selected bit line.

30. The magnetic random access memory according to claim 26, wherein said selected memory cell comprises:
   two diffusion layers as first and second terminals of said first MOS transistor formed in a surface portion of a semiconductor substrate;
   said first word line formed as the gate of said first MOS transistor in an insulating film;
   said first and second selected bit lines formed in said insulating film, the corresponding first bit line being connected with the first terminal of said first MOS transistor via a contact with a first height;
   said extension wiring line formed in said insulating film to be connected at one end with said second terminal of said first MOS transistor via a contact with a second height which is higher than said first height, and at the other end with said second bit line;
   said magnetic resistance element formed on said extension wiring line in a center portion; and
   said second word line formed on said magnetic resistance element via a contact.

31. The magnetic random access memory according to claim 26, wherein each of said plurality of memory cells comprises:
   a diffusion layer formed for said first MOS transistor in a surface portion of a semiconductor substrate;

a portion of said first word line formed as the gate of said first MOS transistor in an insulating film to extend over said diffusion layer, such that first and second terminals of said first MOS transistor are formed in said diffusion layer;

said first and second selected bit lines formed in said insulating film, said first selected bit line being connected with said first terminal of said first MOS transistor via a contact with a first height;

said extension wiring line formed in said insulating film to be connected at one end with said second terminal of said first MOS transistor via a contact with a second height which is higher than said first height and at the other end with said second bit line;

said magnetic resistance element formed on said extension wiring line in a center portion; and said conductive pattern formed on said magnetic resistance element via a contact.

32. The magnetic random access memory according to claim 26, wherein said selected memory cell comprises:

a diffusion layer having first and second portion formed in a surface portion of a semiconductor substrate, wherein said first portion is provided for said first MOS transistor, and said second portion is provided as said extension wiring line;

a portion of said first word line formed as the gate of said first MOS transistor in an insulating film to extend over said first portion, such that first and second terminals of said first MOS transistor are formed in said first portion;

said first and second selected bit lines formed in said insulating film, said first selected bit line being connected with said first terminal of said first MOS transistor via a contact with a first height;

said magnetic resistance element formed on said extension wiring line in a center portion; and said conductive pattern formed on said magnetic resistance element via a contact.

33. The magnetic random access memory according to claim 26, wherein said selected memory cell comprises:

two diffusion layers as first and second terminals of said first MOS transistor formed in a surface portion of a semiconductor substrate;

said first word line formed as the gate of said first MOS transistor in an insulating film;

said first and second bit selected lines formed in said insulating film, said first selected bit line being connected with the first terminal of said first MOS transistor via a contact with a first height;

said conductive pattern formed in said insulating film at a location which is higher than said first height;

said magnetic resistance element formed on said conductive pattern in a center portion; and said extension wiring line formed on said magnetic resistance element via a contact in said insulating film to be connected at both ends with said second terminal of said first MOS transistor via a contact and said second selected bit line.

34. The magnetic random access memory according to claim 2, wherein said selected memory cell comprises:

said magnetic field generating section which comprises:
a diode set of a first diode and a second diode, in which said first diode and said second diode are connected in parallel in opposite directions to each other, wherein said diode set is connected with said first selected word line and said extension wiring line, and said extension wiring line connected with said first selected bit line;

said magnetic resistance element connected with said extension wiring line; and a third diode interposed between said extension wiring line and said conductive pattern.

35. The magnetic random access memory according to claim 34, wherein said selected memory cell comprises:

said first bit line formed on a first insulating film;

said extension wiring line formed above said first bit line to be connected with said first bit line by a contact;

said magnetic resistance element formed on said extension wiring line;

said first and second diodes formed above said extension wiring line to be connected therewith via contacts;

said third diode formed above said magnetic resistance element to be connected therewith via a contact, wherein said first to third diodes are formed at a same height;

said first selected word line formed to connect said first and second diodes;

said second word line formed to be connected with said third diode, wherein said first selected word line and said second selected word line are formed at a same height; and a second insulating film formed to cover said first bit line, said extension wiring line, said magnetic resistance element, said first to third diodes and said first and second selected word lines.

36. The magnetic random access memory according to claim 34, wherein said memory cells are stacked into a height direction.

37. The magnetic random access memory according to claim 2, wherein said memory access array further comprises:

a plurality of second bit lines as said conductive patterns, each of which is provided to form a pair together with a corresponding one of said plurality of first bit lines, one of said plurality of second bit lines connected with said selected memory cell is a second selected bit line, said selected memory cell comprises:

said magnetic field generating section which comprises:
a first MOS transistor connected with said first selected bit line and said extension wiring line and having a gate connected with said first selected word line, and said extension wiring line connected with said second selected bit line;

said magnetic resistance element connected between said extension wiring line; and a diode interposed between said magnetic resistance element and said conductive pattern.

38. The magnetic random access memory according to claim 37, wherein said selected memory cell comprises:

said first MOS transistor on a semiconductor substrate;

said first bit line formed in an insulating film and connected with a source of said first MOS transistor;

said extension wiring line formed in said insulating film and connected with a drain of said first MOS transistor via a contact;

said magnetic resistance element formed on said extension wiring line;

said diode formed on said magnetic resistance element via a contact in said insulating film; and said conductive pattern formed in said insulating film and connected with said extension wiring line via a contact.

39. The magnetic random access memory according to claim 2, wherein said memory access array further comprises:
a plurality of second bit lines as said conductive patterns, each of which is provided to form a pair together with a corresponding one of said plurality of first bit lines,
wherein one of said plurality of second bit lines connected with said selected memory cell is a second selected bit line,
said selected memory cell comprises:
said magnetic field generating section which comprises:
a first MOS transistor connected with said first selected bit line and said extension wiring line and having a gate connected with the corresponding first word line,
said extension wiring line, and
a diode set of a first diode and a second diode, in which said first diode and said second diode are connected in parallel in opposite directions to each other, wherein said diode set is connected with said selected second word line and said extension wiring line; and
said magnetic resistance element between said extension wiring line and said conductive pattern.

40. The magnetic random access memory according to claim 39, wherein said selected memory cell comprises:
said first MOS transistor on a semiconductor substrate;
said first bit line formed in an insulating film and connected with a source of said first MOS transistor;
said extension wiring line formed in said insulating film and connected with a drain of said first MOS transistor via a contact;
said magnetic resistance element formed on said extension wiring line;
said conductive pattern formed in said insulating film and connected with said magnetic resistance element via a contact;
said first and second diodes formed in said insulating film to extend downwardly and connected with said extension wiring line via a contact; and
said selected second bit line formed in said insulating film and connected with said first and second diodes via a contact.

41. The magnetic random access memory according to claim 2, wherein said memory access array further comprises:
a plurality of second bit lines as said conductive patterns, each of which is provided to form a pair together with a corresponding one of said plurality of first bit lines,
wherein one of said plurality of second bit lines connected with said selected memory cell is a second selected bit line,
each of said plurality of memory cells comprises:
said magnetic field generating section which comprises:
a first MOS transistor connected with said selected first bit line and said extension wiring line and having a gate connected with the corresponding first word line,
said extension wiring line, and
a diode set of a first diode and a second diode, in which said first diode and said second diode are connected in series in opposite directions to each other, wherein said diode set is connected with said selected second bit line and said extension wiring line; and
said magnetic resistance element connected between said extension wiring line and said conductive pattern.

42. The magnetic random access memory according to claim 41, wherein said memory access array further comprises:
a plurality of second bit lines as said conductive patterns, each of which is provided to form a pair together with a corresponding one of said plurality of first bit lines,
wherein one of said plurality of second bit lines connected with said selected memory cell is a second selected bit line, and
said selected memory cell comprises:
said first MOS transistor on a semiconductor substrate;
said selected first bit line formed in an insulating film and connected with a source of said first MOS transistor;
said extension wiring line formed in said insulating film and connected with a drain of said first MOS transistor via a contact;
said magnetic resistance element formed on said extension wiring line;
a conductive pattern formed in said insulating film and connected with said magnetic resistance element via a contact;
said diode set formed in said insulating film to extend downwardly and connected with said extension wiring line via a contact; and
the corresponding second bit line formed in said insulating film and connected with said diode set via contacts.

43. The magnetic random access memory according to claim 41, wherein said selected memory cell comprises:
said magnetic field generating section which comprises:
a first MOS transistor connected with said selected first bit line and said extension wiring line and having a gate connected with the corresponding first word line, and
said extension wiring line,
said magnetic resistance element connected between said extension wiring line and said conductive pattern; and
a capacitor connected in parallel to said magnetic resistance element.

44. The magnetic random access memory according to claim 43, wherein said memory cell comprises:
said first MOS transistor on a semiconductor substrate;
said first bit line formed in an insulating film and connected with a source of said first MOS transistor via a contact;
said extension wiring line formed in said insulating film and connected with a drain of said first MOS transistor via a contact;
said magnetic resistance element formed on said extension wiring line;
a ground line formed in said insulating film and connected with said magnetic resistance element via a contact; and
said capacitor formed in said insulating film and connected at one electrode with said extension wiring line via a contact and connected at the other electrode with said ground line via a contact.

45. A magnetic random access memory comprising a memory cell array section which comprises:
a plurality of memory cells arranged in a matrix of rows and columns, wherein one column of said memory cells a column of reference memory cells;
a plurality of first word lines, each of which is connected with one row of said memory cells;
a plurality of first bit lines, each of which is connected with one column of said memory cells;
a plurality of second bit lines, each of which is connected with one column of said memory cells and forms a pair with a corresponding one of said plurality of first bit lines, wherein said first and second bit lines for said column of said reference memory cells are first and second reference bit lines;

a first X selector which selects one of said plurality of first word lines as a first selected word line based on an address;

a first Y selector which selects one of said plurality of second bit lines as a second selected bit line based on said address; and a second Y selector which selects one of said plurality of first bit lines as a first selected bit line based on said address, wherein each of said plurality of memory cells comprises:
an extension wiring line;
a conductive pattern;
a magnetic resistance element provided between said extension wiring line and said conductive pattern, and having a spontaneous magnetization, and storing a data as a direction of said spontaneous magnetization, wherein the direction of said spontaneous magnetization is inverted depending on a magnetic field applied to said magnetic resistance element;
a first MOS transistor provided between said extension wiring line and a corresponding one of said plurality of first bit lines and having a gate connected with a corresponding one of said plurality of first word lines; and
a second MOS transistor provided between said extension wiring line and a corresponding one of said plurality of second bit lines and having a gate connected with the corresponding one of said plurality of first word lines, wherein a magnetic field generating section comprises said first MOS transistor, said extension wiring line, and said first MOS transistor, one of said plurality of memory cells which is connected with said first selected word line, said first selected bit line and said second selected bit line is a selected memory cell, and one of said column of said reference memory cells which is connected with said first selected word line, said first reference bit line and said second reference bit line is a selected reference memory cell, in a data write operation into said selected memory cell, a write data is written in said magnetic resistance element of said selected memory cell by applying said magnetic field generated by a write electric current which flows through said extension wiring line of said magnetic field generating section of said selected memory cell, and a value of said write data is determined based on a direction of said write electric current, and in a data read operation from said selected memory cell, a read electric current flows through a route of said first MOS transistor, said extension wiring line, said magnetic resistance element and said conductive pattern in said selected memory cell, and a read data from said selected memory cell is determined based on a resistance of said magnetic resistance element of said selected memory cell.

46. The magnetic random access memory according to claim 45, wherein said conductive pattern is set to a ground potential in the data read operation and the data write operation.

47. The magnetic random access memory according to claim 45, wherein said conductive pattern is set to a first potential in the data read operation and to a second potential, different from the first potential, in the data write operation.

48. The magnetic random access memory according to claim 45, wherein said first X selector selects said first selected word line based on an address in the data read operation and the data write operation,
said second Y selector selects said first selected bit line based on said address in the data read operation and the data write operation, and
said first Y selector selects said second selected bit line based on said address in the data write operation.

49. The magnetic random access memory according to claim 45, further comprising:
a Y-side current source circuit which supplies or receives a constant electric current as said write electric current to or from said second Y selector based on said write data in the data write operation;
a read current load circuit which supplies said read electric current to said second Y selector and a reference read electric current to said first reference bit line in the data read operation; and
a sense amplifier which senses said read data based on a difference between said read electric current flowing through said first selected bit line and said reference read electric current flowing through said first reference bit line in the data read operation,
wherein said write electric current flows through a route of said second Y selector, said first selected bit line, said magnetic field generating section of said selected memory cell, said second selected bit line and said first Y selector in the data write operation,
said read electric current flows through a route of said second Y selector, said first selected bit line, and said first MOS transistor, said extension bit line, said magnetic resistance element and said conductive pattern of said selected memory cell in the data read operation, and
said reference read electric current flows through a route of said first reference bit line, and said first MOS transistor, said extension bit line, said magnetic resistance element and said conductive pattern of said selected reference memory cell in the data read operation.

50. The magnetic random access memory according to claim 49, wherein said Y-side current source circuit supplies or receives the constant electric current as a reference write electric current to or from said first reference bit line based on said write data in a reference data write operation to said selected reference memory cell, and
said reference write electric current flows through a route of said first reference bit line, said magnetic field generating section of said selected reference memory cell, said second reference bit line and said first Y selector in the reference data write operation.

51. The magnetic random access memory according to claim 50, wherein said Y-side current source circuit comprises:
a first circuit which generates a constant current source as said write electric current or said reference write electric current and receives said write electric current or said reference write electric current based on said write data in the data write operation or a reference data write operation to said selected reference memory cell; and
a second circuit which selects said second Y selector for said write electric current in the data write operation and said first reference bit line for said reference write electric current in the reference data write operation.

52. The magnetic random access memory according to claim 45, wherein said second Y selector is connected with said first reference bit line, said magnetic random access memory further comprises:
a plurality of said memory cell array sections;
first and second main bit lines;
a cell array selector which selects one of said plurality of memory cell array section as a selected memory cell array section based on said address to connect said first and second main bit lines with said second Y selector of said selected memory cell array section;
a Y-side current source circuit which supplies said write electric current onto said first main bit line and receives said write electric current from said first main bit line based on said write data in the data write operation;
a read current load circuit which supplies said read electric current and a reference read electric current to said first and second main bit lines; and
a sense amplifier which senses said read data based on a difference between said read electric current flowing through said first main bit line and said reference read electric current flowing through said second main bit line in the data read operation to said selected memory cell,
wherein said write electric current flows through a route of said first main bit line, said second Y selector, said first selected bit line, said magnetic field generating section of said selected memory cell, said second selected bit line and said first Y selector in said selected memory cell array section and said second main bit line in the data write operation,
said read electric current flows through a route of said first main bit line, said second Y selector, said first selected bit line, and said first MOS transistor, said extension bit line, said magnetic resistance element and said conductive pattern of said selected memory cell in said selected memory cell array section in the data read operation, and
said reference read electric current flows through a route of said second main bit line, said first reference bit line, and said first MOS transistor, said extension bit line, said magnetic resistance element and said conductive pattern of said selected reference memory cell in said selected memory cell array section in the data read operation.

53. The magnetic random access memory according to claim 52, wherein said Y-side current source circuit supplies or receives the constant electric current as a reference write electric current to or from said second main bit line based on said write data in a reference data write operation to said selected reference memory cell, and said reference write electric current flows through a route of said first main bit line, said second Y selector, said first reference bit line, said magnetic field generating section of said selected reference memory cell, said second reference bit line and said first Y selector in the selected memory cell array section in the reference data write operation.

54. The magnetic random access memory according to claim 53, wherein said Y-side current source circuit comprises:
a first circuit which generates a constant current source as said write electric current or said reference write electric current and receives said write electric current or said reference write electric current based on said write data; and
a second circuit which selects said first main bit line for the data write operation and said second main bit line for the reference data write operation.

55. The magnetic random access memory according to claim 45, wherein said second Y selector is connected with said plurality of second bit lines and said first and second reference bit lines, said memory cell array section further comprises:
a plurality of second word lines, each of which is connected with one row of said memory cells as said conductive pattern;
a second X selector which selects one of said plurality of second word lines as a second selected word line based on said address, and supplies an electric current to said second selected word line as said read electric current and said reference read electric current;
a Y-side current source circuit which supplies or receives a constant electric current as said write electric current to or from said second Y selector based on said write data in the data write operation; and
a sense amplifier which senses said read data based on a difference between said read electric current flowing through said second selected bit line and said reference read electric current flowing through said second reference bit line in the data read operation,
wherein said write electric current flows through a route of said second Y selector, said first selected bit line, said magnetic field generating section of said selected memory cell, said second selected bit line and said first Y selector in the data write operation,
said read electric current flows through a route of said second X selector, said second selected word line, said magnetic resistance element, said extension bit line, and said second MOS transistor of said selected memory cell, said second selected bit line, and said second Y selector in the data read operation, and
said reference read electric current flows through a route of said second X selector, said second selected word line, said magnetic resistance element, said extension bit line, and said second MOS transistor of said selected reference memory cell, said second reference bit line, and said second Y selector in the data read operation.

56. The magnetic random access memory according to claim 55, wherein said Y-side current source circuit which supplies or receives the constant electric current as a reference write electric current to or from said second Y selector based on said write data in a reference data write operation to said selected reference memory cell, and said reference write electric current flows through a route of said second Y selector, said first selected bit line, said magnetic field generating section of said selected reference memory cell, said second selected bit line and said first Y selector in the reference data write operation.

57. The magnetic random access memory according to claim 56, wherein said Y-side current source circuit comprises:
a first circuit which generates a constant current source as said write electric current or said reference write electric current and receives said write electric current or said reference write electric current based on said write data in the data write operation or a reference data write operation to said selected reference memory cell; and
a second circuit which selects said first selected bit line for said write electric current in the data write operation and said first reference bit line for said reference write electric current in the reference data write operation.

58. The magnetic random access memory according to claim 45, wherein said memory cell array section further comprises:
- a plurality of second word lines, each of which is connected with one row of said memory cells as said conductive pattern; and
- a second X selector which selects one of said plurality of second word lines as a second selected word line based on said address, and supplies an electric current to said second selected word line as said read electric current and said reference read electric current,
- said second Y selector is connected with said plurality of second bit lines and said first and second reference bit lines,
- said magnetic random access memory further comprises:
- a plurality of said memory cell array sections;
- first and second main bit lines;
- a cell array selector which selects one of said plurality of memory cell array section as a selected memory cell array section based on said address to connect said first and second main bit lines with said second Y selector of said selected memory cell array section;
- a Y-side current source circuit which supplies said write electric current onto said first main bit line and receives said write electric current from said first main bit line based on said write data in the data write operation; and
- a sense amplifier which senses said read data based on a difference between said read electric current flowing through said first main bit line and said reference read electric current flowing through said second main bit line in the data read operation to said selected memory cell,
- wherein said write electric current flows through a route of said first main bit line, and said second Y selector, said first selected bit line, said magnetic field generating section of said selected memory cell, said second selected bit line and said first Y selector in said selected memory cell array section in the data write operation,
- said read electric current flows through a route of said second X selector, said second selected word line, said magnetic resistance element, said extension bit line, and said second MOS transistor of said selected memory cell, said second selected bit line, and said second Y selector in said selected memory cell array section and said first main bit line in the data read operation, and
- said reference read electric current flows through a route of said second X selector, said second selected word line, said magnetic resistance element, said extension bit line, and said second MOS transistor of said selected reference memory cell, said second selected bit line, and said second Y selector in said selected memory cell array section and said second main bit line in the data read operation.

59. The magnetic random access memory according to claim 58, wherein said Y-side current source circuit supplies or receives the constant electric current as a reference write electric current to or from said second main bit line based on said write data in a reference data write operation to said selected reference memory cell, and
- said reference write electric current flows through a route of said second main bit line, said second Y selector, said first reference bit line, said magnetic field generating section of said selected reference memory cell, said second reference bit line and said first Y selector in the selected memory cell array section in the reference data write operation.

60. The magnetic random access memory according to claim 59, wherein said Y-side current source circuit comprises:
- a first circuit which generates a constant current source as said write electric current or said reference write electric current and receives said write electric current or said reference write electric current based on said write data; and
- a second circuit which selects said first main bit line for said write electric current in the data write operation and said second main bit line for said reference write electric current in the reference data write operation.

61. The magnetic random access memory according to claim 45, wherein said second Y selector is connected with said first reference bit line,
- said magnetic random access memory further comprises:
- a plurality of said memory cell array sections;
- first and second main bit lines;
- a cell array selector which selects one of said plurality of memory cell array section as a selected memory cell array section based on said address to respectively connect said first and second main bit lines with said second and first Y selectors;
- a Y-side current source circuit which supplies said write electric current onto one of said first and second main bit lines and receives said write electric current from the other based on said write data in the data write operation;
- a read current load circuit which supplies said read electric current and a reference read electric current to said first and second main bit lines; and
- a sense amplifier which senses said read data based on a difference between said read electric current flowing through said first main bit line and said reference read electric current flowing through said second main bit line in the data read operation to said selected memory cell,
- wherein said write electric current flows through a route of said first main bit line, said second Y selector, said first selected bit line, said magnetic field generating section of said selected memory cell, said second selected bit line and said first Y selector in said selected memory cell array section and said second main bit line in the data write operation,
- said read electric current flows through a route of said first main bit line, said second Y selector, said first selected word line, and said first MOS transistor, said extension bit line, said magnetic resistance element, and said conductive pattern of said selected memory cell in said selected memory cell array section in the data read operation, and
- said reference read electric current flows through a route of said second main bit line, said first Y selector, said second reference bit line, said second MOS transistor, said magnetic resistance element, and said extension bit line of said selected reference memory cell in said selected memory cell array section in the data read operation.

62. The magnetic random access memory according to claim 61, wherein said Y-side current source circuit supplies the constant electric current as a reference write electric current onto one of said first and second main bit lines and receives said reference write electric current from the other based on said write data in a reference data write operation to said selected reference memory cell, and said reference write electric current flows through a route of said first main bit line, said second Y selector, said first reference bit line, said magnetic field generating section of said selected reference memory cell, said second reference bit line and said first Y selector in said selected memory cell array section and said second main bit line in the reference data write operation.

63. The magnetic random access memory according to claim 62, wherein said Y-side current source circuit comprises:
a first circuit which generates a constant current source as said write electric current or said reference write electric current and receives said write electric current or said reference write electric current; and
a second circuit which selects one of said first and second main bit lines for said write electric current in the data write operation and for said reference write electric current in the reference data write operation based on said write data.

64. The magnetic random access memory according to claim 45, wherein said memory cell array section further comprises:
a precharge power supply;
a precharge word line;
a precharge line;
a precharge circuit provided for each of pairs of said first and second bit lines and containing two MOS transistors which are provided between said first and second bit lines of the pair in series and have gates connected with said precharge word line, wherein a node between said two MOS transistors is connected with said precharge line;
a plurality of second word lines, each of which is connected with one row of said memory cells as said conductive pattern;
a precharge selector which selects said precharge word line to activate said two MOS transistors for each pair of said first and second bit lines; and
a precharge power supply which sets one of said plurality of second word line corresponding to said selected memory cell to a predetermined potential in the data read operation, and the data write operation and a reference data write operation to the selected reference memory cell, and sets the pair of said first and second bit lines to a precharge voltage when the pair of said first and second bit lines is not selected.

65. The magnetic random access memory according to claim 45, wherein said second Y selector is connected with said first reference bit line,
said memory cell array section further comprises:
a third Y selector which selects one of said plurality of first bit lines as a first selected bit line based on said address, and is connected with said first reference bit line,
said magnetic random access memory further comprises:
a plurality of said memory cell array sections;
first and second write main bit lines;
first and second read main bit lines;
a cell array selector which selects one of said plurality of memory cell array section as a selected memory cell array section based on said address to respectively connect said first and second write main bit lines with said second and first Y selectors and to connect said first and second read main bit lines with said third Y selector;
a Y-side current source circuit which supplies said write electric current onto one of said first and second write main bit lines and receives said write electric current from the other based on said write data in the data write operation;
a read current load circuit which supplies said read electric current and a reference read electric current to said first and second read main bit lines; and
a sense amplifier which senses said read data based on a difference between said read electric current flowing through said first main bit line and said reference read electric current flowing through said second main bit line in the data read operation to said selected memory cell,
wherein said write electric current flows through a route of said first write main bit line, said second Y selector, said first selected bit line, said magnetic field generating section of said selected memory cell, said second selected bit line and said first Y selector in said selected memory cell array section and said second write main bit line in the data write operation,
said read electric current flows through a route of said first read main bit line, said third Y selector, said first selected word line, and said first MOS transistor, said extension bit line, said magnetic resistance element, and said conductive pattern of said selected memory cell in said selected memory cell array section in the data read operation, and
said reference read electric current flows through a route of said second read main bit line, said third Y selector, said first reference bit line, said first MOS transistor, said extension bit line, said magnetic resistance element, and said conductive pattern of said selected reference memory cell in said selected memory cell array section in the data read operation.

66. The magnetic random access memory according to claim 65, wherein said Y-side current source circuit supplies the constant electric current as a reference write electric current onto one of said first and second write main bit lines and receives said reference write electric current from the other based on said write data in a reference data write operation to said selected reference memory cell, and
said reference write electric current flows through a route of said first write main bit line, said second Y selector, said first reference bit line, said magnetic field generating section of said selected reference memory cell, said second reference bit line and said first Y selector in the selected memory cell array section and said second write main bit line in the reference data write operation.

67. The magnetic random access memory according to claim 66, wherein said Y-side current source circuit comprises:
a first circuit which generates a constant current source as said write electric current or said reference write electric current and receives said write electric current or said reference write electric current; and
a second circuit which selects one of said first and second write main bit lines for said write electric current in the data write operation and for said reference write electric current in the reference data write operation based on said write data.

68. The magnetic random access memory according to claim 45, wherein said second Y selector is connected with said plurality of second bit lines and said first reference bit line,
said first Y selector is connected with said plurality of first bit lines and said first and second reference bit line,
said magnetic random access memory further comprises:

a plurality of said memory cell array sections;

first and second main bit lines;

a cell array selector which selects one of said plurality of memory cell array section as a selected memory cell array section based on said address to respectively connect said first and second main bit lines with said second and first Y selectors;

a Y-side current source circuit which supplies said write electric current onto said second main bit line and receives said write electric current from said first main bit line in the data write operation;

a read current load circuit which supplies said read electric current and a reference read electric current to said first and second main bit lines; and a sense amplifier which senses said read data based on a difference between said read electric current flowing through said first main bit line and said reference read electric current flowing through said second main bit line in the data read operation to said selected memory cell, wherein said write electric current flows through a route of said second main bit line, said first Y selector, one of said first selected bit line and said second selected bit line, said magnetic field generating section of said selected memory cell, the other and said first Y selector in said selected memory cell array section and said first main bit line in the data write operation, said read electric current flows through a route of said first main bit line, said second Y selector, said first and second selected word lines, and said first and second MOS transistors, said extension bit line, said magnetic resistance element, and said conductive pattern of said selected memory cell in said selected memory cell array section in the data read operation, and said reference read electric current flows through a route of said second main bit line, said first Y selector, said first and second reference bit lines, said first and second MOS transistors, said magnetic resistance element, and said extension bit line of said selected reference memory cell in said selected memory cell array section in the data read operation.

69. The magnetic random access memory according to claim 68, wherein said Y-side current source circuit supplies the constant electric current as a reference write electric current onto said second main bit line and receives said reference write electric current from said first main bit line based on said write data in a reference data write operation to said selected reference memory cell, and said reference write electric current flows through a route of said second main bit line, said first Y selector, said second reference bit line, said magnetic field generating section of said selected reference memory cell, said first reference bit line and said first Y selector in said selected memory cell array section in the selected memory cell array section and said first main bit line in the reference data write operation.

70. The magnetic random access memory according to claim 69, wherein said Y-side current source circuit comprises:

a first circuit which generates a constant current source as said write electric current or said reference write electric current and receives said write electric current or said reference write electric current based on said write data; and a second circuit which selects one of said first and second main bit lines for said write electric current in the data write operation and for said reference write electric current in the reference data write operation.

71. The magnetic random access memory according to claim 45, wherein said Y-side current source circuit comprises:

a first circuit which generates a constant current source as said write electric current or said reference write electric current and receives said write electric current or said reference write electric current based on said write data; and a second circuit which selects one of said first and second main bit lines for said write electric current in the data write operation and for said reference write electric current in the reference data write operation.

72. The magnetic random access memory according to claim 45, wherein each of said plurality of second bit lines is provided for one pair of adjacent two of said plurality of first bit lines.

73. A magnetic random access memory comprising a memory cell array section which comprises:

a plurality of memory cells arranged in a matrix of rows and columns, wherein one column of said memory cells a column of reference memory cells;

a plurality of first word lines, each of which is connected with one row of said memory cells;

a plurality of second word lines, each of which is connected with one row of said memory cells;

a plurality of first bit lines, each of which is connected with one column of said memory cells;

a plurality of second bit lines, each of which is connected with one column of said memory cells and forms a pair with a corresponding one of said plurality of first bit lines, wherein said first and second bit lines for said column of said reference memory cells are first and second reference bit lines;

a first X selector which selects one of said plurality of first word lines as a first selected word line based on an address;

a second X selector which selects one of said plurality of second word lines as a second selected word line based on said address;

a first Y selector which selects one of said plurality of second bit lines as a second selected bit line based on said address;

a second Y selector which selects one of said plurality of first bit lines as a first selected bit line based on said address; and a third Y selector which selects one of said plurality of second bit lines as a second selected bit line based on said address, wherein each of said plurality of memory cells comprises:

an extension wiring line connected with a corresponding one of said plurality of second bit lines;

a magnetic resistance element provided between said extension wiring line and a corresponding one of said plurality of second word lines, and having a spontaneous magnetization, and storing a data as a direction of said spontaneous magnetization, wherein the direction of said spontaneous magnetization is inverted depending on a magnetic field applied to said magnetic resistance element; and a first MOS transistor provided between said extension wiring line and a corresponding one of said plurality of first bit lines and having a gate connected with a corresponding one of said plurality of first word lines, a magnetic field generating section comprises said first MOS transistor, and said extension wiring line, one of said plurality of memory cells which is connected with said first selected word line, said first selected bit line and said second selected bit line is a selected memory cell, and one of said column of said reference memory cells which is connected with said first selected word line, said first reference bit line and said second reference bit line is a selected reference memory cell, in a data write operation into said selected memory cell, a write data is written in said magnetic resistance element of said selected memory cell by applying said magnetic field generated by a write electric current which flows through said extension wiring line of said magnetic field generating section of said selected memory cell, and a value of said write data is determined based on a direction of said write electric current, and in a data read operation from said selected memory cell, a read electric current flows through a route of said first MOS transistor, said extension wiring line, and said magnetic resistance element in said selected memory cell, and a read data from said selected memory cell is determined based on a resistance of said magnetic resistance element of said selected memory cell.

74. The magnetic random access memory according to claim 73, wherein said second selected word line is set to a predetermined potential in the data read operation and the data write operation.

75. The magnetic random access memory according to claim 73, wherein said first X selector selects said first selected word line based on an address in the data read operation and the data write operation,
said second Y selector selects said first selected bit line based on said address in the data read operation and the data write operation, and
said first Y selector selects said second selected bit line based on said address in the data write operation.

76. The magnetic random access memory according to claim 73, further comprising:
a Y-side current source circuit which supplies or receives a constant electric current as said write electric current to or from said second Y selector based on said write data in the data write operation; and
a sense amplifier which senses said read data based on a difference between said read electric current flowing through said second selected bit line and said reference read electric current flowing through said second reference bit line in the data read operation,
wherein said write electric current flows through a route of said second Y selector, said first selected bit line, said magnetic field generating section of said selected memory cell, said second selected bit line and said first Y selector in the data write operation,
said read electric current flows through a route of said second X selector, said second selected word line, said magnetic resistance element and said extension bit line of said selected memory cell, and said third Y selector in the data read operation, and
said reference read electric current flows through a route of said second X selector, said second selected word line, said magnetic resistance element and said extension bit line of said selected reference memory cell, and said second reference bit line in the data read operation.

77. The magnetic random access memory according to claim 76, wherein said Y-side current source circuit supplies or receives the constant electric current as a reference write electric current to or from said first reference bit line based on said write data in a reference data write operation to said selected reference memory cell, and
said reference write electric current flows through a route of said first selected bit line, said magnetic field generating section of said selected reference memory cell, said second reference bit line and said first Y selector in the reference data write operation.

78. The magnetic random access memory according to claim 77, wherein said Y-side current source circuit comprises:
a first circuit which generates a constant current source as said write electric current or said reference write electric current and receives said write electric current or said reference write electric current based on said write data in the data write operation or a reference data write operation to said selected reference memory cell; and
a second circuit which selects said second Y selector for said write electric current in the data write operation and said first reference bit line for said reference write electric current in the reference data write operation.

79. The magnetic random access memory according to claim 73, wherein said second Y selector is connected with said first reference bit line,
said magnetic random access memory further comprises:
a plurality of said memory cell array sections;
first and second main bit lines;
a cell array selector which selects one of said plurality of memory cell array section as a selected memory cell array section based on said address to connect said first and second main bit lines with said second Y selector of said selected memory cell array section;
a Y-side current source circuit which supplies said write electric current onto said first main bit line and receives said write electric current from said first main bit line based on said write data in the data write operation;
a read current load circuit which supplies said read electric current and a reference read electric current to said first and second main bit lines; and
a sense amplifier which senses said read data based on a difference between said read electric current flowing through said first main bit line and said reference read electric current flowing through said second main bit line in the data read operation to said selected memory cell,
wherein said write electric current flows through a route of said first main bit line, said second Y selector, said first selected bit line, said magnetic field generating section of said selected memory cell, said second selected bit line and said first Y selector in said selected memory cell array section in the data write operation,
said read electric current flows through a route of said second X selector, said second selected word line, said magnetic resistance element, said extension bit line, and said first MOS transistor of said selected memory cell, said first selected bit line, and said second Y selector in said selected memory cell array section and said first main bit line in the data read operation, and
said reference read electric current flows through a route of said second X selector, said second selected word line, said magnetic resistance element, said extension bit line, and said first MOS transistor of said selected reference memory cell, said second reference bit line, and said first Y selector in said selected memory cell array section and said second main bit line in the data read operation.

80. The magnetic random access memory according to claim 79, wherein said Y-side current source circuit supplies a constant electric current as a reference write electric current to said second main bit line and receives said reference write electric current from said second main bit line based on said write data in a reference data write operation to said selected reference memory cell, and said reference write electric current flows through a route of said second main bit line, said first Y selector, said second reference bit line, said magnetic field generating section of said selected reference memory cell, said first reference bit line and said second Y selector in the selected memory cell array section and said first main bit line in the reference data write operation.

81. The magnetic random access memory according to claim 80, wherein said Y-side current source circuit comprises:

a first circuit which generates a constant current source as said write electric current or said reference write electric current and receives said write electric current or said reference write electric current based on said write data; and a second circuit which selects one of said first and second main bit lines said write electric current and said reference write electric current to be supplied in the data write operation and in the reference data write operation.

82. The magnetic random access memory according to claim 73, wherein said second Y selector is connected with said plurality of second bit lines and said first and second reference bit lines, said memory cell array section further comprises:

a Y-side current source circuit which supplies or receives a constant electric current as said write electric current to or from said second Y selector based on said write data in the data write operation; and a sense amplifier which senses said read data based on a difference between said read electric current flowing through said second selected bit line and said reference read electric current flowing through said second reference bit line in the data read operation, wherein said write electric current flows through a route of said second Y selector, said first selected bit line, said magnetic field generating section of said selected memory cell, said second selected bit line and said first Y selector in the data write operation, said read electric current flows through a route of said second X selector, said second selected word line, said magnetic resistance element, said extension bit line, and said second MOS transistor of said selected memory cell, said second selected bit line, and said second Y selector in the data read operation, and said reference read electric current flows through a route of said second X selector, said second selected word line, said magnetic resistance element, said extension bit line, and said second MOS transistor of said selected reference memory cell, said second reference bit line, and said second Y selector in the data read operation.

83. The magnetic random access memory according to claim 82, wherein said Y-side current source circuit supplies or receives the constant electric current as a reference write electric current to or from said second Y selector based on said write data in a reference data write operation to said selected reference memory cell, and said reference write electric current flows through a route of said second y selector, said first selected bit line, said magnetic field generating section of said selected reference memory cell, said second selected bit line and said first Y selector in the reference data write operation.

84. The magnetic random access memory according to claim 83, wherein said Y-side current source circuit comprises:

a first circuit which generates a constant current source as said write electric current or said reference write electric current and receives said write electric current or said reference write electric current based on said write data in the data write operation or a reference data write operation to said selected reference memory cell; and a second circuit which selects one of said first selected bit line and said first reference bit line Y selector for said write electric current in the data write operation and said first reference bit line for said reference write electric current in the reference data write operation.

85. The magnetic random access memory according to claim 73, wherein said second Y selector is connected with said plurality of second bit lines and said first and second reference bit lines, said magnetic random access memory further comprises:

a plurality of said memory cell array sections;

first and second main bit lines;

a cell array selector which selects one of said plurality of memory cell array section as a selected memory cell array section based on said address to connect said first and second main bit lines with said second Y selector of said selected memory cell array section;

a Y-side current source circuit which supplies said write electric current onto said first main bit line and receives said write electric current from said first main bit line based on said write data in the data write operation; and a sense amplifier which senses said read data based on a difference between said read electric current flowing through said first main bit line and said reference read electric current flowing through said second main bit line in the data read operation to said selected memory cell, wherein said write electric current flows through a route of said first main bit line, and said second Y selector, said first selected bit line, said magnetic field generating section of said selected memory cell, said second selected bit line and said first Y selector in said selected memory cell array section in the data write operation, said read electric current flows through a route of said second X selector, said second selected word line, said magnetic resistance element, said extension bit line, and said second MOS transistor of said selected memory cell, said second selected bit line, and said second Y selector in said selected memory cell array section and said first main bit line in the data read operation, and said reference read electric current flows through a route of said second X selector, said second selected word line, said magnetic resistance element, said extension bit line, and said second MOS transistor of said selected reference memory cell, said second selected bit line, and said second Y selector in said selected memory cell array section and said second main bit line in the data read operation.

86. The magnetic random access memory according to claim 85, wherein said Y-side current source circuit supplies or receives the constant electric current as a reference write electric current to or from said second main bit line based on said write data in a reference data write operation to said selected reference memory cell, and said reference write electric current flows through a route of said second main bit line, said second Y selector, said first reference bit line, said magnetic field generating section of said selected reference memory cell, said second reference bit line and said first Y selector in the selected memory cell array section in the reference data write operation.

87. The magnetic random access memory according to claim 86, wherein said Y-side current source circuit comprises:
a first circuit which generates a constant current source as said write electric current or said reference write electric current and receives said write electric current or said reference write electric current based on said write data; and
a second circuit which selects said first main bit line for said write electric current in the data write operation and said second main bit line for said reference write electric current in the reference data write operation.

88. The magnetic random access memory according to claim 73, wherein said second Y selector is connected with said first reference bit line,
said magnetic random access memory further comprises:
a plurality of said memory cell array sections;
first and second main bit lines;
a cell array selector which selects one of said plurality of memory cell array section as a selected memory cell array section based on said address to respectively connect said first and second main bit lines with said second and first Y selectors of said selected memory cell array section;
a Y-side current source circuit which supplies said write electric current onto one of said first and second main bit lines and receives said write electric current from the other based on said write data in the data write operation; and
a sense amplifier which senses said read data based on a difference between said read electric current flowing through said first main bit line and said reference read electric current flowing through said second main bit line in the data read operation to said selected memory cell,
wherein said write electric current flows through a route of said first main bit line, said second Y selector, said first selected bit line, said magnetic field generating section of said selected memory cell, said second selected bit line and said first Y selector in said selected memory cell array section and said second main bit line in the data write operation,
said read electric current flows through a route of said second X selector, said second selected word line, said magnetic resistance element, and said extension bit line of said selected memory cell, said first selected word line, said second Y selector in said selected memory cell array section and said first main bit line in the data read operation, and
said reference read electric current flows through a route of said second X selector, said second selected word line, said magnetic resistance element, and said extension bit line of said selected reference memory cell, said first reference word line, said second Y selector in said selected memory cell array section and said second main bit line in the data read operation.

89. The magnetic random access memory according to claim 88, wherein said Y-side current source circuit supplies the constant electric current as a reference write electric current onto one of said first and second main bit lines and receives said reference write electric current from the other based on said write data in a reference data write operation to said selected reference memory cell, and
said reference write electric current flows through a route of said first main bit line, said second Y selector, said first reference bit line, said magnetic field generating section of said selected reference memory cell, said second reference bit line and said first Y selector in said selected memory cell array section and said second main bit line in the reference data write operation.

90. The magnetic random access memory according to claim 89, wherein said Y-side current source circuit comprises:
a first circuit which generates a constant current source as said write electric current or said reference write electric current and receives said write electric current or said reference write electric current; and
a second circuit which selects one of said first and second main bit lines for said write electric current in the data write operation and for said reference write electric current in the reference data write operation based on said write data.

91. The magnetic random access memory according to claim 73, wherein said memory cell array section further comprises:
a precharge power supply;
a precharge word line;
a precharge line;
a precharge circuit provided for each of pairs of said first and second bit lines and containing two MOS transistors which are provided between said first and second bit lines of the pair in series and have gates connected with said precharge word line, wherein a node between said two MOS transistors is connected with said precharge line; and
a precharge selector which selects said precharge word line to activate said two MOS transistors for each pair of said first and second bit lines,
wherein said second X selector sets one of said plurality of second word line corresponding to said selected memory cell to a predetermined potential in the data read operation, and the data write operation and a reference data write operation to the selected reference memory cell, and sets the pair of said first and second bit lines to a precharge voltage when the pair of said first and second bit lines is not selected.

92. The magnetic random access memory according to claim 73, wherein said second Y selector is connected with said first reference bit line,
said memory cell array section further comprises:
a third Y selector which selects one of said plurality of first bit lines as a first selected bit line based on said address, and is connected with said first reference bit line,
said magnetic random access memory further comprises:
a plurality of said memory cell array sections;
first and second write main bit lines;
first and second read main bit lines;
a cell array selector which selects one of said plurality of memory cell array section as a selected memory cell array section based on said address to respectively connect said first and second write main bit lines with said second and first Y selectors of said selected memory cell array section and to connect said first and second read main bit lines with said third Y selector of said selected memory cell array section;

a Y-side current source circuit which supplies said write electric current onto one of said first and second write main bit lines and receives said write electric current from the other based on said write data in the data write operation; and a sense amplifier which senses said read data based on a difference between said read electric current flowing through said first main bit line and said reference read electric current flowing through said second main bit line in the data read operation to said selected memory cell, wherein said write electric current flows through a route of said first write main bit line, said second Y selector, said first selected bit line, said magnetic field generating section of said selected memory cell, said second selected bit line and said first Y selector in said selected memory cell array section and said second write main bit line in the data write operation, said read electric current flows through a route of said second X selector, said second selected word line, said magnetic resistance element and said extension bit line of said selected memory cell, said first selected bit line, and said third Y selector in said selected memory cell array section and said first read main bit line in the data read operation, and said reference read electric current flows through a route of said second X selector, said second selected word line, said magnetic resistance element and said extension bit line of said selected reference memory cell, said first reference bit line, and said third Y selector in said selected memory cell array section and said second read main bit line in the data read operation.

93. The magnetic random access memory according to claim 92, wherein said Y-side current source circuit supplies the constant electric current as a reference write electric current onto one of said first and second write main bit lines and receives said reference write electric current from the other based on said write data in a reference data write operation to said selected reference memory cell, and said reference write electric current flows through a route of said first write main bit line, said second Y selector, said first reference bit line, said magnetic field generating section of said selected reference memory cell, said second reference bit line and said first Y selector in said selected memory cell array section and said second write main bit line in the reference data write operation.

94. The magnetic random access memory according to claim 93, wherein said Y-side current source circuit comprises:

a first circuit which generates a constant current source as said write electric current or said reference write electric current and receives said write electric current or said reference write electric current; and a second circuit which selects one of said first and second write main bit lines for said write electric current in the data write operation and for said reference write electric current in the reference data write operation based on said write data.

95. The magnetic random access memory according to claim 45, wherein said memory cell array section further comprises:

a plurality of a plurality of additional word lines;

wherein said gate of said second MOS is connected with a corresponding one of said plurality of additional word lines in place of said corresponding first word line; and each of said plurality of second bit lines is shared by adjacent two of said plurality of first bit lines.

96. The magnetic random access memory according to claim 73, wherein said memory cell array section further comprises:

a plurality of a plurality of additional word lines;

wherein said gate of said first MOS transistor is connected with a corresponding one of said plurality of additional word lines in place of said corresponding first word line; and each of said plurality of second bit lines is shared by adjacent two of said plurality of first bit lines.

97. A magnetic random access memory comprising a memory cell array section which comprises:

a plurality of memory cells arranged in a matrix of rows and columns, wherein one column of said memory cells a column of reference memory cells;

a plurality of first word lines, each of which is connected with one row of said memory cells;

a plurality of second word lines, each of which is connected with one row of said memory cells;

a plurality of first bit lines, each of which is connected with one column of said memory cells, wherein said first bit line for said column of said reference memory cells is a first reference bit line;

a first X selector which selects one of said plurality of first word lines as a first selected word line based on an address;

a second X selector which selects one of said plurality of second word lines as a second selected word line based on an address;

a first Y selector which selects one of said plurality of first bit lines as a first selected bit line based on said address, wherein each of said plurality of memory cells comprises:

an extension wiring line;

a magnetic resistance element having a spontaneous magnetization, and storing a data as a direction of said spontaneous magnetization, wherein the direction of said spontaneous magnetization is inverted depending on a magnetic field applied to said magnetic resistance element;

a first diode connected with said magnetic resistance element in series, wherein a series connection of said magnetic resistance element and said first diode is provided between said extension wiring line and a corresponding one of said plurality of second word line; and a parallel connection of second and third diodes connected between a corresponding one of said plurality of first word lines and said extension wiring line, wherein said second and third diodes are connected in parallel in opposite directions, a magnetic field generating section comprises said extension wiring line, and said parallel connection of said second and third diodes, one of said plurality of memory cells which is connected with said first selected word line, said second selected word line, and said first selected bit line is a selected memory cell, and one of said column of said reference memory cells which is connected with said first and second selected word lines, and said first reference bit line is a selected reference memory cell, in a data write operation into said selected memory cell, a write data is written in said magnetic resistance element of said selected memory cell by applying said magnetic field generated by a write electric current which flows through said extension wiring line of said magnetic field generating section of said selected memory cell, and a value of said write data is determined based on a direction of said write electric current, and in a data read operation from said selected memory cell, a read electric current flows through a route of said extension wiring line, said magnetic resistance element and said first diode in said selected memory cell, and a read data from said selected memory cell is determined based on a resistance of said magnetic resistance element of said selected memory cell.

98. The magnetic random access memory according to claim 97, wherein said first and second X selectors set said plurality of first and second word lines to a first voltage, said magnetic random access memory further comprises:

a Y-side power supply circuit which applies one of a second voltage and a third voltage to said first Y selector based on said write data in the data write operation, wherein said first X selector applies the other of said second and third voltages to said first selected word line;

a read current load circuit which supplies said read electric current to said first Y selector and a reference read electric current to said first reference bit line in the data read operation; and a sense amplifier which senses said read data based on a difference between said read electric current flowing through said first selected bit line and said reference read electric current flowing through said first reference bit line in the data read operation, wherein in the data write operation, said write electric current flows through a route of said first Y selector, said first selected bit line, said magnetic field generating section of said selected memory cell, said first selected word line and said first X selector, in the data read operation, said second X selector sets said second selected word line to said third voltage, and said read electric current flows through a route of said first Y selector, said first selected bit line, said extension bit line, said magnetic resistance element and said first diode of said selected memory cell and said second X selector, and said reference read electric current flows through a route of said first reference bit line, said extension bit line, said magnetic resistance element and said first diode of said selected reference memory cell and said second X selector in the data read operation.

99. The magnetic random access memory according to claim 98, wherein said Y-side power supply circuit which applies said one of said second and third voltages to said first reference bit line based on said write data in a reference data write operation to said selected reference memory cell, and said reference write electric current flows through a route of said first reference bit line, said magnetic field generating section of said selected reference memory cell, said first selected word line and said first Y selector in the reference data write operation.

100. The magnetic random access memory according to claim 97, wherein said first Y selector is connected with said first reference bit line, and said first and second X selectors set said plurality of first and second word lines to a first voltage, said magnetic random access memory further comprises:
a plurality of said memory cell array sections;
first to third main bit lines;
a cell array selector which selects one of said plurality of memory cell array section as a selected memory cell array section based on said address to connect said first and second main bit lines with said first Y selector of said selected memory cell array section and said third main bit line with said first X selector of said selected memory cell array section;

a Y-side power supply circuit which applies one of said second and third voltages to said third main bit line and the other of said second and third voltages to said second main bit line based on said write data in the data write operation, wherein said first X selector applies the other of said second and third voltages on said second main bit line to said first selected word line;

a read current load circuit which supplies said read electric current and a reference read electric current to said second and first main bit lines; and a sense amplifier which senses said read data based on a difference between said read electric current flowing through said second main bit line and said reference read electric current flowing through said first main bit line in the data read operation to said selected memory cell, wherein said write electric current flows through a route of said second main bit line, and said first Y selector, said first selected bit line, said magnetic field generating section of said selected memory cell, said first selected word line and said first X selector in said selected memory cell array section and said third main bit line in the data write operation, in the data read operation, said second X selector sets said second selected word line to said third voltage, and said read electric current flows through a route of said second main bit line, said first Y selector, said first selected bit line, and said extension bit line, said magnetic resistance element and said first diode of said selected memory cell and said second X selector in said selected memory cell array section, and said reference read electric current flows through a route of said first main bit line, said first reference bit line, and said extension bit line, said magnetic resistance element and said first diode of said selected reference memory cell and said second X selector in said selected memory cell array section in the data read operation.

101. The magnetic random access memory according to claim 100, wherein said Y-side current source circuit applies one of said second and third voltages to said first main bit based on said write data in a reference data write operation to said selected reference memory cell, and a reference write electric current flows through a route of said first main bit line, said first Y selector, said first reference bit line, said magnetic field generating section of said selected reference memory cell, said first selected word line and said first Y selector in the selected memory cell array section in the reference data write operation.

102. A magnetic random access memory comprising a memory cell array section which comprises:

a plurality of memory cells arranged in a matrix of rows and columns, wherein one column of said memory cells a column of reference memory cells;

a plurality of first word lines, each of which is connected with one row of said memory cells;

a plurality of second word lines, each of which is connected with one row of said memory cells;

a plurality of first bit lines, each of which is connected with one column of said memory cells;

a plurality of second bit lines, each of which is connected with one column of said memory cells, wherein said first and second bit lines for said column of said reference memory cells are first and second reference bit lines;

a first X selector which selects one of said plurality of first word lines as a first selected word line and one of said plurality of second word lines as a second selected word line based on an address;

a first Y selector which selects one of said plurality of second bit lines as a second selected bit line based on said address; and a second Y selector which selects one of said plurality of first bit lines as a first selected bit line based on said address, wherein each of said plurality of memory cells comprises:

an extension wiring line;

a magnetic resistance element having a spontaneous magnetization, and storing a data as a direction of said spontaneous magnetization, wherein the direction of said spontaneous magnetization is inverted depending on a magnetic field applied to said magnetic resistance element;

a first diode connected with said magnetic resistance element in series, wherein a series connection of said magnetic resistance element and said first diode is provided between said extension wiring line and a corresponding one of said plurality of second word line; and a first MOS transistor which is provided between said extension wiring line and a corresponding one of said plurality of first bit lines and having a gate connected with said first selected word line, a magnetic field generating section comprises said extension wiring line, and said first MOS transistor, one of said plurality of memory cells which is connected with said first selected word line, said second selected word line, and said first selected bit line is a selected memory cell, and one of said column of said reference memory cells which is connected with said first and second selected word lines, and said first reference bit line is a selected reference memory cell, in a data write operation into said selected memory cell, a write data is written in said magnetic resistance element of said selected memory cell by applying said magnetic field generated by a write electric current which flows through said extension wiring line of said magnetic field generating section of said selected memory cell, and a value of said write data is determined based on a direction of said write electric current, and in a data read operation from said selected memory cell, a read electric current flows through a route of said extension wiring line, said magnetic resistance element and said first diode in said selected memory cell, and a read data from said selected memory cell is determined based on a resistance of said magnetic resistance element of said selected memory cell.

103. The magnetic random access memory according to claim 102, wherein said first and second X selectors set said plurality of first and second word lines to a first voltage, said magnetic random access memory further comprises:

a Y-side power supply circuit which applies one of a second voltage and a third voltage to said second Y selector based on said write data in the data write operation, wherein said first Y selector applies the other of said second and third voltages to said second selected bit line in the data write operation;

a read current load circuit which supplies said read electric current to said first Y selector and a reference read electric current to said first reference bit line in the data read operation, wherein said first X selector sets said second selected word line to said third voltage in the data read operation; and a sense amplifier which senses said read data based on a difference between said read electric current flowing through said first selected bit line and said reference read electric current flowing through said first reference bit line in the data read operation, wherein in the data write operation, said write electric current flows through a route of said first Y selector, said first selected bit line, said magnetic field generating section of said selected memory cell, said second selected bit line and said first X selector, said read electric current flows through a route of said first Y selector, said first selected bit line, said first MOS transistor, said extension bit line, said magnetic resistance element and said first diode of said selected memory cell and said first X selector in the data read operation, and said reference read electric current flows through a route of said first reference bit line, said first MOS transistor, said extension bit line, said magnetic resistance element and said first diode of said selected memory cell and said first X selector in the data read operation.

104. The magnetic random access memory according to claim 103, wherein said Y-side power supply circuit applies one of said second and third voltages to said first reference bit line based on said write data in a reference data write operation to said selected reference memory cell, and said reference write electric current flows through a route of said first reference bit line, said magnetic field generating section of said selected reference memory cell, said second reference bit line word line and said first Y selector in the reference data write operation.

105. The magnetic random access memory according to claim 102, wherein said first Y selector is connected with said first reference bit line, said magnetic random access memory further comprises:

a plurality of said memory cell array sections;

first to third main bit lines;

a cell array selector which selects one of said plurality of memory cell array section as a selected memory cell array section based on said address to connect said first and second main bit lines with said second Y selector of said selected memory cell array section and said third main bit line with said first Y selector of said selected memory cell array section;

a Y-side power supply circuit which applies one of said second and third voltages to said third main bit line and the other of said second and third voltages to said second main bit line based on said write data in the data write operation;

a read current load circuit which supplies said read electric current and a reference read electric current to said second and first main bit lines; and a sense amplifier which senses said read data based on a difference between said read electric current flowing through said second main bit line and said reference read electric current flowing through said first main bit line in the data read operation to said selected memory cell, wherein said write electric current flows through a route of said second main bit line, and said second Y selector, said first selected bit line, said magnetic field generating section of said selected memory cell, said second selected bit line and said first Y selector in said selected memory cell array section and said first main bit line in the data write operation, said read electric current flows through a route of said second main bit line, said second Y selector, said first selected bit line, and said extension bit line, said magnetic resistance element and said first diode of said selected memory cell and said first X selector in said selected memory cell array section in the data read operation, and said reference read electric current flows through a route of said first main bit line, said first reference bit line, and said extension bit line, said magnetic resistance element and said first diode of said selected reference memory cell and said first X selector in said selected memory cell array section in the data read operation.

106. The magnetic random access memory according to claim 105, wherein said Y-side current source circuit applies said one of said second and third voltages to said first main bit based on said write data in a reference data write operation to said selected reference memory cell;

a reference write electric current flows through a route of said first main bit line, said second Y selector, said first reference bit line, said magnetic field generating section of said selected reference memory cell, said second reference bit line and said first Y selector in the selected memory cell array section and said third main bit line in the reference data write operation.

107. A magnetic random access memory comprising a memory cell array section which comprises:

a plurality of memory cells arranged in a matrix of rows and columns, wherein one column of said memory cells a column of reference memory cells;

a plurality of first word lines, each of which is connected with one row of said memory cells;

a plurality of first bit lines, each of which is connected with one column of said memory cells;

a plurality of second bit lines, each of which is connected with one column of said memory cells, wherein said first and second bit lines for said column of said reference memory cells are first and second reference bit lines;

a first X selector which selects one of said plurality of first word lines as a first selected word line and one of said plurality of second word lines as a second selected word line based on an address;

a first Y selector which selects one of said plurality of second bit lines as a second selected bit line based on said address; and a second Y selector which selects one of said plurality of first bit lines as a first selected bit line based on said address, wherein each of said plurality of memory cells comprises:
an extension wiring line;
a magnetic resistance element having a spontaneous magnetization, and storing a data as a direction of said spontaneous magnetization, wherein the direction of said spontaneous magnetization is inverted depending on a magnetic field applied to said magnetic resistance element;
a conductive pattern which is connected in series with said magnetic resistance element;
a parallel connection of first and second diodes provided between said extension wiring line and a corresponding one of said plurality of second bit lines, said first and second diodes being connected in opposite directions; and a MOS transistor which is provided between said extension wiring line and a corresponding one of said plurality of first bit lines and having a gate connected with said first selected word line, a magnetic field generating section comprises said parallel connection of said second and third diodes, said extension wiring line, and said first MOS transistor, one of said plurality of memory cells which is connected with said first selected word line, said second selected word line, and said first selected bit line is a selected memory cell, and one of said column of said reference memory cells which is connected with said first and second selected word lines, and said first reference bit line is a selected reference memory cell, in a data write operation into said selected memory cell, a write data is written in said magnetic resistance element of said selected memory cell by applying said magnetic field generated by a write electric current which flows through said extension wiring line of said magnetic field generating section of said selected memory cell, and a value of said write data is determined based on a direction of said write electric current, and in a data read operation from said selected memory cell, a read electric current flows through a route of said extension wiring line, said magnetic resistance element and said first diode in said selected memory cell, and a read data from said selected memory cell is determined based on a resistance of said magnetic resistance element of said selected memory cell.

108. The magnetic random access memory according to claim 107, wherein said first Y selector sets said plurality of second bit lines to a first voltage, said magnetic random access memory further comprises:
a Y-side power supply circuit which applies one of said second and third voltages to said second Y selector based on said write data in the data write operation, wherein said first Y selector applies the other of said second and third voltages to said second selected bit line based on said write data in the data write operation;

a read current load circuit which supplies said read electric current to said first Y selector and a reference read electric current to said first reference bit line in the data read operation; and a sense amplifier which senses said read data based on a difference between said read electric current flowing through said first selected bit line and said reference read electric current flowing through said first reference bit line in the data read operation, wherein in the data write operation, said write electric current flows through a route of said second Y selector, said first selected bit line, said magnetic field generating section of said selected memory cell, said second selected bit line and said first X selector, said read electric current flows through a route of said second Y selector, said first selected bit line, and said first MOS transistor, said extension bit line, said magnetic resistance element and said conductive pattern of said selected memory cell in the data read operation, and said reference read electric current flows through a route of said first reference bit line, said first MOS transistor, said extension bit line, said magnetic resistance element and said conductive pattern of said selected memory cell and said first Y selector in the data read operation.

109. The magnetic random access memory according to claim 108, wherein said Y-side power supply circuit which applies said one of said second and third voltages to said first reference bit line based on said write data in a reference data write operation to said selected reference memory cell, and
said reference write electric current flows through a route of said first reference bit line, said magnetic field generating section of said selected reference memory cell, said second reference bit line word line and said first Y selector in the reference data write operation.

110. The magnetic random access memory according to claim 107, wherein said first Y selector is connected with said first reference bit line, and said first Y selector set said plurality of second bit lines to a first voltage,
said magnetic random access memory further comprises:
a plurality of said memory cell array sections;
first to third main bit lines;
a cell array selector which selects one of said plurality of memory cell array section as a selected memory cell array section based on said address to connect said first and second main bit lines with said second Y selector of said selected memory cell array section and said third main bit line with said first Y selector of said selected memory cell array section,
a Y-side power supply circuit which applies one of said second and third voltages to said third main bit line and the other of said second and third voltages to said second main bit line based on said write data in the data write operation;
a read current load circuit which supplies said read electric current and a reference read electric current to said second and first main bit lines; and
a sense amplifier which senses said read data based on a difference between said read electric current flowing through said second main bit line and said reference read electric current flowing through said first main bit line in the data read operation to said selected memory cell,
wherein said write electric current flows through a route of said second main bit line, and said second Y selector, said first selected bit line, said magnetic field generating section of said selected memory cell, said second selected bit line and said first Y selector in said selected memory cell array section and said first main bit line in the data write operation,
said read electric current flows through a route of said second main bit line, said second Y selector, said first selected bit line, and said first MOS transistor, said extension bit line, said magnetic resistance element and said conductive pattern of said selected memory cell in said selected memory cell array section in the data read operation, and
said reference read electric current flows through a route of said first main bit line, said first reference bit line, and said first MOS transistor, said extension bit line, said magnetic resistance element and said conductive pattern of said selected reference memory cell in said selected memory cell array section in the data read operation.

111. The magnetic random access memory according to claim 110, wherein said Y-side current source circuit applies said one of said second and third voltages to said first main bit based on said write data in a reference data write operation to said selected reference memory cell, and a reference write electric current flows through a route of said first main bit line, said second Y selector, said first reference bit line, said magnetic field generating section of said selected reference memory cell, said second reference bit line and said first Y selector in the selected memory cell array section and said third main bit line in the reference data write operation.

112. A magnetic random access memory comprising a memory cell array section which comprises:
a plurality of memory cells arranged in a matrix of rows and columns, wherein one column of said memory cells a column of reference memory cells;
a plurality of first word lines, each of which is connected with one row of said memory cells;
a plurality of first bit lines, each of which is connected with one column of said memory cells;
a plurality of second bit lines, each of which is connected with one column of said memory cells, wherein said first and second bit lines for said column of said reference memory cells are first and second reference bit lines;
a first X selector which selects one of said plurality of first word lines as a first selected word line and one of said plurality of second word lines as a second selected word line based on an address;
a first Y selector which selects one of said plurality of second bit lines as a second selected bit line based on said address,
a second Y selector which selects one of said plurality of first bit lines as a first selected bit line based on said address,
wherein each of said plurality of memory cells comprises:
an extension wiring line;
a magnetic resistance element having a spontaneous magnetization, and storing a data as a direction of said spontaneous magnetization, wherein the direction of said spontaneous magnetization is inverted depending on a magnetic field applied to said magnetic resistance element;
a conductive pattern which is connected in series with said magnetic resistance element;
a serial connection of first and second diodes provided between said extension wiring line and a corresponding one of said plurality of second bit lines, said first and second diodes being connected in opposite directions; and
a MOS transistor which is provided between said extension wiring line and a corresponding one of said plurality of first bit lines and having a gate connected with said first selected word line,
a magnetic field generating section comprises said parallel connection of said second and third diodes, said extension wiring line, and said first MOS transistor,
one of said plurality of memory cells which is connected with said first selected word line, said second selected word line, and said first selected bit line is a selected memory cell, and one of said column of said reference memory cells which is connected with said first and second selected word lines, and said first reference bit line is a selected reference memory cell,
in a data write operation into said selected memory cell, a write data is written in said magnetic resistance element of said selected memory cell by applying said magnetic field generated by a write electric current which flows through said extension wiring line of said magnetic field generating section of said selected memory cell, and a value of said write data is determined based on a direction of said write electric current, and in a data read operation from said selected memory cell,
a read electric current flows through a route of said extension wiring line, said magnetic resistance element and said first diode in said selected memory cell, and a read data from said selected memory cell is determined based on a resistance of said magnetic resistance element of said selected memory cell.

113. The magnetic random access memory according to claim 112, wherein said first Y selector sets said plurality of second bit lines to a first voltage, said magnetic random access memory further comprises:
a Y-side power supply circuit which applies one of said second and third voltages to said second Y selector based on said write data in the data write operation, wherein said first Y selector applies the other of said second and third voltages to said second selected bit line based on said write data in the data write operation;
a read current load circuit which supplies said read electric current to said first Y selector and a reference read electric current to said first reference bit line in the data read operation; and
a sense amplifier which senses said read data based on a difference between said read electric current flowing through said first selected bit line and said reference read electric current flowing through said first reference bit line in the data read operation,
wherein in the data write operation, said write electric current flows through a route of said second Y selector, said first selected bit line, said magnetic field generating section of said selected memory cell, said second selected bit line and said first X selector,
said read electric current flows through a route of said second Y selector, said first selected bit line, and said first MOS transistor, said extension bit line, said magnetic resistance element and said conductive pattern of said selected memory cell in the data read operation, and
said reference read electric current flows through a route of said first reference bit line, and said first MOS transistor, said extension bit line, said magnetic resistance element and said conductive pattern of said selected memory cell in the data read operation.

114. The magnetic random access memory according to claim 113, wherein said Y-side power supply circuit applies said one of said second and third voltages to said first reference bit line based on said write data in a reference data write operation to said selected reference memory cell, and
said reference write electric current flows through a route of said first reference bit line, said magnetic field generating section of said selected reference memory cell, said second reference bit line word line and said first Y selector in the reference data write operation.

115. The magnetic random access memory according to claim 112, wherein said first Y selector is connected with said first reference bit line, and said first Y selector set said plurality of second bit lines to a first voltage, and said second Y selector set said plurality of second bit lines to said first voltage, said magnetic random access memory further comprises:
a plurality of said memory cell array sections;
first to third main bit lines;
a cell array selector which selects one of said plurality of memory cell array section as a selected memory cell array section based on said address to connect said first and second main bit lines with said second Y selector of said selected memory cell array section and said third main bit line with said first Y selector of said selected memory cell array section,
a Y-side power supply circuit which applies one of said second and third voltages to said third main bit line and the other of said second and third voltages to said second main bit line based on said write data in the data write operation;
a read current load circuit which supplies said read electric current and a reference read electric current to said second and first main bit lines; and
a sense amplifier which senses said read data based on a difference between said read electric current flowing through said second main bit line and said reference read electric current flowing through said first main bit line in the data read operation to said selected memory cell,
wherein said write electric current flows through a route of said second main bit line, and said second Y selector, said first selected bit line, said magnetic field generating section of said selected memory cell, said second selected bit line and said first Y selector in said selected memory cell array section and said first main bit line in the data write operation,
said read electric current flows through a route of said second main bit line, said second Y selector, said first selected bit line, and said first MOS transistor, said extension bit line, said magnetic resistance element and said conductive pattern of said selected memory cell in said selected memory cell array section in the data read operation, and
said reference read electric current flows through a route of said first main bit line, said first reference bit line, and said first MOS transistor, said extension bit line, said magnetic resistance element and said conductive pattern of said selected reference memory cell in said selected memory cell array section in the data read operation.

116. The magnetic random access memory according to claim 115, wherein said Y-side current source circuit applies said one of said second and third voltages to said first main bit based on said write data in a reference data write operation to said selected reference memory cell;
a reference write electric current flows through a route of said first main bit line, said second Y selector, said first reference bit line, said magnetic field generating section of said selected reference memory cell, said second reference bit line and said first Y selector in the selected memory cell array section and said third main bit line in the reference data write operation.

117. A magnetic random access memory comprising a memory cell array section which comprises:
a plurality of memory cells arranged in a matrix of rows and columns, wherein one column of said memory cells a column of reference memory cells;
a plurality of first word lines, each of which is connected with one row of said memory cells;
a plurality of first bit lines, each of which is connected with one column of said memory cells, wherein said first bit line for said first column of said reference memory cells is a first reference bit line;
a first X selector which selects one of said plurality of first word lines as a first selected word line and one of said plurality of second word lines as a second selected word line based on an address; and a first Y selector which selects one of said plurality of first bit lines as a first selected bit line based on said address,
wherein each of said plurality of memory cells comprises:
an extension wiring line;
a magnetic resistance element having a spontaneous magnetization, and storing a data as a direction of said spontaneous magnetization, wherein the direction of said spontaneous magnetization is inverted depending on a magnetic field applied to said magnetic resistance element;
a conductive pattern connected with a predetermined voltage;
a first MOS transistor which is provided between said extension wiring line and a corresponding one of said plurality of first bit lines and having a gate connected with said first selected word line;
a capacitor connected between said extension wiring line and said conductive pattern,
a magnetic field generating section comprises said extension wiring line and said first MOS transistor,
one of said plurality of memory cells which is connected with said first selected word line, said second selected word line, and said first selected bit line is a selected memory cell, and one of said column of said reference memory cells which is connected with said first and second selected word lines, and said first reference bit line is a selected reference memory cell,
in a data write operation into said selected memory cell, a write data is written in said magnetic resistance element of said selected memory cell by applying said magnetic field generated by a write electric current which flows through said extension wiring line of said magnetic field generating section of said selected memory cell, and a value of said write data is determined based on a direction of said write electric current, and
in a data read operation from said selected memory cell, a read electric current flows through a route of said extension wiring line, said magnetic resistance element and said first diode in said selected memory cell, and a read data from said selected memory cell is determined based on a resistance of said magnetic resistance element of said selected memory cell.

118. The magnetic random access memory according to claim 117, wherein said first Y selector sets said first selected bit line to a predetermined voltage, and said first X selector selects said first selected word line to charge said capacitor to said predetermined voltage,
said magnetic random access memory further comprises:
a Y-side power supply circuit which applies one of a first voltage higher than said predetermined voltage and a second voltage lower than said predetermined voltage to said first Y selector based on said write data in the data write operation;
a read current load circuit which supplies said read electric current to said first Y selector and a reference read electric current to said first reference bit line in the data read operation, wherein said first X selector sets said second selected word line to said third voltage in the data read operation; and
a sense amplifier which senses said read data based on a difference between said read electric current flowing through said first selected bit line and said reference read electric current flowing through said first reference bit line in the data read operation,
wherein in the data write operation, said write electric current flows through a route of said first Y selector, said first selected bit line, said magnetic field generating section of said selected memory cell, and capacitor,
said read electric current flows through a route of said first Y selector, said first selected bit line, said first MOS transistor, said extension bit line, said magnetic resistance element and said conductive pattern of said selected memory cell in the data read operation, and
said reference read electric current flows through a route of said first reference bit line, said first MOS transistor, said extension bit line, said magnetic resistance element and said conductive pattern of said selected memory cell in the data read operation.

119. The magnetic random access memory according to claim 118, wherein said Y-side power supply circuit applies one of said first and second voltages to said first reference bit line based on said write data in a reference data write operation to said selected reference memory cell, and
said reference write electric current flows through a route of said first reference bit line, said magnetic field generating section of said selected reference memory cell, said capacitor in the reference data write operation.

120. A magnetic random access memory comprising a memory cell array section which comprises:
a plurality of memory cells arranged in a matrix of rows and columns, wherein one column of said memory cells a column of reference memory cells;
a plurality of first word lines, each of which is connected with one row of said memory cells;
a plurality of first bit lines, each of which is connected with one column of said memory cells;
a plurality of second bit lines, each of which is connected with one column of said memory cells and forms a pair with a corresponding one of said plurality of first bit lines, wherein said first and second bit lines for said column of said reference memory cells are first and second reference bit lines;
a X selector which selects one of said plurality of first word lines as a first selected word line based on an address; and
a Y selector interposed between an upper portion and a lower portion of each of said plurality of first bit lines and between an upper portion and a lower portion of each of said plurality of second bit lines to connect said upper portion and said lower portion of each of said plurality of first bit lines in data read and write operations and said upper portion and said lower portion of each of said plurality of second bit lines in the data write operation;
a read current load circuit provided for each of pairs of said first bit line and said second bit line to supply a read electric current to said first selected bit line and a reference read electric current to said first reference bit line in the data read operation; and
a sense amplifier provided for each of pairs of said first bit line and said second bit line to sense said read data based on a difference between a read voltage on said first selected bit line and said reference read voltage on said second selected bit line in the data read operation;
a transfer section which selectively connects said first reference bit line with said plurality of second bit lines;
first and second main bit lines;
a gate section provided for each of pairs of said first bit line and said second bit line to select one of said pairs of said first bit line and said second bit line based on said address as a pair of first selected bit line and a second selected bit line, and to connect said first and second main bit lines with said first and second selected bit lines based on an address, wherein said read current load circuit, said a sense amplifier and transfer section are provided between said Y selector and said gate section, wherein each of said plurality of memory cells comprises:

an extension wiring line;

a conductive pattern;

a magnetic resistance element provided between said extension wiring line and said conductive pattern, and having a spontaneous magnetization, and storing a data as a direction of said spontaneous magnetization, wherein the direction of said spontaneous magnetization is inverted depending on a magnetic field applied to said magnetic resistance element;

a first MOS transistor provided between said extension wiring line and a corresponding one of said plurality of first bit lines and having a gate connected with a corresponding one of said plurality of first word lines; and a second MOS transistor provided between said extension wiring line and a corresponding one of said plurality of second bit lines and having a gate connected with the corresponding one of said plurality of first word lines, a magnetic field generating section comprises said first MOS transistor, said extension wiring line, and said first MOS transistor, one of said plurality of memory cells which is connected with said first selected word line, said first selected bit line and said second selected bit line is a selected memory cell, and one of said column of said reference memory cells which is connected with said first selected word line, said first reference bit line and said second reference bit line is a selected reference memory cell, in a data write operation into said selected memory cell, a write data is written in said magnetic resistance element of said selected memory cell by applying said magnetic field generated by a write electric current which flows through said extension wiring line of said magnetic field generating section of said selected memory cell, and a value of said write data is determined based on a direction of said write electric current, and in a data read operation from said selected memory cell, a read electric current flows through a route of said first MOS transistor, said extension wiring line, said magnetic resistance element and said conductive pattern in said selected memory cell, and a read data from said selected memory cell is determined based on a resistance of said magnetic resistance element of said selected memory cell.

121. The magnetic random access memory according to claim 120, wherein said write electric current flows through a route of said first main bit line, said gate section, said first selected bit line, said Y selector, said magnetic field generating section of said selected memory cell, said second selected bit line and said Y selector, said gate section, and said first main bit line in the data write operation, said read electric current flows through a route of said read current load circuit for said selected memory cell, said first selected bit line, said Y selector, said first MOS transistor, said extension bit line, said magnetic resistance element and said conductive pattern of said selected memory cell in the data read operation, and said reference read electric current flows through a route of said read current load circuit for said selected reference memory cell, said first reference bit line, said Y selector and said first MOS transistor, said extension bit line, said magnetic resistance element and said conductive pattern of said selected reference memory cell in the data read operation, wherein said reference read electric current is transferred to said second selected bit line by said transfer section, said sense amplifier senses said read data from said selected memory cell based on said difference between said read voltage on said first selected bit line and said reference read voltage on said second selected bit line in the data read operation when said upper portions of said first and second selected bit lines are disconnected from said lower portions of said first and second selected bit lines, and outputs the sensing result to said first and second main bit lines through said gate section.

* * * * *